(12) United States Patent
Sato et al.

(10) Patent No.: US 6,270,948 B1
(45) Date of Patent: Aug. 7, 2001

(54) METHOD OF FORMING PATTERN

(75) Inventors: Yasuhiko Sato, Yokohama; Yoshihiko Nakano, Tokyo; Rikako Kani, Yokohama; Shuji Hayase, Yokohama; Yasunobu Onishi, Yokohama; Eishi Shiobara; Seiro Miyoshi, both of Kawasaki; Hideto Matsuyama, Yokohama; Masaki Narita, Yokohama; Sawako Yoshikawa, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/327,223

(22) Filed: Jun. 7, 1999

Related U.S. Application Data

(63) Continuation of application No. 08/915,468, filed on Aug. 20, 1997, now abandoned.

(30) Foreign Application Priority Data

| Aug. 22, 1996 | (JP) | 8-221354 |
| Aug. 30, 1996 | (JP) | 8-229936 |
| Nov. 20, 1996 | (JP) | 8-309474 |

(51) Int. Cl.[7] ................................ G03F 7/00
(52) U.S. Cl. .............. 430/314; 430/311; 430/313; 430/316; 430/317; 430/318; 430/323; 216/49
(58) Field of Search .................. 430/313, 311, 430/314, 312, 316, 317, 318, 323; 216/49

(56) References Cited

U.S. PATENT DOCUMENTS

| 4,599,243 | 7/1986 | Sachdev et al. .................. 430/314 |
| 4,692,205 | 9/1987 | Schdev et al. ................... 430/316 |
| 4,891,303 | 1/1990 | Garza et al. ..................... 430/316 |
| 5,059,500 | 10/1991 | Needham et al. ................. 430/321 |
| 5,093,224 | 3/1992 | Hashimoto et al. ............... 430/313 |
| 5,336,365 | * 8/1994 | Goda et al. ...................... 156/643 |
| 5,372,908 | 12/1994 | Hayase et al. .................... 430/192 |

(List continued on next page.)

FOREIGN PATENT DOCUMENTS 5-257288  10/1993  (JP).

OTHER PUBLICATIONS

Thompson et al., Introduction to Microlithography, ACS Symposium Series, pp. 232–242, 1983.*

Morisawa, Taku et al., "Chemically Amplified Si–contained Resist Using Silsesquoxane for ArF Lithography (CASUAL) and its Application to Bi–Layer Resist Process," *Journal of Photopolymer Science and Technology*, V. 10, No. 4, pp. 589–594 (1997).

Nakano, Kaichiro et al., "Chemically Amplified Resist Based on High Etch–Resistant Polymers for 193–nm Lithography," *Journal of Photopolymer Science and Technology*, V. 10, No. 4, pp. 561–570 (1997).

T.P. Chow and A.J. Steckel, *Plasma Etching of Refractory Gates for VLSI Applications*, 131 J. Electrochem. Soc. 2325–35 (1984).

*Primary Examiner*—Mark F. Huff
*Assistant Examiner*—Nicole Barreca
(74) *Attorney, Agent, or Firm*—Finnegan, Henderson, Farabow, Garrett & Dunner, L.L.P.

(57) ABSTRACT

A method of forming a pattern which comprises the steps of, forming an organosilicon film on a work film, the organosilicon film comprising an organosilicon compound having a silicon-silicon bond in a backbone chain thereof and a glass transition temperature of 0° C. or more, forming a resist pattern on the organosilicon film, and transcribing the resist pattern on the organosilicon film through an etching of the organosilicon film by making use of an etching gas containing at least one kind of atom selected from the group consisting of chlorine, bromine and iodine. The organosilicon pattern obtained by the etching is employed as a mask for patterning the work film.

12 Claims, 11 Drawing Sheets

U.S. PATENT DOCUMENTS

| | | | |
|---|---|---|---|
| 5,380,621 | 1/1995 | Dichiara et al. | 430/272 |
| 5,401,614 | 3/1995 | Dichiara et al. | 430/323 |
| 5,624,788 | 4/1997 | Murai et al. | 430/270.1 |
| 5,635,338 * | 6/1997 | Joshi et al. | 430/325 |
| 5,885,751 * | 3/1999 | Weidman et al. | 430/315 |
| 6,025,117 * | 2/2000 | Nakano | 430/314 |

* cited by examiner

METHOD OF FORMING PATTERN

This is a continuation of application Ser. No. 08/915,468, filed Aug. 20, 1997, now abandoned which is incorporated herein by reference.

BACKGROUND OF THE INVENTION

The present invention relates to a method of forming a pattern using an organosilicon film pattern as an etching mask.

The manufacturing method of a semiconductor device generally involves the steps of depositing a plurality of materials on a semiconductor wafer, and patterning these deposited films into a desired pattern. This patterning step is generally performed by the steps of depositing a photosensitive material called a resist on a work film (a film to be worked or processed) formed on the surface of the wafer thereby forming a resist film, selectively exposing this resist film to a patterning light using as a light source ultraviolet rays, and then developing the resist film.

It is important in this patterning process to prevent a reflection of the patterning light from the work film of the wafer. In order to solve this problem, Japanese Patent Unexamined Publication S/49-55280 describes a method of forming an antireflection film between a resist film and a work film. In this case, various materials may be employed as the antireflection film. However, in view of the possibility to utilize a spin-coating method which enables to save the process cost, the following materials are mainly employed.

(1) A material comprising a spin glass added with a dye (Jpn. J. Appl. Phys. Vol. 35 (1996) pp. L1257–L1259:

(2) A plasma-decomposition type resin such as polysulfone (Japanese Patent Unexamined Publication S/59-93448): and (3) Polysilane (U.S. Pat. No. 5,401,614).

The employment of the material of (1) is accompanied with problems that when a chemical amplification type resist having a high resolution is employed, it is difficult to obtain an excellent resist profile, i.e. resulting in a resist profile exhibiting a footing or undercut of resist. The employment of the material of (2) is also accompanied with problems at the occasion of transcribing a resist pattern by making use of a dry etching method that since the etching rate of the antireflection film is almost identical with that of the resist, a resist pattern may be entirely lost during the etching of the antireflection film, thus making it difficult to work to obtain the antireflection film of desired dimension. In particular, when the film thickness of the resist is thinned to the same degree as that of the antireflection film with a view to enhance the resolution, this problem would become more serious.

On the other hand, the employment of the material (3) may sometimes cause a denaturing of the polysilane film at the occasion of transcribing a resist pattern by making use of a dry etching method thereby making it difficult to precisely perform the etching the polysilane film. Moreover, there is another problem that if etching of this polysilane film is performed by making use of a halogen type gas, the resist pattern may become thickened by a deposition material so that it is impossible to perform the etching with high dimensional control.

BRIEF SUMMARY OF THE INVENTION

Therefore, the object of the present invention is to provide a method of forming a pattern which is free from any denaturing of polysilane film and is capable of improving the etching selectivity between a resist and a polysilane film.

Another object of the present invention is to provide a method of forming a pattern which is capable of preventing the thickening of a resist pattern at the occasion of patterning a polysilane film.

Further object of the present invention is to provide a method of forming a pattern which makes it possible to perform the patterning with high dimensional control.

Further object of the present invention is to provide a method of forming a pattern which makes it possible to remove antireflection film without generating residues.

According to the present invention, there is provided a method of forming a pattern which comprises the steps of;

forming an organosilicon film on a work film, the organosilicon film comprising an organosilicon compound having a silicon-silicon bond in a backbone chain thereof and a glass transition temperature of 0° C. or more;

forming a resist pattern on the organosilicon film; and transcribing the resist pattern on the organosilicon film through an etching of the organosilicon film by making use of an etching gas comprising a gas containing at least one kind of atom selected from the group consisting of chlorine, bromine and iodine.

According to the present invention, there is provided a method of forming a pattern which comprises the steps of;

forming an organosilicon film on a work film, the organosilicon film containing an organosilicon compound having a silicon-silicon bond in a backbone chain thereof and a glass transition temperature of 0° C. or more;

forming a resist pattern on the organosilicon film; and etching the organosilicon film by making use of an etching gas comprising a gas containing at least one kind of atom selected from the group consisting of chlorine, bromine and iodine;

oxidizing the organosilicon film; and etching the work film by making use of a pattern comprising the oxidized organosilicon film as an etching mask.

According to the present invention, there is provided a method of forming a pattern which comprises the steps of;

forming an organosilicon film on a work film, the organosilicon film comprising an organosilicon compound having a silicon-silicon bond in a backbone chain thereof and a glass transition temperature of 0° C. or more;

forming a resist pattern on the organosilicon film;

etching the organosilicon film by making use of an etching gas comprising a gas containing at least one kind of atom selected from the group consisting of chlorine, bromine and iodine;

etching the work film by making use of a pattern comprising the organosilicon film as an etching mask; and removing the pattern of the organosilicon film by making use of a mixture of a gas containing oxygen atom and a gas containing at least one kind of atom selected from the group consisting of chlorine, bromine and fluorine.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The method of forming a pattern according to this invention will be explained in details by referring to drawings.

FIGS. 1A to 1F illustrate cross-sectional views sequentially showing the process of forming a pattern according to one embodiment of this invention.

Figure 1A:
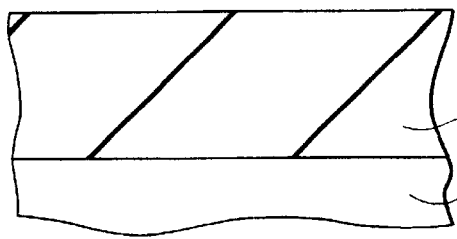
FIGS. 1A to 1F illustrate cross-sectional views sequentially showing the process of forming a pattern according to one embodiment of this invention.

As shown in FIG. 1A, first of all, a work film 2 is formed on a wafer substrate 1. There is not any particular limitation on the kind of this work film 2. Namely, it may be a silicon oxide film, a silicon nitride film, a silicon oxynitride film, a spin-on-glass, a silicon-based insulating film to be used as a blank material in the manufacture of a photo mask, a silicon-based material (such as amorphous silicon, polysilicon (polycrystalline Si) or silicon substrate), or a wiring material (such as aluminum, aluminum silicide, copper and tungsten).

Figure 1B:
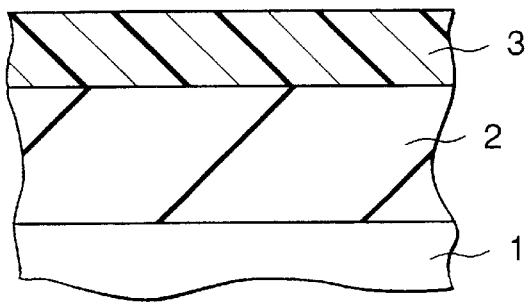

Then, as shown in FIG. 1B, an organosilicon film 3 containing an organosilicon compound having a silicon-silicon bond in its backbone chain is formed on the work film 2. The film thickness of the organosilicon film 3 should preferably be in the range of 0.005 to 5 μm. The reason is that if the film thickness of the organosilicon film 3 is less than 0.005 μm, it is difficult to sufficiently inhibit a reflection light from an underlying substrate at the occasion of forming a pattern by means of light exposure. On the other hand, if the film thickness is more than 5 μm, it may lead to a generation of prominent dimensional change at the occasion of transcribing a resist pattern onto an organosilicon film 3 by means of dry etching method.

An organosilicon compound having a glass transition temperature of 0° C. or more should be selected for the organosilicon film 3. Because if the glass transition temperature of the organosilicon film 3 is less than 0° C., the organosilicon film 3 may be denatured at the occasion of transcribing a resist pattern onto the organosilicon film 3 by means of dry etching method so that it is difficult to properly perform the etching of the organosilicon film 3.

The formation of the organosilicon film 3 may be performed by either a method of coating a solution or a vapor-phase deposition method such as the CVD method (chemical vapor-phase deposition method). However, the employment of the coating method is preferable, since it is simple in process and lower in process cost as compared with the CVD method.

A process of forming an organosilicon film by means of coating method will be explained in detail as follows.

First of all, an organosilicon compound having a silicon-silicon bond in its backbone chain is dissolved in an organic solvent to prepare a solution. One of the organosilicon compounds having a silicon-silicon bond in its backbone chain which is useful in this invention is polysilane to be represented by a general formula $(SiR^{11}R^{12})$ (wherein $R^{11}$ and $R^{12}$ are individually hydrogen atom, or a substituted or unsubstituted aliphatic or aromatic hydrocarbon group having 1 to 20 carbon atoms). As for this polysilane, it may be a homopolymer or a copolymer, or it may of a structure wherein two or more polysilanes are bonded together via oxygen atom, nitrogen atom, an aliphatic group or an aromatic group.

Specific examples of organosilicon compounds useful in this invention are shown in the following formulas (1-1) to (1-114). In these formulas, m and n respectively represent a positive integer.

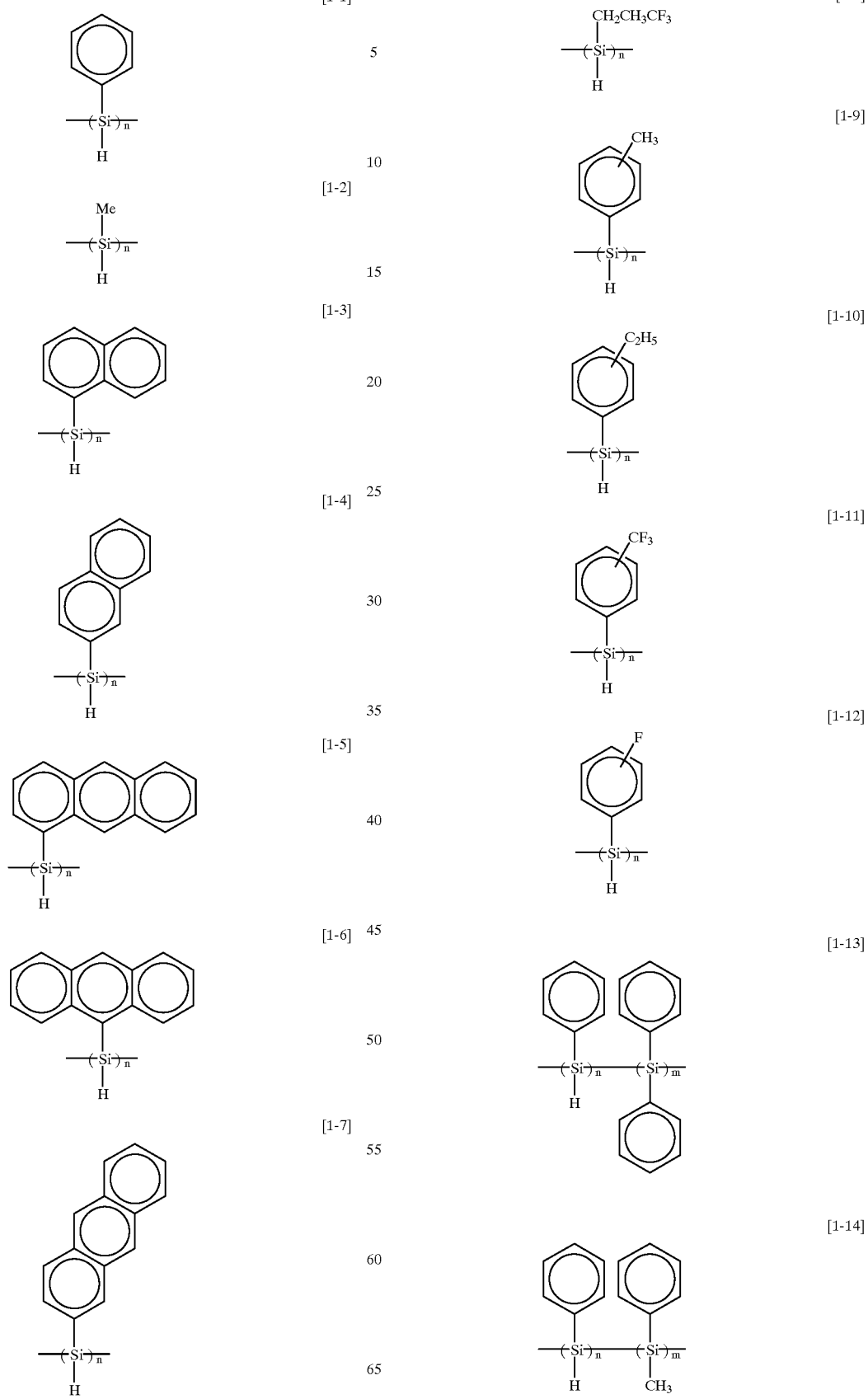

[1-15] 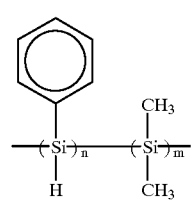
[1-16] 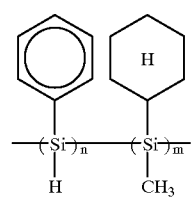
[1-17] 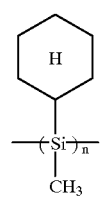
[1-18] 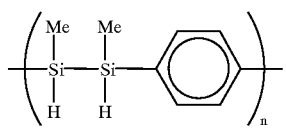
[1-19] 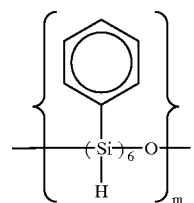
[1-20] 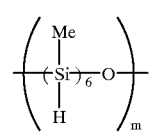
[1-21] 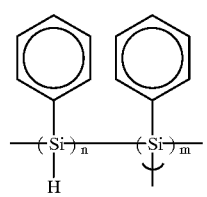
[1-22] 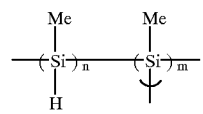
[1-23] 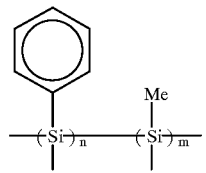
[1-24] 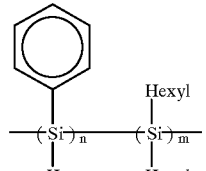
[1-25] 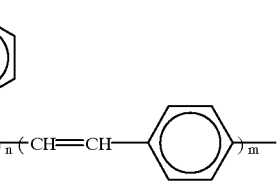
[1-26] 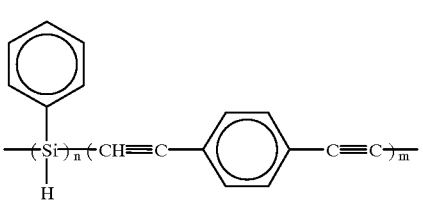
[1-27] 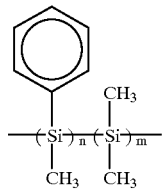
[1-28] 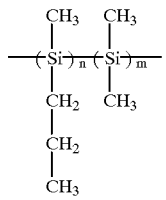
[1-29] 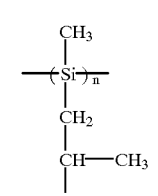

-continued
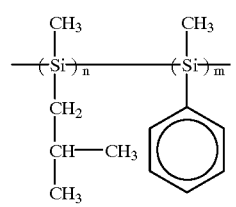
[1-30]
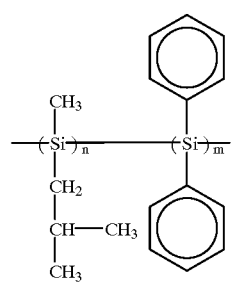
[1-31]
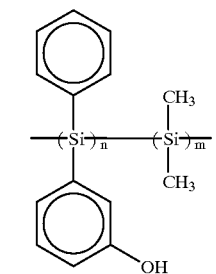
[1-32]
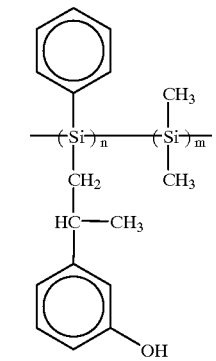
[1-33]
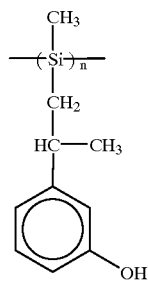
[1-34]
-continued
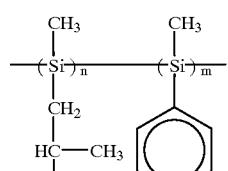
[1-35]
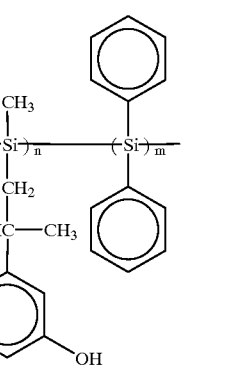
[1-36]
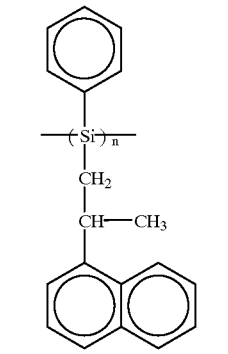
[1-37]
[1-38]

[1-39]
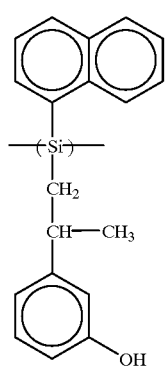
[1-40]
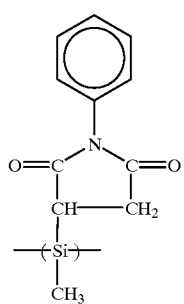
[1-41]
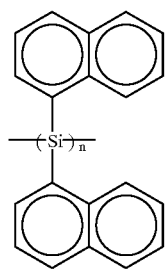
[1-42]
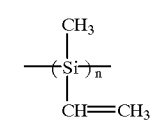
[1-43]
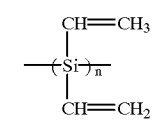
[1-44]
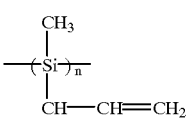
[1-45]
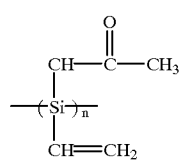
[1-46]
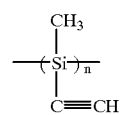
[1-47]
[1-48]
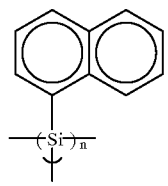
[1-49]
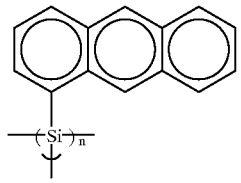
[1-50]
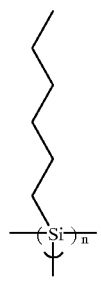
[1-51]
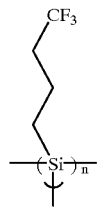
[1-52]
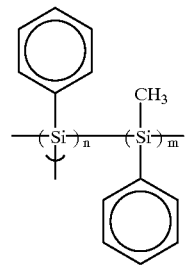

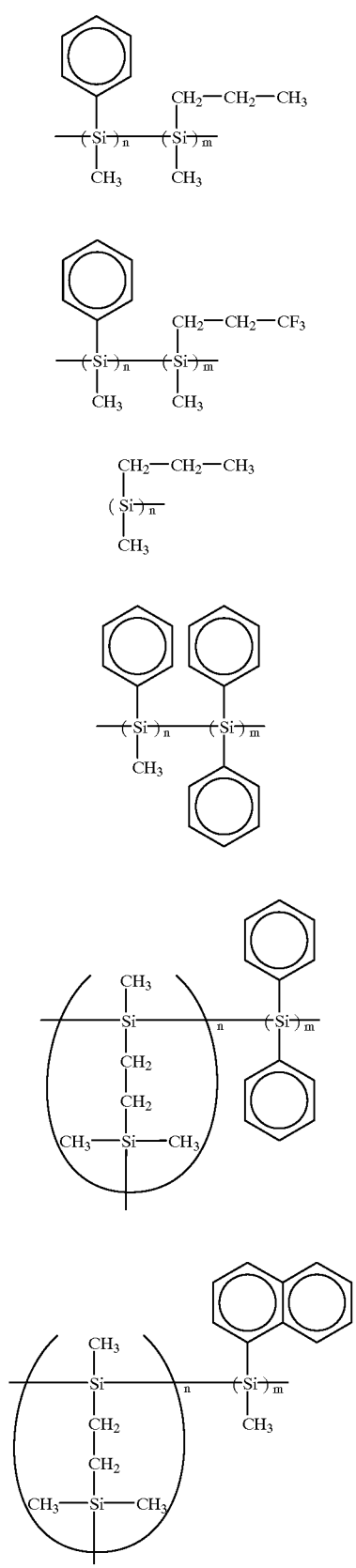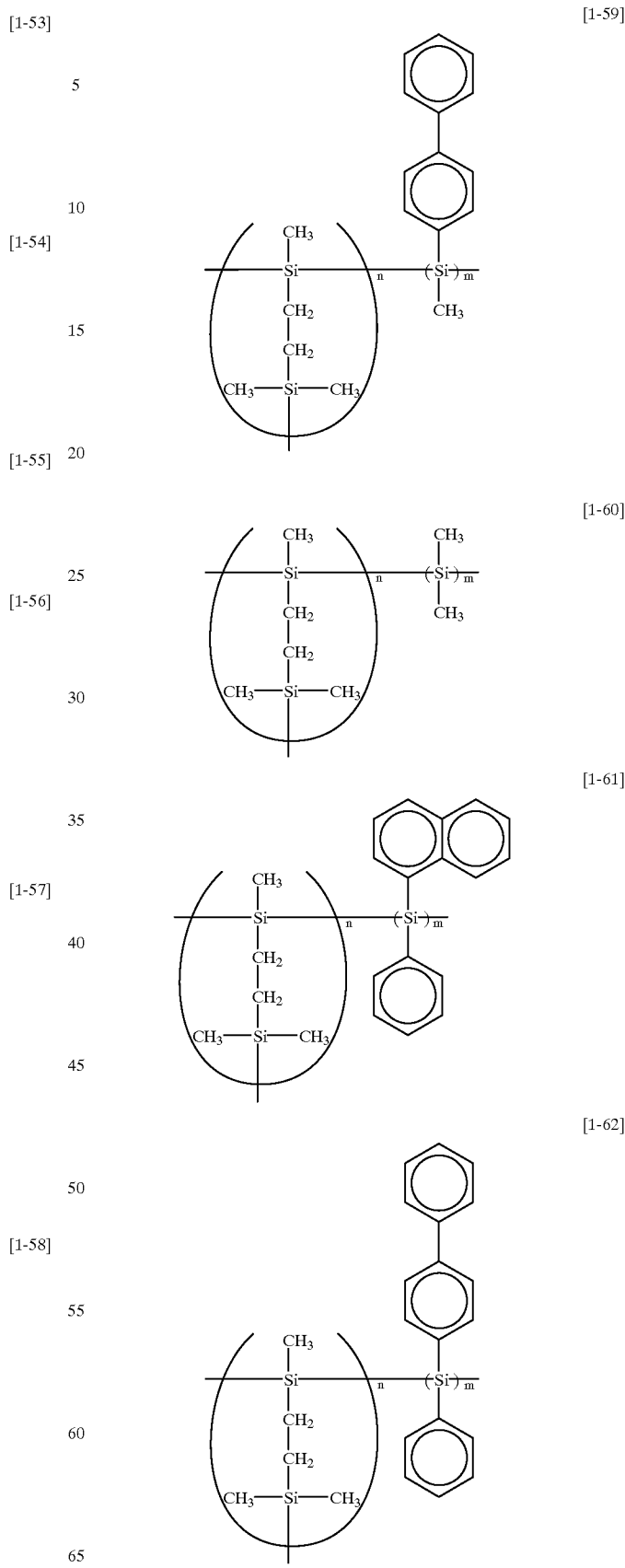

[1-63] 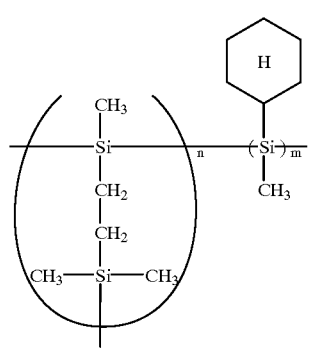
[1-64] 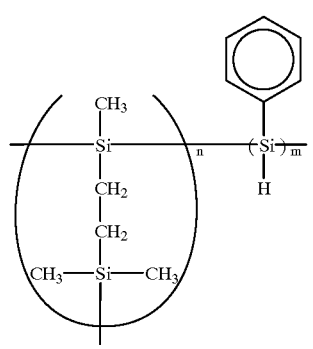
[1-65] 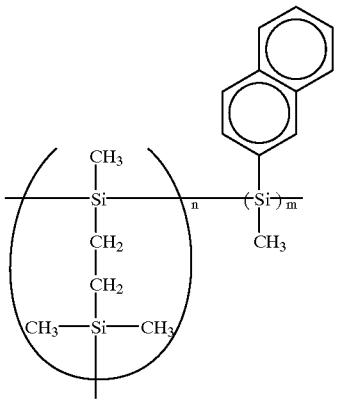
[1-66] 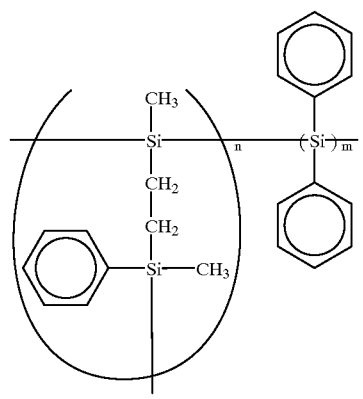
[1-67] 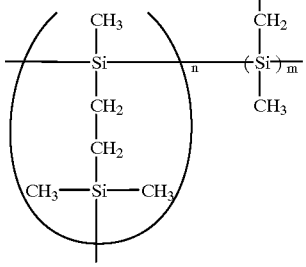
[1-68] 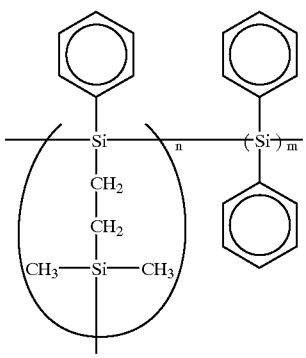
[1-69] 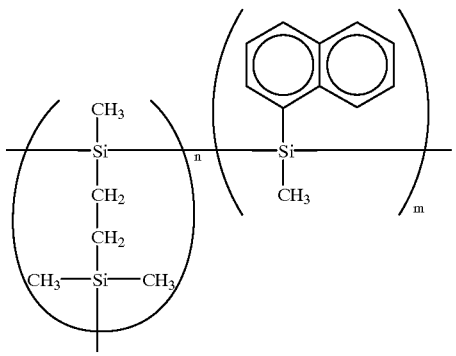
[1-70] 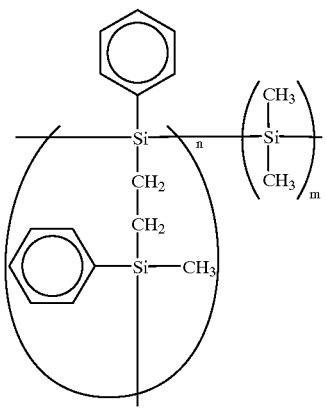

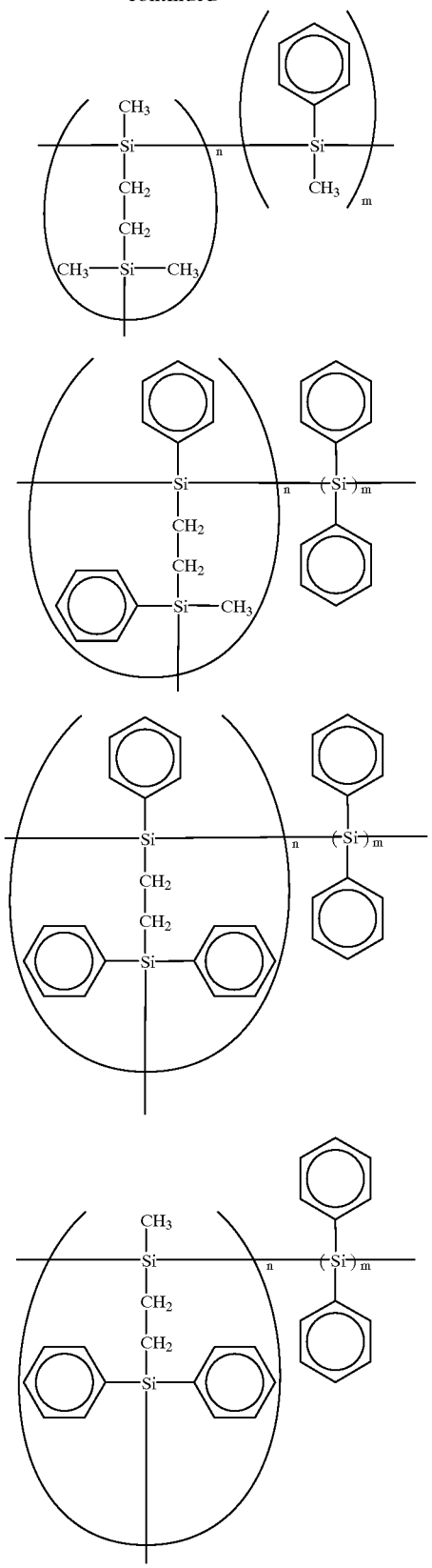
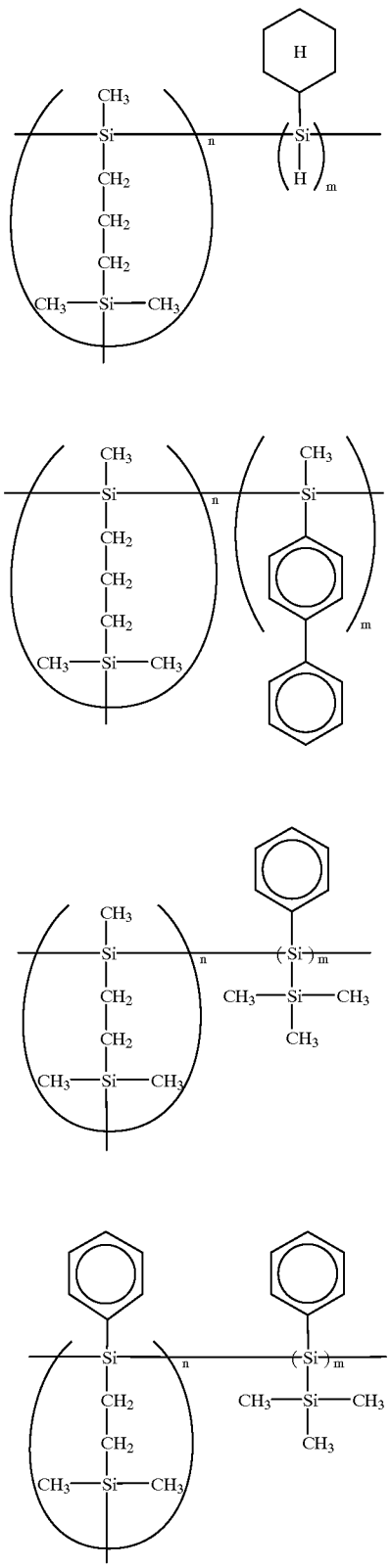

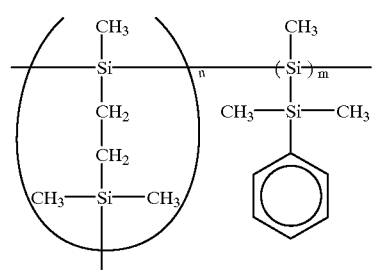
[1-79]
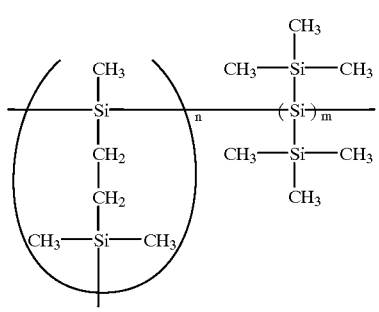
[1-80]
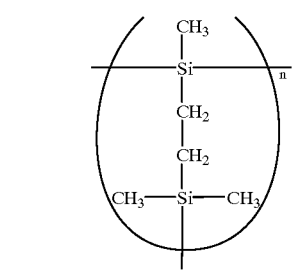
[1-81]
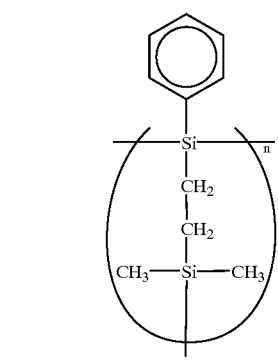
[1-82]
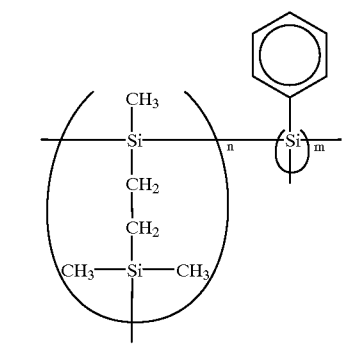
[1-83]
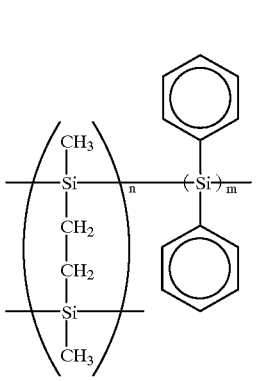
[1-84]
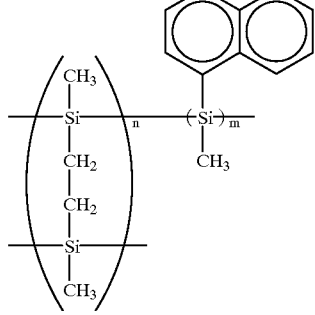
[1-85]
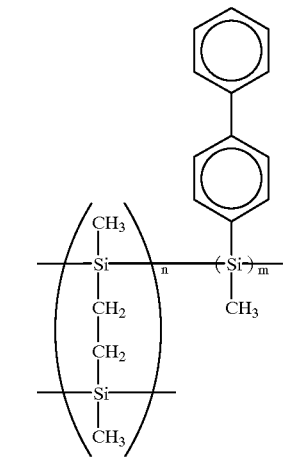
[1-86]
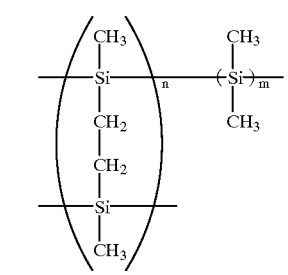
[1-87]

[1-88]
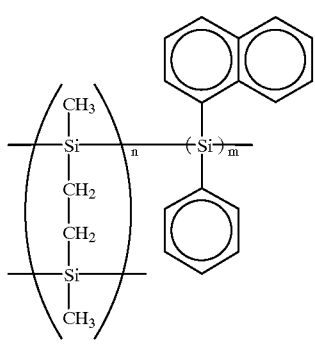
[1-89]
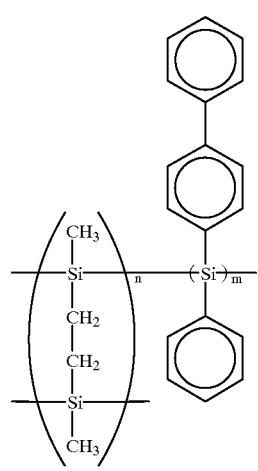
[1-90]
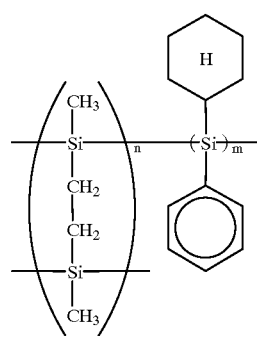
[1-91]
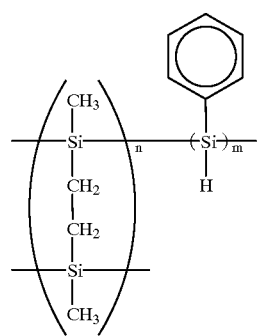
[1-92]
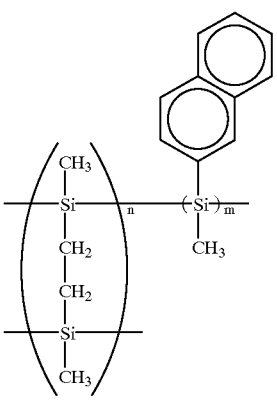
[1-93]
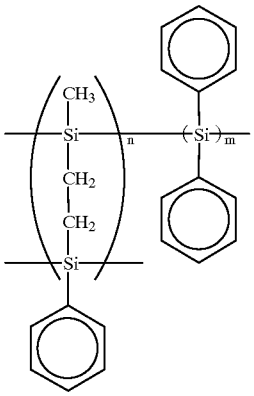
[1-94]
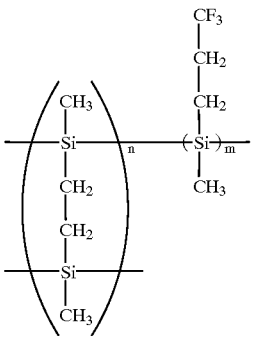
[1-95]
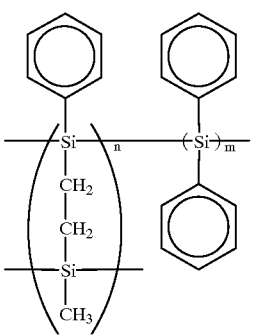

[1-96]
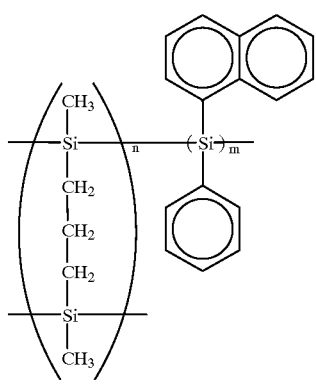
[1-97]
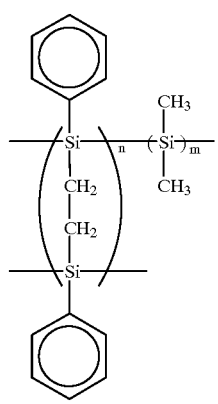
[1-98]
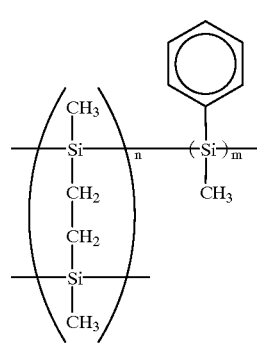
[1-99]
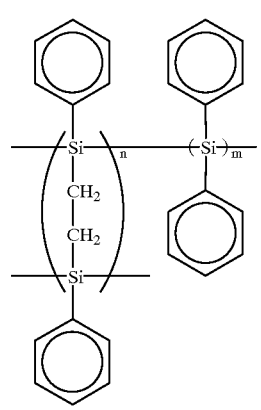
[1-100]
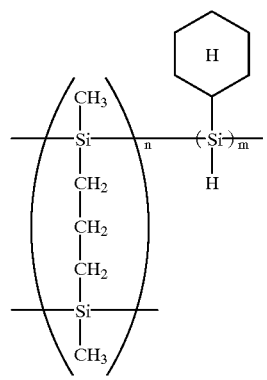
[1-101]
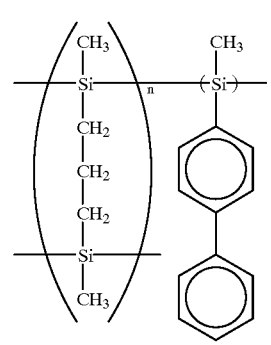
[1-102]
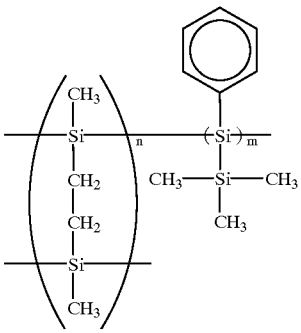
[1-103]
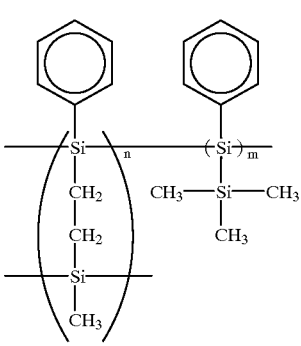

[1-104]
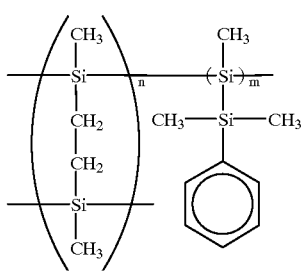
[1-105]
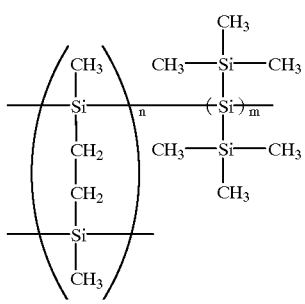
[1-106]
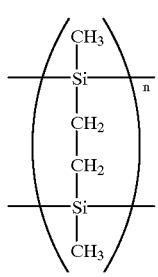
[1-107]
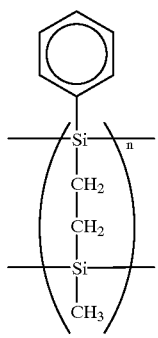
[1-108]
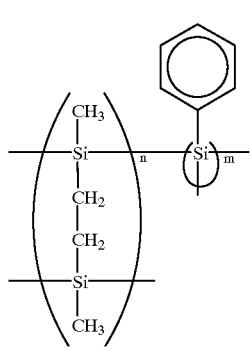
[1-109]
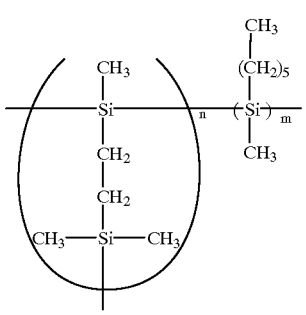
[1-110]
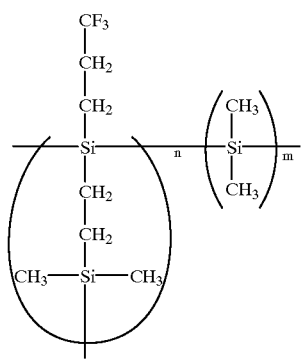
[1-111]
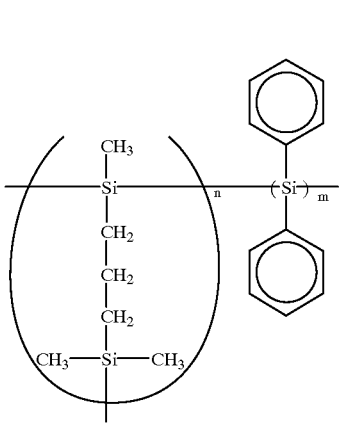
[1-112]
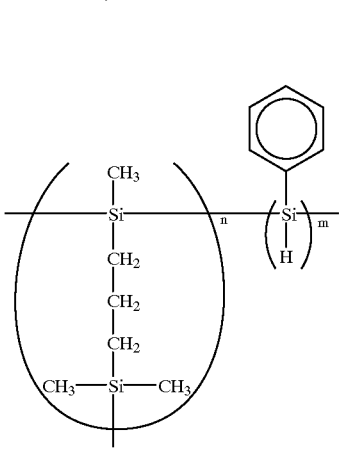

[1-113]

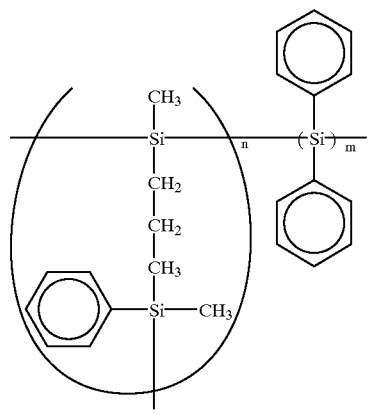

[1-114]

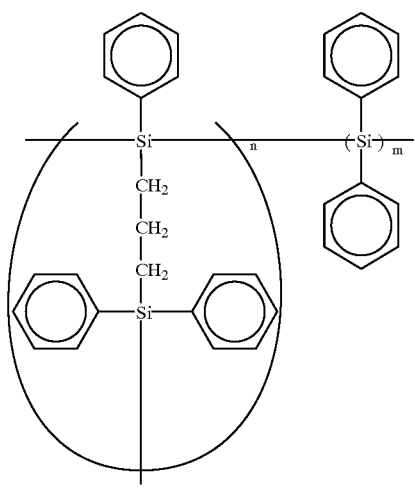

With regard to the weight average molecular weight of these organosilicon compounds, though there is not any particular restriction, it should preferably be in the range of from 200 to 100,000. Because if the weight average molecular weight thereof is less than 200, the organosilicon compound may be easily dissolved in a solvent for the resist, while if the weight average molecular weight thereof exceeds over 100,000, it may become difficult to dissolve the organosilicon compound in an organic solvent, thus making it difficult to prepare a solution of the organosilicon compound. These organosilicon compounds may be employed singly or in combination of two or more kinds.

If desired, a thermal polymerization inhibitor for improving the storage stability of the organosilicon compound, an adhesion improver for improving the adhesion of the organosilicon compound to a work film, an ultraviolet absorbing dye for preventing the light reflected by the work film from reflecting into a resist film, an ultraviolet-absorbing polymer such as polysulfone, polybenzimdazole, a conductive material, a substance exhibiting conductivity by the effect from light or heat, or a crosslinking agent for crosslinking the organosilicon compound may be added to these organosilicon compounds.

The aforementioned conductive material may be selected from organic sulfonic acid, organic carboxylic acid, polyhydric alcohol, polyhydric thiol, $SbF_5$, $PF_5$, $BF_5$ and $SnF_5$. The aforementioned substance exhibiting conductivity by the effect from light or heat may be selected from a carbon cluster ($C_{60}$ and $C_{70}$), cyanoanthracene, dicyanoanthracene, triphenylpillium, tetrafluoroborate, tetracyanoquinodimethane, tetracyanoethylene, phthalimide triphenol, perchloropentacyclododecane, dicyanobenzene, benzonitrile, trichloromethyltriazine, benzoyl peroxide, benzophenone tetracarboxylic acid and t-butyl peroxide. Specific examples of such a substance are the following compounds represented by the chemical formulas (2-1) to (2-106).

[2-1]

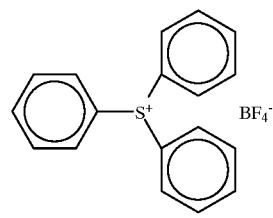

[2-2]

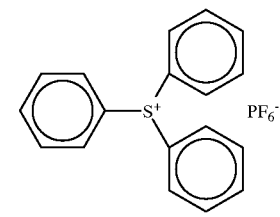

[2-3]

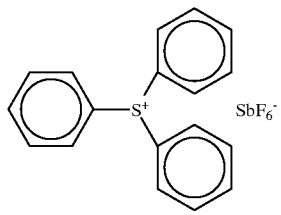

[2-4]

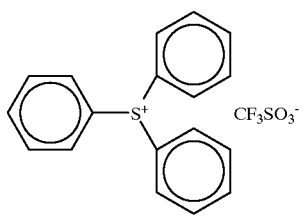

[2-5]

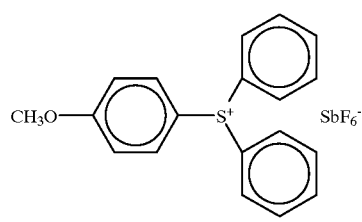

[2-6]
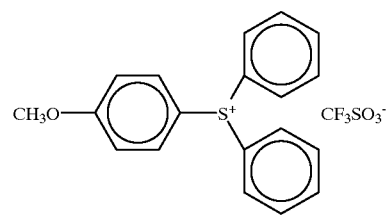
[2-7]
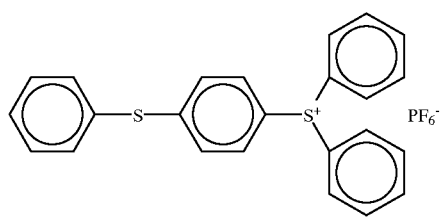
[2-8]
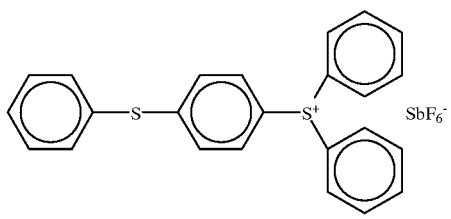
[2-9]
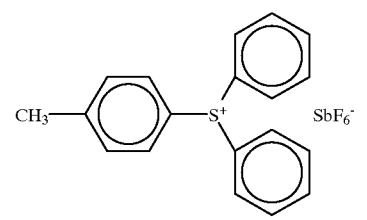
[2-10]
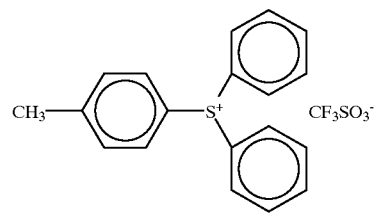
[2-11]
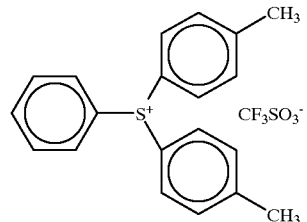
[2-12]
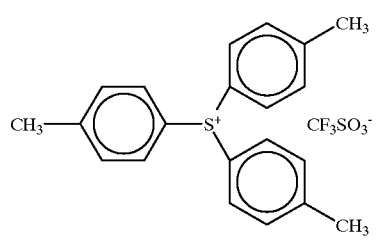
[2-13]
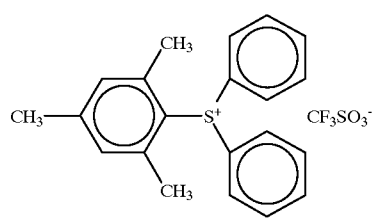
[2-14]
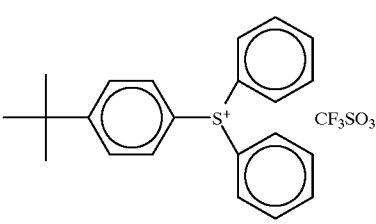
[2-15]
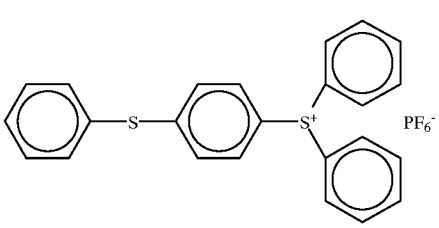
[2-16]
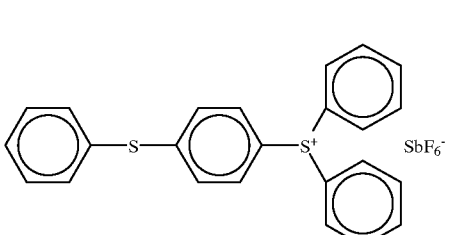
[2-17]
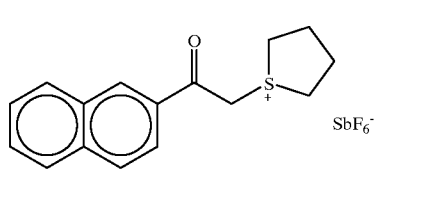
[2-18]
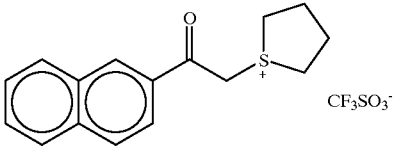

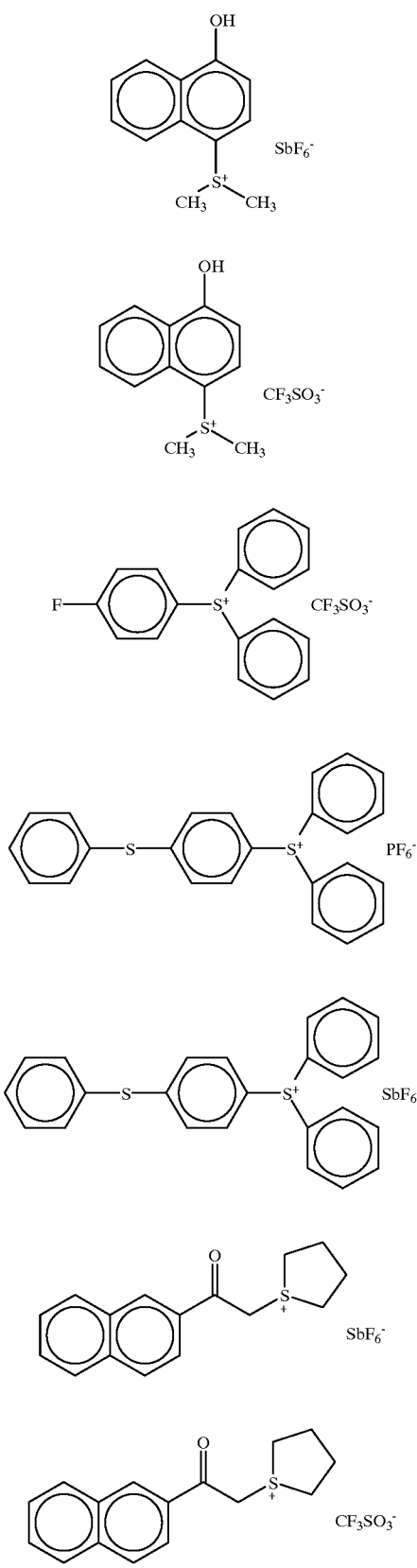

-continued
[2-37]
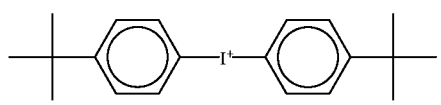
[2-38]
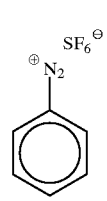
[2-39]
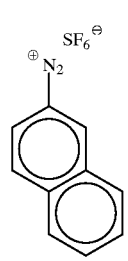
[2-40]
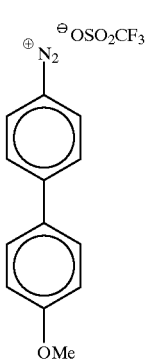
[2-41]
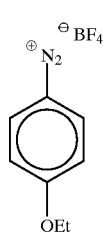
[2-42]
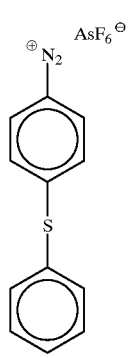
-continued
[2-43]
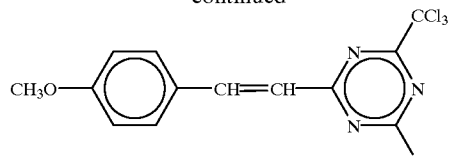
[2-44]
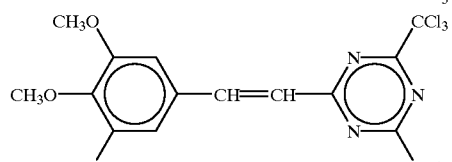
[2-45]
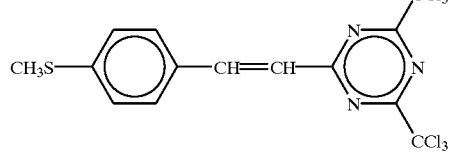
[2-46]
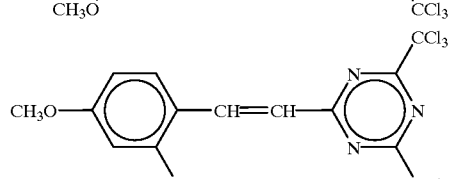
[2-47]
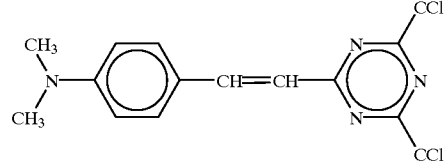
[2-48]
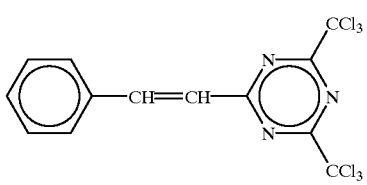
[2-49]
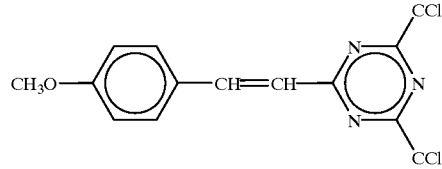
[2-50]
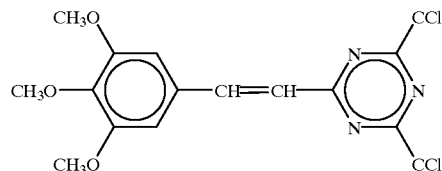
[2-51]
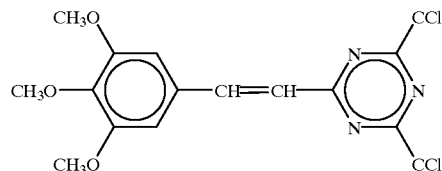

[2-52] 4-(methylthio)stilbene-triazine with CCl₃ groups

[2-53] 2,4,6-tris(trichloromethyl)-1,3,5-triazine

[2-54] 2-phenyl-4,6-bis(trichloromethyl)-1,3,5-triazine

[2-55] 2-(4-chlorophenyl)-4,6-bis(trichloromethyl)-1,3,5-triazine

[2-56] 2-(4-methoxyphenyl)-4,6-bis(trichloromethyl)-1,3,5-triazine

[2-57] 2-(4-methylthiophenyl)-4,6-bis(trichloromethyl)-1,3,5-triazine

[2-58] 2-(4-methoxynaphthyl)-4,6-bis(trichloromethyl)-1,3,5-triazine

[2-59] C₄H₉O-stilbene-bis(trichloromethyl)triazine

[2-60] C₅H₁₁O-stilbene-bis(trichloromethyl)triazine

[2-61] 3-sodiumoxybenzophenone

[2-62] 3,5-bis(sodiumoxy)benzophenone

[2-63] hydroxy-bis(sodiumoxy)benzophenone

[2-64] sodium cyanophenolate

[2-65] sodium methoxyphenolate

[2-66] sodium chlorobiphenyloxide

[2-67] C₂H₅ONa

[2-68] diphenyl sulfone-sulfone

[2-69] 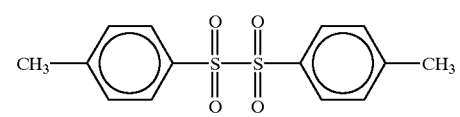
[2-70] 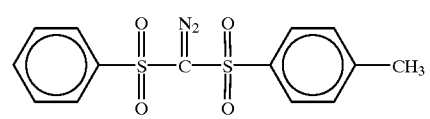
[2-71] 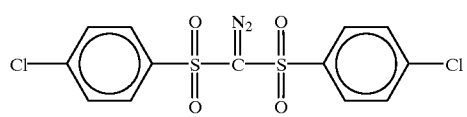
[2-72] 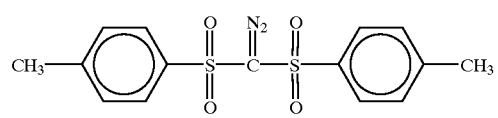
[2-73] 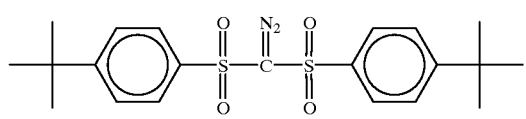
[2-74] 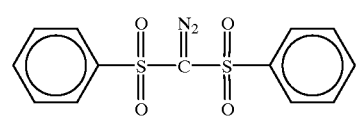
[2-75] 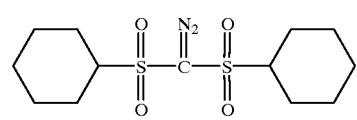
[2-76] 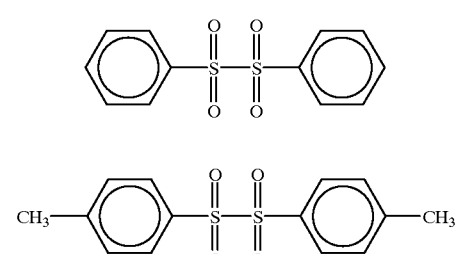
[2-77] 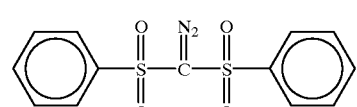
[2-78] 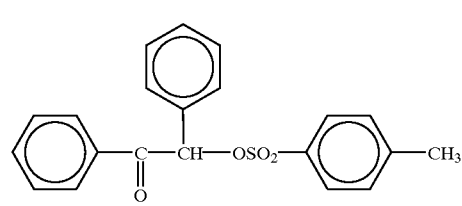
[2-79] 
[2-80] 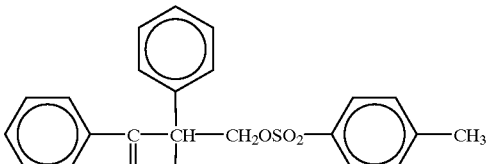
[2-81] 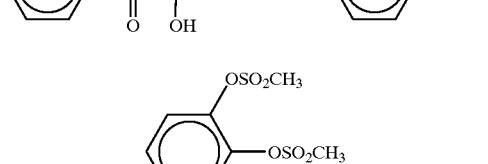
[2-82] 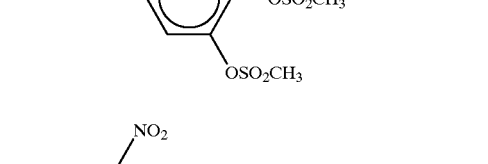
[2-83] 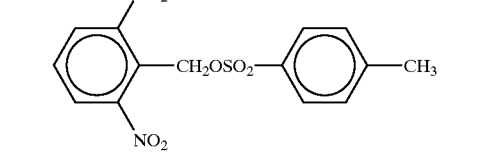
[2-84] 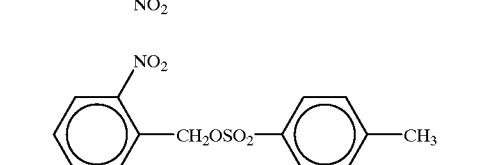
[2-85] 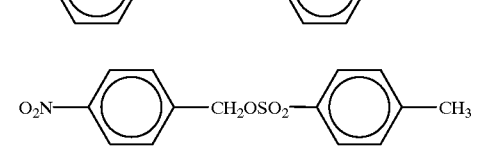
[2-86] 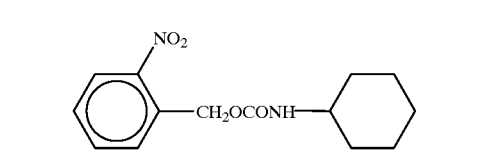
[2-87] 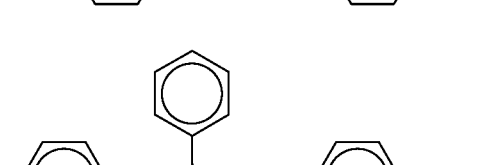
[2-88] 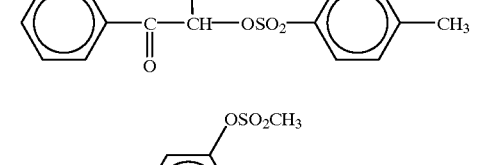

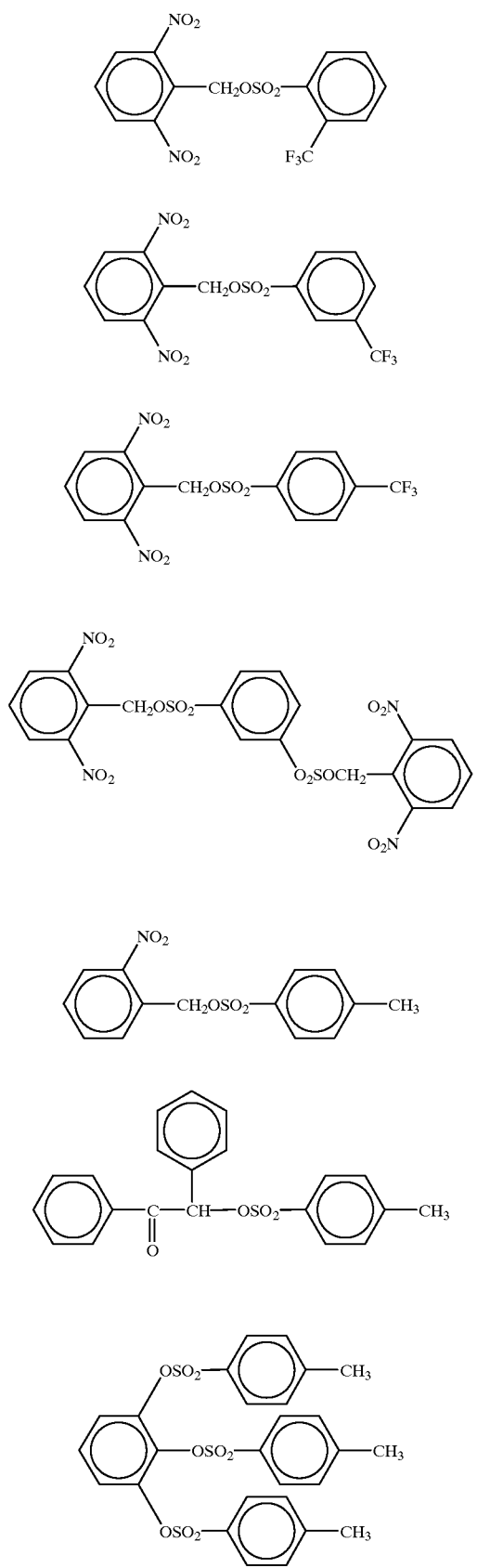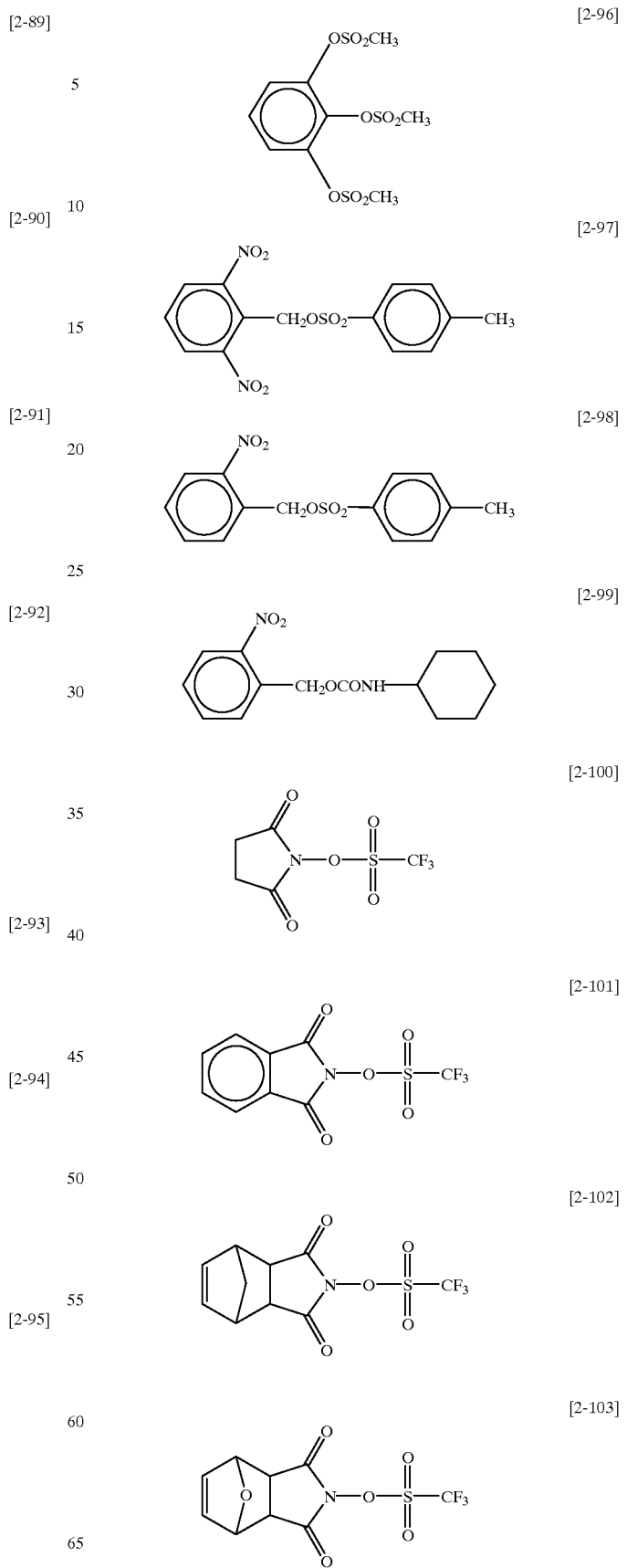

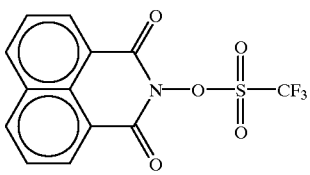
[2-104]

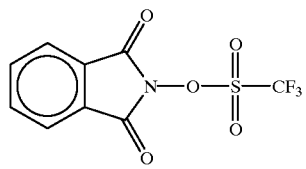
[2-105]

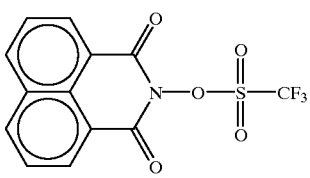
[2-106]

When the crosslinking agent is added to the organosilicon compound, preferred organosilicon compounds have a main chain in which hydrogen atom is connected to silicon atom belonging to the main chain. These organosilicon compounds include compound having chemical structures represented in formulas [1-1] to [1-26].

The purpose of adding the aforementioned crosslinking agent is to cause the organosilicon compound to crosslink so as to prevent the mixing between a resist and the organosilicon compound and at the same time to improve the heat resistance.

As such a crosslinking agent, an organic substance having a multiple bond may be employed. By the "organic substance having a multiple bond", it is meant a compound having a double bond or triple bond, more specifically a compound having vinyl, acryl, aryl, imide or acetylenyl group. This organic substance having a multiple bond may be a monomer, oligomer or polymer. This organic substance having a multiple bond functions by the effect of heat or light to bring about an addition reaction between the organic substance and the Si—H bond of the organosilicon compound, thereby crosslinking the organosilicon compound. The organic substance having a multiple bond may be of self-polymerization. Followings are specific examples of the organic substance having a multiple bond.

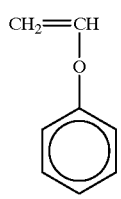
[3-1]

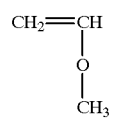
[3-1]

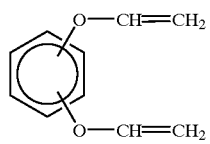
[3-3]

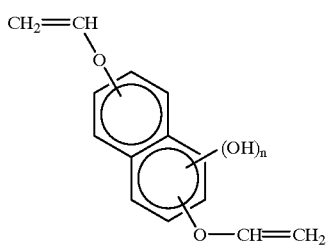
[3-4]

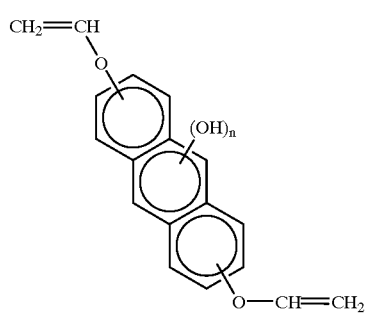
[3-5]

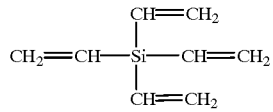
[3-6]

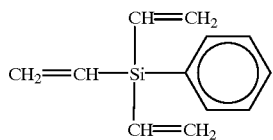
[3-7]

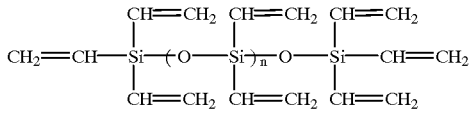
[3-8]

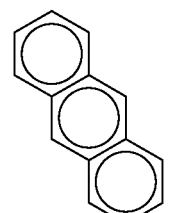

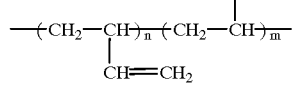
[3-9]

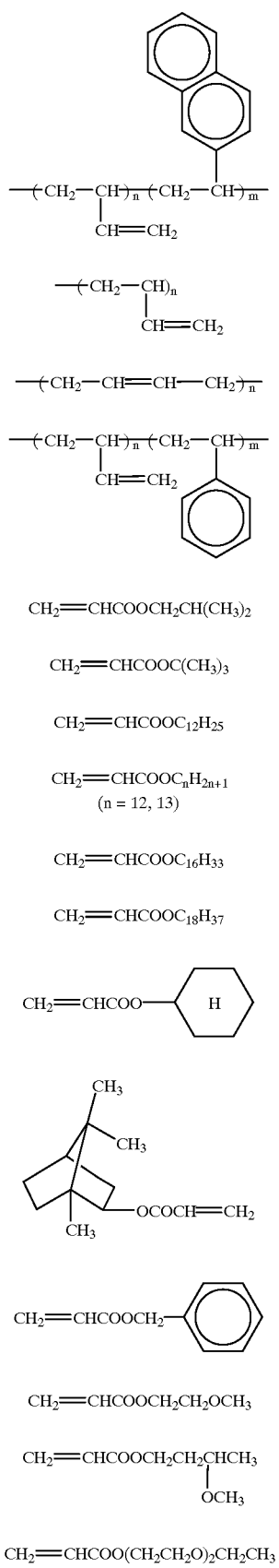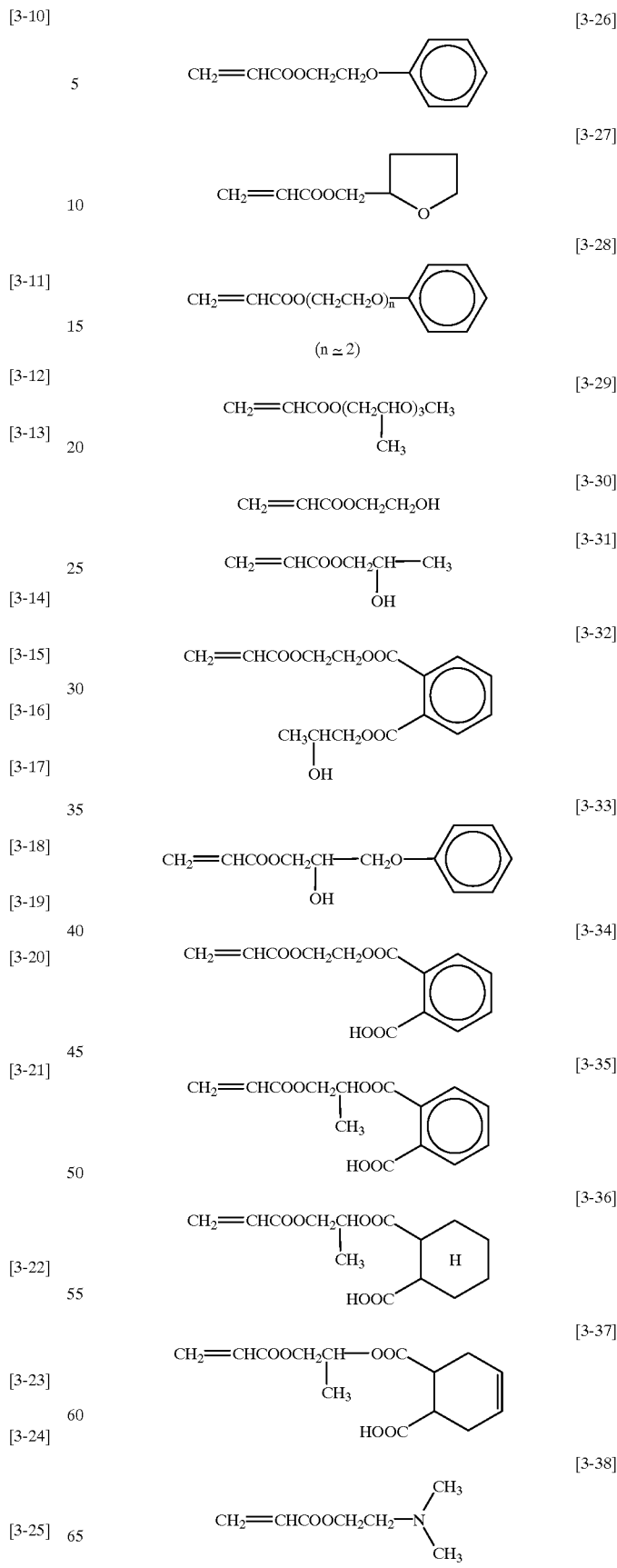

[3-39] 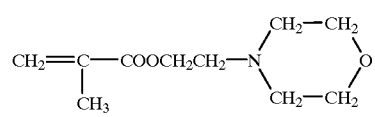
[3-40] 
[3-41] 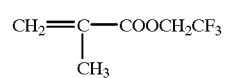
[3-42] 
[3-43] 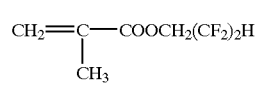
[3-44] 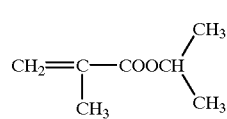
[3-45] 
[3-46] 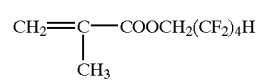
[3-47] 
[3-48] 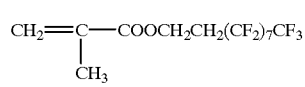
[3-49] 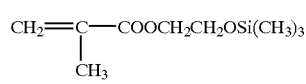
[3-50] 
[3-51] 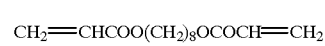
[3-52] 
[3-53] 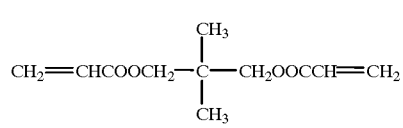
[3-54] 
[3-55] 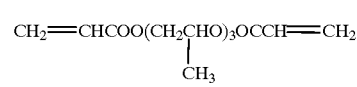
[3-56] 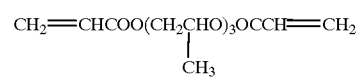
[3-57] 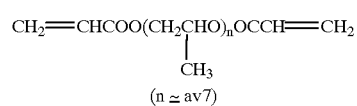
[3-58] 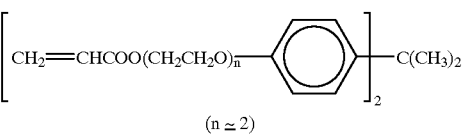
[3-59] 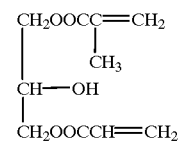
[3-60] 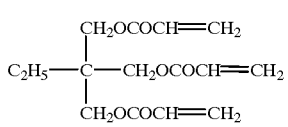
[3-61] 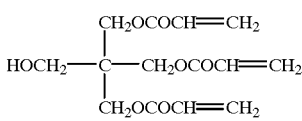
[3-62] 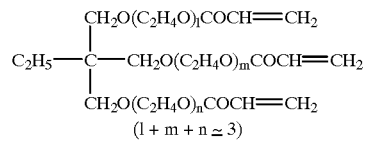
[3-63] 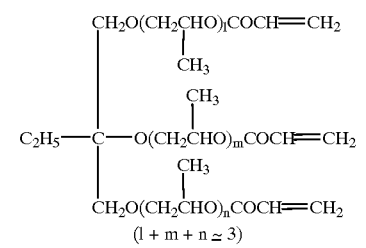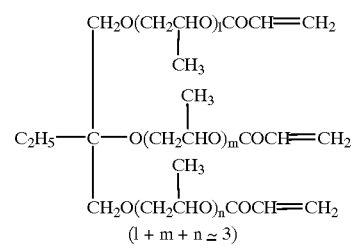
[3-64] 
[3-65] 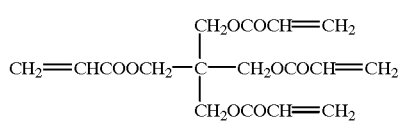

[Chemical structure diagrams labeled 3-66 through 3-80]

silicon compound or to promote the self-polymerization of the organosilicon compound.

The radical-generating agent may be selected from an azo compound (for example, azobisisobutyronitrile), a peroxide, alkylaryl ketone, silyl peroxide and an organic halogen compound. The radical-generating agent is designed to generate radicals through the decomposition of O—O bond or C—C bond in the molecule thereof by the effect of light irradiation or heat. Specific examples of such a radical-generating agent are the following compounds represented by the chemical formulas (4-1) to (4-24):

| | |
|---|---|
| benzoyl peroxide | [4-1] |
| di-tertiarybutyl peroxide | [4-2] |
| benzoin | [4-3] |
| benzoin alkylether | [4-4] |
| benzoin alkylarylether | [4-5] |
| benzoyl arylether | [4-6] |
| benzyl alkylarylthioether | [4-7] |
| benzyl aralkylethanol | [4-8] |
| phenyl glyoxalalkylacetal | [4-9] |
| benzoyl oxime | [4-10] |
| tripheryl-t-butylsilyl peroxide | [4-11] |

When an organic substance having a multiple bond is added to an organosilicon compound as mentioned above, a radical-generating agent or an acid-generating agent may also be added to the organosilicon compound. Any of these radical-generating agent and acid-generating agent function to assist the addition reaction between the organic substance having a multiple bond and the Si—H bond of the organo-

[4-17]

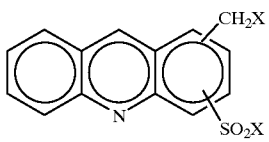

[4-18]

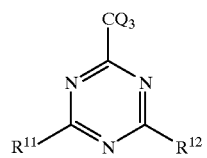

[4-19]

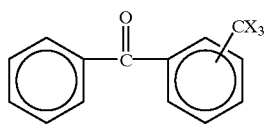

[4-20]

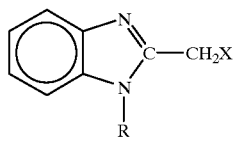

[4-21]

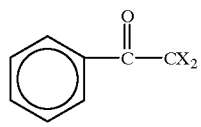

[4-22]

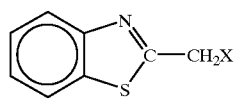

[4-23]

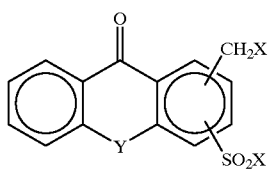

[4-24]

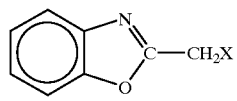

( Y = O, CH$_2$, CHX, S, C = O; X = Cl, Br, I)

As for the organic halide useful as a radical-generating agent, trihalomethyl-s-triazine represented by the general formula (4-18) (for example, U.S. Pat. No. 3,779,778) is preferable. In the general formula (4-18), Q is bromine or chlorine; $R^{11}$ is —CQ$_3$, —NH$_2$, —NHR$^{13}$, —N(R$^{13}$)$_2$, —OR$^{13}$ or a substituted or unsubstituted phenyl group; and $R^{12}$ is —CQ$_3$, —NH$_2$, —NHR$^{13}$, —N(R$^{13}$)$_2$, —OR$^{13}$, —(CH=CH)$_n$—W, or a substituted or unsubstituted phenyl group (herein R$^{13}$ is phenyl, naphthyl or lower alkyl group having not more than 6 carbon atoms; n is an integer of 1 to 3; and W is an aromatic ring, a heterocyclic ring or a group represented by the following general formula). Under some circumstances, these compounds are capable of effecting the crosslinking of polysilane under the influence of light or heat without accompanying the presence of the compound having a multiple bond.

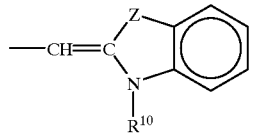

wherein Z is oxygen or sulfur; $R^{10}$ is a lower alkyl or phenyl group.

Among trihalomethyl-s-triazine represented by the general formula (4-18), a compound having a group of —(CH=CH)$_n$—W as $R^{12}$, i.e. vinyltrihalomethyl-s-triazine (for example, U.S. Pat. No. 3,987,037) is preferable. Vinyltrihalomethyl-s-triazine is featured in that it contains trihalomethyl group and ethylenic unsaturated bond to be conjugated with a triazine ring, and can be decomposed by the irradiation of light. By the way, the aromatic ring or heterocyclic ring represented by the aforementioned W may contain a substituent group such as chlorine, bromine, phenyl group, a lower alkyl group having not more than 6 carbon atoms, nitro group, phenoxy group, alkoxyl group, acetoxy group, acetyl group, amino group and alkylamino group.

Specific examples of trihalomethyl-s-triazine represented by the general formula (4-18) are shown in the following general formulas (4-25) to (4-34), and other kinds of radical-generating agents are shown in the following general formulas (4-35) to (4-39). Under some circumstances, these halides are capable of effecting the crosslinking of polysilane under the influence of light or heat without accompanying the presence of the compound having a multiple bond.

[4-25]

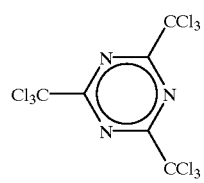

[4-26]

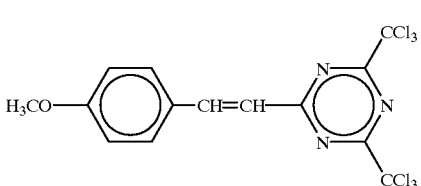

[4-27]

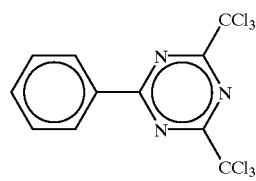

[4-28]

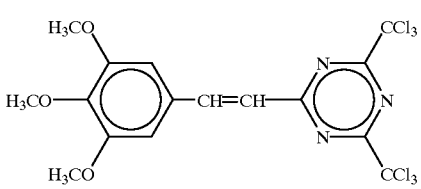

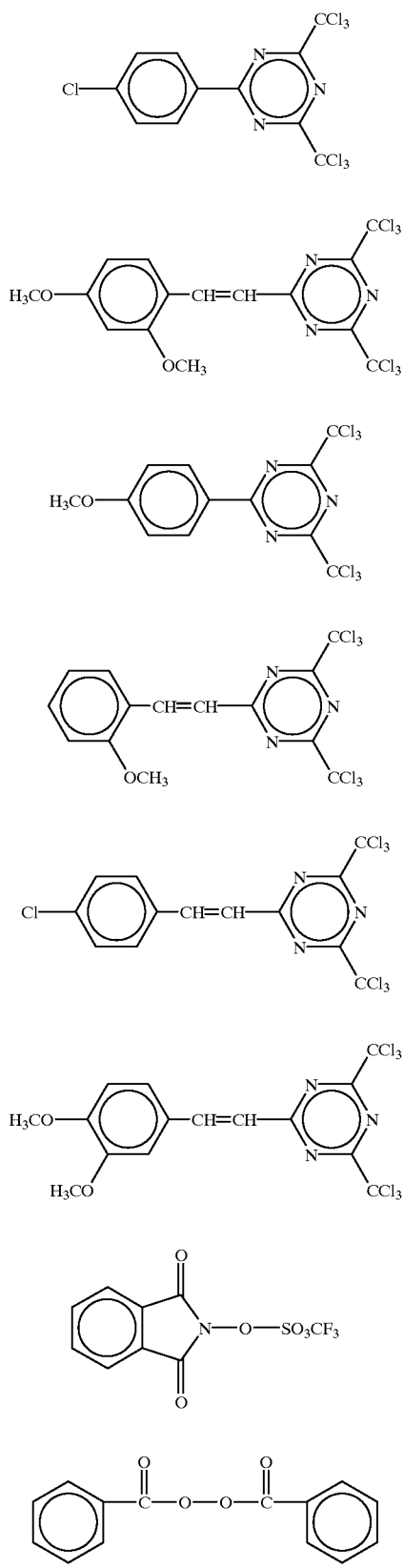

Examples of the acid-generating agent useful in this case are onium salt, a halogen-containing compound, an orthoquinodiazide compound, a sulfone compound, sulfonic acid compound and nitrobenzyl compound. Among them, onium salt and an orthoquinodiazide compound are preferable. Specific examples of onium salt are iodonium salt, sulfonium salt, phosphonium salt, diazonium salt and ammonium salt. Preferable examples of onium salt are the compounds represented by the following general formulas (4-40) to (4-42).

Specific examples of the halogen-containing compound are a haloalkyl-containing hydrocarbon compound and a haloalkyl-containing heterocyclic compound. Preferable examples of the halogen-containing compound are the compounds represented by the following general formulas (4-43) and (4-44).

Specific examples of the orthoquinodiazide compound are a diazobenzoquinone compound and a diazonaphthoquinone compound. Preferable examples of the orthoquinodiazide compound are the compounds represented by the following general formulas (4-45) and (4-48).

Specific examples of the sulfone compound are β-ketosulfone and β-sulfonylsulfone. Preferable examples of the sulfone compound are the compounds represented by the following general formula (4-49).

Specific examples of the nitrobenzyl compound are a nitrobenzyl sulfonate compound and a dinitrobenzyl sulfonate compound. Preferable examples of the nitrobenzyl compound are the compounds represented by the following general formula (4-50).

Specific examples of the sulfonic acid compound are alkylsulfonate, haloalkylsulfonate, arylsulfonate and iminosulfonate. Preferable examples of the sulfonic acid compound are the compounds represented by the following general formulas (4-51) and (4-53).

[4-40]

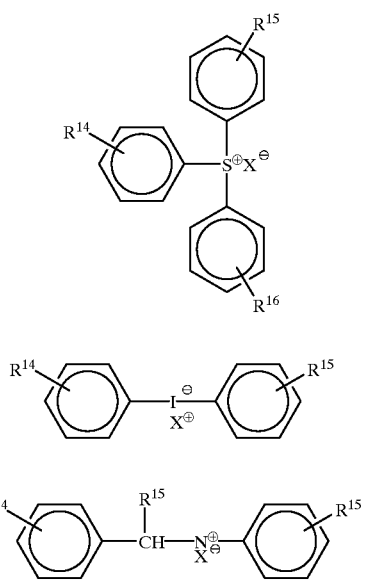

[4-41]

[4-42]

wherein $R^{14}$ to $R^{16}$ may be the same or different and are individually a hydrogen atom, amino group, nitro group, cyano group, or a substituted or unsubstituted alkyl or alkoxy group; X is $SbF_6$, AsF6, $PF_6$, $BF_4$, $CF_3CO_2$, $ClO_4$, $CF_3SO_3$,

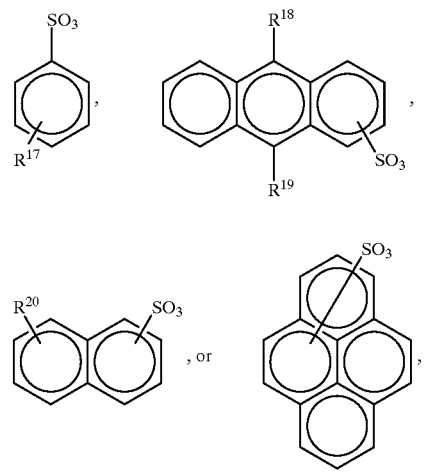

$R^{17}$ is hydrogen atom, amino group, anilino group, or a substituted or unsubstituted alkyl or alkoxyl group; $R^{18}$ to $R^{19}$ may be the same or different and are individually a substituted or unsubstituted alkoxyl group; and $R^{20}$ is hydrogen atom, amino group, anilino group, or a substituted or unsubstitutued alkyl or alkoxyl group.

[4-43]

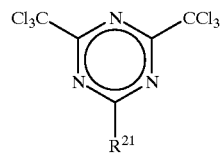

wherein $R^{21}$ is trichloromethyl group, phenyl group, methoxyphenyl group, naphthnyl group or methoxynaphthyl group.

[4-44]

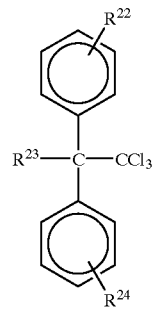

wherein $R^{22}$ to $R^{24}$ may be the same or different and are individually hydrogen atom, halogen atom, methyl, methoxy or hydroxyl group.

[4-45]

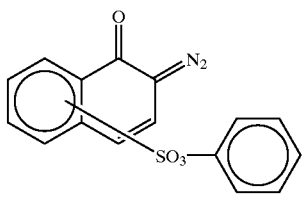

[4-46]

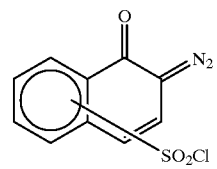

[4-47]

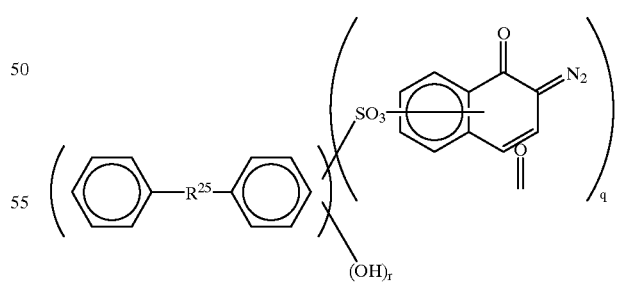

wherein $R^{25}$ is $-CH_2-$, $-C(CH_3)_2-$, $-C-$ or $-SO_2-$; q an integer of 1 to 6; and r is an integer of 0 to 5 with proviso that the total of q+r is 1 to 6.

[4-48]

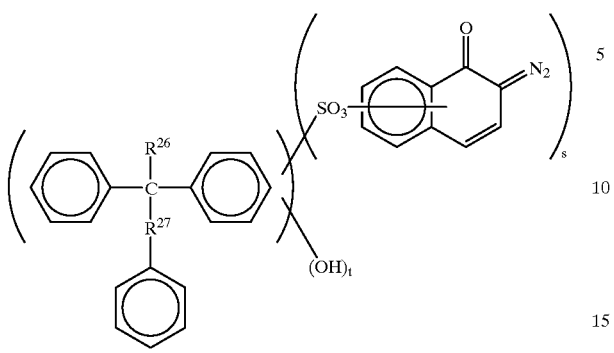

wherein $R^{26}$ is hydrogen atom or methyl; $R^{27}$ is —CH$_2$—, —C(CH$_3$)$_2$—,

or —SO$_2$—; s is an integer of 1 to 6; and t is an integer of 0 to 5 with proviso that the total of s+t is 1 to 6.

[4-49]

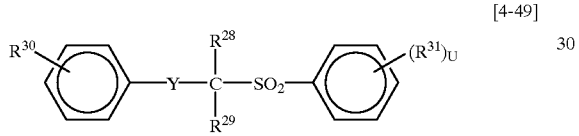

wherein $R^{28}$ to $R^{31}$ may be the same or different and are individually a substituted or unsubstituted alkyl group, or halogen atom; Y is

or —SO$_2$—; and u is an integer of 0 to 3.

[4-50]

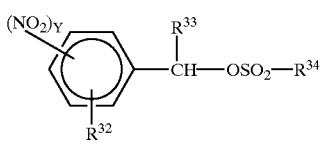

wherein $R^{32}$ is a substituted or unsubstituted alkyl group; $R^{33}$ is hydrogen atom or methyl; $R^{34}$ is

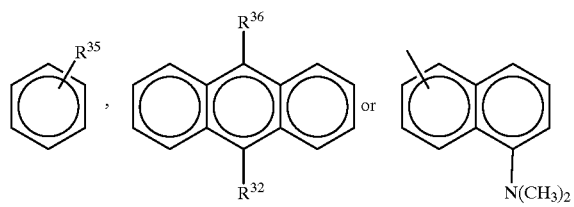

(herein $R^{35}$ is hydrogen atom or methyl; and $R^{36}$ and $R^{37}$ may be the same or different and are individually a substi- tuted or unsubstituted alkoxyl group); and v is an integer of 1 to 3.

[4-51]

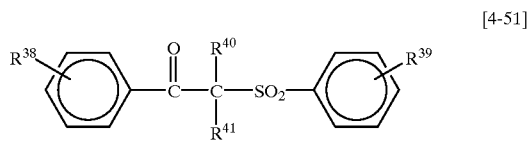

wherein $R^{38}$ and $R^{39}$ may be the same or different and are individually a substituted or unsubstituted alkyl group, $R^{40}$ and $R^{41}$ may be the same or different and are individually hydrogen atom or a substituted or unsubstituted alkyl or aryl group.

[4-52]

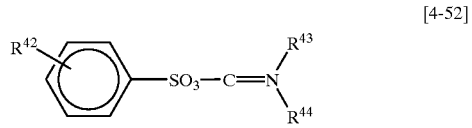

wherein $R^{42}$ is hydrogen atom or a substituted or unsubstituted alkyl group $R^{43}$ and $R^{44}$ may be the same or different and are individually a substituted or unsubstituted alkyl or aryl group; and $R^{43}$ and $R^{44}$ may be connected together to form a closed ring.

[4-53]

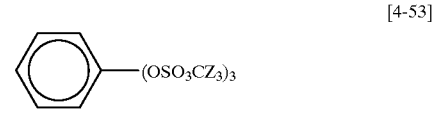

wherein Z is fluorine atom or chlorine atom.

As for the crosslinking agent for the organosilicon compound, which is useful in this invention, the following substances may be employed in addition to the aforementioned organic compound having a multiple bond. Namely, an organic compound having hydroxyl group; an organic compound having epoxy group; an organic compound having amino group; pyridine oxide; a silicon compound having alkoxysilyl group, silyl ester group, oximesilyl group, enoxysilyl group, aminosilyl group, amidesilyl group, aminoxysilly group or halogen; an organometallic compound; and a compound containing halogen may be employed.

Specific examples of the organic compound having hydroxyl group are polyhydric alcohol, novolak resin, a compound having carboxyl group, and silanol. These compounds are capable of reacting under the influence of light or heat with Si—H bond so as to crosslink the organosilicon compound. Specific examples of such an organic compound are those represented by the following general formulas (5-1) and (5-28).

Specific examples of the compound having epoxy group are so-called epoxy resin of epibis type or alicyclic epoxy resin. These may be partially attached with hydroxyl group. The aforementioned acid-generating agent may be employed together with any of these epoxy resins. Specific examples of such an compound are those represented by the following general formulas (6-1) and (6-12).

Specific examples of the compound having amino group are those represented by the following general formulas (7-1) and (7-13).

Specific examples of the pyridine oxide are those represented by the following general formulas (8-1) and (8-6).

Specific examples of the silicon compound having alkoxysilyl group, silyl ester group, oximesilyl group, enoxysilyl group, aminosilyl group, amidesilyl group, aminoxysilly group or halogen are those represented by the following general formulas (9-1) and (9-52). In these chemical formulas, X represents any one of the aforementioned substituent groups. It is possible to employ, together with these compounds, a metallic catalyst such as platinum or organotin compound, and a base which are generally employed as a condensation catalyst for silicone.

By the term organometallic compound, it is meant a metallic salt or a metallic complex for which an organic group is substituted. The metal useful in this case is selected from B, Mg, Al, Ca, Ti, V, Mn, Fe, Co, Ni, Cu, Zn, Zr, Mo, Rh, Pd, Cd, In and Sn. Specific examples of these compounds are those represented by the following general formulas (10-1) and (10-8).

Specific examples of the compound containing halogen are those represented by the following general formulas (11-1) and (11-9).

[5-1]
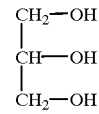

[5-2]
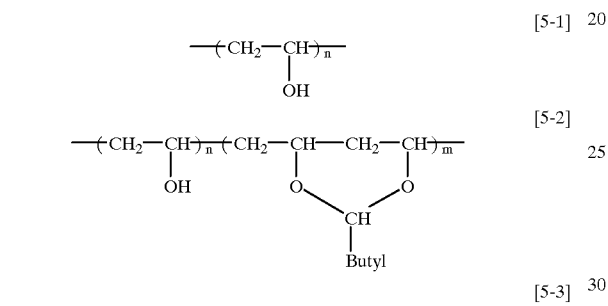

[5-3]
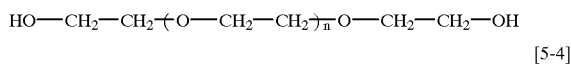

[5-4]
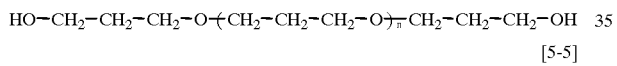

[5-5]
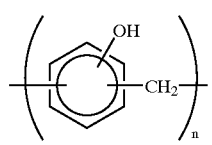

[5-6]
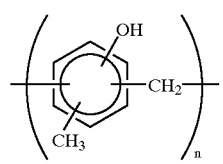

[5-7]
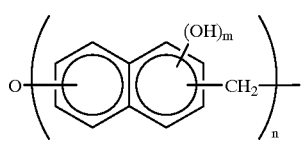

[5-8]
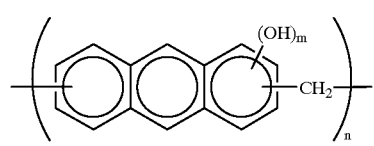

[5-9]
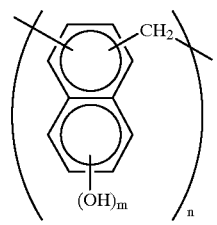

[5-10]
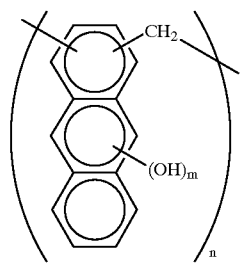

[5-11]
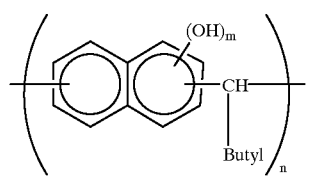

[5-12]
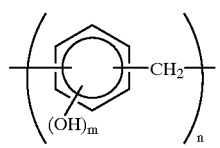

[5-13]
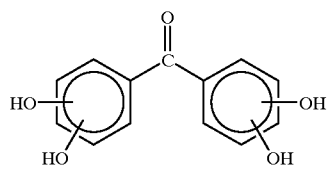

[5-14]
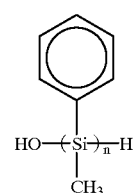

[5-15]
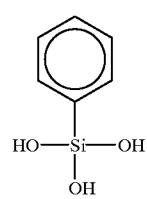

[5-16]

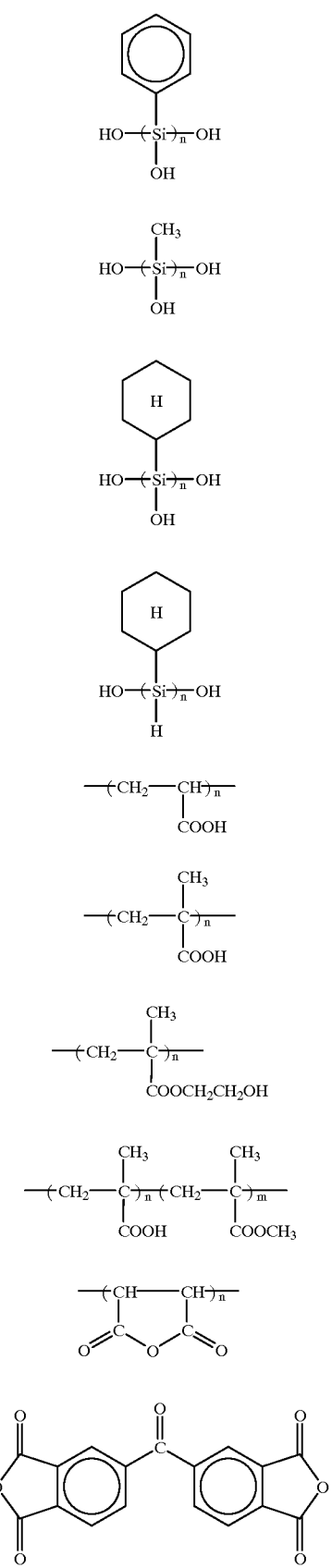
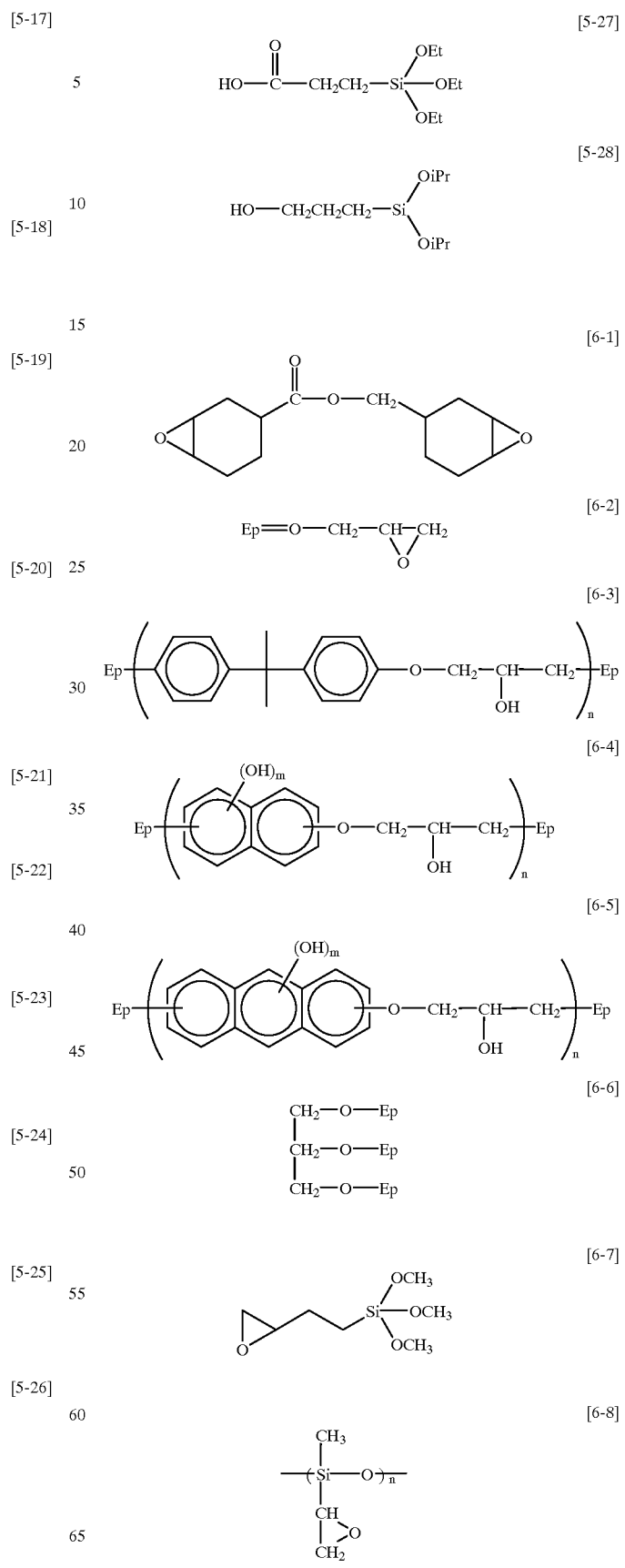

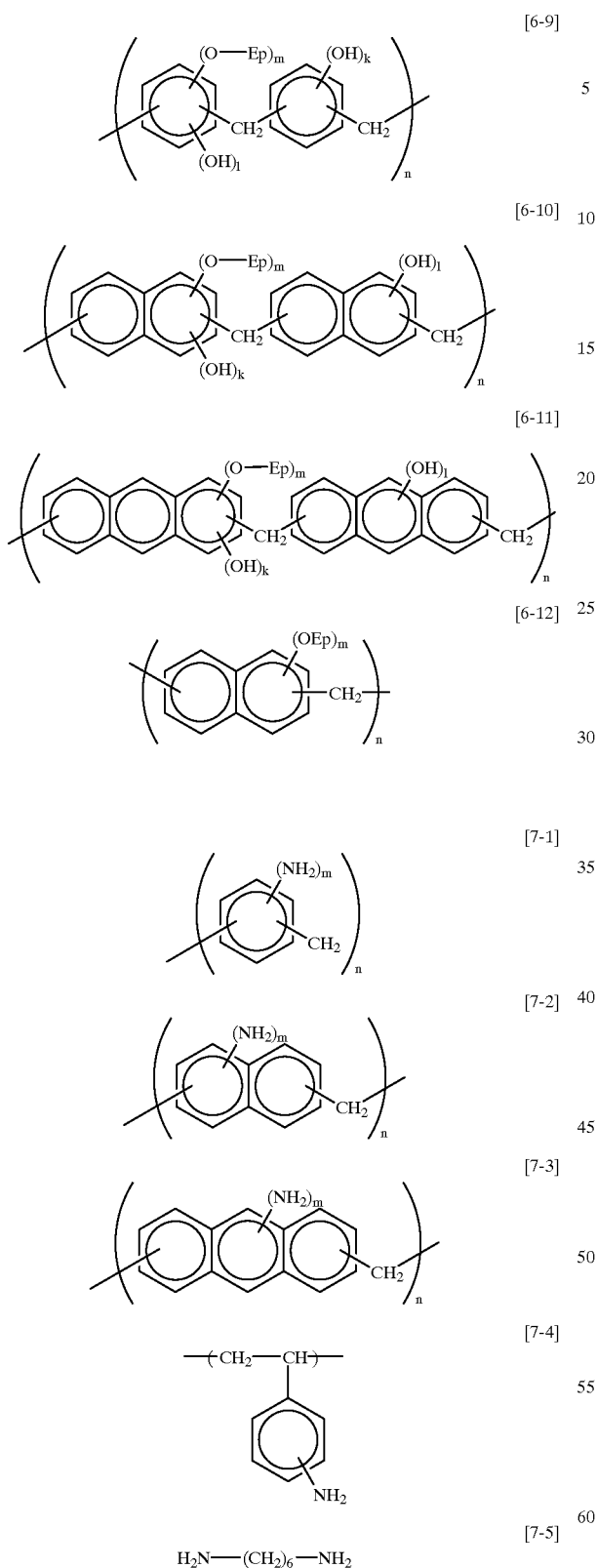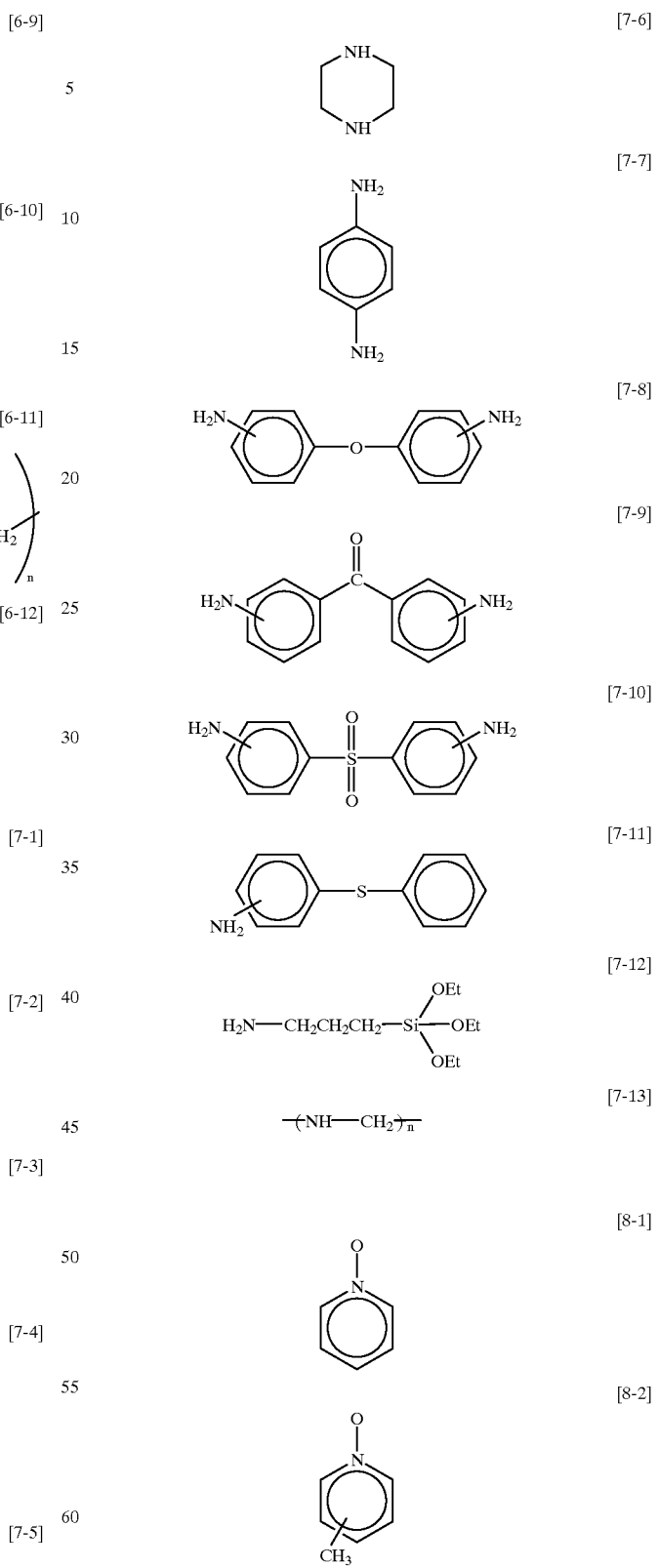

[8-3] 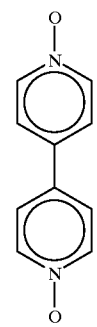
[8-4] 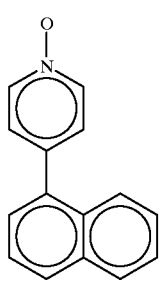
[8-5] 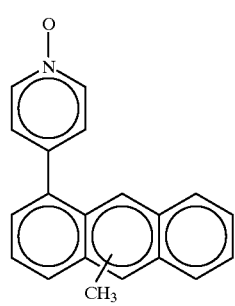
[8-6] 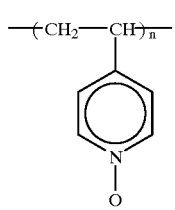
[9-1] 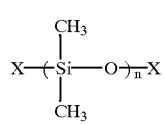
[9-2] 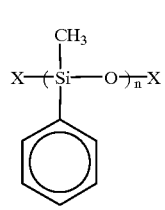
[9-3] 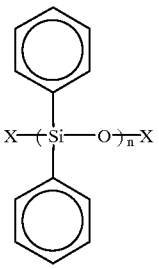
[9-4] 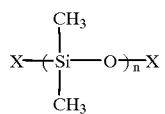
[9-5] 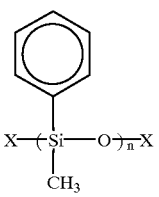
[9-6] 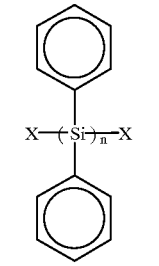
[9-7] 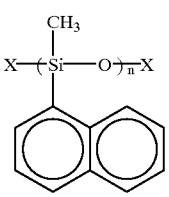
[9-8] 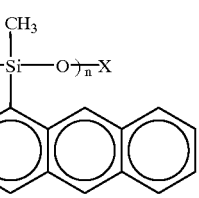
[9-9] 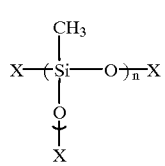

[9-10] 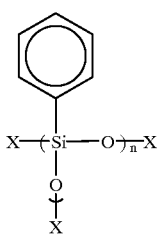
[9-11] 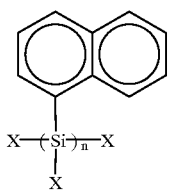
[9-12] 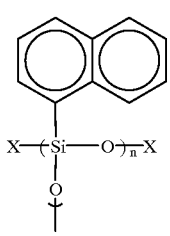
[9-13] 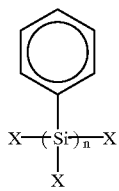
[9-14] 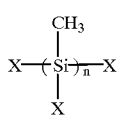
[9-15] 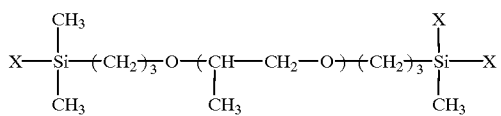
[9-16] 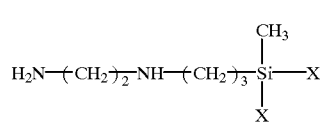
[9-17] 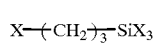
[9-18] 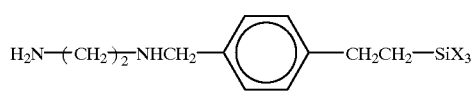
[9-19] 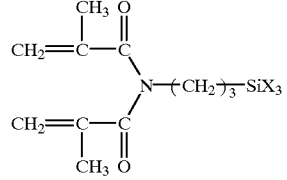
[9-20] 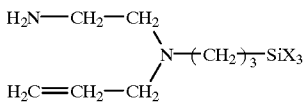
[9-21] 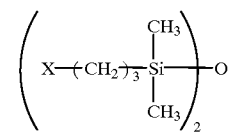
[9-22] 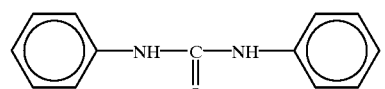
[9-23] 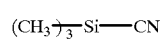
[9-24] 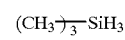
[9-25] 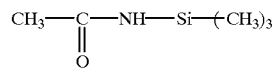
[9-26] 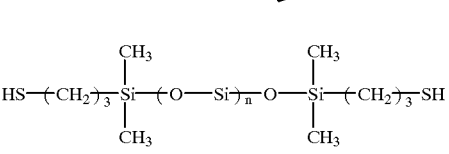
[9-27] 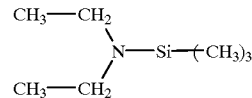
[9-28] 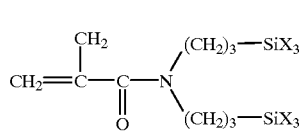
[9-29] 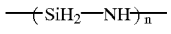
[9-30] 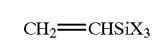
[9-31] 
[9-32] 
[9-33] 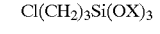
[9-34] 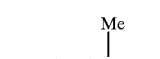

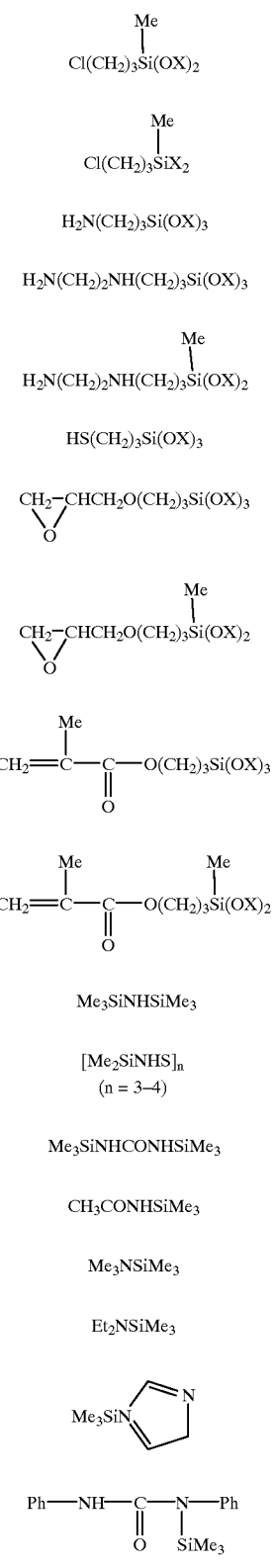
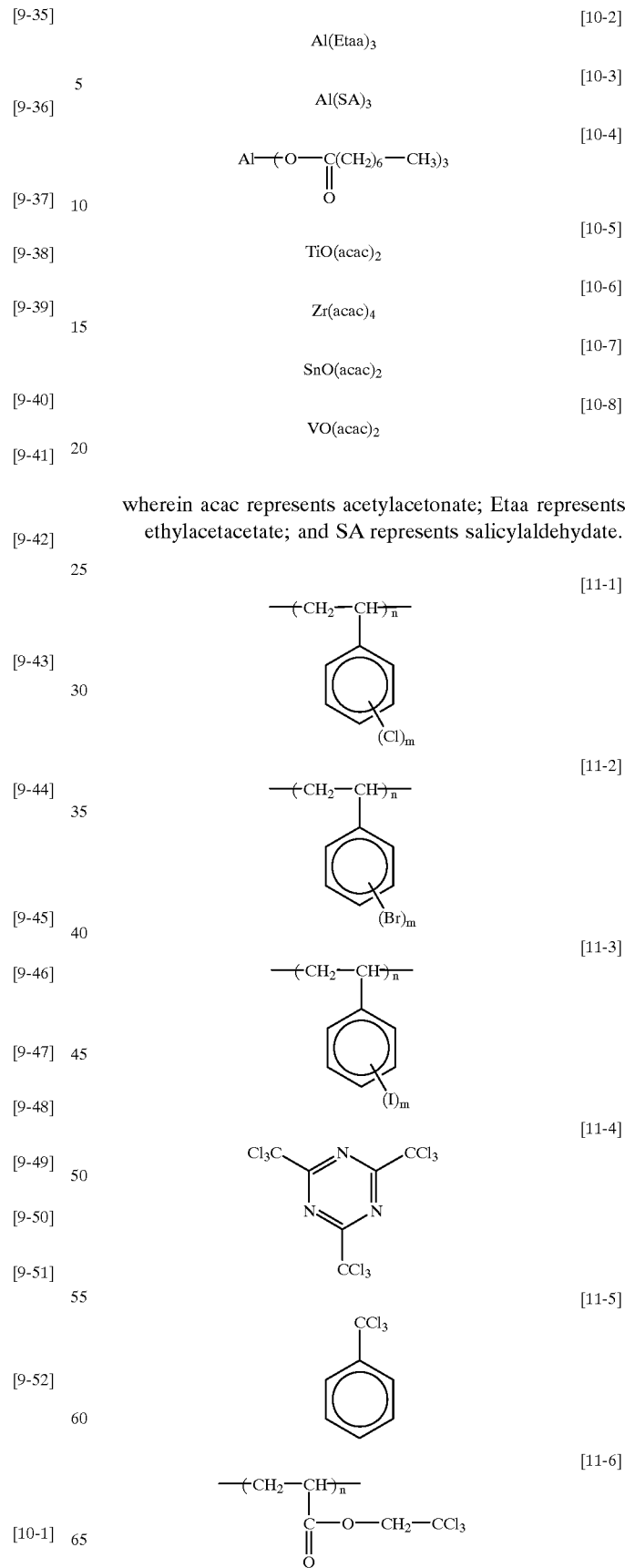
wherein acac represents acetylacetonate; Etaa represents ethylacetacetate; and SA represents salicylaldehydate.

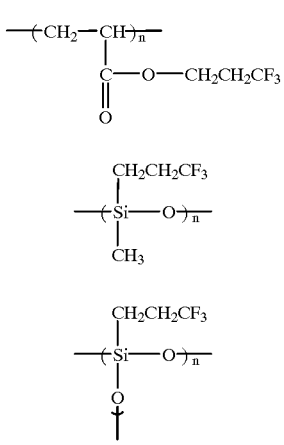

The organic solvent may be either a polar solvent or a non-polar solvent. However, since a solvent having a multiple bond is prone to react with an organosilicon compound, thereby causing a denaturing with time of the resultant solution, it is preferable to employ a solvent not containing a multiple bond.

After the preparation of a coating material as mentioned above, the coating material is coated on a work film by making use of a spin-coating method. Then, the coated layer is heated to allow the solvent to evaporate thereby to form an organosilicon film. If it is impossible at this moment to attain a glass transition temperature in the organosilicon film, which makes it possible to obtain a sufficient selectivity in relative to a resist, the organosilicon film thus formed is required to be further heated or irradiated with an energy beam so as to allow the organosilicon film to undergo the crosslinking thereof.

In the present invention, therefore, if the organosilicon film is crosslinked to improve the heat-resistance property and to attain a glass transition temperature of 0° C. or higher, it is unnecessary to use a compound originally having a glass transition temperature of 0° C. or higher.

The energy beam that can be employed in this case may be ultraviolet ray, X-ray, electron beam or ion beam. In this case, if the heating and the irradiation of energy beam are simultaneously applied to the organosilicon film, the crosslinking reaction can be accelerated, and hence the glass transition temperature of the organosilicon film can be prominently enhanced within a practical processing time. When the organosilicon film is heated or irradiated with an energy beam, the silicon-silicon bond in the backbone chain of the organosilicon compound is caused to open, thus rendering the organosilicon compound to be easily oxidized with oxygen thereby possibly lowering the difference in etching selectivity between the resist and the organosilicon film. If this problem of lowering the difference in etching selectivity is to be avoided, the heating and irradiation of energy beam should preferably be performed in an atmosphere whose oxygen concentration is lower than that in the air atmosphere.

Figure 1C:
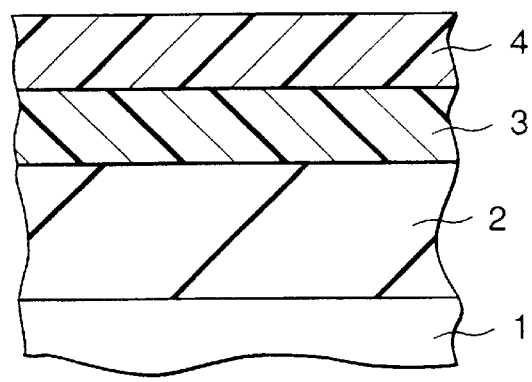

Then, a resist pattern is formed on the surface of the organosilicon film 3. Specifically, as shown in FIG. 1C, a resist solution is coated on the surface of the organosilicon film 3, and then the resultant coated layer is subjected to a heating treatment thereby to form a resist 4. If the film thickness of the resist 4 is made thinner in this case, the exposure tolerance, focus tolerance or resolution at the occasion of light exposure can be proportionately improved. Therefore, the film thickness of the resist 4 should preferably be made thinner as long as the organosilicon film 3 can be etched with excellent dimension controllability. Specifically, the film thickness of the resist 4 should preferably be in the range of 0.01 to 10 $\mu$m.

There is not any particular limitation on the kind of resist, i.e. either a positive resist or a negative resist can be suitably selected depending on the end-use. Specific examples of the positive resist are a resist comprising naphthoquinone diazide and novolak resin (IX-770, Japan Synthetic Rubber Co.); and a chemical amplification type resist comprising polyvinylphenol resin protected by t-BOC and an onium salt (APEX-E, Shiplay Co.). Examples of the negative resist are, among others, a chemical amplification type resist comprising polyvinylphenol, melamine resin and a photo-acid generator (SNR200, Shiplay Co.), and a resist comprising polyvinylphenol and a bisazide compound (RD-2000N, Hitachi Kasei Co.).

Any of these resist solutions is coated on the organosilicon film 3 by means of a spin coating method for instance, and then the solvent in the resist solution is allowed to evaporate by heating to form the resist 4. Then, the resist film is irradiated by energy beam such as visible light and ultraviolet light through a mask with a desired pattern from an exposure light source. The exposure light source includes a mercury lamp, and excimer laser such as XeF (wavelength: 351 nm), XeCl (wavelength: 308 nm), KrF (wavelength: 248 nm), KrCl (wavelength: 222 nm), ArF (wavelength: 193 nm) and Fe (wavelength: 151 nm). X-rays, electron beam or ion beam can be used as an exposure light source. Then, as shown in FIG. iD, the resist 4 is subjected to a developing treatment using an alkali developing solution such as TMAH or choline thereby to form a resist pattern 5. If required in this case, a top antireflective layer may be formed on the resist 4 for the purpose of inhibiting a multiple reflection in the resist 4 that might be generated at the occasion of performing a light exposure, or alternatively, an upper antistatic film may be formed on the resist 4 for the purpose of inhibiting a charge-up that might be generated at the occasion of performing an electron beam exposure.

Figure 1D:
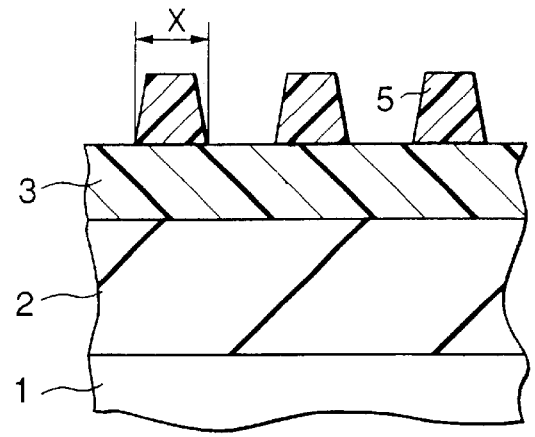
Figure 1E:
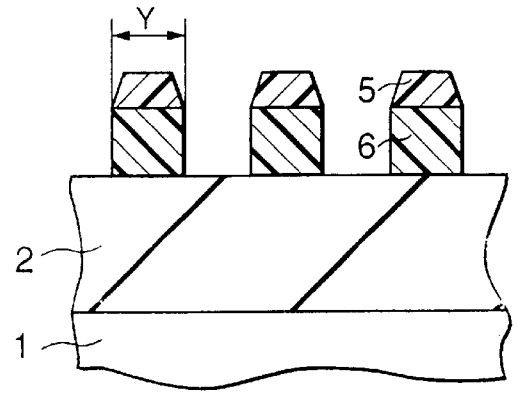

Then, as shown in FIG. 1E, the organosilicon film 3 is dry-etched by making use of the resist pattern 5 as an etching mask, thereby transcribing the resist pattern 5 to the organosilicon film 3. As for the etching method useful in this case, a reactive ion etching, a magnetron type reactive ion etching, an electron beam ion etching, an ICP etching or ECR ion etching may be employed. There is not any particular limitation on this etching method as long as it is possible to perform a fine etching process.

It is preferable for the purpose of assuring a sufficient etching selectivity in relative to the resist to control the power density to be applied to an electrode mounted on the wafer to not more than 10 W/cm$^2$. Because, though the etching of the organosilicon film in this case proceeds like a chemical etching, if the power density exceeds 10 W/cm$^2$, a strong sputtering effect is exhibited, and the etching rate of the resist may be increased, thus deteriorating the aforementioned etching selectivity. Moreover, when an apparatus which is capable of performing the generation of plasma in independent of the generation of bias is employed, the bias should be lowered in view of the aforementioned reason and at the same time the power to be employed for the generation of plasma should be suppressed so as to prevent the number of ions from becoming excessive. Because of these reasons, the power to be employed for the generation of plasma should preferably be controlled, in relative to the area of wafer to be treated, to not more than 10 W/cm$^2$.

If the temperature of wafer is maintained to 20° C. or more at the occasion of etching the organosilicon film, it is possible to perform the etching process without substantially inviting a dimensional change. As for the etching gas, one or more kinds of gas containing chlorine, bromine or iodine will be preferably employed. For example, gases such as HCl, $CF_3Cl$, $CF_2C_2$, $CF_3Br$, $CCl_4$, $C_2F_5Cl_2$, $Cl_2$, $SiCl_4$, $Br_2$, $I_2$, HBr, HI or $BCl_3$ may be employed. These gases may be employed singly or in combination of two or more kinds. It is also possible to add gases other than halogen gases, such as CO, $H_2$, $O_2$, He, $N_2$, Ar, $SO_2$, etc.

By performing the etching of the organosilicon film as explained above, it is possible to attain an etching process with high dimension control and high etching selectivity in relative to the resist while avoiding a denaturing of the organosilicon film.

Figure 1F:
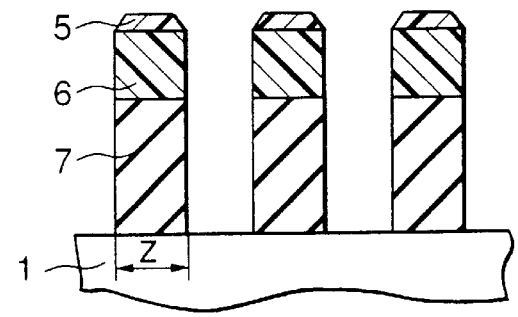

Then, as shown in FIG. 1F, the processing on the work film 2 is performed by making use, as an etching mask, of the resist pattern 5 and the organosilicon film pattern 6. Since etching selectivity of the organosilicon film pattern 6 in relative to the resist pattern 5 (the etching rate of the organosilicon film/the etching rate of the resist) is high, the shapes of the resist pattern 5 and the organosilicon film pattern 6 can be sufficiently kept remained, and hence the missing of shoulder portion or undercut of the pattern due to an insufficiency of etching mask can be prevented, thus making it possible to process the work film 2 with excellent dimension controllability to a pattern 7.

When the work film is formed of a film for metallic wirings or of silicon-based material, it may be preferable to process the organosilicon film by making use of the gas to be employed in the etching of the organosilicon film and to perform the processing of the work film in a continuous process within the same apparatus. In this case, since the organosilicon film and the work film can be etched together, number of steps can be reduced.

Figure 2A:
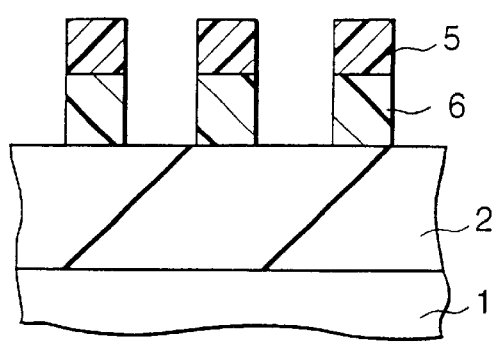
FIGS. 2A to 2C illustrate cross-sectional views sequentially showing the process of etching a work film by making use only of an organosilicon film pattern as a mask.
Figure 2B:
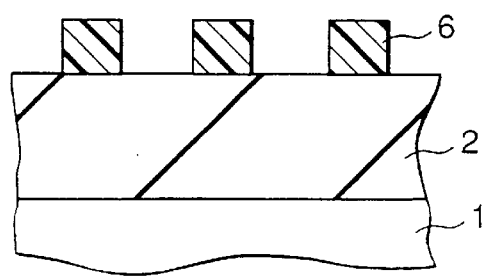
Figure 2C:
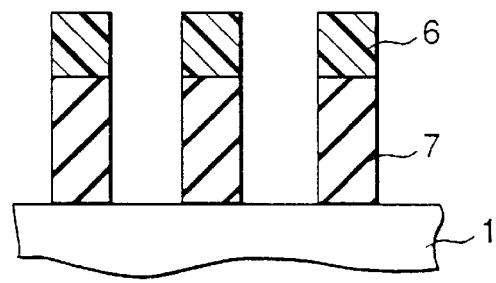

Alternatively, the pattern 7 may be formed as shown in FIGS. 2A to 2C. Namely, the resist pattern 5 is removed as shown in FIGS. 2A and 2B, and then the work film 2 is etched by making use only of the organosilicon film pattern 6 as an etching mask, thereby forming the pattern 7. If it is desired to process the work film 2 into an ultra-fine pattern having a high aspect ratio, the resist pattern 5 formed on the organosilicon film should preferably be removed in a separate or the same apparatus after finishing the processing of the organosilicon film, thereby lowering the aspect ratio at the occasion of the processing of the work film. In this case, the etching mask to be employed is only the organosilicon film pattern 6 that has been transcribed by the resist pattern 5, so that the aspect ratio in the processing can be minimized, thus making it possible to suppress the microloading effect.

As explained above, it is possible according to the method forming a pattern of this invention to perform an etching process with high etching selectivity in relative to the resist while avoiding a denaturing of the organosilicon film, and at the same time it is possible to perform the processing of a work film with high dimension control even if the film thickness of the resist is relatively thin. If the glass transition temperature of the organosilicon film is relatively low, or if the organosilicon film is etched with a fluorine-atom containing gas, the organosilicon film may be denatured into a sponge-like film. The cause for this phenomenon may be ascribed to the fact that the halogen radicals in the plasma can be easily penetrated into the interior of the organosilicon film thereby to form a silicon halide compound, which is then evaporated from the organosilicon film, thus leaving only the organic components that can be hardly evaporated in the organosilicon film without being etched.

By contrast, according to the method of this invention, the glass transition temperature of the organosilicon film is enhanced, or the organosilicon film is crosslinked, thus rendering the halogen radicals generated in the plasma to become difficult to penetrate into the interior of the organosilicon film whereby suppressing the denaturing of the organosilicon film.

Next, various preferable embodiments of this invention will be explained as follows.

(1) The compounds having the following structure represented by the general formula (12) in the backbone chain are employed as an organosilicon compound.

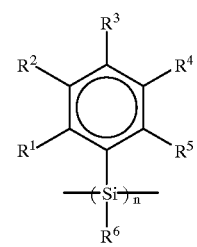

[12]

wherein $R^1$, $R^2$, $R^3$, $R^4$ and $R^5$ may be the same or different and are individually hydrogen atom, a substituted or unsubstituted hydrocarbon group having not more than three carbon atoms; $R^6$ is hydrogen atom or a substituted or unsubstituted aliphatic or aromatic hydrocarbon group having 1 to 20 carbon atoms; and n is a positive integer.

Specific examples of the organosilicon compounds having a structure shown in the above general formula are the compounds represented by the following general formulas (13-1) and (13-54).

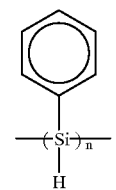

[13-1]

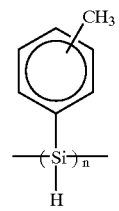

[13-2]

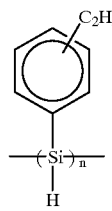

[13-3]

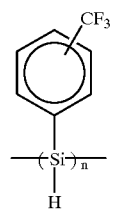 [13-4]
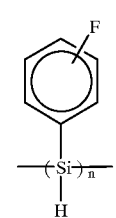 [13-5]
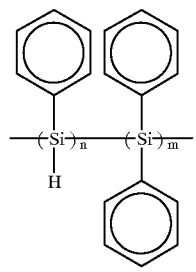 [13-6]
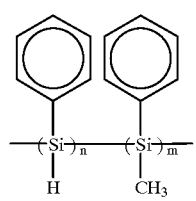 [13-7]
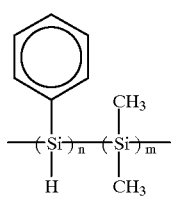 [13-8]
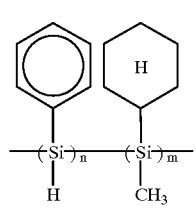 [13-9]
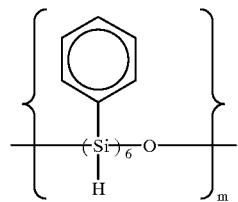 [13-10]
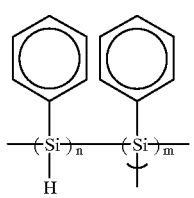 [13-11]
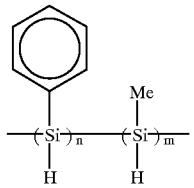 [13-12]
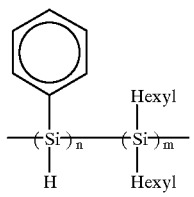 [13-13]
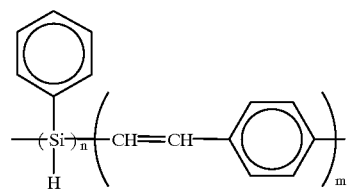 [13-14]
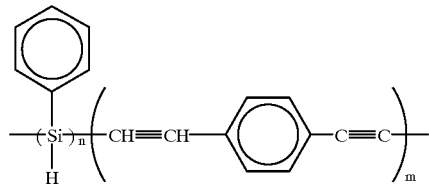 [13-15]

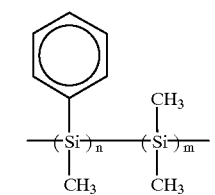
[13-16]
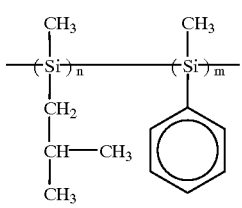
[13-17]
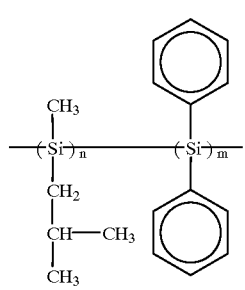
[13-18]
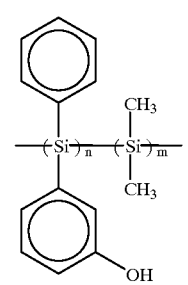
[13-19]
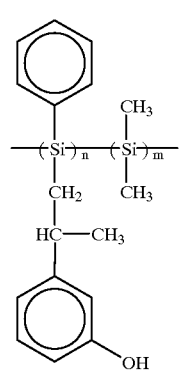
[13-20]
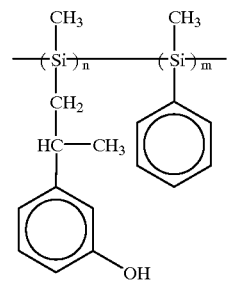
[13-21]
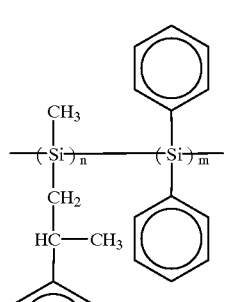
[13-22]
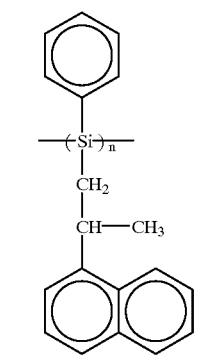
[13-23]
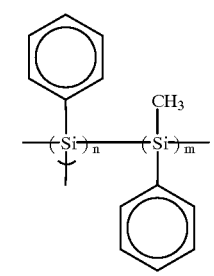
[13-24]
[13-25]

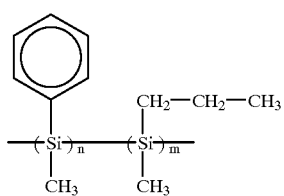
[13-26]
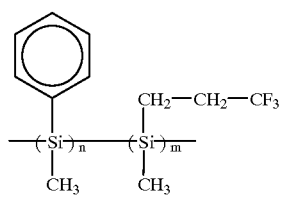
[13-27]
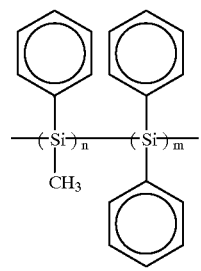
[13-28]
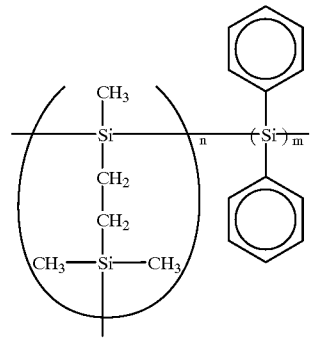
[13-29]
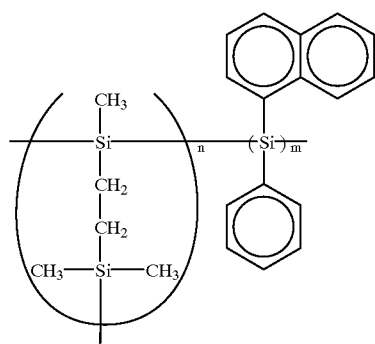
[13-30]
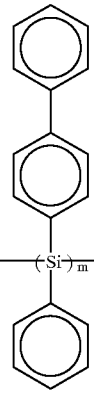
[13-31]
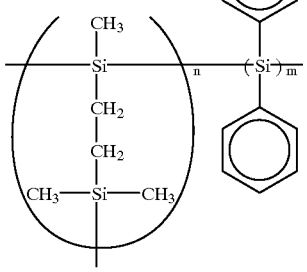
[13-32]
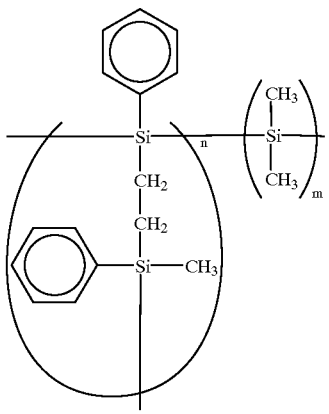
[13-33]
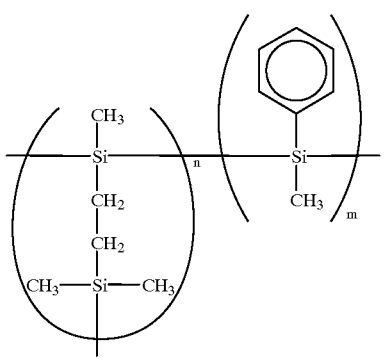
[13-34]
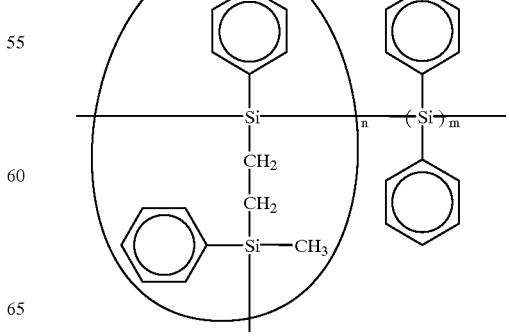

[13-35]
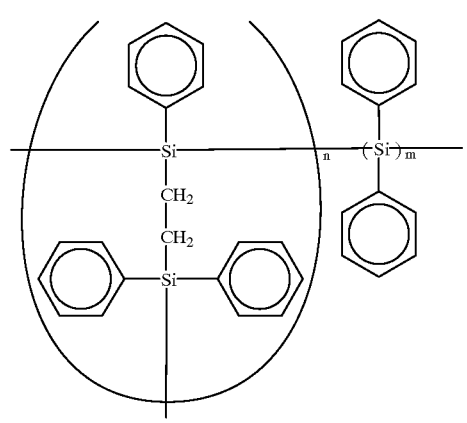
[13-36]
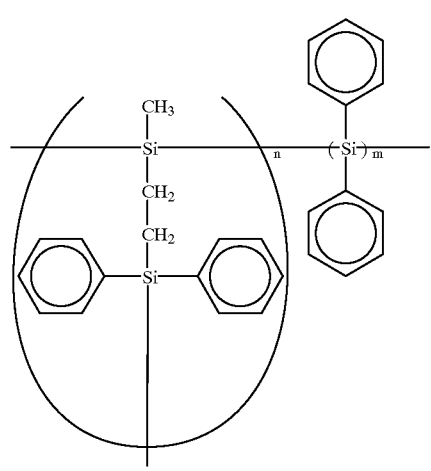
[13-37]
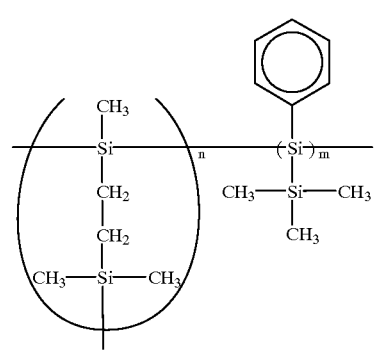
[13-38]
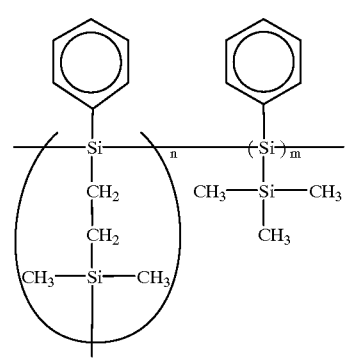
[13-39]
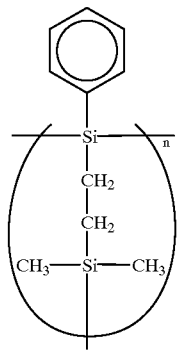
[13-40]
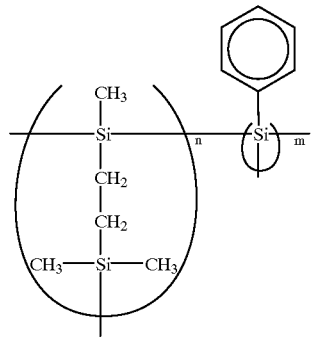
[13-41]
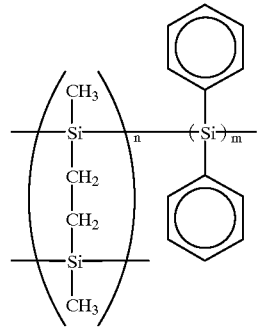
[13-42]
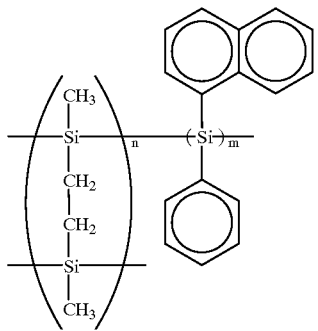

[13-43]
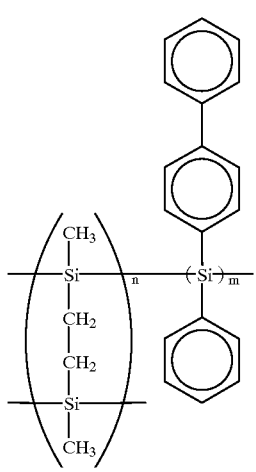
[13-44]
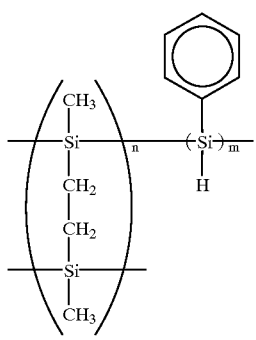
[13-45]
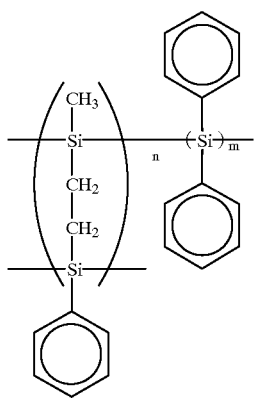
[13-46]
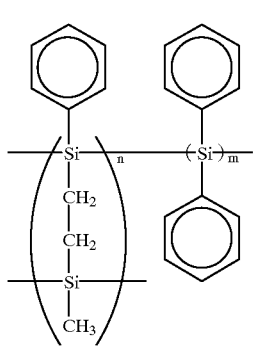
[13-47]
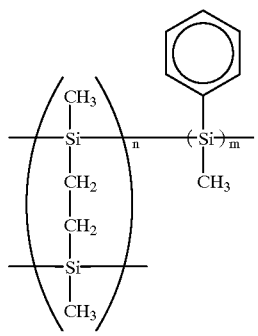
[13-48]
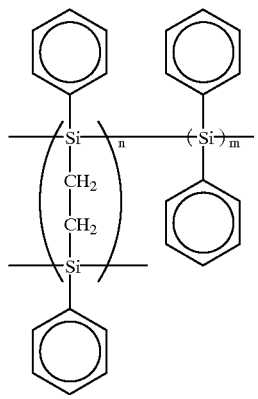
[13-49]
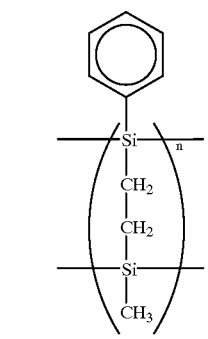
[13-50]
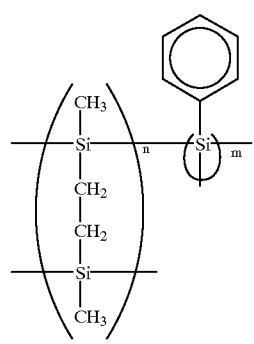

-continued

[13-51]
[13-52]
[13-53]
[13-54]

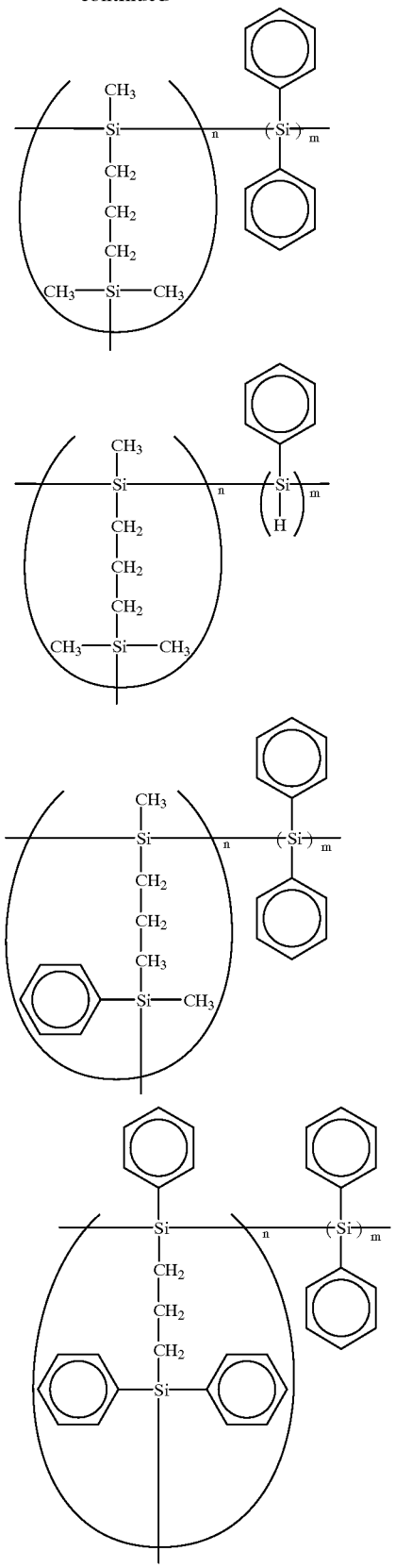

When the compounds having a structure shown in the above general formula 12 are employed as an organosilicon compound, the etching of the organosilicon film can be performed with high etching selectivity in relative to the resist without inviting the thickening of the resist pattern and the organosilicon film pattern. Therefore, it is possible to perform the processing of the work film to obtain a pattern of desired dimension even if the film thickness of the resist is thinned.

The reason for achieving these effects can be assumably attributed to the fact that when the compounds having a structure shown in the above general formula 12 is etched by making use of a gas containing chlorine, bromine or iodine, it is possible to inhibit the generation of products which are prone to re-adhere onto the side wall of the resist and the organosilicon film pattern so that the thickening of the resist pattern can be avoided.

(2) A silicon-based insulating film is employed as a work film in the method of this invention.

The silicon-based insulating film may be selected from a silicon oxide film, a silicon nitride film, a silicon oxynitride film and a spin-on-glass. It is also possible to use, as a material for the silicon-based insulating film, a blank material that is usually employed at the occasion of manufacturing a photo-mask.

The organosilicon film containing an organosilicon compound having a silicon-silicon bond in a backbone chain exhibits a low etching rate, i.e. etching-resistance in a plasma which is suited for etching the silicon-based insulating film. As a result, the thinning of an etching mask material consisting of a resist pattern and an organosilicon film, or of an etching mask material consisting only of an organosilicon film pattern can be prevented at the occasion of etching the silicon-based insulating film. Therefore, it is possible to perform the processing of the silicon-based insulating film with excellent dimension controllability.

As explained above, the method of forming a pattern according to this invention exhibits excellent effects in particular when it is employed for processing a work film consisting essentially of a silicon-based insulating material.

(3) After an organosilicon film pattern is formed, an oxidation treatment of the organosilicon film pattern is performed in the method of this invention.

The preferred work film is made of silicon-based material such as amorphous silicon and polysilicon, wiring material such as aluminum, aluminum silicide, copper and tungsten, and silicon nitride.

Preferably this oxidation treatment may be performed according the following three kinds of methods, i.e. a method of irradiating an energy beam such as electron beam, ion beam, ultraviolet rays and X-rays; a method of irradiating an oxygen radicals by means of oxygen plasma; and a method of dipping the work piece in a solution containing an oxidizing agent, such as an $H_2O_2$ solution, a $Fe_2(CN)_6$ solution, a $KMnO_4$ solution, a mixed solution comprising $H_2O_2$ and $H_2SO_4$, a mixed solution comprising $Cr_2O$ and $H_2SO_4$, a mixed solution comprising $HClO_4$ and $H_2SO_4$, a mixed solution comprising $KMnO_4$ and $H_3PO_4$, a mixed solution comprising $K_2S_2O_8$ and $H_2SO_4$, a mixed solution comprising $(NH_4)_2S_2O_8$, $H_2O_2$ and $H_2SO_4$, a mixed solution comprising $HNO_3$ and $H_2SO_4$, and a mixed solution comprising $(NH_4)_2S_2O_8$ and $H_2SO_4$.

Figure 3A:
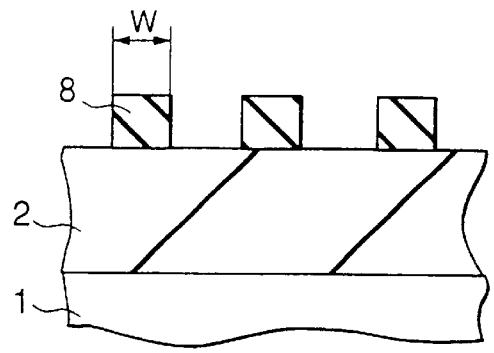
FIGS. 3A to 3D illustrate cross-sectional views sequentially showing the process of forming a pattern according to another embodiment of this invention.

When the aforementioned oxidation treatment is performed under the condition shown in FIG. 1E, the organosilicon film pattern 6 is oxidized to be formed into an oxidation-treated film pattern 8 as shown in FIG. 3A. At this moment, the resist pattern 5 is eliminated through the ashing thereof depending on the oxidation treatment. However, the resist pattern 5 may be left remained as shown FIG. 3C.

Figure 3B:
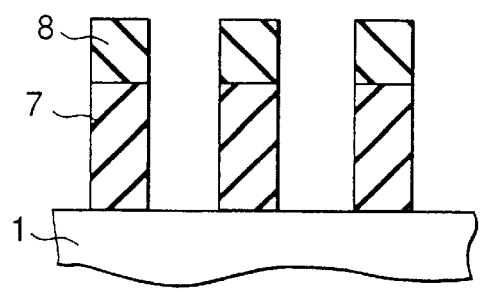
Figure 3C:
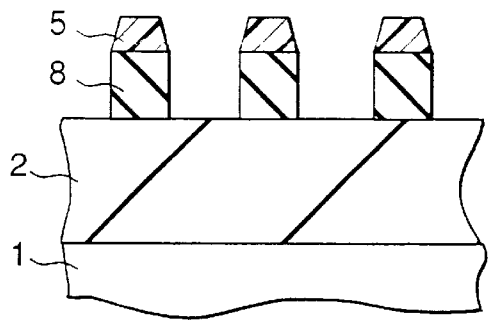
Figure 3D:
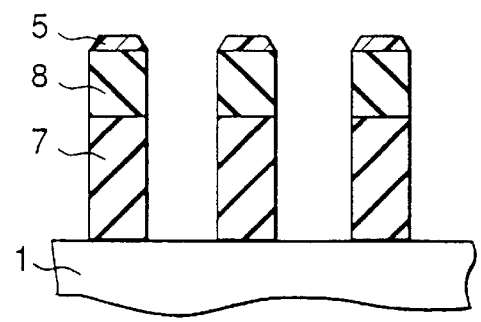

After this oxidation treatment, the oxidation-treated film pattern 8 is employed as an etching mask for etching the work film 2 as shown in FIG. 3C. Although FIG. 3A depicts a case where only the oxidation-treated film pattern 8 is employed as an etching mask for etching the work film 2, the processing of the work film 2 may be performed by making use of an etching mask comprising both resist pattern 5 and oxidation-treated film pattern 8 as shown in FIG. 3C.

As for the etching gas to be employed in this case, a bromine-based gas or a chlorine-based gas may be preferably employed for the etching of the work film if the work film is formed of a wiring material or a silicon-based material. On the other hand, if the work film is formed of SiN, a mixed gas containing at least fluorine-based gas and nitrogen gas, or a mixed gas comprising at least fluorine-based gas and chlorine-based gas may be preferably employed for the etching of the work film.

When the organosilicon film pattern is subjected to an oxidation treatment as mentioned above, the resultant oxidation-treated film pattern 8 functions as an antireflection film at the occasion of patterning exposure and at the same time functions as a hard mask at the occasion of etching the work film, so that any additional antireflection film is no more required to be interposed between the hard mask and the resist. As a result, it is now possible to accurately transcribe the resist pattern to the hard mask, and hence to process the work film with excellent dimension controllability.

(4) After finishing the patterning of the work film, the organosilicon film pattern which has been employed as an etching mask is stripped (removed) by making use of a gas containing oxygen atom and a gas containing at least one kind of atom selected from the group consisting of chlorine atom, bromine atom and fluorine atom in the method of this invention.

Namely, if the organosilicon film pattern is exposed, after the patterning of the work film, to a plasma generated by making use of a mixed gas comprising a large amount of gas containing oxygen atom, and a trace amount of gas containing at least one kind of atom selected from the group consisting of chlorine atom, bromine atom and fluorine atom, the organosilicon film pattern can be completely removed without removing the work film.

When the organosilicon film is removed, chlorine, bromine or fluorine radicals in the plasma functions to promote the etching of the work film. Therefore, if the amount of gas containing any of these atoms can be minimized in this process, the damage of the work film in this process can be proportionally minimized. This phenomenon can be explained as follows. Namely, it is assumed that since an organosilicon film is more likely to entrap chlorine, bromine or fluorine atom therein during the etching thereof, it is possible to proportionally minimize the amount required of chlorine, bromine or fluorine atom at the occasion of removing the organosilicon film.

In particular, when an organosilicon compound having a structure represented by general formula (12) in the backbone chain is employed, the removing rate of the organosilicon film can be accelerated, thus making it possible to remove the organosilicon film while minimizing the amount of cut-off of the work film. This may be ascribed to the nature of the organosilicon compound having a structure represented by the general formula 12 to react easily with chlorine, bromine or fluorine radicals, and evaporate easily.

Followings are specific embodiments of the aforementioned embodiment (4).

(a) A gas containing $CF_4$, $SF_6$ or $NF_3$ is employed in the removing step of the organosilicon film.

(b) The step of treating the organosilicon film with a gas containing oxygen atom and the step of treating the organosilicon film with a gas containing at least one kind of atom selected from the group consisting of chlorine, bromine and fluorine atom are sequentially or alternately performed.

(c) The step of treating the organosilicon film with a gas containing oxygen atom and the step of treating the organosilicon film with a gas containing at least one kind of compound selected from the group consisting of $CF_4$, SF6 or $NF_3$ are sequentially or alternately performed.

(d) The temperature of a substrate to be treated is maintained to about 100° C. or less at the occasion of removing the organosilicon film. When the temperature of a substrate to be treated is maintained to about 100° C. or less, a reaction to oxidize the organosilicon film by oxygen radicals could be hardly taken place, whereby improving the removing rate of the organosilicon film.

(e) After the organosilicon film is exposed to the plasma that has been generated by making use of a gas comprising oxygen atom and at least one kind of atom selected from the group consisting of chlorine, bromine and fluorine atom, the resultant organosilicon film is treated with a solution containing an amine-based solvent.

(f) The organosilicon film is dipped in a solution containing at least one kind of compound selected from the group consisting of an amine-based solvent, hydrogen fluoride, ammonium fluoride, sodium hydroxide, sulfuric acid and hydrogen peroxide to remove the organosilicon film; or after being dipped in the aforementioned solution, the organosilicon film is dipped again in a solution containing one kind of compound which is selected from the group consisting of an amine-based solvent, hydrogen fluoride, ammonium fluoride, sodium hydroxide, sulfuric acid and hydrogen peroxide, but different in kind from the compound(s) contained in the aforementioned solution to remove the organosilicon film.

In particular, if the backbone chain of the organosilicon compound is formed of the structure represented by the aforementioned general formula 12, the aforementioned solution can be more easily penetrated into the organosilicon film thereby to further improve the removing rate of the organosilicon film.

(g) After the organosilicon film is dipped in the aforementioned solution according to the aforementioned embodiment (f), the organosilicon film is exposed to the plasma that has been generated by making use of a gas containing oxygen atom.

The gas containing oxygen atom may be combined with a gas containing chlorine, bromine or fluorine atom. Examples of the gas containing chlorine, bromine or fluorine atom are $CF_4$, $SF_6$ and $NF_3$.

(h) In according with the aforementioned embodiment (f), after the organosilicon film is dipped in the aforementioned solution containing sulfuric acid and hydrogen peroxide, the organosilicon film is dipped again in a solution containing hydrogen fluoride and ammonium fluoride.

It is also possible, at the occasion of removing the organosilicon film by following the method of any of aforementioned preferable embodiments, to simultaneously remove the resist pattern.

This invention will be further explained with reference to the following various examples.

EXAMPLE 1

First of all, an organosilicon film containing an organosilicon compound represented by the formula (1-1) was formed on the surface of a silicon wafer by the following methods (A1) to (A10). On the other hand, a resist and an antireflection film of the conventional type (for the purpose of comparison) were formed on the surface of a silicon wafer by the following methods (R1) to (R4).

(A1): 10 g of an organosilicon compound represented by the general formula (1-1) and having a weight average molecular weight of 5,000 was dissolved in 90 g of toluene to prepare a solution, which was then spin-coated on the surface of an underlying substrate. Then, the substrate was heated for 90 seconds at a temperature of 100° C. by making use of a hot plate to evaporate the solvent and thereby to dry the coated layer, thus forming an organosilicon film.

(A2): In the method of (A1), an organosilicon compound having a weight average molecular weight of 2,500 was employed.

(A3): In the method of (A1), an organosilicon compound having a weight average molecular weight of 1,000 was employed.

(A4): In the method of (A1), an organosilicon compound having a weight average molecular weight of 500 was employed.

(A5): The solution prepared according to (A1) was spin-coated on the surface of an underlying substrate. Then, the substrate was heated in a nitrogen gas atmosphere (oxygen concentration: 50 ppm or less) for one hour at a temperature of 100° C. by making use of a hot plate, thereby allowing the organosilicon film to crosslink.

(A6): The solution prepared according to (A1) was spin-coated on the surface of an underlying substrate. Then, the substrate was heated for 90 seconds at a temperature of 100° C. by making use of a hot plate to evaporate the solvent and thereby to dry the coated layer. Then, the surface of the organosilicon film was entirely irradiated by a KrF excimer laser beam with an exposure of 400 mJ/cm$^2$ in a nitrogen gas atmosphere (oxygen concentration: 50 ppm or less), thereby allowing the organosilicon film to crosslink.

(A7): The solution prepared according to (A1) was spin-coated on the surface of an underlying substrate. Then, the surface of the organosilicon film was entirely irradiated by a KrF excimer laser beam with an exposure of 80 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

(A8): 10 g of an organosilicon compound represented by the general formula (1-1) and having a weight average molecular weight of 5,000, 1 g of a crosslinking agent represented by the formula (3-61) and 0.1 g of silyl peroxide as a radical-generating agent were dissolved in 89.9 g of toluene to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(A9): 10 g of an organosilicon compound represented by the general formula (1-1) and having a weight average molecular weight of 5,000, 1 g of a crosslinking agent represented by the formula (3-61) and 0.1 g of silyl peroxide as a radical-generating agent were dissolved in 89.9 g of toluene to prepare a solution, which was then spin-coated on the surface of an underlying substrate. Then, the substrate was heated for 90 seconds at a temperature of 100° C. by making use of a hot plate to evaporate the solvent and thereby to dry the coated layer. Then, the surface of the organosilicon film was entirely irradiated by a KrF excimer laser beam with an exposure of 150 mJ/cm$^2$ in a nitrogen gas atmosphere (oxygen concentration: 50 ppm or less), thereby allowing the organosilicon film to crosslink.

(A10): 10 g of an organosilicon compound represented by the general formula (1-1) and having a weight average molecular weight of 5,000, 1 g of a crosslinking agent represented by the formula (3-61) and 0.1 g of silyl peroxide as a radical-generating agent were dissolved in 88.9 g of toluene to prepare a solution, which was then spin-coated on the surface of an underlying substrate. Then, the surface of the organosilicon film was entirely irradiated by a KrF excimer laser beam with an exposure of 10 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

(R1): 10 g of polyvinylphenol, as an inhibitor, having a weight average molecular weight of 11,000 and ter-butoxycarbonyl group substituting for 50% of hydroxyl group thereof, and 0.1 g of sulfone imide as an acid-generating agent were dissolved in 89.99 g of ethyl lactate to prepare a resist solution, which was then spin-coated on the surface of an underlying substrate. Then, the substrate was heated for 60 seconds at a temperature of 120° C. by making use of a hot plate to form a resist.

(R2): 10 g of polysulfone was dissolved in 90 g of cyclohexanone to prepare a solution, which was then spin-coated on the surface of an underlying substrate. Then, the substrate was heated for 90 seconds at a temperature of 220° C. by making use of a hot plate.

(R3): 10 g of polybenzimidazol was dissolved in 90 g of cyclohexanone to prepare a solution, which was then spin-coated on the surface of an underlying substrate. Then, the substrate was heated for 90 seconds at a temperature of 220° C. by making use of a hot plate.

(R4): 10 g of novolak resin was dissolved in 90 g of toluene to prepare a solution, which was then spin-coated on the surface of an underlying substrate. Then, the substrate was heated for 90 seconds at a temperature of 320° C. by making use of a hot plate.

The glass transition temperature of each of the organosilicon films prepared according to the aforementioned methods (A1) to (A10) was measured, the results being shown in the following Table 1.

Then, the films prepared according to the methods (A1) to (A10) and (R1) to (R4) were respectively etched under the following etching conditions (P1) to (P4) to examine the etching characteristics of these films.

(P1) Etching gas: $CF_4$ at a flow rate of 120 sccm; Power density: 2 W/cm$^2$; Degree of vacuum: 20 mTorr; and Temperature of substrate: 50° C.

(P2) Etching gas: $Cl_2$ at a flow rate of 200 sccm; Power density: 1.5 W/cm$^2$; Degree of vacuum: 30 mTorr; and Temperature of substrate: 80° C.

(P3) Etching gas: HBr at a flow rate of 150 sccm; Power density: 1.7 W/cm$^2$; Degree of vacuum: 12 mTorr; and Temperature of substrate: 50° C.

(P4) Etching gas: $CF_4/Cl_2$ at a flow rate of 20/180 sccm; Power density: 2 W/cm$^2$; Degree of vacuum: 12 mTorr; and Temperature of substrate: 50° C.

Figure 4A:
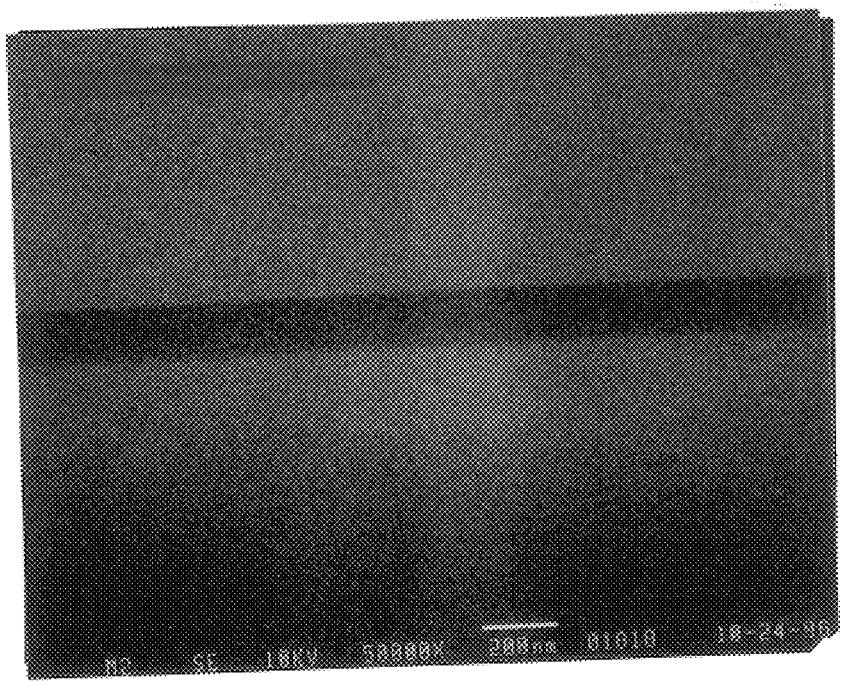
FIGS. 4A and 4B respectively illustrates an electron microscopic photograph showing the conditions of an organosilicon film after an etching treatment.
Figure 4B:
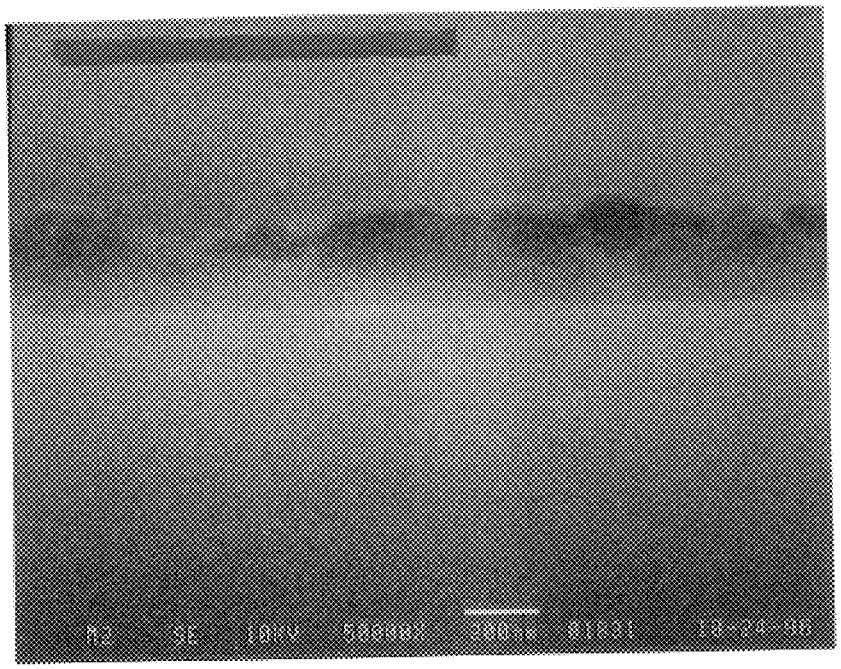

When each of the organosilicon films was observed after the etching treatment with a scanning type electron microscope (SEM), the films of (A1) and (A2) were found denatured into a sponge-like film as shown in FIG. 4B irrespective of the etching conditions (P1) to (P4), indicating an abnormal etching. Even in the case of the films of (A3) to (A10), a denaturing of film was recognized when they were etched under the conditions of (P1). Furthermore, even if a film having a high glass transition temperature was employed, it was found impossible to normally perform the etching if the etching is performed using a fluorine-based gas.

Whereas, when the etching of the films (A3) to (A10) was performed under the conditions of (P2) to (P4), the denaturing of film was not recognized at all as shown in FIG. 4A, indicating the normal etching process of the films.

The etching rate of the resists, the etching selectivity between the resist and the organosilicon film (the etching rate of the organosilicon film/the etching rate of the resist), and the etching selectivity between the resist and the conventional antireflection film (the etching rate of the conventional antireflection film/the etching rate of the resist) for the purpose of comparison are shown in the following Table 1. In Table 1 and the following Tables, the numerals in the upper row denote an etching selectivity, and the numerals in the lower row and in the parentheses denote a dimensional change.

As shown in Table 1, the etching selectivity of any of the films (A3) to (A10) was approximately not less than 2, indicating a higher etching selectivity as compared with that of the conventional antireflection films. Therefore, it is possible to perform the etching of an organosilicon film without causing a receding or total loss of the resist pattern even if the film thickness of the resist is reduced.

TABLE 1

| | Glass-transition temperature (° C.) | Example 1 | | | |
|---|---|---|---|---|---|
| | | (P1) | (P2) | (P3) | (P4) |
| (A1) | −10 | Denatured | Denatured | Denatured | Denatured |
| (A2) | −3 | Denatured | Denatured | Denatured | Denatured |
| (A3) | 5 | Denatured | 1.5 (−4 nm) | 1.8 (−4 nm) | 1.9 (−4 nm) |
| (A4) | 40 | Denatured | 3.1 (−3 nm) | 2.1 (−4 nm) | 2.0 (−4 nm) |
| (A5) | 90 | Denatured | 4.5 (−2 nm) | 2.7 (−4 nm) | 2.6 (−4 nm) |
| (A6) | 80 | Denatured | 4.2 (−2 nm) | 2.5 (−4 nm) | 2.3 (−4 nm) |
| (A7) | 75 | Denatured | 4.1 (−2 nm) | 2.7 (−4 nm) | 2.5 (−4 nm) |
| (A8) | 128 | Denatured | 4.7 (−2 nm) | 3.0 (−3 nm) | 2.8 (−4 nm) |
| (A9) | 132 | Denatured | 5.0 (−1 nm) | 3.1 (−3 nm) | 2.9 (−4 nm) |
| (A10) | 118 | Denatured | 6.0 (0 nm) | 3.5 (−3 nm) | 3.3 (−3 nm) |

| | Example 13, Comparative example 9 | | | | | |
|---|---|---|---|---|---|---|
| | (Q1) | (Q2) | (Q3) | (Q4) | (Q5) | (Q6) |
| (A1) | Denatured | 5.9 | Denatured | 7.2 | 5.9 | 6.1 |
| (A2) | 40.2 | 5.6 | 27.2 | 7.1 | 5.8 | 6.0 |
| (A3) | 40.2 (0 nm) | 6.2 | 28.0 | 7.2 | 6.2 | 6.2 |
| (A4) | 40.2 (0 nm) | 6.1 | 28.4 | 7.4 | 5.8 | 6.3 |
| (A5) | 41.0 (0 nm) | 5.7 | 28.6 | 7.2 | 5.9 | 6.4 |
| (A6) | 37.0 (0 nm) | 5.8 | 29.6 | 7.6 | 5.8 | 6.5 |
| (A7) | 43.0 (0 nm) | 6.4 | 29.2 | 7.1 | 5.9 | 6.1 |
| (A8) | 44.0 (0 nm) | 6.1 | 28.2 | 6.7 | 6.4 | 6.2 |

TABLE 1-continued

| (A9) | 42.0 (0 nm) | 5.9 | 28.5 | 6.8 | 6.2 | 6.3 |
|---|---|---|---|---|---|---|
| (A10) | 44.0 (0 nm) | 6.1 | 29.0 | 6.9 | 6.3 | 6.9 |

| | Glass-transition temperature (° C.) | Example 1 | | | |
|---|---|---|---|---|---|
| | | (P1) | (P2) | (P3) | (P4) |
| (R1) | — | 41 nm/min. | 59 nm/min. | 8 nm/min. | 8 nm/min. |
| (R2) | — | 1.3 | 0.9 | 0.8 | 0.6 |
| (R3) | — | 1.2 | 0.8 | 0.7 | 0.5 |
| (R4) | — | 0.9 | 0.7 | 0.6 | 0.6 |
| (S1) | — | — | — | — | — |
| (S2) | — | — | — | — | — |

| | Example 13, Comparative example 9 | | | | | |
|---|---|---|---|---|---|---|
| | (Q1) | (Q2) | (Q3) | (Q4) | (Q5) | (Q6) |
| (R1) | 18.2 | 4.0 | 12.0 | 3.2 | 3.4 | 2.6 |
| (R2) | 17.9 (−10 nm) | 4.3 (−23 nm) | 11.1 (−15 nm) | 3.3 (−23 nm) | 3.5 (−23 nm) | 2.7 (−28 nm) |
| (R3) | 18.2 (−10 nm) | 4.3 (−23 nm) | 11.2 (−15 nm) | 3.4 (−25 nm) | 3.5 (−23 nm) | 2.8 (−28 nm) |
| (R4) | 19.0 (−10 nm) | 4.2 (−25 nm) | 11.3 (−15 nm) | 3.7 (−23 nm) | 3.6 (−23 nm) | 2.6 (−28 nm) |
| (S1) | 330 nm/min. | 350 nm/min. | 350 nm/min. | 560 nm/min. | 510 nm/min. | 378 nm/min. |
| (S2) | 420 nm/min. | 400 nm/min. | 420 nm/min. | 620 nm/min. | 520 nm/min. | 380 nm/min. |

EXAMPLE 2

This example illustrates experiments where flurren (C60) was further added to the organosilicon film in Example 1 for the purpose of providing the organosilicon film with photoconductivity.

(B1): 10 g of an organosilicon compound represented by the general formula (1-1) and having a weight average molecular weight of 5,000 was dissolved together with 0.01 g of flurren in 89.99 g of toluene to prepare a solution, which was then spin-coated on the surface of an underlying substrate. Then, the substrate was heated for 90 seconds at a temperature of 100° C. by making use of a hot plate to evaporate the solvent and thereby to dry the coated layer, thus forming an organosilicon film.

(B2): In the method of (B1), an organosilicon compound having a weight average molecular weight of 2,500 was employed.

(B3): In the method of (B1), an organosilicon compound having a weight average molecular weight of 1,000 was employed.

(B4): In the method of (B1), an organosilicon compound having a weight average molecular weight of 500 was employed.

(B5): The solution prepared according to (B1) was spin-coated on the surface of an underlying substrate. Then, the substrate was heated in a nitrogen gas atmosphere (oxygen concentration: 50 ppm or less) for one hour at a temperature of 500° C. by making use of a hot plate, thereby allowing the organosilicon film to crosslink.

(B6): The solution prepared according to (B1) was spin-coated on the surface of an underlying substrate. Then, the substrate was heated for 90 seconds at a temperature of 100°

C. by making use of a hot plate to evaporate the solvent and thereby to dry the coated layer. Then, the surface of the organosilicon film was entirely irradiated by a KrF excimer laser beam with an exposure of 400 mJ/cm$^2$ in a nitrogen gas atmosphere (oxygen concentration: 50 ppm or less), thereby allowing the organosilicon film to crosslink.

(B7): The solution prepared according to (B1) was spin-coated on the surface of an underlying substrate. Then, the surface of the organosilicon film was entirely irradiated by a KrF excimer laser beam with an exposure of 80 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

(B8): 10 g of an organosilicon compound represented by the general formula (1-1) and having a weight average molecular weight of 5,000, 1 g of a crosslinking agent represented by the formula (3-61), 0.1 g of silyl peroxide as a radical-generating agent and 0.01 g of flurren were dissolved in 88.89 g of toluene to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(B9): The solution prepared according to (B8) was spin-coated on the surface of an underlying substrate. Then, the substrate was heated for 90 seconds at a temperature of 100° C. by making use of a hot plate to evaporate the solvent and thereby to dry the coated layer. Then, the surface of the organosilicon film was entirely irradiated by a KrF excimer laser beam with an exposure of 150 mJ/cm$^2$ in a nitrogen gas atmosphere (oxygen concentration: 50 ppm or less), thereby allowing the organosilicon film to crosslink.

(B10): The solution prepared according to (B8) was spin-coated on the surface of an underlying substrate. Then, the surface of the organosilicon film was entirely irradiated by a KrF excimer laser beam with an exposure of 10 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

Then, the glass transition temperature of each of the organosilicon films prepared according to the aforementioned methods (B1) to (B10) was measured, the results being shown in the following Table 2.

Then, the organosilicon films prepared according to the methods (A1) to (A10) were respectively etched under the etching conditions (P1) to (P4) described in Example 1 to examine the etching characteristics of these films.

When each of the organosilicon films was observed after the etching treatment with a scanning type electron microscope, the organosilicon films of (B1) and (B2) were found denatured irrespective of the etching conditions (P1) to (P4), indicating an abnormal etching. Even in the case of the films of (B3) to (B10), a denaturing of film was recognized when they were etched under the conditions of (P1). Furthermore, even if a film having a high glass transition temperature was employed, it was found impossible to normally perform the etching if the etching is performed using a fluorine-based gas.

Whereas, when the etching of the films (B3) to (B10) was performed under the conditions of (P2) to (P4), the denaturing of film was not recognized at all, indicating the normal etching process of the films.

The etching selectivity between the resist and the organosilicon film in this occasion is shown in the following Table 2.

As shown in Table 2, the etching selectivity of any of the films (B3) to (B10) was approximately not less than 2, indicating a higher etching selectivity as compared with that of the conventional antireflection films. Therefore, it is possible to perform the etching of an organosilicon film without causing a receding or total loss of the resist pattern even if the film thickness of the resist is reduced.

Table 2 also shows the results calculated of the etching selectivity between the resist and the organosilicon film. As seen from Table 2, the etching selectivity was improved as compared with that in Example 1. This can be attributed to the fact that the organosilicon film became conductive due to the emission of plasma during the etching, whereby causing a reaction between the radicals in the plasma and silicon of the organosilicon film, and hence facilitating the generation of volatile substances.

TABLE 2

| | Glass-transition temperature | Example 2 | | | |
|---|---|---|---|---|---|
| | (° C.) | (P1) | (P2) | (P3) | (P4) |
| (B1) | −10 | Denatured | Denatured | Denatured | Denatured |
| (B2) | −3 | Denatured | Denatured | Denatured | Denatured |
| (B3) | 12 | Denatured | 1.6 (−3 nm) | 2.0 (−4 nm) | 2.1 (−4 nm) |
| (B4) | 50 | Denatured | 3.3 (−2 nm) | 2.3 (−4 nm) | 2.1 (−4 nm) |
| (B5) | 98 | Denatured | 4.7 (−1 nm) | 2.9 (−3 nm) | 2.7 (−4 nm) |
| (B6) | 92 | Denatured | 4.5 (−1 nm) | 2.7 (−3 nm) | 2.4 (−3 nm) |
| (B7) | 90 | Denatured | 4.3 (−1 nm) | 2.9 (−3 nm) | 2.6 (−3 nm) |
| (B8) | 128 | Denatured | 5.0 (−2 nm) | 3.2 (−3 nm) | 2.9 (−3 nm) |
| (B9) | 132 | Denatured | 5.2 (−1 nm) | 3.2 (−3 nm) | 3.1 (−4 nm) |
| (B10) | 118 | Denatured | 6.2 (0 nm) | 3.7 (−3 nm) | 3.4 (−3 nm) |

| | Example 14 | | | | | |
|---|---|---|---|---|---|---|
| | (Q1) | (Q2) | (Q3) | (Q4) | (Q5) | (Q6) |
| (B1) | Denatured | 5.9 | Denatured | 7.2 | 5.9 | 6.1 |
| (B2) | 40.2 | 5.6 | 27.2 | 7.1 | 5.8 | 6.0 |
| (B3) | 40.2 | 6.2 (−4 nm) | 28.0 | 7.2 | 6.2 | 6.2 |
| (B4) | 40.2 | 6.1 (−4 nm) | 28.4 | 7.4 | 5.8 | 6.3 |
| (B5) | 41.0 | 5.7 (−4 nm) | 28.6 | 7.2 | 5.9 | 6.4 |
| (B6) | 37.0 | 5.8 (−4 nm) | 29.6 | 7.6 | 5.8 | 6.5 |
| (B7) | 43.0 | 6.4 (−4 nm) | 29.2 | 7.1 | 5.9 | 6.1 |
| (B8) | 44.0 | 6.1 (−4 nm) | 28.2 | 6.7 | 6.4 | 6.2 |
| (B9) | 42.0 | 5.9 (−4 nm) | 28.5 | 6.8 | 6.2 | 6.3 |
| (B10) | 44.0 | 6.1 (−4 mn) | 29.0 | 6.9 | 6.3 | 6.9 |

EXAMPLE 3

First of all, an organosilicon film containing an organosilicon compound (m/n=4/1) represented by the formula (1-84) was formed on the surface of an underlying substrate by the following methods (C1) to (C10).

(C1): 10 g of an organosilicon compound represented by the general formula (1-84) and having a weight average molecular weight of 2,000 was dissolved in 90 g of anisole to prepare a solution, which was then spin-coated on the surface of an underlying substrate. Then, the substrate was heated for 90 seconds at a temperature of 160° C. by making use of a hot plate to evaporate the solvent and thereby to dry the coated layer, thus forming an organosilicon film.

(C2): In the method of (C1), an organosilicon compound having a weight average molecular weight of 4,000 was employed.

(C3): In the method of (C1), an organosilicon compound having a weight average molecular weight of 8,000 was employed.

(C4): In the method of (C1), an organosilicon compound having a weight average molecular weight of 16,000 was employed.

(C5): The solution prepared according to (C2) was spin-coated on the surface of an underlying substrate. Then, the substrate was heated in a nitrogen gas atmosphere (oxygen concentration: 50 ppm or less) for one hour at a temperature of 350° C. by making use of a hot plate, thereby allowing the organosilicon film to crosslink.

(C6): The solution prepared according to (C2) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by an ArF excimer laser beam with an exposure of 150 mJ/cm$^2$, thereby allowing the organosilicon film to crosslink.

(C7): The solution prepared according to (C2) was spin-coated on the surface of an underlying substrate. Then, the surface of the organosilicon film was entirely irradiated by an ArF excimer laser beam with an exposure of 10 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

(C8): 10 g of an organosilicon compound represented by the general formula (1-84) and having a weight average molecular weight of 4,000 and 0.1 g of the radical-generating agent represented by the formula (4-12) were dissolved in 89.9 g of anisole to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(C9): The solution prepared according to (C8) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by an ArF excimer laser beam with an exposure of 60 mJ/cm$^2$, thereby allowing the organosilicon film to crosslink.

(C10): The solution prepared according to (C8) was spin-coated on the surface of an underlying substrate. Then, the surface of the organosilicon film was entirely irradiated by an ArF excimer laser beam with an exposure of 10 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

Then, the glass transition temperature of each of the organosilicon films prepared according to the aforementioned methods (C1) to (C10) was measured, the results being shown in the following Table 3.

Then, the films prepared according to the methods (C1) to (C10), the resists formed according to the methods (R1) to (R4), and the conventional antireflection film were respectively etched under the following etching conditions (P5) to (P8) to examine the etching characteristics of these films.

(P5) Etching gas: CF$_4$ at a flow rate of 120 sccm; Power density: 1.8 W/cm$^2$; Degree of vacuum: 20 mTorr; and Temperature of substrate: 80° C.

(P6) Etching gas: Cl$_2$/BCl$_3$ at a flow rate of 20/180 sccm; Power density: 1.5 W/cm$^2$; Degree of vacuum: 30 mTorr; and Temperature of substrate: 80° C.

(P7) Etching gas: Cl$_2$/HBr at a flow rate of 180/20 sccm; Power density: 1.2 W/cm$^2$; Degree of vacuum: 12 mTorr; and Temperature of substrate: 50° C.

(P8) Etching gas: CF$_3$Cl at a flow rate of 200 sccm; Power density: 1.2 W/cm$^2$; Degree of vacuum: 12 mTorr; and Temperature of substrate: 50° C.

When each of the organosilicon films was observed after the etching treatment with a scanning type electron microscope, the films of (C1) and (C2) were found denatured irrespective of the etching conditions (P5) to (P8), indicating an abnormal etching. Even in the case of the films of (C3) to (C10), a denaturing of film was recognized when they were etched under the conditions of (P5). Furthermore, even if a film having a high glass transition temperature was employed, it was found impossible to normally perform the etching if the etching is performed using a fluorine-based gas.

Whereas, when the etching of the films (C3) to (C10) was performed under the conditions of (P6) to (P8), the denaturing of film was not recognized at all, indicating the normal etching process of the films.

The etching rate of the resists, the etching selectivity between the resist and the organosilicon film (the etching rate of the organosilicon film/the etching rate of the resist), and the etching selectivity between the resist and the conventional antireflection film (the etching rat of the conventional antireflection film /the etching rate of the resist) for the purpose of comparison are shown in the following Table 3.

As shown in Table 3, the etching selectivity of any of the films (C3) to (C10) was approximately not less than 2, indicating a higher etching selectivity as compared with that of the conventional antireflection films. Therefore, it is possible to perform the etching of an organosilicon film without causing a receding or total loss of the resist pattern even if the film thickness of the resist is reduced.

TABLE 3

| | Glass-transition temperature | Example 3 | | | |
|---|---|---|---|---|---|
| | (° C.) | (P5) | (P6) | (P7) | (P8) |
| (C1) | −10 | Denatured | Denatured | Denatured | Denatured |
| (C2) | −3 | Denatured | Denatured | Denatured | Denatured |
| (C3) | 12 | Denatured | 2.4 (−4 nm) | 1.6 (−4 nm) | 1.8 (−4 nm) |
| (C4) | 128 | Denatured | 3.1 (−3 nm) | 1.8 (−4 nm) | 2.2 (−4 nm) |
| (C5) | 132 | Denatured | 4.2 (−2 nm) | 2.6 (−4 nm) | 2.6 (−4 nm) |
| (C6) | 138 | Denatured | 3.9 (−3 nm) | 2.9 (−4 nm) | 2.7 (−4 nm) |
| (C7) | 118 | Denatured | 3.9 (−3 nm) | 2.5 (−4 nm) | 2.8 (−4 nm) |
| (C8) | 148 | Denatured | 4.6 (−2 nm) | 3.1 (−3 nm) | 3.2 (−3 nm) |

TABLE 3-continued

| | | | | | |
|---|---|---|---|---|---|
| (C9) | 142 | Denatured | 4.8 (-2 nm) | 3.2 (-3 nm) | 2.5 (-4 nm) |
| (C10) | 140 | Denatured | 5.9 (-1 nm) | 3.6 (-3 nm) | 3.5 (-3 nm) |
| (R1) | — | | 41 nm/min. | 52 nm/min. | 6 nm/min. | 8 nm/min. |
| (R2) | — | | 1.3 | 0.9 | 0.6 | 0.7 |
| (R3) | — | | 1.2 | 0.8 | 0.7 | 0.6 |
| (R4) | — | | 0.9 | 0.7 | 0.6 | 0.6 |

EXAMPLE 4

This example illustrates experiments where flurren ($C_{60}$) was further added to the organosilicon film in Example 3 for the purpose of providing the organosilicon film with photoconductivity.

(D1): 10 g of an organosilicon compound represented by the general formula (1-84) and having a weight average molecular weight of 2,000 was dissolved together with 0.0 g of flurren in 89.99 g of anisole to prepare a solution, which was then spin-coated on the surface of an underlying substrate. Then, the substrate was heated for 90 seconds at a temperature of 160° C. by making use of a hot plate to evaporate the solvent and thereby to dry the coated layer, thus forming an organosilicon film.

(D2): In the method of (D1), an organosilicon compound having a weight average molecular weight of 4,000 was employed.

(D3): In the method of (D1), an organosilicon compound having a weight average molecular weight of 8,000 was employed.

(D4): In the method of (D1), an organosilicon compound having a weight average molecular weight of 16,000 was employed.

(D5): The solution prepared according to (D2) was spin-coated on the surface of an underlying substrate. Then, the substrate was heated in a nitrogen gas atmosphere (oxygen concentration: 50 ppm or less) for one hour at a temperature of 350° C. by making use of a hot plate, thereby allowing the organosilicon film to crosslink.

(D6): The solution prepared according to (D2) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by an ArF excimer laser beam with an exposure of 150 mJ/cm², thereby allowing the organosilicon film to crosslink.

(D7): The solution prepared according to (D2) was spin-coated on the surface of an underlying substrate. Then, the surface of the organosilicon film was entirely irradiated by an ArF excimer laser beam with an exposure of 10 mJ/cm² while heating it in a nitrogen gas atmosphere (oxygen concentration: 50 ppm or less) for 90 seconds at a temperature of 160° C. by making use of a hot plate, thereby allowing the organosilicon film to crosslink.

(D8): 10 g of an organosilicon compound represented by the general formula (1-84) and having a weight average molecular weight of 4,000, 0.1 g of a radical-generating agent represented by the formula (4-12) and 0.01 g of flurren were dissolved in 88.89 g of anisole to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(D9): The solution prepared according to (DB) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by an ArF excimer laser beam with an exposure of 60 mJ/cm², thereby allowing the organosilicon film to crosslink.

(D10): The solution prepared according to (D8) was spin-coated on the surface of an underlying substrate. Then, the surface of the organosilicon film was entirely irradiated by an ArF excimer laser beam with an exposure of 10 mJ/cm² while heating it in a nitrogen gas atmosphere (oxygen concentration: 50 ppm or less) for 90 seconds at a temperature of 160° C. by making use of a hot plate, thereby allowing the organosilicon film to crosslink.

Then, the glass transition temperature of each of the organosilicon films prepared according to the aforementioned methods (D1) to (D10) was measured, the results being shown in the following Table 4.

Then, the organosilicon films prepared according to the methods (D1) to (D10) and the resists were respectively etched under the etching conditions (P5) to (P8) described in Example 3 to examine the etching characteristics of these films.

When each of the organosilicon films was observed after the etching treatment with a scanning type electron microscope, the organosilicon films of (D1) and (D2) were found denatured irrespective of the etching conditions (P5) to (P8), indicating an abnormal etching. Even in the case of the films of (D3) to (D10), a denaturing of film was recognized when they were etched under the conditions of (P5). Furthermore, even if a film having a high glass transition temperature was employed, it was found impossible to normally perform the etching if the etching is performed using a fluorine-based gas.

Whereas, when the etching of the films (D3) to (D10) was performed under the conditions of (P6) to (P8), the denaturing of film was not recognized at all, indicating the normal etching process of the films.

The etching selectivity between the resist and the organosilicon film in this occasion is shown in the following Table 4. As apparent from Table 4, the etching selectivity of any of the films (D3) to (D10) was approximately not less than 2, indicating a higher etching selectivity as compared with that of the conventional antireflection films. Therefore, it is possible to perform the etching of an organosilicon film without causing a receding or total loss of the resist pattern even if the film thickness of the resist is reduced.

Table 4 also shows the results calculated of the etching selectivity between the resist and the organosilicon film. As seen from Table 4, the etching selectivity was improved as compared with that in Example 3. This can be attributed to the fact that the organosilicon film became conductive due to the emission of plasma during the etching, whereby causing a reaction between the radicals in the plasma and silicon of the organosilicon film, and hence facilitating the generation of volatile substances.

TABLE 4

| | Glass-transition temperature | Example 4 | | | |
|---|---|---|---|---|---|
| | (° C.) | (P5) | (P6) | (P7) | (P8) |
| (D1) | −10 | Denatured | Denatured | Denatured | Denatured |
| (D2) | −2 | Denatured | Denatured | Denatured | Denatured |
| (D3) | 12 | Denatured | 2.6 (−3 nm) | 1.8 (−3 nm) | 1.9 (−4 nm) |
| (D4) | 128 | Denatured | 3.2 (−3 nm) | 2.0 (−3 nm) | 2.3 (−3 nm) |
| (D5) | 132 | Denatured | 4.4 (−2 nm) | 2.7 (−4 nm) | 2.7 (−4 nm) |
| (D6) | 138 | Denatured | 4.1 (−3 nm) | 3.1 (−4 nm) | 2.8 (−3 nm) |
| (D7) | 118 | Denatured | 4.1 (−3 nm) | 2.6 (−3 nm) | 2.9 (−3 nm) |
| (D8) | 148 | Denatured | 4.8 (−2 nm) | 3.2 (−3 nm) | 3.3 (−3 nm) |
| (D9) | 142 | Denatured | 5.1 (−2 nm) | 3.3 (−3 nm) | 2.6 (−4 nm) |
| (D10) | 140 | Denatured | 6.1 (−1 nm) | 3.7 (−3 nm) | 3.7 (−3 nm) |

EXAMPLE 5

First of all, an organosilicon film containing an organosilicon compound represented by the formula (1-95) was formed on the surface of a silicon wafer by the following methods (E1) to (E10). In this case, the ratio n/m in the copolymer represented by the formula (1-95) was set to 1 (n/m=1/4) in any of (E1) to (E10).

(E1): 10 g of an organosilicon compound represented by the general formula (1-95) and having a weight average molecular weight of 1,000 was dissolved in 90 g of anisole to prepare a solution, which was then spin-coated on the surface of an underlying substrate. Then, the substrate was heated for 90 seconds at a temperature of 160° C. by making use of a hot plate to evaporate the solvent and thereby to dry the coated layer, thus forming an organosilicon film.

(E2): In the method of (E1), an organosilicon compound having a weight average molecular weight of 3,000 was employed.

(E3): In the method of (E1), an organosilicon compound having a weight average molecular weight of 6,000 was employed.

(E4): In the method of (E1), an organosilicon compound having a weight average molecular weight of 12,000 was employed.

(E5): The solution prepared according to (E2) was spin-coated on the surface of an underlying substrate. Then, the substrate was heated in a nitrogen gas atmosphere (oxygen concentration: 50 ppm or less) for one hour at a temperature of 400° C. by making use of a hot plate, thereby allowing the organosilicon film to crosslink.

(E6): The solution prepared according to (E2) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by the i beam of mercury lamp (365 nm in wavelength) with an exposure of 500 mJ/$cm^2$, thereby allowing the organosilicon film to crosslink.

(E7): The solution prepared according to (E2) was spin-coated on the surface of an underlying substrate. Then, the surface of the organosilicon film was entirely irradiated by the i beam of mercury lamp with an exposure of 10 mJ/$cm^2$ while heating it in a nitrogen gas atmosphere (oxygen concentration: 50 ppm or less) for 90 seconds at a temperature of 160° C. by making use of a hot plate, thereby allowing the organosilicon.film to crosslink.

(E8): 10 g of an organosilicon compound represented by the general formula (1-95) and having a weight average molecular weight of 3,000 and 2 g of an organosilicon compound represented by the general formula (1-1) and having a weight average molecular weight of 1,000 were dissolved in 88 g of anisole to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(E9): The solution prepared according to (E8) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by the i beam of mercury lamp with an exposure of 100 mJ/$cm^2$, thereby allowing the organosilicon film to crosslink.

(E10): The solution prepared according to (E8) was spin-coated on the surface of an underlying substrate. Then, the surface of the organosilicon film was entirely irradiated by the i beam of mercury lamp with an exposure of 80 mJ/$cm^2$ while heating it in a nitrogen gas atmosphere (oxygen concentration: 50 ppm or less) for 90 seconds at a temperature of 160° C. by making use of a hot plate, thereby allowing the organosilicon film to crosslink.

Then, the glass transition temperature of each of the organosilicon films prepared according to the aforementioned methods (E1) to (E10) was measured, the results being shown in the following Table 5.

Then, the films prepared according to the methods (E1) to (E10), the resists formed according to the methods (R1) to (R4), and the conventional antireflection film were respectively etched under the following etching conditions (P9) to (P12) to examine the etching characteristics of these films.

(P9) Etching gas: $CF_4$ at a flow rate of 120 sccm; Power density: 3 W/$cm^2$; Degree of vacuum: 75 mTorr; and Temperature of substrate: 50° C.

(P10) Etching gas: $Cl_2$/He at a flow rate of 180/20 sccm; Power density: 1.5 W/$cm^2$; Degree of vacuum: 30 mTorr; and Temperature of substrate: 80° C.

(P11) Etching gas: $Cl_2/O_2$ at a flow rate of 190/10 sccm; Power density: 1.2 W/$cm^2$; Degree of vacuum: 12 mTorr; and Temperature of substrate: 50° C.

(P12) Etching gas: $CF_3Cl$ at a flow rate of 200 sccm; Power density: 1.1 W/$cm^2$; Degree of vacuum: 12 mTorr; and Temperature of substrate: 50° C.

When each of the organosilicon films was observed after the etching treatment with a scanning type electron microscope, the films of (E1) and (E2) were found denatured irrespective of the etching conditions (P9) to (P12), indicating an abnormal etching. Even in the case of the films of (E3) to (E10), a denaturing of film was recognized when they were etched under the conditions of (P9). Furthermore, even if a film having a high glass transition temperature was employed, it was found impossible to normally perform the etching if the etching is performed using a fluorine-based gas.

Whereas, when the etching of the films (E3) to (E10) was performed under the conditions of (P10) to (P12), the denaturing of film was not recognized at all, indicating the normal etching process of the films.

The etching rate of the resists, the etching selectivity between the resist and the organosilicon film (the etching rate of the organosilicon film/the etching rate of the resist), and the etching selectivity between the resist and the conventional antireflection film (the etching rate of the conventional antireflection film/the etching rate of the resist) for the purpose of comparison are shown in the following Table 5.

As shown in Table 5, the etching selectivity of any of the films (E3) to (E10) was approximately not less than 2, indicating a higher etching selectivity as compared with that of the conventional antireflection films. Therefore, it is possible to perform the etching of an organosilicon film without causing a receding or total loss of the resist pattern even if the film thickness of the resist is reduced.

TABLE 5

| | Glass-transition temperature | Example 5 | | | |
|---|---|---|---|---|---|
| | (° C.) | (P9) | (P10) | (P11) | (P12) |
| (E1) | −10 | Denatured | Denatured | Denatured | Denatured |
| (E2) | −2 | Denatured | Denatured | Denatured | Denatured |
| (E3) | 12 | Denatured | 2.0 (−4 nm) | 1.5 (−4 nm) | 1.6 (−4 nm) |
| (E4) | 50 | Denatured | 2.8 (−3 nm) | 1.7 (−4 nm) | 2.1 (−4 nm) |
| (E5) | 98 | Denatured | 4.3 (−2 nm) | 2.4 (−4 nm) | 2.6 (−4 nm) |
| (E6) | 92 | Denatured | 4.1 (−2 nm) | 3.0 (−3 nm) | 2.6 (−4 nm) |
| (E7) | 90 | Denatured | 3.9 (−2 nm) | 2.6 (−4 nm) | 3.0 (−3 nm) |
| (E8) | 90 | Denatured | 4.7 (−1 nm) | 3.2 (−3 nm) | 3.1 (−3 nm) |
| (E9) | 105 | Denatured | 4.7 (−1 nm) | 3.3 (−3 nm) | 2.7 (−4 nm) |
| (E10) | 140 | Denatured | 5.8 (0 nm) | 3.6 (−3 nm) | 3.5 (−3 nm) |
| (R1) | — | 41 nm/min. | 43 nm/min. | 10 nm/min. | 10 nm/min. |
| (R2) | — | 1.3 | 0.8 | 0.8 | 0.7 |
| (R3) | — | 1.2 | 0.8 | 0.7 | 0.6 |
| (R4) | — | 0.9 | 0.8 | 0.7 | 0.6 |

EXAMPLE 6

First of all, an organosilicon film containing an organosilicon compound represented by the formula (1-34) was formed on the surface of a silicon wafer by the following methods (F1) to (F10).

(F1): 10 g of an organosilicon compound represented by the general formula (1-34) and having a weight average molecular weight of 1,000 was dissolved in 90 g of toluene to prepare a solution, which was then spin-coated on the surface of an underlying substrate. Then, the substrate was heated for 90 seconds at a temperature of 160° C. by making use of a hot plate to evaporate the solvent and thereby to dry the coated layer, thus forming an organosilicon film.

(F2): In the method of (F1), an organosilicon compound having a weight average molecular weight of 3,000 was employed.

(F$_3$): In the method of (F1), an organosilicon compound having a weight average molecular weight of 6,000 was employed.

(F$_4$): In the method of (F1), an organosilicon compound having a weight average molecular weight of 12,000 was employed.

(F$_5$): The solution prepared according to (F2) was spin-coated on the surface of an underlying substrate. Then, the substrate was heated in a nitrogen gas atmosphere (oxygen concentration: 50 ppm or less) for one hour at a temperature of 300° C. by making use of a hot plate, thereby allowing the organosilicon film to crosslink.

(F6): The solution prepared according to (F2) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by an ArF excimer laser beam with an exposure of 200 mJ/cm$^2$, thereby allowing the organosilicon film to crosslink.

(F7): The solution prepared according to (F2) was spin-coated on the surface of an underlying substrate. Then, the surface of the organosilicon film was entirely irradiated by an ArF excimer laser beam with an exposure of 30 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

(F8): 10 g of an organosilicon compound represented by the general formula (1-34) and having a weight average molecular weight of 3,000, 1 g of a crosslinking agent represented by the formula (3-49) and 0.1 g of the radical-generating agent represented by the formula (4-1) were dissolved in 88.99 g of toluene to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(F9): The solution prepared according to (F8) was spin-coated on the surface of an underlying substrate. Then, the substrate was heated for 90 seconds at a temperature of 100° C. by making use of a hot plate to evaporate the solvent and thereby to dry the coated layer. Then, the surface of the organosilicon film was entirely irradiated by an ArF excimer laser beam with an exposure of 80 mJ/cm$^2$, thereby allowing the organosilicon film to crosslink.

(F10): The solution prepared according to (F8) was spin-coated on the surface of an underlying substrate. Then, the surface of the organosilicon film was entirely irradiated by an ArF excimer laser beam with an exposure of 10 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

Then, the glass transition temperature of each of the organosilicon films prepared according to the aforementioned methods (F1) to (F10) was measured, the results being shown in the following Table 6.

Then, the films prepared according to the methods (F1) to (F10) were respectively etched under the etching conditions (P1) to (P4) shown in Example 1 to examine the etching characteristics of these films.

When each of the organosilicon films was observed after the etching treatment with a scanning type electron microscope, the films of (F1) and (F2) were found denatured irrespective of the etching conditions (P1) to (P4), indicating an abnormal etching. Even in the case of the films of (F$_3$) to (F10), a denaturing of film was recognized when they were etched under the conditions of (P1). Furthermore, even if a film having a high glass transition temperature was employed, it was found impossible to normally perform the etching if the etching is performed using a fluorine-based gas.

Whereas, when the etching of the films (F$_3$) to (F10) was performed under the conditions of (P2) to (P4), the denaturing of film was not recognized at all, indicating the normal etching process of the films.

The etching selectivity between the resist and the organosilicon film is shown in the following Table 6.

As shown in Table 6, the etching selectivity of any of the films (F$_3$) to (F10) was approximately not less than 2, indicating a higher etching selectivity as compared with that of the conventional antireflection films. Therefore, it is possible to perform the etching of an organosilicon film without causing a recreding or total loss of the resist pattern even if the film thickness of the resist is reduced.

TABLE 6

| | Glass-transition temperature | Example 6 | | | |
|---|---|---|---|---|---|
| | (° C.) | (P1) | (P2) | (P3) | (P4) |
| (F1) | −23 | Denatured | Denatured | Denatured | Denatured |
| (F2) | −10 | Denatured | Denatured | Denatured | Denatured |
| (F3) | 10 | Denatured | 2.8 (+10 nm) | 1.8 (+15 nm) | 1.9 (+15 nm) |
| (F4) | 60 | Denatured | 3.7 (+12 nm) | 2.0 (+14 nm) | 2.2 (+15 nm) |
| (F5) | 84 | Denatured | 4.4 (+12 nm) | 2.6 (+15 nm) | 2.9 (+15 nm) |
| (F6) | 88 | Denatured | 4.2 (+12 nm) | 3.2 (+15 nm) | 2.9 (+13 nm) |
| (F7) | 87 | Denatured | 4.2 (+12 nm) | 2.8 (+15 nm) | 3.2 (+13 nm) |
| (F8) | 92 | Denatured | 5.2 (+12 nm) | 3.4 (+15 nm) | 3.3 (+13 nm) |
| (F9) | 105 | Denatured | 5.3 (+13 nm) | 3.5 (+15 nm) | 2.8 (+14 nm) |
| (F10) | 133 | Denatured | 6.3 (+14 nm) | 3.9 (+16 nm) | 3.7 (+14 nm) |

EXAMPLE 7

First of all, an organosilicon film containing an organosilicon compound represented by the formula (1-18) was formed on the surface of a silicon wafer by the following methods (G1) to (G10).

(G1): 10 g of an organosilicon compound represented by the general formula (1-18) and having a weight average molecular weight of 1,000 was dissolved in 90 g of toluene to prepare a solution, which was then spin-coated on the surface of an underlying substrate. Then, the substrate was heated for 90 seconds at a temperature of 160° C. by making use of a hot plate to evaporate the solvent and thereby to dry the coated layer, thus forming an organosilicon film.

(G2): In the method of (G1), an organosilicon compound having a weight average molecular weight of 3,000 was employed.

(G3): In the method of (G1), an organosilicon compound having a weight average molecular weight of 6,000 was employed.

(G4): In the method of (G1), an organosilicon compound having a weight average molecular weight of 12,000 was employed.

(G5): The solution prepared according to (G2) was spin-coated on the surface of an underlying substrate. Then, the substrate was heated in a nitrogen gas atmosphere (oxygen concentration: 50 ppm or less) for one hour at a temperature of 300° C. by making use of a hot plate, thereby allowing the organosilicon film to crosslink.

(G6): The solution prepared according to (G2) was spin-coated on the surface of an underlying substrate. Then, the substrate was heated for 90 seconds at a temperature of 160° C. by making use of a hot plate to evaporate the solvent and thereby to dry the coated layer. Then, the surface of the organosilicon film was entirely irradiated by a KrF excimer laser beam with an exposure of 400 mJ/cm$^2$, thereby allowing the organosilicon film to crosslink.

(G7): The solution prepared according to (G2) was spin-coated on the surface of an underlying substrate. Then, the surface of the organosilicon film was entirely irradiated by a KrF excimer laser beam with an exposure of 100 mJ/cm$^2$ while heating it in a nitrogen gas atmosphere (oxygen concentration: 50 ppm or less) for 90 seconds at a temperature of 160° C. by making use of a hot plate, thereby allowing the organosilicon film to crosslink.

(G8): 10 g of an organosilicon compound represented by the general formula (1-18) and having a weight average molecular weight of 3,000, 1 g of a crosslinking agent represented by the formula (3-8) and 0.1 g of the radical-generating agent represented by the formula (4-8) were dissolved in 88.99 g of toluene to prepare a solution, which was then spin-coated on the surface of an underlying substrate. Then, the substrate was heated in a nitrogen gas atmosphere (oxygen concentration: 50 ppm or less) for one hour at a temperature of 180° C. by making use of a hot plate, thereby allowing the organosilicon film to crosslink.

(G9): The solution prepared according to (G8) was spin-coated on the surface of an underlying substrate. Then, the substrate was heated for 90 seconds at a temperature of 100° C. by making use of a hot. plate to evaporate the solvent and thereby to dry the coated layer. Then, the surface of the organosilicon film was entirely irradiated by a KrF excimer laser beam with an exposure of 100 mJ/cm$^2$, thereby allowing the organosilicon film to crosslink.

(G10): The solution prepared according to (G8) was spin-coated on the surface of an underlying substrate. Then, the surface of the organosilicon film was entirely irradiated by a KrF excimer laser beam with an exposure of 10 mJ/cm$^2$ while heating it in a nitrogen gas atmosphere (oxygen concentration: 50 ppm or less) for 90 seconds at a temperature of 180° C. by making use of a hot plate, thereby allowing the organosilicon film to crosslink.

Then, the glass transition temperature of each of the organosilicon films prepared according to the aforementioned methods (G1) to (G10) was measured, the results being shown in the following Table 7.

Then, the films prepared according to the methods (G1) to (G10) were respectively etched under the etching conditions (P5) to (P8) shown in Example 3 to examine the etching characteristics of these films.

When each of the organosilicon films was observed after the etching treatment with a scanning type electron microscope, the films of (G1) and (G2) were found denatured irrespective of the etching conditions (P5) to (P8), indicating an abnormal etching. Even in the case of the films of (G3) to (G10), a denaturing of film was recognized when they were etched under the conditions of (P5). Furthermore, even if a film having a glass transition temperature of 0° C. or more was employed, it was found impossible to normally perform the etching if the etching is performed using a fluorine-based gas.

Whereas, when the etching of the films (G3) to (G10) was performed under the conditions of (P6) to (P8), the denaturing of film was not recognized at all, indicating the normal etching process of the films. The etching selectivity between the resist and the organosilicon film is shown in the following Table 7.

As shown in Table 7, the etching selectivity of any of the films (G3) to (G10) was approximately not less than 2, indicating a higher etching selectivity as compared with that of the conventional antireflection films. Therefore, it is possible to perform the etching of an organosilicon film without causing a receding or total loss of the resist pattern even if the film thickness of the resist is reduced.

TABLE 7

| | Glass-transition temperature (° C.) | Example 7 | | | |
|---|---|---|---|---|---|
| | | (P5) | (P6) | (P7) | (P8) |
| (G1) | −34 | Denatured | Denatured | Denatured | Denatured |
| (G2) | −9 | Denatured | Denatured | Denatured | Denatured |
| (G3) | 4 | Denatured | 2.6 (+12 nm) | 1.4 (+12 nm) | 1.7 (+11 nm) |
| (G4) | 122 | Denatured | 3.4 (+13 nm) | 2.8 (+11 nm) | 2.0 (+12 nm) |
| (G5) | 132 | Denatured | 4.3 (+10 nm) | 2.4 (+9 nm) | 2.7 (+12 nm) |
| (G6) | 138 | Denatured | 3.9 (+13 nm) | 2.9 (+11 nm) | 2.7 (+12 nm) |
| (G7) | 131 | Denatured | 3.6 (+12 nm) | 3.2 (+12 nm) | 3.0 (+12 nm) |
| (G8) | 139 | Denatured | 4.9 (+12 nm) | 3.2 (+12 nm) | 3.1 (+12 nm) |
| (G9) | 142 | Denatured | 5.4 (+11 nm) | 3.2 (+11 nm) | 2.6 (+12 nm) |
| (G10) | 150 | Denatured | 6.1 (+12 nm) | 3.3 (+11 nm) | 3.5 (+12 nm) |

EXAMPLE 8

5 g of polysilane represented by the following formula 14 (n/m=4/1) and having an average molecular weight of 15,000 was dissolved in 95 g of anisole to prepare a solution, which was then spin-coated on the surface of a silicon wafer constituting a work piece. Then, the coated layer was baked for 90 seconds at a temperature of 200° C. to dry the coated layer, thereby obtaining an organosilicon film having a film thickness of 95 nm and a glass-transition temperature of 125° C.

[14]

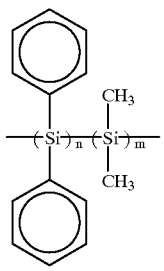

The film thickness of the organosilicon film was determined as follows. Namely, the complex index of refraction at λ=248 nm as measured by means of spectral ellipsometry was n=2.10 and k=0.30. As the values for the complex index of refraction at λ=248 nm of the organosilicon film, resist and silicon substrate, the values shown in Table 8 were adopted thereby to calculate the light reflectance at the interface between the resist and the organosilicon film. Then, based on the light reflectance thus calculated, the coating of the aforementioned solution was performed in such a manner that the film thickness after the baking of the organosilicon film becomes 95 nm, i.e. a minimum point of the reflectance.

TABLE 8

| Complex index of refraction at λ = 248 nm | | |
|---|---|---|
| Materials | n | k |
| Resist | 1.78 | 0.02 |
| Poly-Si | 1.60 | 3.61 |
| SiO$_2$ | 1.52 | 0.02 |
| Carbon | 1.58 | 0.69 |
| Si | 1.50 | 3.42 |

Then, a chemical amplification type resist (APEX-E, Shiplay Co.) was coated on the surface of the organosilicon film, and the resultant resist layer was baked for 120 seconds at a temperature of 98° C. The film thickness of the resist after the baking was 150 nm. Subsequently, the resist was exposed (exposure: 78 mJ/cm$^2$) by making use of a reduced optical type stepper using KrF excimer laser as a light source, and baked for 120 seconds at a temperature of 98° C. Thereafter, the resist was developed for 90 seconds by making use of a 0.21N TMAH developing solution to form a line and space pattern having a line width of 0.18 μm.

When the resist pattern thus obtained was observed, a footing or undercut of resist was not recognized thus indicating an excellent profile of the resist pattern. Furthermore, the film thickness of the resist was varied within the range of from 100 nm to 200 nm to measure the dimension of resist pattern at various film thicknesses. As a result, a difference in dimension due to the standing wave generated in the resist film was found negligible.

Then, the etching of the organosilicon film was performed making use of the resist pattern thus formed. In this etching, a magnetron type RIE apparatus was employed as an etching apparatus, Cl$_2$ gas (flow rate: 80 sccm) was employed as an etching gas, and power density was set to 200 W. As a result, the receding of resist pattern was not recognized at all after the etching of the organosilicon film, and the denaturing of the organosilicon film was not recognized at all, indicating the normal etching process of the film. As a result, the etching was performed with excellent dimension controllability.

EXAMPLE 9

5 g of polysilane represented by the following formula 15 and having an average molecular weight of 17,000 (n/m= 1/1) was dissolved in 92 g of cyclohexanone to prepare a solution for an organosilicon film, which was then spin-coated on the surface of SiO$_2$ film having a thickness of 500 nm and formed in advance on the surface of a silicon substrate by means of sputtering method. Then, the coated layer was baked for 300 seconds at a temperature of 200° C. to dry the coated layer, thereby allowing the organosilicon film to crosslink, and thus obtaining an organosilicon film having a film thickness of 500 nm and a glass-transition temperature of 153° C.

[15]

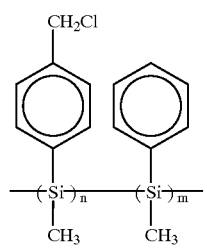

Then, a chemical amplification type resist (UV6, Shiplay Co.) was coated on the surface of the organosilicon film, and the resultant resist layer was baked for 120 seconds at a temperature of 135° C. The film thickness of the resist after the baking was 300 nm. Subsequently, the resist was exposed (exposure: 28 mJ/cm$^2$) by making use of a reduced optical type stepper using KrF excimer laser as a light source, and baked for 120 seconds at a temperature of 135° C. Thereafter, the resist was developed for 90 seconds by making use of a 0.21N TMAH developing solution to form a line and space pattern having a line width of 0.18 $\mu$m.

When the dimension of resist pattern was measured by variously changing the film thickness of the resist pattern, any dimensional change due to the standing wave generated in the resist film was found negligible, thus indicating a sufficient inhibition of light reflection to the resist.

Then, the etching of the organosilicon film was performed making use of the resist pattern thus formed. In this etching, a magnetron type RIE apparatus was employed as an etching apparatus, HBr gas (flow rate: 200 sccm) was employed as an etching gas, and etching was carried out at a condition of power density of 200 W and a substrate temperature of 80° C. As a result, the etching could be performed without causing any receding of resist pattern, and the denaturing of the organosilicon film was not recognized at all, indicating the normal etching process of the film. When a dimensional change after the finish of etching of the organosilicon film is defined by Y−X shown in FIGS. 1D and 1E, the dimensional change was found as small as 0.005 $\mu$m, falling within the acceptable range.

Additionally, the etching of the SiO$_2$ film was performed making use of the organosilicon film thus etched and of the resist pattern left remained on the organosilicon film after the previous etching. In this etching, a magnetron type RIE apparatus was employed as an etching apparatus, a mixed gas comprising CF$_4$ and H$_2$ (flow rate: 20 sccm and 30 sccm respectively) was employed as an etching gas, and power density was set to 0.8 kW. As a result, the etching of SiO$_2$ film could be performed without causing any receding of the organosilicon film pattern. Subsequently, these films were exposed to xylene for 300 seconds, and then subjected to an ashing treatment by making use of an oxygen plasma to remove the resist and the organosilicon film. Thereafter, the surface of the SiO$_2$ film was observed by means of SEM, finding out that the resist and the organosilicon film were removed selectively in relative to the SiO$_2$ film without leaving any residues.

EXAMPLE 10

In this example, source gases listed in the following Table 9 were employed in the etching process of the organosilicon film illustrated in Example 9. A magnetron type RIE apparatus was employed as an etching apparatus in this example.

Table 9 shows the etching conditions and the etching selectivity which enabled to perform the etching of the organosilicon film without causing any receding of the resist pattern. The etching selectivity shown in this Table is defined as being a ratio between the etching rate of the organosilicon film and the etching rate of the resist.

TABLE 9

| Condition for etching | Ratio of source gas flow rate | | | | Excitation power [kW] | Selectivity |
|---|---|---|---|---|---|---|
| | Gas | Flow rate [SCCM] | Gas | Flow rate [SCCM] | | |
| 1 | CCl$_4$ | 200 | | | 0.2 | 4.8 |
| 2 | CCl$_4$ | 400 | He | 10 | 0.3 | 6.2 |
| 3 | CCl$_2$F$_2$ | 300 | | | 0.3 | 5.8 |
| 4 | Cl$_2$ | 300 | O$_2$ | 20 | 0.3 | 6.8 |
| 5 | Cl$_2$ | 200 | CBrF$_3$ | 40 | 0.3 | 4.2 |
| 6 | CBrF$_3$ | 200 | N$_2$ | 20 | 0.15 | 4.8 |
| 7 | CCl$_3$F | 200 | | | 0.3 | 4.8 |
| 8 | CCl$_2$F$_2$ | 500 | | | 0.3 | 6.2 |
| 9 | HBr | 200 | | | 0.3 | 2.9 |

EXAMPLE 11

10 g of an organosilicon compound represented by the formula (1-99) and having an average molecular weight of 18,000 (n/m=1/4) was dissolved in 90 g of anisole to prepare a solution for an organosilicon film, which was then spin-coated on the surface of a silicon wafer constituting a work piece. Then, the coated layer was baked for 90 seconds at a temperature of 160° C. to dry the coated layer, thereby obtaining an organosilicon film having a film thickness of 110 nm and a glass-transition temperature of 145° C.

The complex index of refraction at $\lambda$=248 nm as measured by means of spectral ellipsometry was n=2.10 and k=0.38.

Then, a resist was coated on the surface of the organosilicon film, and a resist pattern was formed in the same manner as explained in Example 8. Any footing or undercut was not recognized in the resultant resist pattern thus obtaining a resist pattern of excellent profile. Furthermore, the film thickness of the resist was varied within the range of from 50 nm to 150 nm to measure the dimension of resist pattern at various film thicknesses. As a result, a dimensional change due to the standing wave generated in the resist film was found negligible.

Then, the etching of the organosilicon film was performed making use of the resist pattern thus formed. This etching was performed in the same manner as illustrated in Example 8 except that a gas mixture of Cl$_2$ (flow rate: 180 sccm) and SF$_6$ (flow rate: 20 sccm) was employed as an etching gas and the power density was set to 200 W. As a result, the receding of resist pattern and the denaturing of the organosilicon film were not recognized at all after the etching of the organosilicon film. As a result, the etching was performed with excellent dimension controllability.

EXAMPLE 12

8 g of poly(phenyl silene) having an average molecular weight of 13,000 and 3 g of poly(phenylmethyl silane) having an average molecular weight of 12,000 were dissolved in 89 g of anisole to prepare a solution for an organosilicon film, which was then spin-coated on the surface of a silicon wafer constituting a work piece. Then, the coated layer was baked for 90 seconds at a temperature of 160° C. to dry the coated layer, thereby obtaining an organosilicon film having a film thickness of 200 nm and a glass-transition temperature of 158° C.

The complex index of refraction at λ=248 nm as measured by means of spectral ellipsometry was n=2.10 and k=0.42.

Then, a resist was coated on the surface of the organosilicon film, and a resist pattern was formed in the same manner as explained in Example 8. Any footing or undercut was not recognized in the resultant resist pattern thus obtaining a resist pattern of excellent profile. Furthermore, the film thickness of the resist was varied within the range of from 50 nm to 150 nm to measure the dimension of resist pattern at various film thicknesses. As a result, a dimensional change due to the standing wave generated in the resist film was found negligible.

Then, the etching of the organosilicon film was performed making use of the resist pattern thus formed. This etching was performed in the same manner as illustrated in Example 8 except that HBr gas (flow rate: 200 sccm) was employed as an etching gas and the power density was set to 150 W. As a result, the receding of resist pattern after the etching of the organosilicon film and the denaturing of the organosilicon film were not recognized at all. As a result, the etching was performed with excellent dimension controllability.

10 g of polysilane represented by the general formula (16) and having a weight average molecular weight of 6,000 was dissolved in 90 g of anisole to prepare a solution, which was then spin-coated on the surface of a silicon substrate. Then, the substrate was heated for 90 seconds at a temperature of 160° C. by making use of a hot plate to evaporate the solvent and thereby to dry the coated layer, thus forming an organosilicon film having a glass transition temperature of –20° C.

Then, the films prepared were respectively etched under the etching conditions (1) to (12) to examine the etching characteristics of these film. As a result, the films were found denatured in a similar manner as in Example 1, irrespective of the etching conditions (P1) to (P12), indicating an abnormal etching.

Organosilicon films were formed using polysilanes having weight-average molecular weight of 500, 1,500, 13,000 and 40,000, respectively, in the same manner as described above. When glass transition temperatures of the films were measured, they were –30° C., –24° C., –20° C. and –12° C. As seen from these results, even if the weight-average molecular weight of the film was altered, a glass transition temperature of 0° C. or more could not be obtained.

Comparative Example 1

When the films were respectively etched under the etching conditions (P1) to (P12) shown in Examples 3 to 7 to examine the etching characteristics of these films, the films were found denatured irrespective of the etching conditions (P1) to (P12), indicating an abnormal etching.

Even if $R^1$, $R^2$ and $R^3$ in the general formula (16) were changed to $C_2H_5$ or $C_3H_8$, a glass transition temperature of the films was less than 0°, and a normal etching could not be performed.

[16]

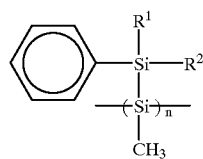

It will be seen from the results of Examples 1 to 12 and Comparative Example 1 that an organosilicon film (or crosslinked organosilicon film) having a glass transition temperature of about 0° C. or more can be etched with high selectivity in relative to the resist without accompanying any denaturing if the etching of the organosilicon film is performed by making use of a gas containing chlorine, bromine or iodine atom. The cause for the denaturing of an organosilicon film into a sponge-like film may be ascribed to the fact that the halogen radicals in the plasma can be easily penetrated into the interior of the organosilicon film thereby to form a silicon halide compound, which is then evaporated from the organosilicon film, thus leaving only the organic components that can be hardly evaporated in the organosilicon film without being etched.

By contrast, in the case of an organosilicon film (including a crosslinked organosilicon film) having a relatively high glass transition temperature, the halogen radicals can be hardly penetrated into the interior of the organosilicon film, so that the organosilicon film is etched from the surface thereof, thus preventing the organosilicon film from being denatured.

The following Examples 13 to 44 illustrate a second embodiment of this invention wherein a silicon-based insulating film was etched by making use of an organosilicon film pattern as an etching mask.

EXAMPLE 13

In this example, an etching resistance of an organosilicon film was examined by performing the etching of a silicone-based insulating film by making use of the organosilicon films illustrated in (A1) to (A10) as an etching mask. First of all, the silicone-based insulating films were formed in the following methods (S1) and (S2). As for the resist and the conventional antireflection film for comparison, the resist formed according to the method of (R1) of Example 1 was employed.

(S1): An $SiO_2$ film was formed on an underlying substrate by means of the LPCVD method.

(S2): An SiN film was formed on an underlying substrate by means of the LPCVD method.

Then, the etching resistivity of the organosilicon films was examined. Namely, the organosilicon films prepared according to the methods (A1) to (A10); the resists and antireflection films prepared according to the methods (R1) to (R4); and the silicon-based insulating films prepared according to the methods (S1) and (S2) were respectively etched by making use of a magnetron type reactive plasma etching apparatus under the following etching conditions (Q1) to (Q6).

(Q1) Etching gas: $CHF_3/CO$ at a flow rate of 45/155 sccm; Exciting power: 700 W; Degree of vacuum: 40 mTorr; and Temperature of substrate: 50° C.

(Q2) Etching gas: $CHF_3/CF_4/O_2$ at a flow rate of 45/155/7 sccm; Exciting power: 700 W; Degree of vacuum: 40 mTorr; and Temperature of substrate: 50° C.

(Q3) Etching gas: $C_4F_8/CO/Ar$ at a flow rate of 12/100/240 sccm; Exciting power: 700 W; Degree of vacuum: 40 mTorr; and Temperature of substrate: 50° C.

(Q4) Etching gas: $CHF_3/CF_4$ at a flow rate of 74/78 sccm; Exciting power: 700 W; Degree of vacuum: 40 mTorr; and Temperature of substrate: 50° C.

(Q5) Etching gas: $CF_4/O_2/Ar$ at a flow rate of 80/20/160 sccm; Exciting power: 800 W; Degree of vacuum: 40 mTorr; and Temperature of substrate: 50° C.

(Q6) Etching gas: $CHF_3/CO/O_2$ at a flow rate of 45/155/10 sccm; Exciting power: 800 W; Degree of vacuum: 40 mTorr; and Temperature of substrate: 50° C.

The etching rate of the films (A1) to (A10); (R1) to (R4); and (S1) and (S2) were measured. Then, the etching selectivity of the SiO$_2$ film in relative to the organosilicon film (the etching rate of the SiO$_2$ film/the etching rate of the organosilicon film) was calculated, the results being shown in the above Table 1. For the purpose of comparison, the etching selectivity of the silicon-based insulating film in relative to the etching mask (the etching rate of the silicon-based insulating film/the etching rate of the etching mask) are shown in the above Table 1.

As shown in Table 1, the etching rate of any of the films (A1) to (A10) was low as compared with that of the conventional etching mask at each etching condition, indicating a higher dry etching resistance of the organosilicon films as compared with that of the etching mask constituted by the conventional resist or antireflection film.

EXAMPLE 14

In this example, an etching resistance of an organosilicon film was examined by performing the etching of a silicone-based insulating film by making use of the organosilicon films illustrated in (B1) to (B10) as an etching mask. First of all, the etching resistance of the organosilicon films were determined in the same manner as explained in Example 13, the results being shown in the above Table 2.

As shown in Table 2, the etching rate of any of the films (B1) to (B10) was low as compared with that of the conventional etching mask (R1) to (R4), indicating a higher dry etching resistance of these organosilicon films as compared with that of the conventional etching mask.

Likewise, etching resistance of the organosilicon films of (C1) to (C10); (D1) to (D10); (E1) to (E10); (F1) to (F10); and (G1) to (G10) were examined by performing the etching of a silicone-based insulating film by making use of these organosilicon films as an etching mask. As a result, as in the case of the organosilicon films of (A1) to (A10) and (B1) to (B10), these organosilicon films were found excellent in dry etching resistance as compared with that of the etching conventional mask.

EXAMPLE 15

In this example, experiments on the etching selectivity of the organosilicon film in relative to the resist, and on the optical constant of the organosilicon film were performed.

First of all, twelve kinds of solutions for forming an organosilicon film were prepared as shown in the following (A) to (L)

(A) 10 g of polysilane having a weight average molecular weight of 1,000 and represented by the following formula (17-1) was dissolved in 90 g of cyclohexanone to obtain a solution.

(B) 10 g of polysilane having a weight average molecular weight of 12,000 and represented by the following formula (17-2) was dissolved in 90 g of cyclohexanone to obtain a solution.

(C) 10 g of polysilane (n/m=1/1) having a weight average molecular weight of 12,000 and represented by the following formula (17-3) was dissolved in 90 g of cyclohexanone to obtain a solution.

(D) 10 g of polysilane (n/m =4/1) having a weight average molecular weight of 13,000 and represented by the following formula (17-4) was dissolved in 90 g of cyclohexanone to obtain a solution.

(E) 10 g of polysilane having a weight average molecular weight of 12,000 and represented by the following formula (17-5) was dissolved in 90 g of xylene to obtain a solution.

(F) 10 g of polysilane having a weight average molecular weight of 12,000 and represented by the following formula (17-6) was dissolved in 90 g of xylene to obtain a solution.

(G) 10 g of polysilane (n/m=1/4) having a weight average molecular weight of 9,000 and represented by the following formula (17-7) was dissolved in 90 g of xylene to obtain a solution.

(H) 10 g of polysilane having a weight average molecular weight of 13,000 and represented by the following formula (17-8) was dissolved in 90 g of xylene to obtain a solution.

(I) 10 g of polysilane having a weight average molecular weight of 16,000 and represented by the following formula (17-9) was dissolved in 90 g of xylene to obtain a solution.

(J) 5 g of polysilene having a weight average molecular weight of 13,000 and represented by the following formula (17-10), and log of polysilane having an average molecular weight of 1,000 and represented by the following formula (17-1) were dissolved in 85 g of xylene to obtain a solution.

(K) 5 g of polysilene (n/m=1/2) having a weight average molecular weight of 12,000 and represented by the following formula (17-11), and 10 g of polysulfone having an average molecular weight of 4,000 were dissolved in 85 g of xylene to obtain a solution.

(L) 10 g of polysilane (n/m=1/1) having a weight average molecular weight of 15,000 and represented by the following formula (17-12) and 1 g of coumarin were dissolved in 89 g of xylene to obtain a solution.

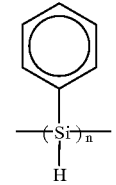

[17-1]

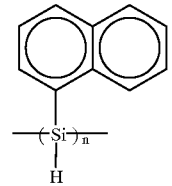

[17-2]

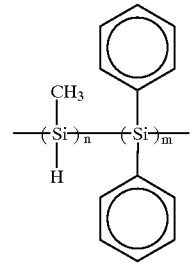

[17-3]

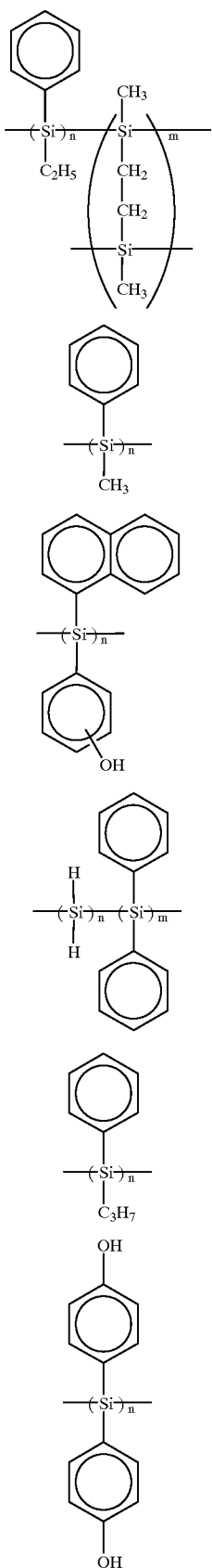

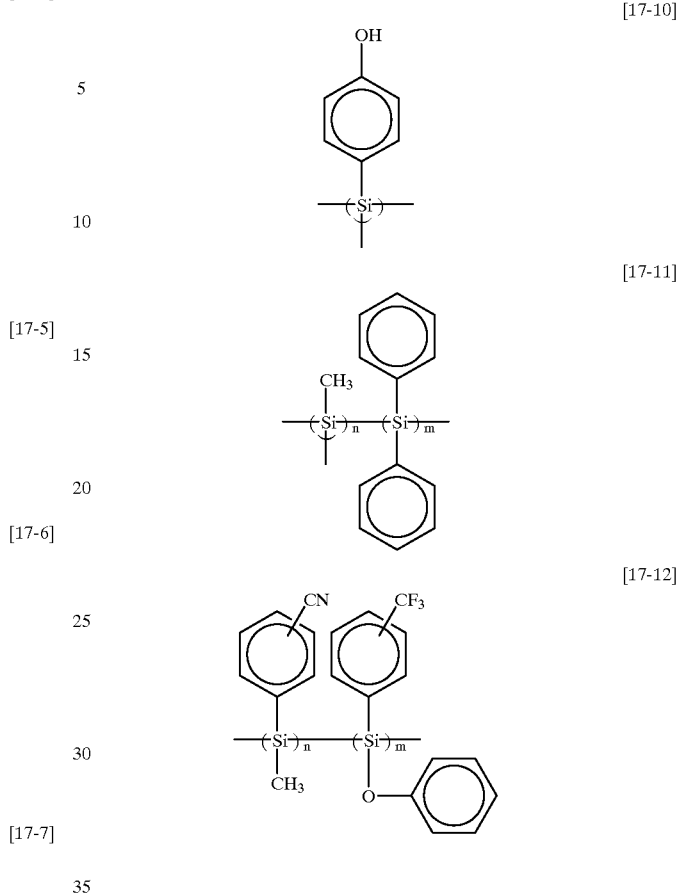

The solutions of (A) to (L) were then spin-coated on the surface of a silicon wafer. Then, the coated layer was baked for 60 seconds at a temperature of 160° C. to form organosilicon films each having a thickness of 500 nm. The glass-transition temperature of the organosilicon film is shown in Table 10. Likewise, a chemical amplification type positive resist comprising polyhydroxystyrene as a resinous component (APEX-E, Shiprey Co.), a chemical amplification type negative resist (SNR2200, Shiprey Co.), and a positive resist comprising novolak resin as a resinous component (IX770, Japan Synthetic Rubber Co.) were respectively coated on the surface of a silicon wafer.

Then, the etching of the films formed from the solutions of (A) to (L) as well as the resist was performed making use of a magnetron type RIE apparatus, and the etching rate of these films and resist were measured. The etching was performed under the conditions: $Cl_2$ gas (flow rate: 200 sccm) was employed as an etching gas, the degree of vacuum was 80 mTorr, and power density was set to 200 W. The results of measurement are shown in the following Table 10.

The complex index of refraction in each of these organosilicon films at wavelength of 248 nm and 193 nm was measured. At the same time, the reflectance of each of these organosilicon films having a thickness of 500 nm was measured at each wavelength by making use of

TABLE 10

| | Glass-transition temperature (° C.) | Etching rate [nm/min] Example 15 | Example 16, Comparative example 4 |
|---|---|---|---|
| Organosilicon film | | | |
| A | 45 | 220 | 10 |
| B | 60 | 160 | 12 |
| C | 125 | 400 | 15 |
| D | 128 | 170 | 11 |
| E | 63 | 182 | 10 |
| F | 103 | 175 | 15 |
| G | 83 | 180 | 16 |
| H | 78 | 170 | 10 |
| I | 105 | 175 | 14 |
| J | 98 | 190 | 14 |
| K | 92 | 190 | 15 |
| L | 78 | 180 | 13 |
| Resist | | | |
| XP89131 | | 40 | 102 |
| APEX-E | | 45 | 108 |
| IX-770 | | 42 | 188 |
| Carbon film | | — | 25 |
| Novolak film | | — | 85 |
| Polysulfone film | | — | 152 |
| Polyimide film | | — | 123 |
| Polysilicon film | | 400 | 15 |
| SiO$_2$ film | | — | 240 |
| SiN film | | — | 225 | an ultraviolet spectrophotometer. Each of the organosilicon film was normally etched without denaturing. The measured results of etching rates are shown in the following Table 11.

TABLE 11

| | Complex index of refraction at 248 nm wavelength | | Reflectance at 248 nm wavelength |
|---|---|---|---|
| | n | k | [%] |
| Organosilicon film | | | |
| A | 2.10 | 0.40 | 2 |
| B | 1.98 | 0.32 | 3 |
| C | 1.92 | 0.35 | 2 |
| D | 2.15 | 0.52 | 2 |
| E | 2.08 | 0.52 | 5 |
| F | 1.82 | 0.48 | 4 |
| G | 2.05 | 0.69 | 5 |
| H | 1.92 | 0.42 | 3 |
| I | 1.98 | 0.35 | 4 |
| J | 1.92 | 0.48 | 2 |
| K | 2.08 | 0.38 | 2 |
| L | 2.15 | 0.28 | 2 |
| | Complex index of refraction at 193 nm wavelength | | Reflectance at 193 nm wavelength |
| | n | k | [%] |
| Organosilicon film | | | |
| A | 1.92 | 0.26 | 3 |
| B | 1.92 | 0.35 | 4 |
| C | 1.88 | 0.37 | 3 |
| D | 2.08 | 0.53 | 3 |
| E | 2.02 | 0.53 | 5 |
| F | 1.92 | 0.51 | 5 |
| G | 2.03 | 0.71 | 5 |
| H | 1.90 | 0.45 | 4 |
| I | 1.92 | 0.38 | 5 |
| J | 1.96 | 0.31 | 3 |
| K | 2.06 | 0.41 | 3 |
| L | 2.13 | 0.31 | 3 |
| | Complex index of refraction at 248 nm wavelength | | Reflectance at 248 nm wavelength |
| | n | k | [%] |
| Resist | | | |
| XP89131 | — | — | — |
| APEX-E | — | — | — |
| IX-770 | — | — | — |
| Carbon film | 1.49 | 0.69 | 6 |
| Novolak film | 1.60 | 3.61 | 5 |
| Polysulfone film | 1.78 | 0.24 | 6 |
| Polyimide film | 1.64 | 0.48 | 6 |
| Polysilicon film | 1.60 | 3.61 | 45 |
| SiO$_2$ film | — | — | — |
| SiN film | — | — | — |
| | Complex index of refraction at 193 nm wavelength | | Reflectance at 193 nm wavelength |
| | n | k | [%] |
| Resist | | | |
| XP89131 | — | — | — |
| APEX-E | — | — | — |
| IX-770 | — | — | — |
| Carbon film | 1.72 | 0.78 | 7 |
| Novolak film | 1.42 | 0.59 | 6 |
| Polysulfone film | 1.35 | 0.62 | 7 |
| Polyimide film | 1.45 | 0.79 | 7 |
| Polysilicon film | 1.32 | 4.02 | 47 |
| SiO$_2$ film | — | — | — |
| SiN film | — | — | — |

It will be seen from Table 10 that the etching rate of the organosilicon films is at least 3.6 times as high as the etching rate of the resist. Therefore, it will be understood that the organosilicon films obtained according to this example can be etched with high etching selectivity by making use of the resist as a mask.

Comparative Example 2

A carbon film, a novolak resin film, a polysufone film and a polyimide film were respectively formed on a silicon wafer. Specifically, the carbon film was formed in an argon gas atmosphere by means of a DC magnetron sputtering method where a graphite sheet was employed as a target. The deposition conditions of carbon film were: the substrate temperature, 250° C.; pressure, $4 \times 10^{-3}$ Torr; power density, 3.5 W/cm$^2$; and the flow rate of argon, 40 sccm.

In the deposition of the novolak resin, a solution comprising novolak resin having a weight average molecular weight of 6,000 and dissolved in ethyl lactate was spin-coated on the silicon wafer, and then baked at a temperature of 320° C. for 180 seconds, thereby obtaining a novolak resin film.

In the deposition of the polysulfone resin, a solution comprising polysulfone resin having a weight average molecular weight of 5,000 and dissolved in cyclohexanone was coated on the silicon wafer, and then baked at a temperature of 220° C. for 90 seconds, thereby obtaining a polysulfone resin film.

The polyimide resin film was formed by coating a solution comprising polyimide resin having a weight average molecular weight of 5,000 and dissolved in cyclohexanone on the silicon wafer, and then by baking the coated layer at a temperature of 220° C. for 90 seconds.

The resist film was formed on a silicon wafer in the same manner as explained in Example 15.

The complex index of refraction in each of these carbon film, novolak resin film, polysufone film and polyimide film at wavelength of 248 nm and 193 nm was measured. At the same time, the reflectance of each of these carbon film, novolak resin film, polysufone film and polyimide film each having a thickness of 500 nm was measured at each wavelength by making use of an ultraviolet spectrophotometer. The measured results are shown in the above Table 11.

It will be seen from Table 11 that the surface reflectance of each of these carbon film, novolak resin film, polysulfone film and polyimide film was 7% or less, indicating an effectiveness of these films as an antireflection film.

Then, the etching of these films were performed making use of a magnetron type RIE apparatus, and the etching rate of these films were measured. The etching was performed under the optimum conditions for these films: $CF_4$ gas (flow rate: 50 sccm), $O_2$ gas (flow rate: 8 sccm) and Ar gas (flow rate: 20 sccm) were employed as a source gas, the degree of vacuum was set to 10 mTorr, and power density was set to 200 W. The results of measurement are shown in the following Table 12.

TABLE 12

|  | Etching rate (nm/min) |
| --- | --- |
| Resist |  |
| XP89131 | 325 |
| APEX-E | 306 |
| IX-770 | 285 |
| Carbon film | 105 |
| Novolak film | 261 |
| Polysulfone film | 395 |
| Polyimide film | 380 |

It will be seen from Table 12 that the etching rate of each of these carbon film, novolak resin film, polysulfone film and polyimide film is respectively 0.37 time, 0.91 time, 1.39 times and 1.33 times the etching rate of the resist exhibiting the highest dry etching resistance. Therefore, the etching selectivity of these films in relative to the resist is insufficient.

As explained above, although any of these carbon film, novolak resin film, polysufone film and polyimide film exhibit an excellent antireflective effect, the etching selectivity of these films in relative to the resist is insufficient so that it is difficult to accurately transcribe the resist pattern to an etching mask for an insulating film by making use of these films.

Comparative Example 3

A polysilicon film was formed on a silicon wafer. Then, the etching of polysilicon film was performed making use of a magnetron type RIE apparatus, and the etching rate of polysilicon film was measured. The etching conditions were the same as explained in Example 15. The results of measurement are shown in the above Table 11.

It will be seen from Table 10 that the etching rate of the polysilicon film is not less than 8.9 time as high as that of the resist.

Further, the complex index of refraction of the polysilicon film at wavelength of 248 nm and 193 nm was measured. At the same time, the reflectance of the polysilicon film having a thickness of 500 nm and formed on the silicon wafer was measured at each wavelength by making use of an ultraviolet spectrophotometer. The measured results are shown in the above Table 11.

It will be seen from Table 11 that the surface reflectance of the polysilicon film was as high as 45% or more, and the side wall of the resist pattern formed on the polysilicon film was corrugated, indicating a difficulty for forming an excellent resist pattern with high dimension controllability.

As explained above, although the polysilicon film exhibits a high etching selectivity in relative to the resist, the surface reflectance thereof is too high to use it as an etching mask for an insulating film.

EXAMPLE 16

In this example, experiments on the etching selectivity of the organosilicon film in relative to a silicon oxide film and to a silicon nitride were performed.

First of all, various kinds of organosilicon films were deposited on a silicon wafer, and at the same time, an $SiO_2$ film and an SiN film were respectively formed on a silicon wafer. Then, the etching of these films was performed making use of a magnetron type RIE apparatus to measure the etching rate of these films. The etching was performed under the conditions: $C_4F_8$ gas (flow rate: 50 sccm), CO gas (flow rate: 10 sccm), Ar gas (flow rate: 100 sccm) and $O_2$ gas (flow rate: 3 sccm) were employed as a source gas, the degree of vacuum was set to 10 mTorr, and power density was set to 800 W. The results of measurement are shown in the above Table 10.

It will be seen from Table 10 that the etching rate of the $SiO_2$ film is at least 15 times as high as the etching rate of the organosilicon film. On the other hand, the etching rate of the SiN film is at least 14 times as high as the etching rate of the organosilicon film.

Comparative Example 4

The etching rates of a resist film, a carbon film, a novolak resin film, a polysulfone film, a polyimide film and a polysilicon film were respectively measured in the same etching conditions as illustrated in Example 16. As for the resist film, three kinds of resist films employed in Example 15 were employed. The measured results are shown in the above Table 10.

It will be seen from Table 10 that the etching rates of both $SiO_2$ film and SiN film are respectively at most 2.7 times and 2.6 times the etching rate of the resist film. Although the carbon film and the polysilicon film exhibited an excellent etching resistivity which is almost equivalent to the organosilicon film to be employed in this invention in the etching of both $SiO_2$ film and SiN film, the employment of carbon film and polysilicon film is accompanied with the same problem as illustrated in Comparative Examples 2 and 3, so that the carbon film as well as the polysilicon film can not be used as an etching mask for the etching of $SiO_2$ film and SiN film.

On the other hand, the novolak resin film, polysufone film and polyimide film exhibit almost the same degree of etching resistance as that of the resist, so that, as compared with the organosilicon film, the employment of these films for the etching of $SiO_2$ film and SiN film is not appropriate. Additionally, since the etching selectivity of these novolak resin film, polysufone film and polyimide film in relative to the resist is insufficient as shown in Comparative Example 2, these films are not suited for use as an etching mask for the etching of SiO₂ film and SiN film.

Therefore, it will be understood from the results shown in Examples 15 and 16, and of Comparative Examples 1 to 3 that the organosilicon film is most suited for use as an etching mask for the etching of SiO₂ film and SiN film. Moreover, since the organosilicon film according to this invention can be formed into a film by making use of a spin coating method, the employment of the organosilicon film as an etching mask is advantageous as compared with the etching mask formed of a polysilicon film or carbon film which can be formed only through the CVD method or sputtering method in that the process cost can be saved and the generation of dust during the formation of a film can be inhibited.

Following Examples 17 to 44 illustrate the etching of an organosilicon film by making use of a resist pattern as an etching mask, wherein an organosilicon compound having a structure represented by the general formula (12) was employed for the organosilicon film.

EXAMPLE 17

As shown in FIG. 1A, an SiO₂ film 2 having a thickness of 500 nm was formed on a silicon wafer 1 by means of the CVD method. Then, a solution which was obtained by dissolving 8 g of polysilane represented by the aforementioned formula (17-1) and having a weight average molecular weight of 1,000, 1.8 g of crosslinking agent represented by the aforementioned formula (3-79), and 0.2 g of trihalomethyl-S-triazine as a radical-generating agent in 90 g of cyclohexanone was spin-coated on the surface of the SiO₂ film 2. Then, the coated layer was baked for 600 seconds at a temperature of 180° C. in a nitrogen atmosphere (oxygen concentration: 50 ppm or less) to effect the crosslinking of the coated layer, thereby obtaining an organosilicon film 3 having a film thickness of 250 nm (FIG. 1B) and a glass-transition temperature of 153° C.

Figure 5:
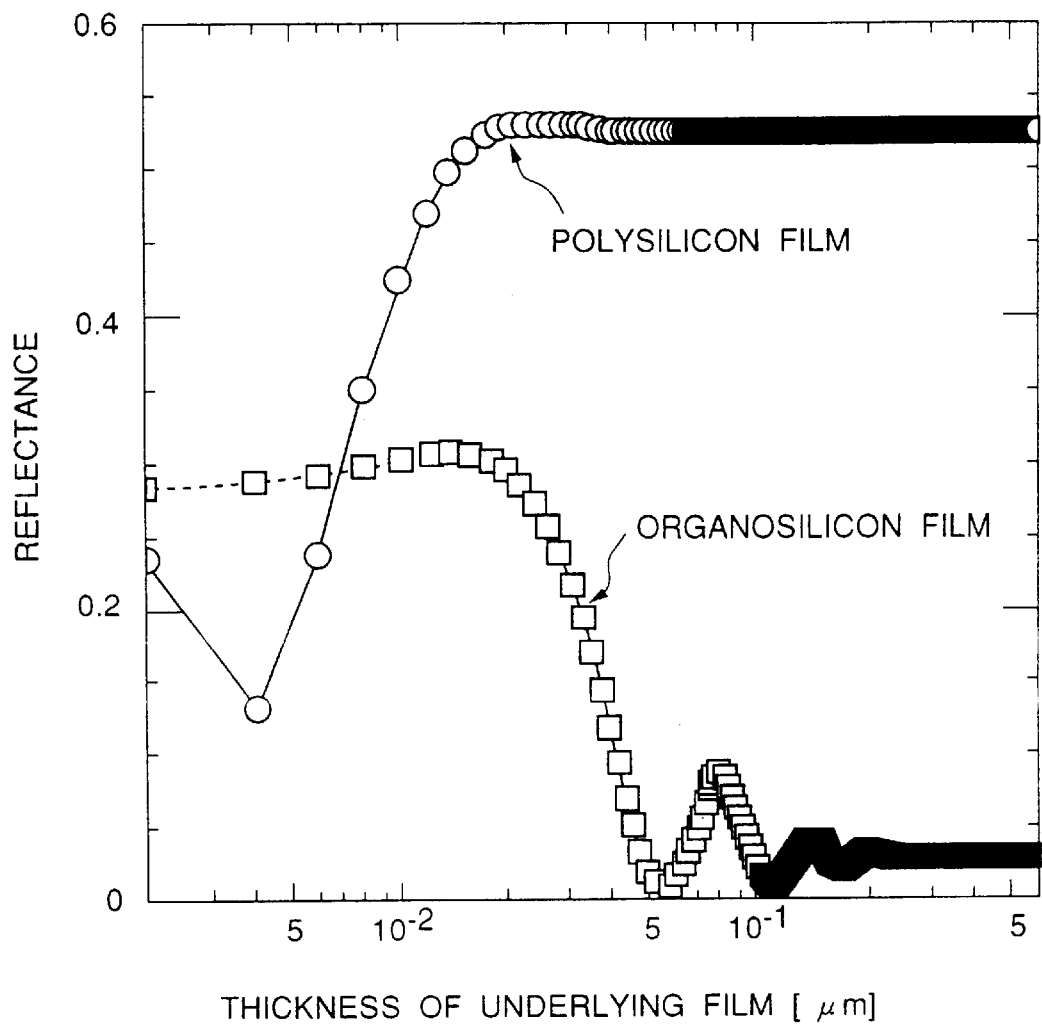
FIG. 5 is a graph showing a result of calculation made on the intensity of light reflectance measured at an interface between a resist and a polysilane film.

The complex index of refraction of the organosilicon film 3 at a wavelength of 248 nm as measured by means of spectral ellipsometry was n=2.10 and k=0.38. Based on these values of complex index of refraction, the reflectance of optical intensity at the interface between the resist and the organosilicon film 3 was calculated for each film thickness of the organosilicon film. The measured results are shown in FIG. 5. The complex index of refraction employed for the calculation at the exposure wavelength was taken up from the values shown in the above Table 8.

It will be seen from FIG. 5 that when the organosilicon film 3 was formed on the surface of the SiO₂ film 2, a return of light from the resist film 4 could be reduced.

Then, the resist 4 was formed on the surface of the organosilicon film 3, and then baked at a temperature of 98° C. for 120 seconds (FIG. 1C), thereby forming the resist film 4 having a thickness of 200 nm. The resist employed in this case was obtained according to the method of (R1) employed in Example 1.

Subsequently, the resist was subjected to a patterning exposure (30 mJ/cm²) by making use of a reduced optical type stepper using KrF excimer laser as a light source, and then baked for 120 seconds at a temperature of 98° C. Thereafter, the resist was developed by making use of a 0.21N TMAH developing solution to form a line and space pattern 5 having a line width of 0.18 μm (FIG. 1D).

When the profile of the resist pattern thus obtained was observed by means of the SEM, any footing or undercut was not recognized in the resultant resist pattern thus obtaining a resist pattern of excellent profile, and a corrugation due to a standing-wave was not recognized on the side wall of the resist pattern.

Figure 6:
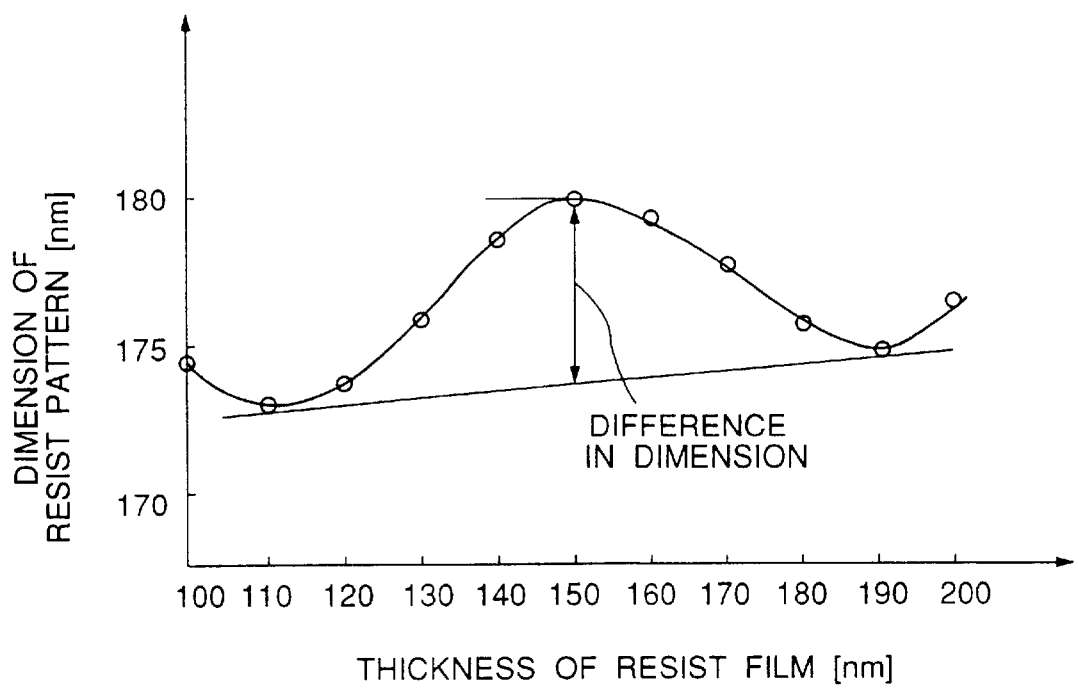
FIG. 6 is a graph showing a relationship between the film thickness of a resist pattern and the dimension of the resist pattern.

Furthermore, the film thickness of the resist was varied within the range of from 100 nm to 200 nm to measure the dimension of resist pattern at various film thicknesses. The results are shown in FIG. 6. Additionally, the film thickness of the SiO₂ film 2 was varied within the range of from 450 nm to 550 nm to measure the dimension of resist pattern 5 at various film thicknesses. The results are shown in FIG. 7.

Figure 7:
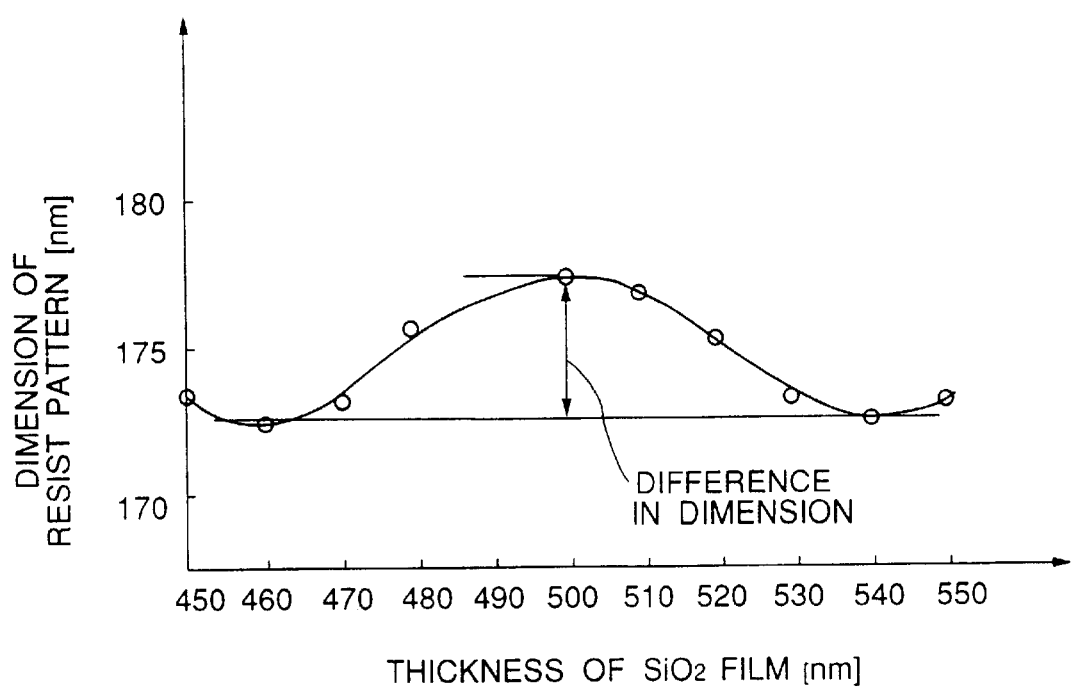
FIG. 7 is a graph showing a relationship between the film thickness of $SiO_2$ film and the dimension of a resist pattern.

If a difference in dimension due to a multiple reflection generated in the resist film and SiO₂ film is defined as shown in FIGS. 6 and 7, a difference in dimension due to a multiple reflection generated in the resist film was 6 nm, while a difference in dimension due to a multiple reflection generated in the SiO₂ film was 5 nm, both falling below the acceptable upper limit of 9 nm. Accordingly, since the organosilicon film functioned as an antireflection film, a resist pattern which was excellent in dimension controllability was obtained without being substantially influenced by a variation in film thickness of the resist or SiO₂ film.

Then, the etching of the organosilicon film was performed using the resist pattern thus formed as an etching mask and employing a magnetron type RIE apparatus as shown in FIG. 1E. The etching was performed under the conditions: Cl₂ gas (flow rate: 200 sccm) was employed as an etching gas, the degree of vacuum was set to 30 mTorr, and power density was set to 300 W. As a result, it was possible to perform the etching without generating a receding of the resist pattern.

When the processed shape of the organosilicon film was examined, the organosilicon film was found as being etched vertically and excellent in anisotropy. If the dimension of organosilicon film pattern after etching is defined by the bottom of the pattern, i.e. "Y" shown in FIG. 1E, a dimensional change (=Y-X) that had been caused to generate by the etching of the organosilicon film was -2 nm, indicating an excellent etching of the organosilicon film with little discrepancy from the shape before etching of resist pattern.

Then, as shown in FIG. 1F, the etching of the SiO₂ film was performed using both patterned organosilicon film and resist pattern that had been left on the organosilicon film as an etching mask and employing a magnetron type reactive ion etching apparatus. The etching was performed under the conditions: C₄F₈ gas (flow rate: 30 sccm) and O₂ gas (flow rate: 3 sccm) were employed as a source gas, the degree of vacuum was set to 30 mTorr, and power density was set to 800 W. As a result, it was possible to perform the etching of SiO₂ film without generating a receding of the organosilicon film pattern.

When the SiO₂ film was etched as illustrated above, a dimensional change (=Z-X) that had been caused to generate by the etching of the organosilicon film and the SiO₂ film was -5 nm, falling well within the acceptable range of -9 nm to +9 nm and indicating an excellent transcription of the resist pattern to the SiO₂ film, thus accomplishing the processing of the SiO₂ film.

When the etching rate of the resist pattern and organosilicon film, both being in a state of solid, was measured under the aforementioned etching conditions, the etching rate of the resist film was 25 nm/min and the etching rate of the organosilicon film was 165 nm/min, i.e. the etching rate of the organosilicon film was 6.6 times as fast as that of the resist film.

These results show that the organosilicon film could be anistoropically etched with an excellent dimension controllability without thinning of the resist pattern.

When the etching rate of the resist film, organosilicon film and SiO$_2$ film, all being in a state of solid, was measured under the aforementioned etching conditions and in the same manner as illustrated in Example 15, the etching rate of the resist film was 72 nm/min, the etching rate of the organosilicon film was 9 nm/min and the etching rate of the SiO$_2$ film was 230 nm/min, i.e. the etching rate of the SiO$_2$ film was 25.6 times as fast as that of the organosilicon film and 3.3 times as fast as that of the resist film. It is clear from these results that the organosilicon film which was more excellent in dry-etching resistance than the resist functioned as an etching mask at the occasion of etching the SiO$_2$ film.

It is assumed that, because of these etching rates, it was possible to perform the etching of the SiO$_2$ film without generating a difference in dimension from the original resist pattern before etching, while assuring vertical etching and excellent anisotropy.

EXAMPLE 18

In the procedures of Example 17, after the SiO$_2$ film was processed, the resist and the organosilicon film used as an etching mask were successively removed by making use of a down-flow etching apparatus. When the etching was performed under the conditions where O$_2$ gas (flow rate: 20 sccm) was employed as a source gas, the degree of vacuum was set to 8 mTorr, and the power density was set to 200 W, the resist was completely removed.

When the infrared absorption spectrum of the organosilicon was measured after the removal of the resist, an absorption by the Si—O—Si bond was observed at 1,000 to 1200 cm$^{-1}$, indicating the glassification (oxidation) of the organosilicon due to the exposure thereof to an oxygen plasma.

Then, the organosilicon thus glassified (oxidized) was immersed in a dilute solution of hydrofluoric acid comprising a mixture of hydrofluoric acid and water (1:500) for 90 seconds, it was possible to selectively remove the glassified organosilicon film from the SiO$_2$ film.

EXAMPLE 19

In the procedures of Example 17, after the SiO$_2$ film was processed, the resist and the organosilicon film used as an etching mask were successively removed by making use of a down-flow etching apparatus. When the etching was performed under the conditions where O$_2$ gas (flow rate: 20 sccm) was employed as a source gas, the degree of vacuum was set to 8 mTorr, and the power density was set to 200 W, the resist was completely removed.

Although the organosilicon was glassified by the exposure thereof to an oxygen plasma, it was possible to selectively etch away the organosilicon without erasing the silicon oxide film by performing the etching under the conditions where CF$_4$ gas (flow rate: 30 sccm) was employed as an etching gas, the degree of vacuum was set to 35 mTorr, and the power density was set to 800 W.

Comparative Example 5

In the same manner as illustrated in Example 17, an SiO$_2$ film having a thickness of 500 nm was formed on a silicon wafer. Then, a carbon film having a sufficient film thickness, i.e. 200 nm that is required for etching the SiO$_2$ film was coated on the surface of the SiO$_2$ film. Furthermore a resist was coated on the carbon film, and the resultant body was baked for 120 seconds at a temperature of 98° C. The film thickness of the resist at this moment was 200 nm. The resist employed in this case was the one that was obtained by the method of (R1) employed in Example 1.

Subsequently, in the same manner as illustrated in Example 17, the resist was subjected to the processes of exposure and development to form a line and space pattern having a line width of 0.18 μm. Since the carbon film was high in absorbency at the wavelength of 248 nm, the reflection of light from the underlying films could be suppressed, thus making it possible to obtain a resist pattern which was excellent in profile and in dimension controllability.

Further, since the resist film was made thin, the focus margin at an optimum exposure energy was 0.7 μm. Thus, the value exceeding 0.6 μm, which is necessary for the device manufacture, could be obtained.

The etching of the carbon film was performed using the resist pattern thus formed as an etching mask and under the same conditions as illustrated in Comparative Example 2. However, the resist pattern was faded out during the etching of the carbon film so that it was impossible to perform the etching of the SiO$_2$ film.

When the etching rate of the resist film and carbon film, both being in a state of solid, was measured in the same manner as illustrated in Comparative Example 2, the etching rate of the resist film was 185 nm/min and the etching rate of the carbon film was 65 nm/min, i.e. the etching rate of the carbon film was only 0.35 time as low as that of the resist film, indicating insufficiency in etching selectivity of the carbon film in relative to the resist film. It is assumed, because of this insufficient selectivity between the resist film and the carbon film, that the resist pattern was disintegrated and faded out during the etching process of the carbon film.

Comparative Example 6

An SiO$_2$ film having a thickness of 500 nm was formed on a silicon wafer. Then, a carbon film having a thickness of 200 nm was coated on the surface of the SiO$_2$ film. Furthermore a resist was coated on the carbon film and baked for 120 seconds at a temperature of 98° C. The film thickness of the resist thus obtained was 700 nm. The resist employed in this case was the one that was obtained by the method of (R1) employed in Example 1.

Subsequently, in the same manner as illustrated in Example 17, the resist was subjected to the processes of exposure and development to form a line and space pattern having a line width of 0.18 μm.

Figure 8:
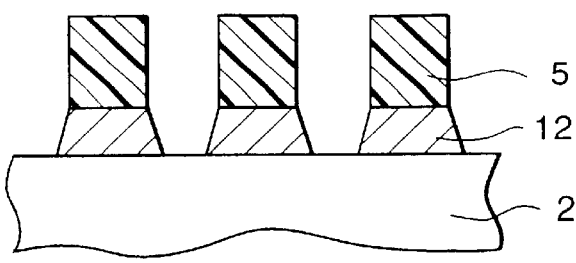
FIG. 8 is a cross-sectional view showing a processed shape of a carbon film pattern obtained according to a comparative example.

Then, the etching of the carbon film was performed using the resist pattern thus formed as a mask and under the same conditions as illustrated in Comparative Example 2. However, although it was possible to perform the etching of the carbon film, the processed shape of the carbon film 12 was tapered as shown in FIG. 8, thus failing to perform an anisotropic etching of the carbon film.

This may be attributed to a receding of the resist pattern during the etching of the carbon film due to an insufficient etching selectivity of the carbon film in relative to the resist film as in the case of Comparative Example 5.

Furthermore, since the thickness of the resist film was as thick as 700 nm in this comparative example, the focus margin at an optimum exposure was as narrow as 0.3 μm, thus failing to obtain a focus margin of 0.6 μm which is required in the manufacture of the device.

Comparative Example 7

Figure 9A:
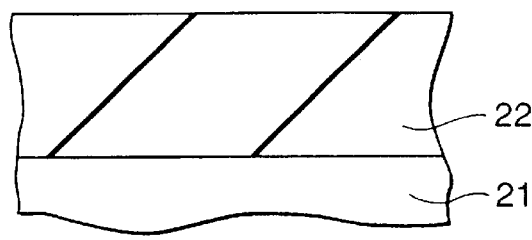
FIGS. 9A to 9F illustrate cross-sectional views sequentially showing the process of forming a pattern according to one comparative example.
Figure 9B:
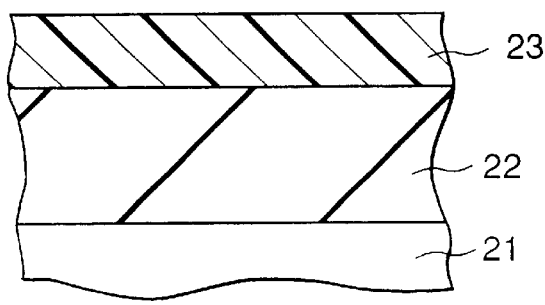

As shown in FIG. 9A, an SiO$_2$ film 22 having a thickness of 500 nm was formed on a silicon wafer 21. Then, a solution which was prepared by dissolving polysulfone having an average molecular weight of 6,000 in cyclohexanone was spin-coated on the surface of $SiO_2$ film 22. Then, the coated layer was baked for 90 seconds at a temperature of 225° C. to dry the coated layer, thereby obtaining an antireflection film 23 as shown in FIG. 9B.

The thickness of the antireflection film 23 thus obtained was 115 nm, which was determined by calculating the reflectance of optical intensity at the interface between the resist and the antireflection film 23, and by selecting a film thickness which exhibited a minimum reflectance. By the way, the complex index of refraction of the antireflection film 23 at a wavelength of 248 nm was n=1.74 and k=0.24.

Figure 9C:
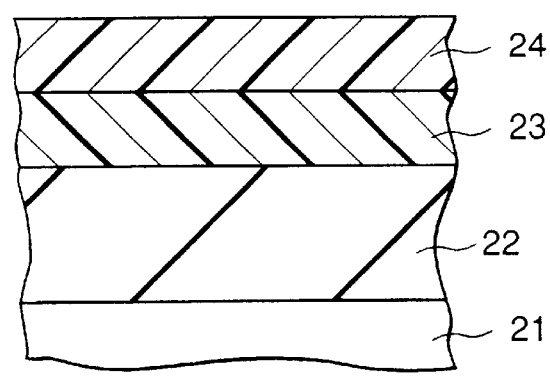

Then, a resist was coated on the surface of the antireflection film 23 and baked for 120 seconds at a temperature of 98° C. to form a resist film 24 as shown in FIG. 9C. The film thickness of the resist film 24 thus obtained was 300 nm. The resist employed in this case was the one that was obtained by the method of (R1) employed in Example 1.

Subsequently, in the same manner as illustrated in Example 17, the resist was subjected to the processes of exposure and development to form a line and space pattern 24 having a line width of 0.18 μm.

Figure 9D:
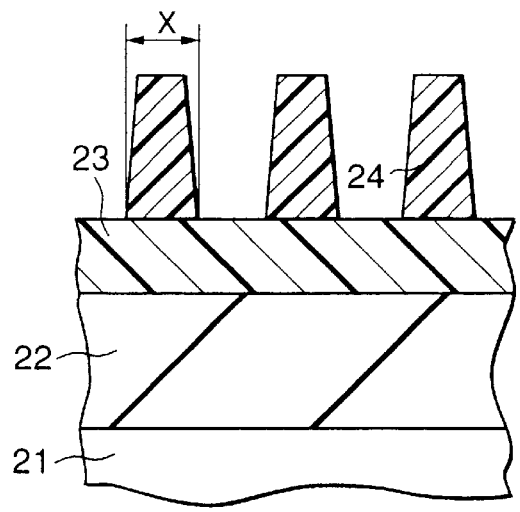
Figure 9E:
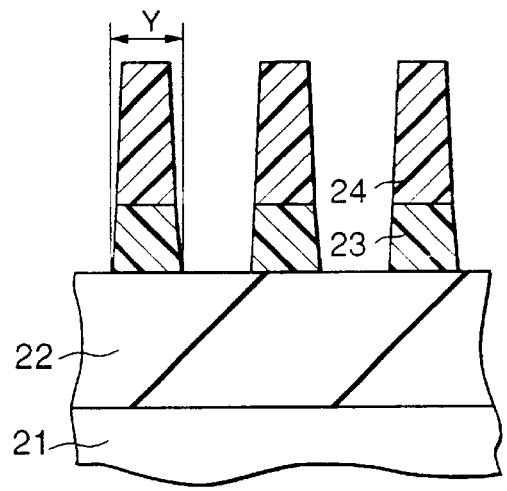

Then, as shown in FIG. 9E, the etching of the antireflection film 23 was performed making use of the resist pattern 24 thus formed as an etching mask and in the same conditions as illustrated in Comparative Example 2. When the etching rate of the antireflection film 23 was measured making use of the solid film thereof, the etching rate thereof was found to be 200 nm/min, which was faster than that of the carbon film. Moreover, since the thickness of the antireflection film 23 was thinner than that of the carbon film, the degree of tapering of the antireflection film 23 was not so prominent as that of the carbon film. The dimensional change (=Y−X) generated in the etching of the antireflection film was −12 nm, which is larger than that obtained using an organosilicon film. This may be attributed to the receding of the resist pattern during the etching of the antireflection film due to an insufficient etching selectivity of the resist film in relative to the antireflection film.

Subsequently, the etching of the $SiO_2$ film was performed under the same etching condition as shown in Example 17. A dimensional change that had been caused to generate by the etching of the $SiO_2$ film (=Z−Y) was −20 nm, while a dimensional change that had been caused to generate by the etching of the antireflection film and $SiO_2$ film (=Z−X) was −23 nm, falling out of the acceptable range of −9 nm to +9 nm.

Moreover, the processed shape of the $SiO_2$ film 22 was tapered as shown in FIG. 9, thus failing to perform a vertical etching with excellent anisotropy. When the etching rate of the antireflection film 23 during the etching of the $SiO_2$ film 22 was measured making use of the solid film thereof, the etching rate thereof was 152 nm/min, i.e. lower in dry etching resistance than that of the resist film. It is assumed that, because of this insufficient dry etching resistance, the resist pattern 24 and the antireflection film pattern 23 were receded and the dimension of the pattern of the $SiO_2$ film 22 was caused to become thinner and tapered in etched cross-section.

It will be clear from the comparison with this comparative example that since the organosilicon film functions as an etching mask excellent in dry etching resistance for the $SiO_2$ film according to this invention, it is possible to perform the etching of the $SiO_2$ film in perpendicular to the surface thereof, with an excellent anisotropy and without failing to match with the dimension before etching of resist pattern.

EXAMPLE 20

As shown in FIG. 1A, an $SiO_2$ film 2 having a thickness of 500 nm was formed on a silicon wafer 1. Then, as shown in FIG. 1B, an organosilicon film 3 having a thickness of 100 nm was formed on the $SiO_2$ film 2 by the methods (A1) to (A10) illustrated in Example 1. Then, a resist 4 having a thickness of 200 nm was formed on the organosilicon film 3 by means of the method (Ri) shown in Example 1 as shown in FIG. 1C. Next, the resist 4 was subjected to a patterning exposure by making use of a reduced optical type stepper using KrF excimer laser as a light source, and then baked for 90 seconds at a temperature of 110° C. Thereafter, as shown in FIG. 1D, the resist was developed by making use of a 0.21N TMAH developing solution to form a line and space pattern 5 having a line width of 0.18 μm. The film thickness of the resist pattern 5 obtained after this development was found to be 180 nm.

When the profile of the resist pattern thus obtained was observed by means of the SEM, a corrugation due to a standing-wave in the resist film was not recognized even in any of the organosilicon film, indicating an excellent resist profile. Any footing or undercut was not recognized in the resultant resist pattern thus obtaining a resist pattern of excellent profile. The focus margin at an optimum light exposure (18 mJ/cm$^2$) in this occasion was found as being 0.8 μm.

Then, the resist pattern 5 was transcribed onto the organosilicon film 3. An etching was then performed using a magnetron type reactive etching apparatus as an etching apparatus under the conditions of (P1) to (P4). The determination of the etching time was made by detecting the terminal point by the emission of light, thus performing a 50% over-etching exceeding over the just time. As a result, it was found that when the etching of the organosilicon films (A1) and (A2) was performed, a swelling of the organosilicon films was admitted in any of the conditions (P1) to (P4), failing to achieve a desired anisotropic etching. Whereas, in the case of the etching of the organosilicon films (A3) to (A10), a swelling of the organosilicon films was admitted under the condition of (P1). It is assumed that the cause of these phenomena may be ascribed to the denaturing of these organosilicon films into a sponge-like structure by the effect of etching.

With respect to the cases where the aforementioned swelling was not recognized, a dimensional change that was brought about by the etching of each organosilicon film was measured as shown in the above Table 1, wherein the measurement was performed by defining the dimension of resist pattern prior to the etching as being "X" as shown in FIG. 1D and defining the dimension of the organosilicon film pattern in subsequent to the etching as being "Y" as shown in FIG. 1E, and then by calculating the difference (=Y−X). As seen from Table 1, when the etching of the organosilicon films (A3) to (A10) was performed under the conditions of (P2) to (P4), it was possible to obtain an excellent organosilicon film pattern, the dimension of which was almost identical with that of the original resist pattern (prior to etching).

Then, as shown in FIG. 1E, the organosilicon film etched under the condition of (P2) and the resist pattern were employed as an etching mask to perform the etching of the $SiO_2$ film. Etching was performed under the same condition as (Q1) in Example 13. A magnetron type reactive etching apparatus was employed as an etching apparatus, and the determination of the etching time was made by detecting the terminal point by the emission of light, thus performing a 50% over-etching exceeding over the just time. The dimension of $SiO_2$ film pattern in subsequent to the etching was defined as being "Z" as shown in FIG. 1F and a dimensional change (=Z−Y) that was brought about by the etching of $SiO_2$ film was measured, the results being shown in Table 1.

When a dimensional change (=Z−X) that was brought about by the etching of the organosilicon film and of the $SiO_2$ film was calculated, the difference was found to fall within the acceptable range of −9 nm to +9 nm, thus accomplishing the processing of the $SiO_2$ film with excellent dimension controllability.

Comparative Example 8

This comparative example illustrates experiments where the antireflection films which were prepared according to the methods (R2) to (R4) shown in Example 1 were employed.

As shown in FIG. 9A, an $SiO_2$ film 22 having a thickness of 500 nm was formed on a silicon wafer 21.

Then, as shown in FIG. 9B, antireflection films 23 having a thickness of 100 nm were formed on the $SiO_2$ film 22 by the methods (R2) to (R4) illustrated in Example 1. Then, a resist 24 having a thickness of 150 nm was formed on the antireflection film 23 by the method (R1) shown in Example 1 as shown in FIG. 9C. Next, the resist 24 was subjected to a patterning exposure by making use of a reduced optical type stepper using KrF excimer laser as a light source, and then baked for 90 seconds at a temperature of 110° C. by making use of a hot plate.

Thereafter, as shown in FIG. 9D, the resist was developed by making use of a 0.21N TMAH developing solution to form a line and space pattern having a line width of 0.18 μm. The film thickness of the resist pattern obtained after this development was found to be 180 nm. When the profile of the resist pattern thus obtained was observed by means of the SEM, a corrugation due to a standing-wave in the resist film was not recognized even in any of the antireflection film, indicating an excellent resist profile.

Then, the etching of the organosilicon films 23 was performed making use of an RIE apparatus and $CF_4/O_2/Ar$ (flow rate: 20/60/80 sccm) as a source gas, and under the conditions: 800 W in power density, 40 mTorr in degree of vacuum and 60° C. in substrate temperature. The etching rate of the resist and antireflection film, and the etching selectivity of the antireflection film in relative to the resist (the etching rate of the organosilicon film/the etching rate of the resist) are shown in the following Table 13. The etching rate in this case was measured by using a solid film as in the case of Example 1.

TABLE 13

| Film | Resist R1 | Antireflection film R2 | R3 | R4 |
| --- | --- | --- | --- | --- |
| Etching rate (nm/min.) | 982 | 820 | 890 | 780 |
| Selectivity | — | 0.84 | 0.91 | 0.79 |
| Dimensional change | — | −12 nm | −13 nm | −12 nm |

The determination of the etching time was made by detecting the terminal point by the emission of light, thus performing a 50% over-etching exceeding over the just time. As a result, almost all of the resist pattern was faded out and the shape of the organosilicon film obtained was tapered as shown in FIG. 8.

Comparative Example 9

This comparative example illustrates experiments where the etching of the antireflection films prepared according to the methods (R2) to (R4) was performed by thickening the resist film.

As shown in FIG. 9C, a resist 24 having a thickness of 300 nm was formed on each of the antireflective coatings by the method (R1) shown in Example 1. Next, the resist 24 was subjected to a patterning exposure by making use of a reduced optical type stepper using KrF excimer laser as a light source, and then baked for 90 seconds at a temperature of 110° C. by making use of a hot plate.

Thereafter, as shown in FIG. 9D, the resist was developed by making use of a 0.21N TMAH developing solution to form a line and space pattern having a line width of 0.18 μm. The film thickness of the resist pattern obtained after this development was found to be 280 nm.

When the profile of the resist pattern thus obtained was observed by means of the SEM, a corrugation due to a standing-wave in the resist film was not recognized even in any of the antireflection film, indicating an excellent resist profile. However, the focus margin at an optimum exposure (19 mJ/cm²) was 0.3 μm, which was far less than the acceptable value of 0.6 μm. This may be ascribed to the fact that since the film thickness of the resist is relatively thick, the resolution was deteriorated.

Then, the etching of the antireflection film was performed in the same manner as illustrated in Comparative Example 8. As a result, it was possible to perform the etching of the antireflection film without a receding of the resist pattern. The dimensional change that was brought about by the etching of the antireflection film 23 (=Y−X) is shown in the above Table 13. The etching conditions for the antireflection film were more suited as compared with the etching conditions of (P1) to (P12) for anisotropically etching the ordinary resin film constituted by carbon, hydrogen and oxygen. However, the degree of dimensional change was relatively large as compared with the case of the organosilicon film to be employed in this invention. The reason for this may be ascribed to the fact that due to an insufficient etching selectivity between the resist and the antireflection film, the resist pattern was caused to recede in the etching of the antireflection film.

Figure 9F:
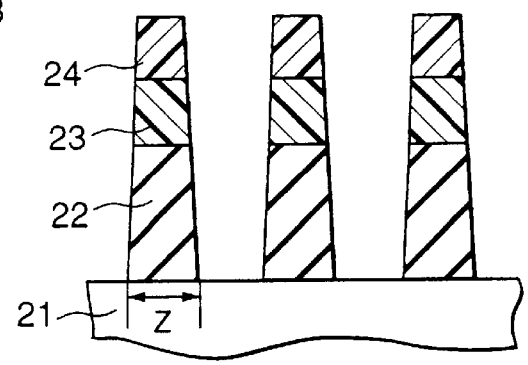

Then, as shown in FIG. 9F, the resist pattern and the antireflection film pattern were employed as an etching mask to perform the etching of the $SiO_2$ film. The etching conditions were the same as shown in (Q1) to (Q6) illustrated in Example 13. The dimensional change (=Z−Y) that was brought about by the etching of the $SiO_2$ film was calculated, the results being shown in the above Table 1.

As seen from Table 1, it was found that the dimensional change to be brought about in the employment of the organosilicon film according to this invention was smaller than that of the example where the conventional antireflection film was employed, and the $SiO_2$ film was etched under the condition of (Q1). This may be ascribed to the fact that since the resistivity of the organosilicon film as an etching mask is excellent, the organosilicon film pattern can be hardly receded during the etching of the $SiO_2$ film.

EXAMPLE 21

As shown in FIG. 1A, an $SiO_2$ film having a thickness of 500 nm was formed on a silicon wafer. Then, as shown in FIG. 1B, an organosilicon film having a thickness of 100 nm was formed on each $SiO_2$ film by the methods (B3) to (B10) illustrated in Example 2. Then, a resist having a thickness of 200 nm was formed on the organosilicon film by means of the method (R1) shown in Example 1 as shown in FIG. 1C. Next, the resist was subjected to a patterned exposure by making use of an electron beam (50 keV in accelerating voltage) as a light source, and then baked for 90 seconds at a temperature of 110° C. In this case, the patterned exposure was performed while irradiating the g-beam (436 nm) of mercury lamp through the resist to the organosilicon film so as to provide the organosilicon film with photoconductivity.

Then, as shown in FIG. 1D, the resist was developed by making use of a 0.21N TMAH developing solution to form a line and space pattern having a line width of 0.18 μm. The film thickness of the resist pattern obtained after this development was found to be 180 nm. Since ultraviolet rays were irradiated during the patterned exposure, a photoconductivity was brought about in the organosilicon film, so that it was possible in all of the organosilicon films to form a resist pattern which was free from any dislocation of pattern to be resulted from charge-up. Any footing or undercut was not recognized in the resultant resist pattern thus obtaining a resist pattern of excellent profile.

Then, the resist pattern was transcribed onto the organosilicon film as shown in FIG. 1E. Then, the etching of films (B3) to (B10) was then performed in the same manner as illustrated in Example 20 under the conditions of (P2) to (P4). As a result, a swelling of the organosilicon films was not admitted, thus accomplishing an excellent anisotropic etching. A dimensional change that was brought about by the etching of each organosilicon film was then measured, the results being shown in the above Table 2. As seen from Table 2, since the etching selectivity of the organosilicon film according to this invention in relative to the resist is high, it is possible according to the organosilicon film to be employed in this invention to perform the etching with excellent dimension controllability as compared with where the conventional antireflection film is etched in Comparative Example 9.

Then, as shown in FIG. 1F, the antireflection film pattern obtained by the etching under the condition of (P3) and the resist pattern were employed as an etching mask to perform the etching of the SiO$_2$ film under the condition of (Q2) shown in Example 13. Then, a dimensional change (=Z–Y) that was brought about by the etching of the SiO$_2$ film was calculated, the results being shown in the above Table 2. It will be clear from Table 2 that, as compared with Comparative Example 9 where a conventional antireflection film was employed and the SiO$_2$ film was etched under the condition of (Q2), the dimensional change that was brought about by the etching of the SiO$_2$ film in this example was much smaller. Furthermore, the dimensional change (=Z–X) that was brought about by the etching of the organosilicon film and of the SiO$_2$ film was found to fall within the acceptable range of –9 nm to +9 nm, thus accomplishing the processing of the SiO$_2$ film with excellent dimension controllability.

EXAMPLE 22

As shown in FIG. 1A, an SiO$_2$ film having a thickness of 500 nm was formed on a silicon wafer. Then, as shown in FIG. 1B, an organosilicon film having a thickness of 100 nm was formed on the SiO$_2$ film by the methods (C1) to (C10) illustrated in Example 3. Then, as in the same manner as described in Example 20, a resist pattern was formed on the organosilicon film, thus forming a line and space pattern having a line width of 0.18 μm as shown in FIG. 1D. The film thickness of the resist pattern obtained after the development was found to be 180 nm.

When the profile of the resist pattern thus obtained was observed by means of the SEM, a corrugation due to a standing-wave in the resist film was not recognized even in any of the organosilicon film, indicating an excellent resist profile. Any footing or undercut was not recognized in the resultant resist pattern thus obtaining a resist pattern of excellent profile.

Then, the resist pattern was transcribed onto the organosilicon film as shown in FIG. 1E under the etching conditions of (P6) to (P8) described in Example 3. Namely, when the etching of films (C3) to (C10) was performed in the same manner as illustrated in Example 20 under the conditions of (P6) to (P8), a swelling of the organosilicon films was not admitted, thus accomplishing an excellent anisotropic etching. A dimensional change that was brought about by the etching of each organosilicon film was then measured, the results being shown in the above Table 3. As seen from Table 3, since the etching selectivity of the organosilicon film according to this invention in relative to the resist is high, it is possible, according to the organosilicon film to be employed in this invention, to perform the etching with excellent dimension controllability as compared with where the conventional antireflection film is etched in Comparative Example 9.

Then, as shown in FIG. 1F, the organosilicon film pattern formed under the condition of (P7) and the resist pattern were employed as etching masks to perform the etching of the SiO$_2$ film under the condition of (Q3) shown in Example 13. As a result, it was found that, as compared with Comparative Example 9 where a conventional antireflection film was etched under the condition of (Q3), the dimensional change that was brought about by the etching of the SiO$_2$ film in this example was much smaller. Furthermore, when the dimensional change (=Z–X) that was brought about by the etching of the organosilicon film and of the SiO$_2$ film was calculated, it was found to fall within the acceptable range of –9 nm to +9 nm, thus accomplishing the processing of the SiO$_2$ film with excellent dimension controllability.

EXAMPLE 23

As shown in FIG. 1A, an SiO$_2$ film having a thickness of 500 nm was formed on a silicon wafer. Then, as shown in FIG. 1B, an organosilicon film having a thickness of 100 nm was formed on the SiO$_2$ film by the methods (D1) to (D10) illustrated in Example 4. Then, as in the same manner as described in Example 20, a resist pattern was formed on the organosilicon film, thus forming a line and space pattern having a line width of 0.18 μm as shown in FIG. 1C. The film thickness of the resist pattern obtained after the development was found to be 180 nm.

When the profile of the resist pattern thus obtained was observed by means of the SEM, a corrugation due to a standing-wave in the resist film was not recognized even in any of the organosilicon film, indicating an excellent resist profile. Any footing or undercut was not recognized in the resultant resist pattern thus obtaining a resist pattern of excellent profile.

Then, the resist pattern was transcribed onto the organosilicon film under the etching conditions of (P5) to (P8) described in Example 3. Namely, when the etching of films (D3) to (D10) was performed in the same manner as illustrated in Example 20 under the conditions of (P6) to (P8), a swelling of the organosilicon films was not admitted, thus accomplishing an excellent anisotropic etching. A dimensional change that was brought about by the etching of each organosilicon film was then measured, the results being shown in the above Table 4. As seen from Table 4, since the etching selectivity of the organosilicon film according to this invention in relative to the resist is high, it is possible, according to the organosilicon film to be employed in this invention, to perform the etching with excellent dimension controllability as compared with where the conventional antireflection film is etched in Comparative Example 9.

Then, the resist pattern on the organosilicon film which was subjected to the etching treatment under the condition of (P6) was removed by means of oxygen plasma. Furthermore, the $SiO_2$ film was etched using the organosilicon film as an etching mask under the etching condition (Q4) of Example 13. As a result, it was found, as in the case of Example 20, that, as compared with Comparative Example 9 where a conventional antireflection film was etched under the condition of (Q4), the dimensional change that was brought about by the etching of the $SiO_2$ film in this example was much smaller. Furthermore, when the dimensional change that was brought about by the etching of the organosilicon film and of the $SiO_2$ film was calculated, it was found to fall within the acceptable range of −9 nm to +9 nm, thus accomplishing the processing of the $SiO_2$ film with excellent dimension controllability.

EXAMPLE 24

As shown in FIG. 1A, an $SiO_2$ film having a thickness of 500 nm was formed on a silicon wafer. Then, as shown in FIG. 1B, an organosilicon film having a thickness of 100 nm was formed on the $SiO_2$ film by the methods (E1) to (E10) illustrated in Example 5. Then, as in the same manner as described in Example 20, a resist pattern was formed on the organosilicon film, thus forming a line and space pattern having a line width of 0.18 μm as shown in FIG. 1D. The film thickness of the resist pattern obtained after the development was found to be 180 nm.

When the profile of the resist pattern thus obtained was observed by means of the SEM, a corrugation due to a standing-wave in the resist film was not recognized even in any of the organosilicon film, indicating an excellent resist profile. Any footing or undercut was not recognized in the resultant resist pattern thus obtaining a resist pattern of excellent profile.

Then, as shown in FIG. 1E, the resist pattern was transcribed onto the organosilicon film under the etching conditions of (P9) to (P12) described in Example 3. Namely, when the etching of films (E3) to (E10) was performed under the conditions of (P10) to (P12), a swelling of the organosilicon films was not admitted, thus accomplishing an excellent anisotropic etching. A dimensional change that was brought about by the etching of each organosilicon film was then measured, the results being shown in the above Table 5. As seen from Table 5, since the etching selectivity of the organosilicon film according to this invention in relative to the resist is high, it is possible, according to the organosilicon film to be employed in this invention, to perform the etching with excellent dimension controllability as compared with where the conventional antireflection film is etched in Comparative Example 9.

Then, as shown in FIG. 1F, the organosilicon film pattern formed under the condition of (P12) and the resist pattern were employed as an etching mask to perform the etching of the $SiO_2$ film under the condition of (Q3) shown in Example 13. As a result, it was found that, as compared with Comparative Example 9 where the $SiO_2$ film was etched using a conventional an antireflection film under the condition of (Q3), the dimensional change that was brought about by the etching of the $SiO_2$ film in this example was much smaller. Furthermore, when the dimensional change that was brought about by the etching of the organosilicon film and of the $SiO_2$ film was calculated in the same manner as illustrated in Example 20, it was found to fall within the acceptable range of −9 nm to +9 nm, thus accomplishing the processing of the $SiO_2$ film with excellent dimension controllability.

EXAMPLE 25

This example illustrates an embodiment where an organosilicon film containing an organosilicon compound having a structure other than the general formula 12 was employed.

As shown in FIG. 1A, an $SiO_2$ film having a thickness of 500 nm was formed on a silicon wafer. Then, as shown in FIG. 1B, an organosilicon film having a thickness of 100 nm was formed on the $SiO_2$ film by the methods (F1) to (F10) illustrated in Example 6. Then, as in the same manner as described in Example 20, a resist pattern was formed on the organosilicon film, thus forming a line and space pattern having a line width of 0.30 μm as shown in FIG. 1C. The film thickness of the resist pattern obtained after the development was found to be 180 nm.

When the profile of the resist pattern thus obtained was observed by means of the SEM, a corrugation due to a standing-wave in the resist film was not recognized even in any of the organosilicon film, indicating an excellent resist profile. Any footing or undercut was not recognized in the resultant resist pattern thus obtaining a resist pattern of excellent profile.

An etching was then performed using a magnetron type reactive etching apparatus as an etching apparatus under the conditions of (P1) to (P4) shown in Example 1. The determination of the etching time was made by detecting the terminal point by the emission of light, thus performing a 50% over-etching exceeding over the just time. As a result, it was found that when the etching of the organosilicon films (F1) and (F2) was performed, a swelling of the organosilicon films was admitted in any of the conditions (P1) to (P4), failing to achieve a desired anisotropic etching. Whereas, in the case of the etching of the organosilicon films ($F_3$) to (F10), a swelling of the organosilicon films was admitted under the condition of (P1). It is assumed that the cause of these phenomena may be ascribed to the denaturing of these organosilicon films into a sponge-like structure by the effect of etching.

When the organosilicon films ($F_3$) to (F10) were subjected to the etching under the conditions of (P2) to (P4), it was possible to perform the etching without denaturing the organosilicon films into a sponge-like structure thereby forming an organosilicon film pattern. Then, a dimensional change that was brought about by the etching of each organosilicon film was measured as shown in the above Table 6, wherein the measurement was performed by defining the dimension of resist pattern prior to the etching as being "X" as shown in FIG. 1D and defining the dimension of the organosilicon film pattern in subsequent to the etching as being "Y" as shown in FIG. 1E, and then by calculating the dimensional (=Y−X).

As seen from Table 6, the dimension of the organosilicon pattern was enlarged after the etching. This may be ascribed to the materials that were produced at the occasion of etching the organosilicon film and adhered onto the side wall of the resist pattern and the organosilicon pattern to thicken the resist pattern and the organosilicon pattern.

Then, as shown in FIG. 1F, the organosilicon film pattern formed under the condition of (P2) and resist pattern were employed as etching masks to perform the etching of the $SiO_2$ film. This etching was performed using a magnetron type reactive etching apparatus as an etching apparatus under the conditions of (Q6) shown in Example 13.

When a dimensional change (=Z–X) that was brought about by the etching of the organosilicon film and $SiO_2$ film was calculated, the dimensional change was found to fall within the acceptable range of –9 nm to +9 nm in the etching of the organosilicon film which was performed under any of the conditions (P1) to (P4), thus indicating an accurate transcription of the resist pattern onto the $SiO_2$ film.

EXAMPLE 26

This example also illustrates an embodiment where an organosilicon film containing an organosilicon compound having a structure other than the general formula 12 was employed.

As shown in FIG. 1A, an $SiO_2$ film having a thickness of 500 nm was formed on a silicon wafer. Then, as shown in FIG. 1B, an organosilicon film having a thickness of 100 nm was formed on the $SiO_2$ film by the methods (G1) to (G10) illustrated in Example 7. Then, as in the same manner as described in Example 20, a resist pattern was formed on the organosilicon film, thus forming a line and space pattern having a line width of 0.35 μm as shown in FIG. 1C. The film thickness of the resist pattern obtained after the development was found to be 180 nm.

When the profile of the resist pattern thus obtained was observed by means of the SEM, a corrugation due to a standing-wave in the resist film was not recognized even in any of the organosilicon film, indicating an excellent resist profile. Any footing or undercut was not recognized in the resultant resist pattern thus obtaining a resist pattern of excellent profile.

Then, the resist pattern was transcribed to the organosilicon film. Namely, an etching was performed using a magnetron type reactive etching apparatus as an etching apparatus under the conditions of (P5) to (P8) shown in Example 3. The determination of the etching time was made by detecting the terminal point by the emission of light, thus performing a 50% over-etching exceeding over the just time. As a result, it was found that when the etching of the organosilicon films (G1) and (G2) was performed, a swelling of the organosilicon films was admitted in any of the conditions (P5) to (P8), failing to achieve a desired anisotropic etching.

Whereas, in the case of the etching of the organosilicon films (G3) to (G10), a swelling of the organosilicon films was admitted under the condition of (P5). It is assumed that, as would be clear from Example 1, the cause of these phenomena may be ascribed to the denaturing of these organosilicon films into a sponge-like structure by the effect of etching.

When the organosilicon films (G3) to (G10) were subjected to the etching under the conditions of (P6) to (P8), it was possible to perform the etching without denaturing the organosilicon films into a sponge-like structure thereby forming an organosilicon film pattern. Then, a dimensional change that was brought about by the etching of each organosilicon film was measured as shown in the above Table 7, wherein the measurement was performed by defining the dimension of resist pattern prior to the etching as being "X" as shown in FIG. 1D and defining the dimension of the organosilicon film pattern in subsequent to the etching as being "Y" as shown in FIG. 1E, and then by calculating the difference (=Y–X).

As seen from Table 7, the dimension of the organosilicon pattern was enlarged after the etching. This may be ascribed to the materials that were produced at the occasion of etching the organosilicon film and adhered onto the side wall of the resist pattern and the organosilicon film pattern to thicken the resist pattern and the organosilicon pattern.

Then, as shown in FIG. 1F, the resist pattern and the organosilicon film pattern formed under the condition of (P7) were employed as etching mask to perform the etching of the $SiO_2$ film under the conditions of (Q1) shown in Example 13. This etching was performed using a magnetron type reactive etching apparatus as an etching apparatus. It was found as a result that the dimensional change that was brought about by the etching of the $SiO_2$ film according to this invention smaller than that brought about by the etching of the conventional antireflection film of Comparative Example 9 under the condition (Q1). Then, a dimensional change that was brought about by the etching of the organosilicon film and $SiO_2$ film (=Z–X) was measured. As a result, the dimensional change was found to fall within the acceptable range of –15 nm to +15 nm in the etching of the organosilicon film which was performed under any of the conditions (P6) to (P8), thus indicating an accurate transcription of the resist pattern onto the $SiO_2$ film.

In Examples 20 to 25, when the organosilicon film containing an organosilicon compound represented by the general formula 12 was etched, a thickening of the resist pattern was not admitted. The reason for this phenomenon that the thickening of the resist pattern can be inhibited when an organosilicon compound represented by the general formula 12 is etched with an etching gas containing at least one kind of atom selected from chlorine, bromine and iodine atom may be ascribed to the fact that the products evaporated from the organosilicon compound during the etching thereof can be hardly readhered onto the side wall of the resist pattern and the organosilicon film pattern. Therefore, it is preferable in this invention to employ an organosilicon film containing an organosilicon compound represented by the general formula 12. However, in the case where the dimension of the pattern is relatively large so that the thickening of the resist pattern may be disregarded, it is not necessarily required to employ the compound represented by the general formula 12.

Then, as shown in FIG. 1F, the organosilicon film pattern formed under the condition of (P2) and resist pattern were employed as etching masks to perform the etching of the $SiO_2$ film. This etching was performed using a magnetron type reactive etching apparatus as an etching apparatus under the conditions of (Q6) shown in Example 13.

When a dimensional change (=Z–X) that was brought about by the etching of the organosilicon film and $SiO_2$ film was calculated, the dimensional change was found to fall within the acceptable range of –9 nm to +9 nm in the etching of the organosilicon film which was performed under any of the conditions (P1) to (P4), thus indicating an accurate transcription of the resist pattern onto the $SiO_2$ film.

EXAMPLE 27

8 g of polysilane represented by the following formula 14 and having a weight average molecular weight of 8,000 was dissolved in 92 g of anisole to prepare a solution for an organosilicon film, which was then spin-coated on the surface of an $SiO_2$ film having a thickness of 500 nm and coated on a silicon wafer by means of sputtering. Then, the coated layer was baked for 90 seconds at a temperature of 150° C. to dry the coated layer, thereby obtaining an organosilicon film having a film thickness of 500 nm and a glass-transition temperature of 125° C.

Then, a chemical amplification type resist formed by ($R^1$) in Example 1 was coated on the surface of the organosilicon film, and the resultant resist layer was baked for 120 seconds at a temperature of 98° C. The film thickness of the resist after the baking was 500 nm. Subsequently, the resist was exposed (exposure: 18 mJ/cm$^2$) by making use of a reduced optical type stepper using KrF excimer laser as a light source, and baked for 120 seconds at a temperature of 98° C. Thereafter, the resist was developed for 90 seconds by making use of a 0.21N TMAH developing solution to form a line and space pattern having a line width of 0.25 μm.

When the dimension of resist pattern was measured by variously changing the film thickness of the resist pattern, any difference in dimension due to the standing wave generated in the resist film was found negligible, thus indicating a sufficient inhibition of light reflection to the resist. Any footing or undercut was not recognized in the resultant resist pattern thus obtaining a resist pattern of excellent profile.

Then, the etching of the organosilicon film was performed making use of the resist pattern thus formed. In this etching, a magnetron type RIE apparatus was employed as an etching apparatus, HBr gas (flow rate: 200 sccm) was employed as an etching gas, and power density was set to 0.4 kW. As a result, the etching could be performed without causing any receding of resist pattern. When a dimensional change after the finish of etching of the organosilicon film is defined by "(Y)–(X)" shown in FIG. 1, the dimensional change was found as small as –0.005 μm, falling within the acceptable range.

Additionally, the etching of the SiO$_2$ film was performed making use of the organosilicon film thus etched and of the resist pattern left remained on the organosilicon film after the previous etching. In this etching, a magnetron type RIE apparatus was employed as an etching apparatus. Table 14 shows the etching conditions which enabled the etching with an optimum selectivity. Table 14 also shows this optimum selectivity and the gases employed in the etching.

TABLE 14

| Condition for etching | Ratio of source gas flow rate | | | | Excitation power [kW] | Selectivity |
|---|---|---|---|---|---|---|
| | Gas | Flow rate [SCCM] | Gas | Flow rate [SCCM] | | |
| 1 | CF$_4$ | 20 | H$_2$ | 30 | 0.8 | 1.3 |
| 2 | CHF$_3$ | 15 | | | 0.8 | 1.6 |
| 3 | CHF$_3$ | 40 | O$_2$ | 5 | 0.8 | 1.4 |
| 4 | CHF$_3$ | 40 | CO$_2$ | 10 | 1.2 | 1.8 |
| 5 | C$_2$F$_6$ | 20 | | | 0.8 | 2.5 |
| 6 | C$_3$F$_8$ | 30 | | | 1.2 | 3.5 |
| 7 | C$_4$F$_{10}$ | 20 | | | 0.8 | 4 |

As seen from Table 14, when the etching was performed under the conditions where C$_4$F$_{10}$ (flow rate: 20 sccm) was employed as a source gas and a power density of 0.7 kW was employed, the etching selectivity could be increased as high as 4.

EXAMPLE 28

This example illustrate the etching of an SiO$_2$ film, which was performed under the etching conditions which enabled the etching with an optimum selectivity as shown in Example 27. Since the selectivity was 4 under these etching conditions, it was possible to make the film thickness of the organosilicon film functioning as an etching mask thinner than that of the previous example. First of all, a solution of the organosilicon film was coated on an SiO$_2$ film and baked for 90 seconds at a temperature of 150° C. to dry the coated layer in the same manner as in Example 27, thereby obtaining an organosilicon film having a film thickness of 150 nm as measured after the baking.

Then, a resist pattern was formed on the organosilicon film in the same manner as in Example 27. When the dimension of resist pattern was measured by variously changing the film thickness of the resist pattern, any difference in dimension due to the standing wave generated in the resist film was found negligible, thus indicating a sufficient inhibition of light reflection to the resist. Any footing or undercut was not recognized in the resultant resist pattern thus obtaining a resist pattern of excellent profile.

Then, the etching of the organosilicon film was performed in the same etching conditions as illustrated in Example 25. Since the film thickness of the organosilicon film was made thinner in this example, the dimensional change in the organosilicon film pattern after the finish of the etching could be reduced to 0.002 μm. Furthermore, when the etching of an SiO$_2$ film was performed using the organosilicon film as an etching mask under the condition (7) shown in Table 14, an SiO$_2$ film pattern of desired dimension was obtained by the etching.

Comparative Example 10

10 g of polysulfone having a weight average molecular weight of 8,000 was dissolved in 90 g of cyclohexanone to prepare a solution for an antireflection film, which was then spin-coated on the surface of an SiO$_2$ film. Then, the coated layer was baked for 90 seconds at a temperature of 220° C. to dry the coated layer, thereby obtaining an antireflection film having a film thickness of 100 nm.

Then, in the same manner as described in Example 27, a resist pattern was formed and the etching of the antireflection film was performed making use of the resist pattern. In this etching, a magnetron type RIE apparatus was employed as an etching apparatus, a gas mixture comprising CF$_4$ and O$_2$ (flow rate: 680 sccm/20 sccm) was employed as an etching gas, and a power density of 0.4 kW was employed. As a result, the etching of the antireflection film could be performed without causing totally loss of resist pattern.

Additionally, the etching of the SiO$_2$ film was performed making use of the organosilicon film thus etched. In this etching, a magnetron type RIE apparatus was employed as an etching apparatus, and various kinds of source gas, such as (CF$_4$, H$_2$), (CHF$_3$), (CHF$_3$, O$_2$), (CHF$_3$, CO$_2$), (C$_2$F$_6$), (C$_3$F$_8$) and (C$_4$F$_{10}$) were employed, while changing the power density and flow rate of gas. As a result, the etching was performed with causing a receding of the antireflection film, and hence it was impossible to obtain a desired dimension of pattern in all samples.

EXAMPLE 29

As shown in FIG. 1A, an SiN film having a thickness of 500 nm was formed on a silicon wafer 1 by means of the LPCVD method. Then, a solution which was obtained by dissolving 8 g of polysilane represented by the aforementioned formula (17-1) and having a weight average molecular weight of 1,500, 1.8 g of a crosslinking agent represented by the formula (3-82) and 0.2 g of compound represented by the formula (4-25) as a radical-generating agent in 90 g of anisole was spin-coated on the surface of the SiN film 2. Then, the coated layer was baked for 10 minutes at a temperature of 180° C. to effect crosslinking of polysilane, thereby obtaining an organosilicon film 3 having a film thickness of 250 nm and a glass-transition temperature of 183° C. (FIG. 1B).

The complex index of refraction of the organosilicon film 3 at a wavelength of 248 nm as measured by means of spectral ellipsometry was n=2.03 and k=0.42.

Then, a chemical amplification type positive resist (trade name: TDUR-P007, Tokyo Ohka Kougyo Co.) was coated on the surface of the organosilicon film 3, and then baked at a temperature of 98° C. for 120 seconds (FIG. 1C), thereby forming the resist film 4 having a thickness of 250 nm.

Subsequently, the resist was subjected to a patterned exposure (30 mJ/cm$^2$) by making use of a reduced optical type stepper using KrF excimer laser as a light source, and then baked for 120 seconds at a temperature of 98° C. Thereafter, the resist was developed by making use of a 0.21N TMAH developing solution to form a line and space pattern having a line width of 0.18 μm (FIG. 1D). The resist pattern thus obtained was 230 nm in film thickness.

When the profile of the resist pattern thus obtained was observed by means of the SEM, a corrugation due to a standing-wave was not recognized on the side wall of the resist pattern. Any footing or undercut was not recognized in the resultant resist pattern thus obtaining a resist pattern of excellent profile.

Then, the etching of the organosilicon film was performed using the resist pattern thus formed as a mask and employing a magnetron type RIE apparatus as shown in FIG. 1E. The etching was performed under the conditions: a gas mixture of HBr gas (flow rate: 20 sccm) and Cl$_2$ gas (flow rate: 180 sccm) was employed as an etching gas, the degree of vacuum was set to 30 mTorr, and power density was set to 300 W. As a result, it was possible to perform the etching without a receding of the resist pattern.

When the processed shape of the organosilicon film was examined, the organosilicon film was found as being etched vertically and excellent in anisotropy. The film thickness of the resist left remained after the etching was 100 nm. When the etching rate of the resist pattern and organosilicon film, both being in a state of solid, was measured, the etching rate of the resist film was 25 nm/min and the etching rate of the organosilicon film was 95 nm/min, i.e. the etching rate of the organosilicon film was 3.8 times as fast as that of the resist film.

Then, as shown in FIG. 1F, the etching of the SiN film was performed using both patterned organosilicon film and resist pattern that had been left on the organosilicon film as etching masks and employing a magnetron type reactive ion etching apparatus. The etching was performed under the conditions: C$_4$F$_8$ gas (flow rate: 30 sccm), Ar gas (flow rate: 160 sccm) and Co gas (flow rate: 140 sccm) were employed as a source gas, the degree of vacuum was set to 30 mTorr, and power density was set to 350 W. As a result, it was possible to perform the etching of silicon nitride film without generating a receding of the organosilicon film pattern.

When the processed shape of the SiN film was examined, the SiN film was found as being etched vertically and excellent in anisotropy. When the etching rate of the resist film, organosilicon film and SiN film, all being in a state of solid, was measured under the same manner as illustrated in Example 15, the etching rate of the resist film was 45 nm/min, the etching rate of the organosilicon film was 17 nm/min and the etching rate of the SiN film was 230 nm/min, i.e. the etching rate of the SiN film was 13.5 times as fast as that of the organosilicon film and 5.1 times as fast as that of the resist film. It is clear from these results that the organosilicon film which was more excellent in dry-etching resistance than the resist functioned as an etching mask at the occasion of etching the SiN film.

It is assumed that, because of these etching rates, it was possible to perform the etching of the SiN film without generating a difference in dimension from the original resist pattern before etching, while assuring vertical etching and excellent anisotropy.

EXAMPLE 30

As shown in FIG. 1A, an SiO$_2$ film 2 having a thickness of 500 nm was formed on a silicon wafer 1 by means of the LPCVD method. Then, a solution which was obtained by dissolving 10 g of poly(phenyl silene) and having a weight average molecular weight of 8,900 in 90 g of xylene was coated on the surface of the SiO$_2$ film 2. Then, the coated layer was baked for 120 seconds at a temperature of 160° C. to dry the coated layer. The film thickness of the organosilicon film 3 thus obtained was 250 nm and the complex index of refraction thereof at a wavelength of 248 nm was n=1.92 and k=0.48 (FIG. 1B). The glass-transition temperature of the organosilicon film was 98° C.

Then, a chemical amplification type positive resist 4 (trade name: TDUR-P007, Tokyo Ohka Kougyo Co.) was coated on the surface of the organosilicon film 3, and then baked at a temperature of 98° C. for 120 seconds (FIG. 1C), thereby forming the resist film 4 having a thickness of 150 nm.

Subsequently, the resist was subjected to a patterning exposure (30 mJ/cm$^2$) by making use of a reduced optical type stepper using KrF excimer laser as a light source, and then baked for 120 seconds at a temperature of 98° C. Thereafter, the resist was developed by making use of a 0.21N TMAH developing solution to form a resist pattern 4 consisting of a line and space pattern having a line width of 0.18 μm (FIG. 1D). The resist pattern 4 thus obtained was 130 nm in film thickness.

When the profile of the resist pattern 4 was observed by means of the SEM, a corrugation due to a standing-wave was not recognized on the side wall of the resist pattern 4. Any footing or undercut was not recognized in the resultant resist pattern thus obtaining a resist pattern of excellent profile.

Then, the etching of the organosilicon film 3 was performed using the resist pattern 4 thus formed as an etching mask and employing a magnetron type RIE apparatus. The etching was performed under the conditions: Cl$_2$ gas (flow rate: 200 sccm) was employed as an etching gas, the degree of vacuum was set to 25 mTorr, and power density was set to 200 W. As a result, it was possible to perform the etching without generating a receding of the resist pattern 4.

When the processed shape of the organosilicon film was examined, the organosilicon film was found as being etched vertically and excellent in anisotropy. The film thickness of the resist left remained after the etching was 80 nm. When the etching rate of the resist pattern and organosilicon film, both being in a state of solid, was measured, the etching rate of the resist film was 23 nm/min and the etching rate of the organosilicon film was 210 nm/min, i.e. the etching rate of the organosilicn film was 9.1 times as fast as that of the resist film.

Then, as shown in FIG. 2C, the removal of the resist pattern and the etching of the SiO$_2$ film were successively performed employing a magnetron type reactive ion etching apparatus (RIE). The removal of the resist pattern was performed under the conditions: O$_2$ gas (flow rate: 20 sccm) was employed as a source gas, the degree of vacuum was set to 30 mTorr, and the power density was set to 200 W.

Then, the etching of SiO$_2$ film was performed in the same chamber but changing the etching conditions, i.e. under the conditions: $CHF_3$ gas (flow rate: 30 sccm), CO gas (flow rate: 100 sccm) and Ar gas (flow rate: 100 sccm) were employed as source gases, the degree of vacuum was set to 15 mTorr, and power density was set to 280 W. As a result, it was possible to perform the etching of $SiO_2$ film without generating a receding of the organosilicon film.

When the processed shape of the $SiO_2$ film was examined, the $SiO_2$ film was found as being etched vertically and excellent in anisotropy without generating a difference in dimension from the original resist pattern before etching.

When the etching rate of the resist film, organosilicon film and $SiO_2$ film, all being in a state of solid, was measured, the etching rate of the resist film was 56 nm/min, the etching rate of the organosilicon film was 20 nm/min and the etching rate of the $SiO_2$ film was 368 nm/min, i.e. the etching rate of the $SiO_2$ film was 18.4 times as fast as that of the organosilicon film. It is clear from these results that the organosilicon film which was more excellent in dry-etching resistance than the resist functioned as an etching mask at the occasion of etching the $SiO_2$ film.

It is assumed that, because of these etching rates, it was possible to perform the etching of the $SiO_2$ film without generating a difference in dimension from the original resist pattern before etching, while assuring vertical etching and excellent anisotropy.

EXAMPLE 31

In the procedures of Example 30, after the $SiO_2$ film was processed, the resist and the polysilane film used as an etching mask were successively removed by making use of a down-flow etching apparatus. When the etching was performed under the conditions where $O_2$ gas (flow rate: 20 sccm) was employed as a source gas, the degree of vacuum was set to 8 mTorr, and the power density was set to 200 W, the resist was completely removed.

When the infrared absorption spectrum of the organosilicon was measured after the removal of the resist, an absorption by the Si—O—Si bond was observed at 1,000 to 1200 $cm^{-1}$, indicating the glassification (oxidation) of the organosilicon due to the exposure thereof to an oxygen plasma.

Then, the organosilicon thus glassified was immersed in a dilute solution of hydrofluoric acid comprising a mixture of hydrofluoric acid and water (1:500) for 90 seconds, it was possible to selectively remove the glassified organosilicon film from the silicon oxide film.

EXAMPLE 32

In the procedures of Example 30, after the $SiO_2$ film was processed, the resist and the organosilicon film used as an etching mask were successively removed by making use of a down-flow etching apparatus. When the etching was performed under the conditions where $O_2$ gas (flow rate: 20 sccm) was employed as a source gas, the degree of vacuum was set to 8 mTorr, and the power density was set to 200 W, the resist was completely removed.

Although the organosilicon was glassified by the exposure thereof to an oxygen plasma, it was possible to selectively etch away the organosilicon without erasing the $SiO_2$ film by performing the etching under the conditions where $CF_4$ gas (flow rate: 30 sccm) was employed as an etching gas, the degree of vacuum was set to 35 mTorr, and the power density was set to 800 W.

EXAMPLE 33

As shown in FIG. 1A, an $SiO_2$ film 2 having a thickness of 500 nm was formed on a silicon wafer 1 by means of the LPCVD method. Then, a solution which was obtained by dissolving 10 g of organosilicon compound (n/m=1/4) represented by the aforementioned formula (1-99) and having a weight average molecular weight of 14,000 in 90 g of anisole was coated on the surface of the $SiO_2$ film 2. Then, the coated layer was baked for 120 seconds at a temperature of 160° C. to dry the coated layer. The film thickness of the organosilicon film 3 thus obtained was 150 nm and the complex index of refraction thereof at a wavelength of 248 nm was n=2.01 and k=0.38 (FIG. 1B). The glass-ttansition temperature of the organosilicon film was 132° C.

Then, a chemical amplification type positive resist 24 (trade name: TDUR-P007, Tokyo Ohka Kougyo Co.) was coated on the surface of the organosilicon film 3, and then baked at a temperature of 98° C. for 120 seconds (FIG. 1C), thereby forming the resist film 4 having a thickness of 150 nm.

Subsequently, the resist was subjected to a patterning exposure (30 $mJ/cm^2$) by making use of a reduced optical type stepper using KrF excimer laser as a light source, and then baked for 120 seconds at a temperature of 98° C. Thereafter, the resist was developed by making use of a 0.21N TMAH developing solution to form a resist pattern 4 consisting of a line and space pattern having a line width of 0.18 $\mu$m (FIG. 1D). The resist pattern 4 thus obtained was 130 nm in film thickness.

When the profile of the resist pattern 4 was observed by means of the SEM, a corrugation due to a standing-wave was not recognized on the side wall of the resist pattern 4. Any footing or undercut was not recognized in the resultant resist pattern thus obtaining a resist pattern of excellent profile.

Then, the etching of the organosilicon film 23 was performed using the resist pattern 4 thus formed as an etching mask and employing a magnetron type RIE apparatus (FIG. 2A). The etching was performed under the conditions: a gas mixture of $Cl_2$ gas (flow rate: 200 sccm) and $SF_6$ gas (flow rate: 10 sccm) was employed as an etching gas, the degree of vacuum was set to 25 mTorr, and power density was set to 200 W. As a result, it was possible to perform the etching of the organosilicon film 3 without generating a receding of the resist pattern 4.

When the processed shape of the organosilicon film 3 was examined, the organosilicon film was found as being etched vertically and excellent in anisotropy. The film thickness of the resist left remained after the etching was 80 nm. When the etching rate of the resist pattern and organosilicon film, both being in a state of solid, was measured, the etching rate of the resist film was 48 nm/min and the etching rate of the organosilicon film was 210 nm/min, i.e. the etching rate of the organosilicon film was 4.4 times as fast as that of the resist film.

Then, as shown in FIG. 2C, the removal of the resist pattern (FIG. 2B) and the etching of the $SiO_2$ film (FIG. 2C) were successively performed employing a magnetron type reactive ion etching apparatus (RIE). The removal of the resist pattern was performed under the conditions: $O_2$ gas (flow rate: 20 sccm) was employed as a source gas, the degree of vacuum was set to 30 mTorr, and the power density was set to 200 W.

Then, the etching of $SiO_2$ film was performed in the same chamber but changing the etching conditions, i.e. under the conditions: $CHF_3$ gas (flow rate: 30 sccm), CO gas (flow rate: 100 sccm), Ar gas (flow rate: 100 sccm) and $O_2$ gas (flow rate: 10 sccm) were employed as etching gases, the degree of vacuum was set to 15 mTorr, and power density was set to 280 W. As a result, it was possible to perform the etching of $SiO_2$ film without generating a receding of the organosilicon film pattern.

When the processed shape of the $SiO_2$ film was examined, the $SiO_2$ film was found as being etched vertically and excellent in anisotropy without generating a difference in dimension from the original resist pattern before etching.

When the etching rate of the resist film, organosilicon film and $SiO_2$ film, all being in a state of solid, was measured under the same manner as illustrated in Example 15, the etching rate of the resist film was 54 nm/min, the etching rate of the organosilicon film was 20 nm/min and the etching rate of the $SiO_2$ film was 368 nm/min, i.e. the etching rate of the $SiO_2$ film was 18.4 times as fast as that of the organosilicon film. It is clear from these results that the organosilicon film which was more excellent in dry-etching resistance than the resist functioned as an etching mask at the occasion of etching the $SiO_2$ film.

It is assumed that, because of these etching rates, it was possible to perform the etching of the $SiO_2$ film without generating a difference in dimension from the original resist pattern before etching, while assuring vertical etching and excellent anisotropy.

EXAMPLE 34

As shown in FIG. 1A, an SiN film 2 having a thickness of 500 nm was formed on a silicon wafer 1 by means of the LPCVD method. Then, a solution which was obtained by dissolving 10 g of organosilicon compound (n/m=1/4) represented by the aforementioned formula (1-95) and having a weight average molecular weight of 12,800 in 90 g of anisole was coated on the surface of the SiN film 2. Then, the coated layer was baked for 120 seconds at a temperature of 160° C. to dry the coated layer. The film thickness of the organosilicon film 3 thus obtained was 250 nm and the complex index of refraction thereof at a wavelength of 248 nm was n=2.01 and k=0.35 (FIG. 1B). The glass-transition temperature of the organosilicon film was 138° C.

Then, a chemical amplification type positive resist 4 (trade name: TDUR-P007, Tokyo Ohka Kougyo Co.) was coated on the surface of the organosilicon film 3, and then baked at a temperature of 98° C. for 120 seconds (FIG. 1C), thereby forming the resist film 4 having a thickness of 150 nm.

Subsequently, the resist was subjected to a patterning exposure (30 $mJ/cm^2$) by making use of a reduced optical type stepper using KrF excimer laser as a light source, and then baked for 120 seconds at a temperature of 98° C. Thereafter, the resist was developed by making use of a 0.21N TMAH developing solution to form a resist pattern 4 consisting of a line and space pattern having a line width of 0.18 $\mu$m (FIG. 1D). The resist pattern 4 thus obtained was 130 nm in film thickness.

When the profile of the resist pattern 4 was observed by means of the SEM, a corrugation due to a standing-wave was not recognized on the side wall of the resist pattern 4. Any footing or undercut was not recognized in the resultant resist pattern thus obtaining a resist pattern of excellent profile.

Then, the etching of the organosilicon film 3 was performed using the resist pattern 4 thus formed as a mask and employing a magnetron type RIE apparatus (FIG. 1E). The etching was performed under the conditions: $Cl_2$ gas (flow rate: 200 sccm) was employed as an etching gas, the degree of vacuum was set to 25 mTorr, and power density was set to 200 W. As a result, it was possible to perform the etching of the organosilicon film 3 without generating a receding of the resist pattern 4.

When the processed shape of the organosilicon film 3 was examined, the organosilicon film was found as being etched vertically and excellent in anisotropy. The film thickness of the resist left remained after the etching was 80 nm. When the etching rate of the resist pattern and organosilicon film, both being in a state of solid, was measured under the etching conditions illustrated in Example 15, the etching rate of the resist film was 52 nm/min and the etching rate of the organosilicon film was 195 nm/min, i.e. the etching rate of the organosilicon film was 3.75 times as fast as that of the resist film.

Then, as shown in FIG. 2C, the removal of the resist pattern and the etching of the SiN film were successively performed employing a magnetron type reactive ion etching apparatus (RIE). The removal of the resist pattern was performed under the conditions: $O_2$ gas (flow rate: 30 sccm) was employed as a source gas, the degree of vacuum was set to 30 mTorr, and the power density was set to 200 W.

Then, the etching of SiN film was performed in the same chamber but changing the etching conditions, i.e. under the conditions: $C_4H_8$ gas (flow rate: 30 sccm), CO gas (flow rate: 100 sccm), Ar gas (flow rate: 100 sccm) and $O_2$ gas (flow rate: 3 sccm) were employed as etching gases, the degree of vacuum was set to 15 mTorr, and power density was set to 280 W. As a result, it was possible to perform the etching of SiN film without generating a receding of the organosilicon film.

When the processed shape of the SiN film was examined, the SiN film was found as being etched vertically and excellent in anisotropy without genrrating a difference in dimension from the original resist pattern before etching.

When the etching rate of the resist film, organosilicon film and SiN film, all being in a state of solid, was measured under the same manner as illustrated in Example 15, the etching rate of the resist film was 62 nm/min, the etching rate of the organosilicon film was 32 nm/min and the etching rate of the SiN film was 323 nm/min, i.e. the etching rate of the SiN film was 10.1 times as fast as that of the organosilicon film. It is clear from these results that the organosilicon film which was more excellent in dry-etching resistance than the resist functioned as an etching mask at the occasion of etching the SiN film.

It is assumed that, because of these etching rates, it was possible to perform the etching of the SiN film without generating a difference in dimension from the original resist pattern before etching, while assuring vertical etching and excellent anisotropy.

EXAMPLE 35

A TEOS oxide film having a thickness of 600 nm was formed on a silicon wafer by means of the plasma CVD method. Then, a solution which was obtained by dissolving 13 g of polysilane (n/m=4/1) represented by the aforementioned formula (14) and having a weight average molecular weight of 12,000 in 87 g of anisole was coated on the surface of the TEOS oxide film. Then, the coated layer was baked for 180 seconds at a temperature of 160° C. to dry the coated layer. The film thickness of the organosilicon film thus obtained was 400 nm and the complex index of refraction thereof at a wavelength of 248 nm was n=2.03 and k=0.32. The glass-transition temperature of the organosilicon film was 139° C.

Then, a chemical amplification type positive resist (trade name: APEX-E, Shiprey Co.) was coated on the surface of the organosilicon film, and then baked at a temperature of 98° C. for 120 seconds, thereby forming the resist film having a thickness of 250 nm. Then, a top antireflective layer film (trade name: Aquatarl, Hoechst Co.) 42 nm in thickness was formed by coating it on the surface of the resist film.

Subsequently, the resist was subjected to a patterning exposure (28 mJ/cm$^2$) by making use of a reduced optical type stepper using KrF excimer laser as a light source, and then baked for 120 seconds at a temperature of 98° C. Thereafter, the resist was developed by making use of a 0.21N TMAH developing solution to form a resist pattern of 0.25 µmL/S. Since this top antireflective layer was water-soluble, it was removed from the resist film at the occasion of the development.

When the profile of the resist pattern was observed by means of the SEM, a corrugation due to a standing-wave was not recognized on the side wall of the resist pattern. Any footing or undercut was not recognized in the resultant resist pattern thus obtaining a resist pattern of excellent profile.

When the resist pattern was formed as described above and the TEOS oxide film was processed in the same manner as illustrated in Example 30, it was possible to perform the etching of the TEOS oxide film without generating a difference in dimension from the original resist pattern before etching.

EXAMPLE 35

A spin-on glass (trade name: R7, Hitachi Kasei Co.) was spin-coated on a silicon wafer. Then, the coated layer was baked in step-wise, i.e. for one minute at a temperature of 80° C., for one minute at a temperature of 150° C. and for one minute at a temperature of 200° C. to dry the coated layer. Thereafter the coated layer was further baked for 30 minutes at a temperature of 400° C. under a purging with nitrogen gas to obtain a film of the spin-on glass having a film thickness of 500 nm as measured after this baking treatment.

Then, a solution which was obtained by dissolving 10 g of polysilane (n/m=4/1) represented by the aforementioned formula (14) and having a weight average molecular weight of 12,500 in 90 g of anisole was coated on the surface of the spin-on glass film. Then, the coated layer was baked for 60 seconds at a temperature of 180° C. to form an organosilicon film having a film thickness of 300 nm and a glass-transition temperature of 139° C.

Thereafter, the organosilicon film was subject to KrF excimer laser (300 mJ/cm$^2$) to oxidize the surface portion thereof.

Figure 10:
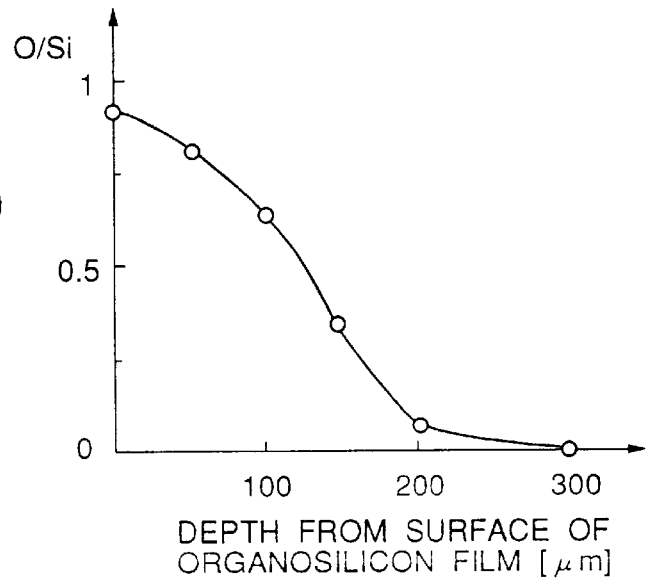
FIG. 10 is a graph showing a ratio of O/Si in the thickness-wise direction of a polysilane film according to one example of this invention.

When the ratio of O/Si in thickness-wise of the polysilane film was examined by means of the X-ray Photoemission Spectroscopy, the results shown in FIG. 10 were obtained. As seen from FIG. 10, the surface of the organosilicon film was oxidized. However, due to this surface oxidation of the organosilicon film, the reflection of the exposure light from the organosilicon film to the resist was inhibited, thus making it possible to obtain a resist pattern excellent in dimension controllability. The extinction coefficient of an organosilicon film may be gradually increased in thickness-wise in this manner from the surface thereof toward the insulating film side, thus inhibiting the reflection of light.

Then, a chemical amplification type positive resist (trade name: APEX-E, Shiplay Co.) was coated on the surface of the organosilicon film, and then baked at a temperature of 98° C. for 120 seconds, thereby forming the resist film having a thickness of 100 nm. Subsequently, the resist film was subjected to a patterning exposure (28 mJ/cm$^2$) by making use of a reduced optical type stepper using KrF excimer laser as a light source, and then baked for 120 seconds at a temperature of 98° C. Thereafter, the resist film was developed by making use of a 0.21N TMAH developing solution to form a resist pattern of 0.25 µmL/S.

When the profile of the resist pattern was observed by means of the SEM, a corrugation due to a standing-wave was not recognized on the side wall of the resist pattern. Any footing or undercut was not recognized in the resultant resist pattern thus obtaining a resist pattern of excellent profile.

When the resist pattern was formed as described above and the spin-on glass was processed in the same manner as illustrated in Example 30, it was possible to perform the etching of the spin-on glass without generating a difference in dimension from the original resist pattern before etching.

EXAMPLE 37

A BPSG film having a thickness of 500 nm was formed on a silicon wafer by means of the plasma CVD method. Then, a solution which was obtained by dissolving 10 g of polysilane (n/m=4/1) represented by the aforementioned formula (14) and having a weight average molecular weight of 9,000 together with 5 g of poly(phenyl silene) and having a weight average molecular weight of 2,000 in 85 g of anisole was coated on the surface of the BPSG film. Then, the coated layer was baked for 180 seconds at a temperature of 160° C. to dry the coated layer. The film thickness of the organosilicon film thus obtained was 150 nm and the complex index of refraction thereof at a wavelength of 248 nm was n=2.20 and k=0.39. The glass-transition temperature of the organosilicon film was 139° C.

Then, a solution which was obtained by dissolving 10 g of polysulfone in 90 g of cyclohexanone was coated on the surface of the organosilicon film, and then baked at a temperature of 220° C. for 180 seconds, thereby forming an underlying film for improving the profile of resist, the film thickness of the underlying layer being 30 nm.

Then, a chemical amplification type negative resist (trade name: TDUR-N908, Tokyo Ohka Kougyo Co.) was coated on the surface of the underlying layer, and then baked at a temperature of 98° C. for 120 seconds, thereby forming the resist film having a thickness of 300 nm.

Subsequently, the resist was subjected to a patterning exposure (38 mJ/cm$^2$) by making use of a reduced optical type stepper using KrF excimer laser as a light source, and then baked for 120 seconds at a temperature of 98° C. Thereafter, the resist was developed by making use of a 0.21N TMAH developing solution to form a resist pattern of 0.18 µmL/S. When the profile of the resist pattern was observed by means of the SEM, a corrugation due to a standing-wave was not recognized on the side wall of the resist pattern.

As shown in FIG. 1D, any footing or undercut of resist was not recognized in the resultant resist pattern thus obtaining a resist pattern of excellent profile.

When the resist pattern was formed as mentioned above and the BPSG film was processed in the same manner as illustrated in Example 30, it was possible to perform the etching of the BPSG film without generating a difference in dimension from the original resist pattern before etching. As shown in this example, the underlying layer may be formed on the organosilicon film to improve the resist profile.

EXAMPLE 37

A fluorine-containing SiO$_2$ film having a thickness of 500 nm was formed on a silicon wafer by means of the vacuum CVD method. Then, a solution which was obtained by dissolving 10 g of polysilane represented by the aforementioned formula (1-95) and having a weight average molecular weight of 9,800 in 90 g of anisole was coated on the surface of the $SiO_2$ film. Then, the coated layer was baked for 60 seconds at a temperature of 160° C. to dry the coated layer. The film thickness of the organosilicon film thus obtained was 180 nm. The glass-transition temperature of the organosilicon film was 141° C.

Then, a resist solution which was obtained by dissolving 10 g of polymethylmathacrylate in 90 g of ethyl lactate was coated on the surface of the organosilicon film, and then baked at a temperature of 98° C. for 120 seconds, thereby forming a resist film having a thickness of 200 nm.

Then, the resist was subjected to a patterning exposure (800 $mJ/cm^2$) by making use of a reduced optical type stepper using ArF excimer laser as a light source, and then baked for 120 seconds at a temperature of 98° C. Thereafter, the resist was developed by making use of a 0.21N TMAH developing solution to form a resist pattern of 0.18 $\mu$mL/S. When the profile of the resist pattern was observed by means of the SEM, a corrugation due to a standing-wave was not recognized on the side wall of the resist pattern. Any footing or undercut was not recognized in the resultant resist pattern thus obtaining a resist pattern of excellent profile.

When the resist pattern was formed as mentioned above and the $SiO_2$ film was processed in the same manner as illustrated in Example 30, it was possible to perform the etching of the $SiO_2$ film without generating a difference in dimension from the original resist pattern before etching.

EXAMPLE 39

First of all, the polysilane to be employed in this example was synthesized as follows. Namely, a mixture comprising 60 mL (milliliter) of dried diethyl ether and 5.34 g of dichlorozirconocene were stirred in an argon atmosphere at a temperature of −20° C., during which 1.6 $\mu$m methyl ether was added little by little to the mixture. After continuing the stirring for 70 minutes, the mixture was further stirred at 0° C. for another 30 minutes. Thereafter, diethyl ether was removed and a white solid thus produced was allowed to sublimate to obtain methylzirconocene.

Then this methylzirconocene was added to phenyl silane at a molar ratio of 50:1, and phenyl silane was allowed to polymerize at room temperature over 5 hours. The polymer thus obtained was dissolved in toluene, and the resultant solution was poured into methanol with stirring thereby to reprecipitate the polymer. After repeating this reprecipitation of the polymer twice in methanol, the polymer was vacuum-dried at a temperature of 80 to 90° C., thereby obtaining a polymer having a weight average molecular weight of about 2,000 and represented by the aforementioned general formula (16-1).

Then, in the same manner as illustrated in Example 17, an $SiO_2$ film was formed on a silicon wafer. Subsequently, 8 g of polysilane obtained as illustrated above and 2 g of a crosslinking agent represented by the formula (6-9) were dissolved in 90 g of anisole to prepare a solution, which was then coated on the $SiO_2$ film and baked for 60 seconds at a temperature of 150° C. to effect crosslinking, thus obtaining an organosilicon film having a thickness of 250 nm and a glass-transition temperature of 158° C. Then, a resist pattern was formed on this organosilicon film in the same procedures as described in Example 20.

When the profile of this resist pattern was observed by means of the SEM, a corrugation due to a standing-wave was not recognized on the side wall of the resist pattern. Any footing or undercut was not recognized in the resultant resist pattern thus obtaining a resist pattern of excellent profile.

When the etching of the polysilane film and $SiO_2$ film were performed, it was possible to obtain an $SiO_2$ A film pattern having a predetermined dimension.

EXAMPLE 40

A solution which was obtained by dissolving 8 g of polysilane represented by the formula (1-95) and having a weight average molecular weight of 12,000 in 90 g of anisole was coated on the surface of a quartz substrate. Then, the coated layer was baked for 100 seconds at a temperature of 160° C. to dry the coated layer, thereby forming an organosilicon film having a thickness of 300 nm and a glass-transition temperature of 132° C.

Then, a chemical amplification type positive resist (trade name: APEX, Shiplay Co.) was coated on the surface of the organosilicon film, and then baked at a temperature of 98° C. for 120 seconds, thereby forming the resist film having a thickness of 200 nm. Subsequently, the resist was subjected to a patterning exposure (1 $\mu$mC/$cm^2$) by making use of an electron beam drawing apparatus as a light source, and then baked for 120 seconds at a temperature of 98° C. Thereafter, the resist was developed by making use of a 0.21N TMAH developing solution to form a resist pattern of 0.9 $\mu$mL/S. When the profile of the resist pattern was observed by means of the SEM, a change in position due to a charging-up was not recognized.

The resist pattern was formed as mentioned above and a groove 0.4 $\mu$m in width was formed on the quartz substrate. As explained above, it is possible to utilize the method of this invention for processing a the quartz substrate.

EXAMPLE 41

10 g of poly(phenylsilene) having an average molecular weight of 8,000 was dissolved in 90 g of xylene to prepare a solution for an organosilicon film. After an $SiO_2$ film was coated on a silicon wafer, the solution for the organosilicon film was spin-coated on the surface of an $SiO_2$ film. Then, the coated layer was baked for 300 seconds at a temperature of 160° C. to dry the coated layer, thereby obtaining an organo-silicon film having a film thickness of 250 nm and a glass-transition temperature of 132° C. The complex index of refraction of the organosilicon film as measured by means of spectral ellipsometry at $\lambda$=193 nm was n=2.03 and k=0.48.

Next, a resist solution which was prepared by dissolving 10 g of polymethyl methacrylate in 90 g of ethyl lactate was coated on the surface of the organosilicon film, and baked at a temperature of 110° C. for 90 seconds to form a resist film having a thickness of 100 nm.

Subsequently, the resist film was exposed (exposure: 500 $mJ/cm^2$) by making use of a reduced optical type stepper using ArF excimer laser as a light source. Thereafter, the resist was developed for 90 seconds by making use of a 0.21N TMAH developing solution to form a line and space pattern having a line width of 0.18 $\mu$m.

Any footing or undercut of resist was not recognized in the resultant resist pattern thus obtaining a resist pattern of excellent profile. Furthermore, the film thickness of the resist film was varied within the range of from 50 nm to 150 nm to measure the dimension of resist pattern at various film thicknesses. As a result, a difference in dimension due to the standing wave generated in the resist film was found negligible. Any footing or undercut was not recognized in the resultant resist pattern thus obtaining a resist pattern of excellent profile.

Then, the etching of the organosilicon film was performed making use of the resist pattern thus formed. This etching was performed in the same manner as illustrated in Example 30 except that $Cl_2$ gas (flow rate: 300 sccm) was employed as an etching gas, the power density was 300 W and the degree of vacuum set to 30 mTorr. As a result, the receding of resist pattern was not recognized at all after the etching of the organosilicon film, i.e. the etching was performed with excellent dimension controllability.

EXAMPLE 42

A fluorine-containing $SiO_2$ film having a thickness of 500 nm was formed on a silicon wafer by means of the vacuum CVD method. Then, a solution which was obtained by dissolving 10 g of polysilane (n/m=1/4) represented by the aforementioned formula (1-95) and having a weight average molecular weight of 12,000 in 90 g of anisole was coated on the surface of the $SiO_2$ film. Then, the coated layer was baked for 100 seconds at a temperature of 180° C. to dry the coated layer. The organosilicon film thus obtained had a thickness of 200 nm and a glass-transition temperature of 137° C., and the complex index of refraction thereof at a wavelength of 193 nm was n=2.10 and k=0.57.

Then, a resist solution which was obtained by dissolving 10 g of polymethylmathacrylate in 90 g of ethyl lactate was coated on the surface of the organosilicon film, and then baked at a temperature of 98° C. for 120 seconds, thereby forming a resist film having a thickness of 200 nm.

Then, the resist was subjected to a patterning exposure (800 mJ/cm$^2$) by making use of a reduced optical type stepper using ArF excimer laser as a light source, and then baked for 120 seconds at a temperature of 98° C. Thereafter, the resist was developed by making use of a 0.21N TMAH developing solution to form a resist pattern of 0.18 µmL/S. When the profile of the resist pattern was observed by means of the SEM, a corrugation due to a standing-wave was not recognized on the side wall of the resist pattern. Any footing or undercut was not recognized in the resultant resist pattern thus obtaining a resist pattern of excellent profile.

When the resist pattern was formed as mentioned above and the $SiO_2$ film was processed in the same manner as illustrated in Example 30, it was possible to perform the etching of the $SiO_2$ film without generating a difference in dimension from the original resist pattern before etching.

EXAMPLE 43

A fluorine-containing $SiO_2$ film having a thickness of 500 nm was formed on a silicon wafer by means of the vacuum CVD method. Then, a solution which was obtained by dissolving 10 g of polysilane (n/m=1/4) represented by the aforementioned formula (17-7) and having an average molecular weight of 12,000 in 90 g of anisole was coated on the surface of the $SiO_2$ film. Then, the coated layer was baked for 100 seconds at a temperature of 180° C. in a nitrogen atmosphere. The organosilicon film thus obtained had a thickness of 300 nm and a glass-transition temperature of 128° C.

Then, the organosilicon film was exposed to an atmosphere containing $AsF_5$ to dope $AsF_5$ in the organosilicon film, thus making the film conductive.

Then, a resist solution which was obtained by dissolving 10 g of polymethylmathacrylate in 90 g of ethyl lactate was coated on the surface of the polysilane film, and then baked at a temperature of 98° C. for 120 seconds, thereby forming a resist film having a thickness of 200 nm.

Subsequently, the resist was subjected to a patterning exposure (10 µm/cm$^2$) by making use of an electron beam drawing apparatus as a light source. Thereafter, the resist was developed by making use of a 0.21N TMAH developing solution to form a resist pattern of 0.18 µmL/S. Any footing or undercut was not recognized in the resultant resist pattern thus obtaining a resist pattern of excellent profile.

When the resist pattern was formed as mentioned above and the $SiO_2$ film was processed in the same manner as illustrated in Example 30, it was possible to perform the etching of the $SiO_2$ film without generating a difference in dimension from the original resist pattern before etching. Furthermore, the conductivity of the organosilicon obtained in this example was 5×10$^{-6}$ S/cm, and the resist pattern was formed without causing any dislocation of pattern that might be brought about by a charge-up.

EXAMPLE 44

A fluorine-containing $SiO_2$ film having a thickness of 500 nm was formed on a silicon wafer by means of the vacuum CVD method. Then, a solution which was obtained by dissolving 10 g of polysilane represented by the aforementioned general formula (17-3) and having a weight average molecular weight of 12,000 in 90 g of anisole was coated on the $SiO_2$ film. Then, the coated layer was baked for 100 seconds at a temperature of 180° C. to obtain a polysilane film having a thickness of 200 nm and a glass-transition temperature of 136° C.

Then, a chemical amplification type positive resist (trade name: APEX-E, Shiplay Co.) was coated on the surface of the polysilane film, and then baked at a temperature of 98° C. for 120 seconds, thereby forming the resist film having a thickness of 200 nm. Subsequently, the resist was subjected to a patterning exposure (45 mJ/cm$^2$) by making use of an X-ray stepper using a radiation as a light source, and then baked for 120 seconds at a temperature of 98° C. Thereafter, the resist was developed by making use of a 0.21N TMAH developing solution to form a resist pattern of 0.18 µmL/S. Any footing or undercut was not recognized in the resultant resist pattern thus obtaining a resist pattern of excellent profile.

When the resist pattern was formed as mentioned above and the $SiO_2$ film was processed in the same manner as illustrated in Example 30, it was possible to perform the etching of the $SiO_2$ film without generating a difference in dimension from the original resist pattern before etching.

EXAMPLE 45

Then, an $SiO_2$ film having a thickness of 300 nm was formed on a silicon wafer by means of the LPCVD method. As shown in FIG. 1A, an amorphous silicon film 2 (wiring film) having a thickness of 300 nm was formed on an $SiO_2$ film by a sputtering method. Then, as shown in FIG. 1B, an organosilicon film 3 having a thickness of 100 nm was formed on the surface of the amorphous silicon film by the methods of (B3) to (B10) described in Example 2.

Figure 11A:
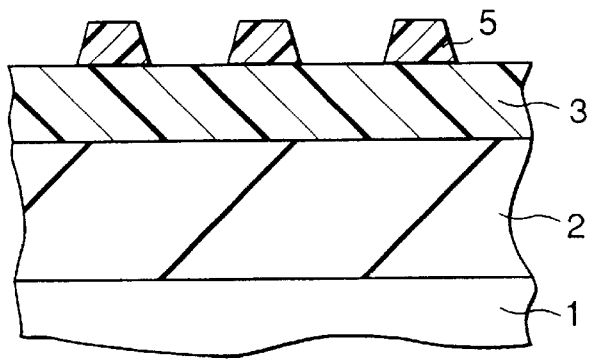
FIGS. 11A and 11B illustrate cross-sectional views sequentially showing the process of forming a pattern according to another embodiment of this invention.

Then, in the same manner as described in Example 21, a resist 4 was formed on the organosilicon film as shown in FIG. 1C. Thereafter, the resist was developed by making use of a 0.21N TMAH developing solution to form a resist pattern consisting of a line and space pattern 5 having a line width of 0.18 µm as shown in FIG. 11A. The resist pattern thus developed was 250 nm in film thickness.

When the resist pattern was observed, a change in position due to a charging-up was not recognized. Any footing or undercut was not recognized in the resultant resist pattern thus obtaining a resist pattern of excellent profile.

Figure 11B:
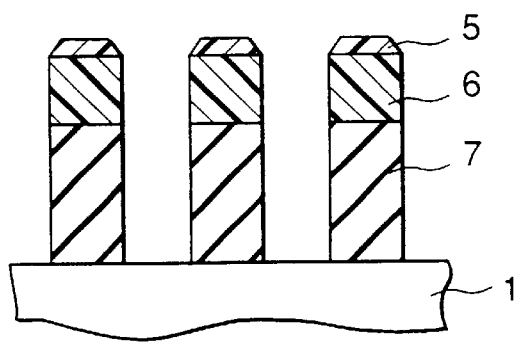

Then, as shown in FIG. 11B, the etching of the organosilicon film and the amorphous silicon film was performed concurrently using the resist pattern thus formed as an etching mask. In this case, an etching apparatus of TCP mode was employed. The etching was performed under the conditions wherein a $Cl_2$ gas (flow rate: 100 sccm) was employed as an etching gas, the degree of vacuum was set to 12 mTorr, TCP power/bias power was set to 500 W/100 W, and the substrate temperature was set to 30° C. As a result, it was possible to perform the etching of the organosilicon film and the amorphous silicon film without generating a receding of the resist pattern, thus making it possible to form an amorphous film of a line and space pattern 7 having a line width of 0.18 μm.

EXAMPLE 46

Then, an $SiO_2$ film having a thickness of 300 nm was formed on a silicon wafer by means of the LPCVD method. As shown in FIG. 1A, a tungsten film having a thickness of 300 nm was successively formed on an $SiO_2$ film by a sputtering method, thereby forming a wiring film. Then, as shown in FIG. 1B, an organosilicon film having a thickness of 100 nm was formed on the surface of the tungsten silicon film by the methods of (C3) to (C10) described in Example 3.

Then, a resist which was prepared by the method (R) described in Example 1 was respectively formed on an organosilicon film as shown in FIG. 1C, and heated with a hot plate for 90 seconds at a temperature of 110° C., thereby forming a resist film having a thickness of 300 nm. Subsequently, the resist was subjected to a patterning exposure by making use of a reduced optical type stepper using KrF excimer laser as a light source, and then baked with a hot plate for 90 seconds at a temperature of 110° C.

Thereafter, the resist was developed by making use of a 0.21N TMAH developing solution to form a resist pattern consisting of a line and space pattern having a line width of 0.18 μm as shown in FIG. 11A. The resist pattern thus developed was 250 nm in film thickness.

When the profile of the resist pattern was observed by means of the SEM, a corrugation due to a standing-wave was not recognized on the side wall of the resist pattern, i.e. indicating an excellent profile of the resist pattern. Any footing or undercut was not recognized in the resultant resist pattern thus obtaining a resist pattern of excellent profile.

Then, as shown in FIG. 11B, the etching of the organosilicon film and the tungsten silicon film was performed concurrently using the resist pattern thus formed as an etching mask. In this case, an etching apparatus of TCP mode was employed. The etching was performed under the conditions wherein a $Cl_2$ gas (flow rate: 100 sccm) was employed as an etching gas, the degree of vacuum was set to 12 mTorr, the TCP power/bias power was set to 500/250 W, and the substrate temperature was set to 30° C. As a result, it was possible to perform the etching of the organosilicon film and the tungsten film without generating a receding of the resist pattern, thus making it possible to form a wiring pattern consisting of a line and space pattern having a line width of 0.18 μm.

As described in Examples 45 and 46, where the work film is formed of a silicon-based material such as amorphous silicon, polycrystalline silicon and silicon substrate, single wiring layer, multi-layer structure consisting of wiring layer and barrier metal layer, multi-layer structure consisting of barrier metal layer and antireflection film such as TiN, TiW, these film can be etched under the same etching condition as the case where an organosilicon film is etched, and thus the manufacturing process can be simplified.

The following Examples 47 to 51 are based on the aforementioned preferred embodiment (3).

EXAMPLE 47

First of all, an SiN film 2 having a thickness of 800 nm was formed on the surface of a silicon wafer 1 (FIG. 1A). Then, an organosilicon film 3 having a thickness of 100 nm was formed on the SiN film 2 (FIG. 1B). The organosilicon film 3 employed was formed by the following methods (H1) to (H6).

(H1): 9 g of the polysilane represented by the general formula (1-1) and having a weight average molecular weight of 1,000, 0.9 g of a crosslinking agent represented by the formula (3-1) and 0.1 g of benzoin as a radical-generating agent were dissolved in 90 g of anisole to prepare a solution, which was then spin-coated on the surface of an underlying substrate. Then, the substrate was heated for 10 minutes at a temperature of 180° C. under the atmosphere of nitrogen gas (oxygen concentration: 50 ppm or less), thus forming an organosilicon film having a glass transition temperature of 68° C.

($H_2$): 10 g of the polysilane (n/m=1/4) represented by the general formula (1-84) and having a weight average molecular weight of 12,000 was dissolved in 90 g of anisole to prepare a solution, which was then spin-coated on the surface of an underlying substrate. Then, the substrate was heated for one minute at a temperature of 160° C., thus forming an organosilicon film having a glass transition temperature of 123° C.

(H3): 10 g of the polysilane (n/m=1/4) represented by the general formula (1-95) and having a weight average molecular weight of 18,000 was dissolved in 90 g of anisole to prepare a solution, which was then spin-coated on the surface of an underlying substrate. Then, the substrate was heated for one minute at a temperature of 160° C., thus forming an organosilicon film having a glass transition temperature of 148° C.

(H4): 9.99 g of the polysilane (n/m=1/4) represented by the general formula (1-84) and having a weight average molecular weight of 15,000 and 0.01 g of fulleren were dissolved in 90 g of anisole to prepare a solution, which was then spin-coated on the surface of an underlying substrate. Then, the substrate was heated for one minute at a temperature of 160° C., thus forming an organosilicon film having a glass transition temperature of 123° C.

(H5): 10 g of the polysilane (n/m=1/1) represented by the general formula (1-56) and having a weight average molecular weight of 18,000 was dissolved in 90 g of anisole to prepare a solution, which was then spin-coated on the surface of an underlying substrate. Then, the substrate was heated for one minute at a temperature of 160° C., thus forming an organosilicon film having a glass transition temperature of 118° C.

(H6): The polysilane represented by the general formula (1-51) was formed by means of the CVD method on an underlying substrate, thus forming an organosilicon film having a glass transition temperature of 52° C.

The values of n and k at the wavelength of 248 nm, i.e. the exposure wavelength, which were measured by means of spectral ellipsometry are shown in the above Table 15. It would be clear from Table 15 that all of the organosilicon films indicated a sufficient values required for functioning as an antireflection film.

5 g of polyvinylphenol resin having an average molecular weight of 20,000, 4.97 g of an inhibitor comprising polyvinylphenol having an average molecular weight of 27,000 and ter-butoxycarbonyl group substituting for 50% of hydroxyl group thereof, and 0.03 g of sulfone imide as an acid-generating agent were dissolved in 90 g of ethyl lactate to prepare a solution of resist, which was then spin-coated on the surface of each organosilicon film 3. Then, the coated layer was baked for 90 seconds at a temperature of 110° C., thereby obtaining a resist film 4 having a thickness of 200 nm (FIG. 1C).

Subsequently, the resist film 4 was subjected to a patterning exposure by making use of a reduced optical type stepper (NA=0.5; s=0.5) using KrF excimer laser as a light source, and then subjected to a post exposure baking for 90 seconds at a temperature of 110° C. Thereafter, the resist film 4 was developed by making use of a 0.21N TMAH developing solution to form a resist pattern 5 of 0.18 $\mu$mL/S (FIG. 1D).

Furthermore, the film thickness of the resist film formed on the organosilicon film 3 (H1) was varied to measure the dimension of resist pattern 5 at various film thicknesses. The magnitude of the difference in dimension due to the changes in film thickness of the resist film was measured on each organosilicon film, the results being shown in Table 15. This magnetude of the difference in dimension is defined in Example 17.

As seen from Table 15, all of the organosilicon films indicated a difference in dimension which was smaller than the acceptable upper limit of 9 nm, thus indicating the effectiveness of the antireflection films to inhibit the reflected light from the SiN film, whereby making it possible to obtain a resist pattern excellent in dimension controllability.

Then, the etching of the organosilicon film 3 by making use of the resist pattern 5 as an etching mask was performed (FIG. 1E). In this etching, a parallel-plate type reactive etching apparatus (RIE) was employed under the conditions wherein a $Cl_2$ gas (flow rate: 200 sccm) was employed as a source gas, the degree of vacuum was set to 75 mTorr, the power density was set to 200 W, and the substrate temperature was set to 60° C. The determination of the etching time was made by detecting the terminal point by the emission of light from the plasma so as to perform a 50% over-etching exceeding over the just time.

When the processed shape of the organosilicon film 6 was observed by means of the SEM, an excellent anisotropic etching of the organosilicon film 6 was confirmed. A dimensional change was defined by a difference between the dimension "X" of resist pattern 5 prior to the etching and the dimension "Y" of the organosilicon film pattern 6 in subsequent to the etching, i.e. (=Y–X). The results are shown in Table 15. As seen from Table 15, all of the differences fall within the range of about –2 nm to +2 nm, thus indicating that the organosilicon films were processed with excellent dimension controllability.

Then, the organosilicon films were subjected to an oxidation treatment by making use of the parallel-plate type (RIE) which was employed in the etching of the organosilicon films, and under the conditions wherein an $O_2$ gas (flow rate: 300 sccm) was employed as a source gas, the degree of vacuum was set to 12 mTorr, and the power density was set to 75 W, whereby allowing oxygen plasma to be generated (FIG. 3A). When the infrared absorption spectrum of the organosilicon film before and after the oxidation treatment was measured, a growth of the absorption peak due to a siloxane bond was admitted in the vicinity of 1,000 to 1,100 $cm^{-1}$ in all of the organosilicon films as a result of the oxidation treatment thereof. This phenomenon may be explained such that the silicon-silicon bond contained in the backbone chain of the organosilicon film was caused to open by the oxygen plasma, thus allowing the silicon atom to bond with the oxygen radical thereby forming the siloxane bond.

Furthermore, the resist pattern was ashed by the irradiation of the oxygen plasma. Table 15 shows the magnitude of difference in dimension (=W–Y) due to the oxidation treatment which was obtained by measuring the dimension of the organosilicon film after the oxidation treatment. It would be clear from Table 15 that there was little change in dimension that might be induced by the oxidation treatment. The dimensional change resulting from the etching of the organosilicon film as well as the dimensional change dimension conversion resulting from the oxidation of the organosilicon film are all controlled within the acceptable range of –9 nm to +9 nm, thus making it possible to form an etching mask material with excellent controllability.

Then, the etching of the SiN film 2 was performed by making use of this oxidized organosilicon film 8 as an etching mask (FIG. 3B). In this etching, a parallel-plate type reactive etching apparatus (RIE) was employed under the conditions wherein a $CF_4$ gas (flow rate: 50 sccm) and a $N_2$ gas (flow rate: 100 sccm) were employed as a source gas, the degree of vacuum was set to 45 mTorr, the power density was set to 200 W, and the substrate temperature was set to 60° C. The determination of the etching time was made by detecting the terminal point by the emission of light from the plasma so as to perform a 50% over-etching exceeding over the just time.

When the processed shape of the SiN 7 was observed by means of the SEM, an excellent anisotropic etching of the SiN film 7 was confirmed. Table 15 shows the results measured of the etching selectivity between the oxidized organosilicon film 8 and the SiN film 2 (=an etching rate of the SiN film/an etching rate of the organosilicon film 8 treated with oxidation), which were measured by suspending the etching of the SiN film 2. The etching rate of the SiN film was 250 nm/min. As seen from this Table, the selectivity was all found as being 10 or more, thus indicating a sufficient resistance as an etching mask for the SiN film 7.

Comparative Example 11

The procedures of Example 47 were repeated except that the etching of the SiN film was performed without conducting the oxidation treatment after the etching of the organosilicon film. As a result, the resist pattern as well as the organosilicon film are all erased during the etching of the SiN film, thus failing to perform the etching of the SiN film.

Comparative Example 12

Figure 12A:
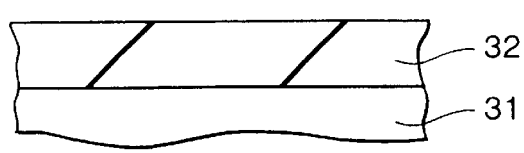
FIGS. 12A to 12G illustrate cross-sectional views sequentially showing the process of forming a pattern according to another comparative example.
Figure 12B:
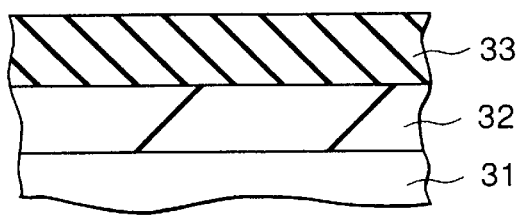
Figure 12C:
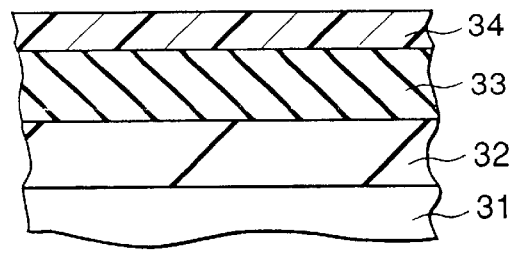

The procedures of Example 47 were repeated except that an $SiO_2$ film was substituted for the oxidized organosilicon film and employed as a hard mask. Namely, the $SiO_2$ film 33 was formed on the SiN film 32 formed on a silicon wafer 31 by means of the LPCVD method (FIGS. 12A and 12B). Then, a solution which was obtained by dissolving 10 g of polysulfone in 90 g of cyclohexanone was spin-coated on the surface of the $SiO_2$ film 33. Then, the coated layer was baked for 90 seconds at a temperature of 220° C. to obtain an antireflection film 34 (FIG. 12C). The film thickness after heat treatment of the organosilicon film 34 was 90 nm. The complex index of refraction of the antireflection film at a wavelength of 248 nm as measured by means of spectral ellipsometry was n=1.72 and k=0.23.

Figure 12D:
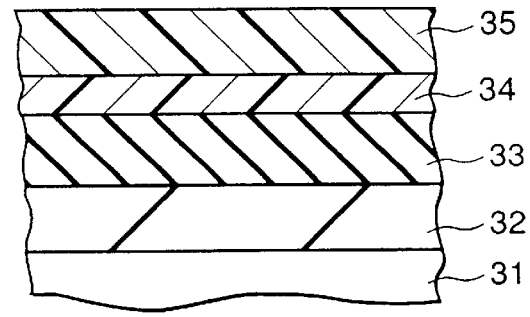
Figure 12E:
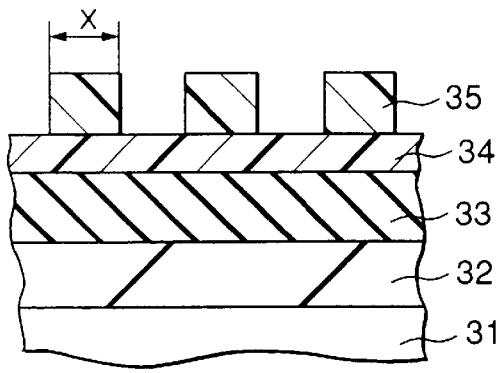

Then, a resist film 35 was formed on the antireflection film 34 and patterned in the same manner as described in Example 47 (FIG. 12D) to form a line and space pattern having a line width of 0.18 μm (FIG. 12E). Next, the etching of the organosilicon film 34 and the $SiO_2$ film was performed concurrently using the resist pattern 35 as an etching mask. In this case, a parallel-plate type RIE apparatus was employed as an etching means. The etching was performed under the conditions wherein a $C_4F_8$ gas (flow rate: 30 sccm), a CO gas (flow rate: 100 sccm) and an Ar gas (flow rate: 100 sccm) were employed as an etching gas, the degree of vacuum was set to 45 mTorr, the power density was set to 200 W, and the substrate temperature was set to 60° C. The determination of the etching time was made by detecting the terminal point by the emission of light from the plasma so as to perform a 50% over-etching exceeding over the just time.

A dimensional change was defined by a difference between the dimension "X" of resist pattern prior to the etching and the dimension "Y" of the $SiO_2$ pattern in subsequent to the etching, i.e. (=Y–X). The dimensional change was as large as +12 nm, thus falling outside the acceptable range of –9 nm to +9 nm. The reason for this may be ascribed to the structure where the antireflection film was interposed between the resist film and the $SiO_2$ film.

By contrast, according to this invention, since the organosilicon film functions as an antireflection film at the occasion of patterning exposure, no antireflection film is required to be interposed between the resist film and the hard mask, and hence it is possible to more accurately transcribe the resist pattern to the organosilicon film.

Figure 12F:
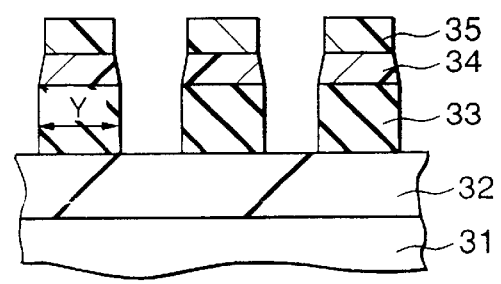
Figure 12G:
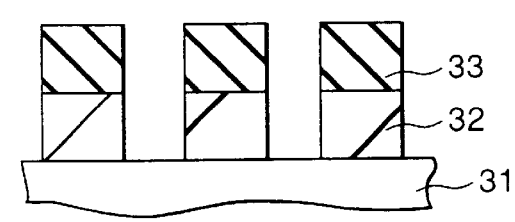

Then, by making use of oxygen plasma, the resist pattern 35 and the antireflection film 34 were removed, and the etching of SiN film 32 was performed by making use of the $SiO_2$ film pattern 33 as an etching mask (FIG. 12G). The etching conditions were the same as in Example 47.

The etching selectivity between the $SiO_2$ film and the SiN film (=an etching rate of the SiN film/a quantity lost of the $SiO_2$ film) were measured by suspending the etching of the SiN film. As a result, the etching selectivity was found to be 10.6. It will be seen from the results that the oxidized organosilicon film according to this invention also exhibits such an excellent etching resistance as that of the $SiO_2$ film even in a plasma suited for etching an SiN film.

Comparative Example 13

In this comparative example, an organosilicon film was patterned by directly irradiating ultraviolet ray onto the organosilicon film.

Figure 13A:
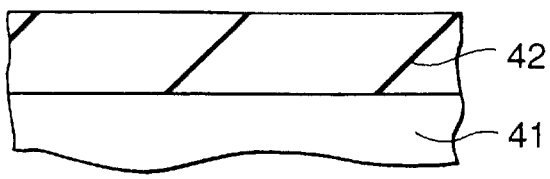
FIGS. 13A to 13E illustrate cross-sectional views sequentially showing the process of forming a pattern according to a further comparative example.
Figure 13B:
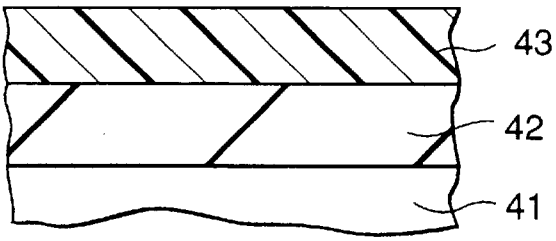
Figure 13C:
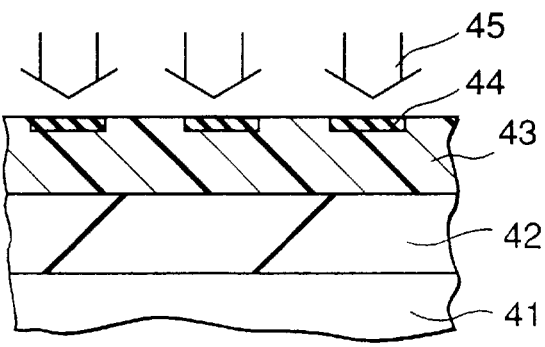

An organosilicon film 43 having a thickness of 100 nm was formed on an SiN film 42 formed on a silicon wafer 41 in the same manner as described in Example 47 (FIGS. 13A and 13B). Subsequently, the organosilicon film 43 was subjected to a patterning exposure by making use of an exposure apparatus using ArF excimer laser as a light source so as to oxidize the exposed portion 44 thereof (FIG. 13C).

Figure 13D:
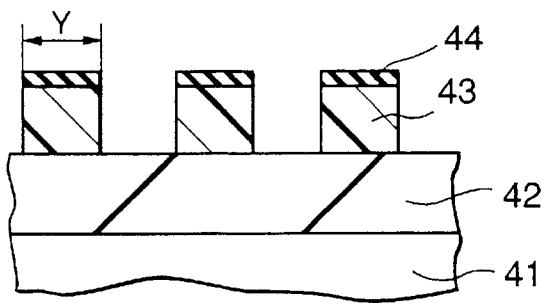
Figure 13E:
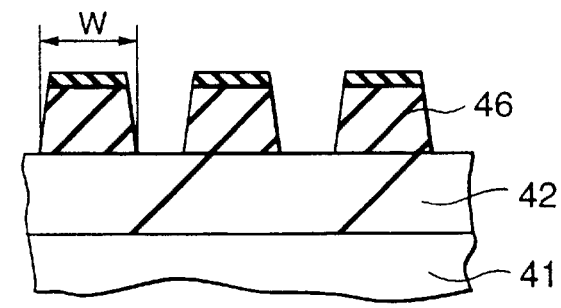

Then, the unexposed portion, which was not oxidized, of the organosilicon film 43 was etched away by making use of the exposed portion or oxidized portion 44 of the organosilicon film 43 as an etching mask, thereby forming a line and space pattern 43 having a line width of 0.18 μm (FIG. 13D). In this case, a parallel-plate type RIE apparatus was employed as an etching means. The etching was performed under the conditions wherein a $Cl_2$ gas (flow rate: 200 sccm) was employed as an etching gas, the degree of vacuum was set to 75 mTorr, the power density was set to 200 W, and the substrate temperature was set to 60° C. The determination of the etching time was made by detecting the terminal point by the emission of light from the plasma so as to perform a 50% over-etching exceeding over the just time. When the processed shape of the organosilicon film was observed by means of the SEM, an excellent anisotropic etching of the organosilicon film was confirmed. Then, the organosilicon film was irradiated with oxygen plasma to oxidize the organosilicon film (FIG. 13E). Then, a dimensional change (=W–Y) of the organosilicon film induced by the oxidation treatment thereof was measured, the results being shown in Table 15. As seen from this Table, all of the organosilicon film pattern exhibited a thickened dimension.

It would be clear from this comparative example that when the organosilicon film was etched by making use of a resist pattern as an etching mask, it was possible to obtain an organosilicon film which could be hardly thickened by the oxidation treatment. The reason for this may be ascribed to the phenomenon that when an organosilicon film is etched by making use of a resist pattern as an etching mask, the products generated during the etching adhere onto the side wall of the organosilicon film whereby inhibiting the thickening of the film by the oxidation treatment.

EXAMPLE 48

This example illustrates an embodiment where the SH treatment was employed for an oxidation treatment.

In the same manner as described in Example 47, the organosilicon films of (H1) to (H6) were formed respectively on an SiN film, and then a resist pattern was formed on each of the organosilicon films. Then, the organosilicon films were etched in the same manner as described in Example 47 by making use of a resist pattern as an etching mask.

Then, the wafer was immersed in a mixed solution comprising sulfuric acid and an aqueous solution of hydrogen peroxide (1:2 in weight ratio) thereby to oxidize the organosilicon film. When this oxidized organosilicon film was measured with an infrared absorption spectrum, the formation of a siloxane bond resulting from the oxidation treatment was recognized. When a difference in dimension of the organosilicon film pattern due to the oxidation treatment was measured, little change that might be induced by the oxidation treatment was recognized as in the case of Example 47 in the dimension of the organosilicon film pattern.

When the SiN film was etched in the same manner as in Example 47 by making use of this oxidized organosilicon film as a mask, it was possible to etch the SiN film with excellent anisotropy.

EXAMPLE 49

This example illustrates an embodiment where ultraviolet irradiation was employed for an oxidation treatment.

In the same manner as described in Example 47, the organosilicon films of (H1) to (H6) were formed respectively on an SiN film, and then a resist pattern was formed on each of the organosilicon films. Then, the organosilicon films were etched in the same manner as described in Example 47 by making use of a resist pattern as an etching mask.

Then, each organosilicon film was exposed to an irradiation (exposure: 1 W/cm$^2$) from a high pressure mercury lamp thereby to oxidize the organosilicon film (FIG. 12F). After irradiation from a high pressure mercury lamp, the resist pattern remained without being ashed. When this oxidized organosilicon film was measured with an infrared absorption spectrum, the formation of a siloxane bond resulting from the oxidation treatment was recognized. When a difference in dimension of the organosilicon film pattern due to the oxidation treatment was measured, little change that might be induced by the oxidation treatment was recognized as in the case of Example 47 in the dimension of the organosilicon film pattern.

When the SiN film was etched in the same manner as in Example 47 by making use of this oxidized organosilicon film as a mask, it was possible to etch the SiN film with excellent anisotropy (FIG. 12G).

EXAMPLE 50

This example illustrates an embodiment where a wiring layer comprising a barrier metal and a metallic film was employed as a work film.

First of all, an SiO$_2$ film having a thickness of 300 nm was formed on a silicon wafer by means of the LPCVD method. Then, a W film 50 nm in thickness, an AlSi film 300 nm in thickness and a W film 50 nm in thickness were successively formed on the SiO$_2$ film by means of sputtering method thereby to form a wiring layer. Then, in the same manner as described in Example 47, the organosilicon films of (H1) to (H6) were formed respectively on an SiN film, and then a resist pattern was formed on each of the organosilicon films. Then, the organosilicon films were etched in the same manner as described in Example 47 by making use of a resist pattern as an etching mask.

The organosilicon films were then subjected to an oxidation treatment in the same manner as explained in Example 47. Furthermore, the etching of the wiring layer was performed by making use of this oxidized organosilicon film as an etching mask. In this case, an ICP type RIE apparatus was employed as an etching means. The etching was performed under the conditions wherein a Cl$_2$ gas (flow rate: 90 sccm) and a BCl$_3$ gas (flow rate: 10 sccm) were employed as an etching gas, the degree of vacuum was set to 12 mTorr, the ICP power was set to 500 W, the bias power was set to 250 W, and the substrate temperature was set to 30° C. The determination of the etching time was made by detecting the terminal point by the emission of light from the plasma so as to perform a 50% over-etching exceeding over the just time.

When the processed shape of the organosilicon film was observed by means of the SEM, an excellent anisotropic etching of the organosilicon film was confirmed. The etching selectivity between the oxidized organosilicon film and the AlSi film (=an etching rate of the AlSi film/an etching rate of the oxidized organosilicon film) were measured by suspending the etching of the AlSi film. Table shows the results thus obtained. The etching rate of the AlSi film was 530 nm/min. As seen from this Table, the selectivity was all found as being 10 or more, thus indicating a sufficient resistance of the oxidized organosilicon film as an etching mask for the AlSi film.

Comparative Example 14

The procedures of Example 50 were repeated except that the etching of the AlSi film was performed without conducting the oxidation treatment after the etching of the organosilicon film. As a result, the resist pattern as well as the organosilicon film are all erased during the etching of the AlSi film, thus failing to perform the etching of the AlSi film.

Comparative Example 15

In the same manner as described in Comparative Example 12, the etching selectivity between the SiO$_2$ film and the AlSi film (=an etching rate of the AlSi film/an etching rate of the SiO$_2$ film) were measured under the same etching condition of the wiring layer shown in Example 50. As a result, the selectivity was found to be 13.0. It will be seen from the results that the oxidized organosilicon film according to this invention exhibits such an excellent etching resistance as that of the SiO$_2$ film even in a plasma suited for etching an SiN film.

In contrast, according to the method of the present invention, since it is not necessary to form the antireflection film on the SiO$_2$ film, the wiring layer can be etched with excellent dimension controllability.

EXAMPLE 51

This example illustrates an embodiment where silicon was processed according to the method of this invention.

First of all, organosilicon films having a thickness of 500 nm and prepared by the methods of (H1) to (H6) described in Example 47 were formed respectively on a silicon wafer. Then, a resist solution which was prepared in Example 47 was coated on the organosilicon film, and baked at a temperature of 110° C. for 90 seconds to form a resist film having a thickness of 300 nm.

Subsequently, the resist film was subjected to a patterning exposure by making use of a reduced optical type stepper (NA=0.5; s=0.5) using KrF excimer laser as a light source, and then subjected to a post exposure baking for 90 seconds at a temperature of 110° C. Thereafter, the resist film was developed by making use of a 0.21N TMAH developing solution to form a contact hole pattern having a diameter of 0.18 $\mu$m.

Then, the organosilicon films were etched under the same conditions as described in Example 47 by making use of a resist pattern as an etching mask. The organosilicon films were then subjected to an oxidation treatment in the same manner as explained in Example 47.

Then, the etching of the silicon was performed by making use of this oxidized organosilicon film as an etching mask. In this case, a magnetron type RIE apparatus was employed as an etching means. The etching was performed under the conditions wherein a Cl$_2$ gas (flow rate: 200 sccm) was employed as a source gas, the degree of vacuum was set to 12 mTorr, the ICP power was set to 500 W, the bias power was set to 250 W, and the substrate temperature was set to 30° C., whereby obtaining a hole having a depth of 7 $\mu$m.

When the processed shape of the silicon was observed by means of the SEM, an excellent anisotropic etching of the organosilicon film was confirmed. The etching selectivity between the oxidized organosilicon film and the silicon (=an etching rate of the silicon/an etching rate of the oxidized organosilicon film) were measured by suspending the etching of the silicon. Table 17 shows the results thus obtained. The etching rate of silicon was 250 nm/min. As seen from this Table, the selectivity was all found as being 6 or more, thus indicating a sufficient resistance of the oxidized organosilicon film as an etching mask for the silicon.

Comparative Example 16

The procedures of Example 51 were repeated except that the etching of the silicon was performed without conducting the oxidation treatment after the etching of the organosilicon film. As a result, the resist pattern as well as the organosilicon film are all erased during the etching of the silicon, thus failing to form a hole structure having a desired depth.

Comparative Example 17

In the same manner as described in Comparative Example 12, the etching selectivity between the $SiO_2$ film and the silicon (=an etching rate of the silicon/an etching rate of the $SiO_2$ film) were measured under the same etching condition of the silicon shown in Example 51. As a result, the selectivity was found to be 7.0. It will be seen from the results that the oxidized organosilicon film according to this invention exhibits such an excellent etching resistance as that of the $SiO_2$ film.

In contrast, according to the method of the present invention, since it is not necessary to form the antireflection film on the $SiO_2$ film, the wiring layer can be etched with excellent dimension controllability.

First of all, organosilicon films were formed according to the following methods (J1) to (J3) as a first step.

(J1): 10 g of an organosilicon compound represented by the general formula (1-84) (n/m=1/4) and having a weight average molecular weight of 12,000 was dissolved in 90 g of anisole to prepare a solution, which was then spin-coated on the surface of an $SiO_2$ film having a thickness of 500 nm and formed on a silicon substrate. Then, the coated layer was heated for 90 seconds at a temperature of 160° C. by making use of a hot plate to evaporate the solvent and thereby to dry the coated layer, thus forming an organosilicon film having a thickness of 0.1 μm.

Figure 14A:
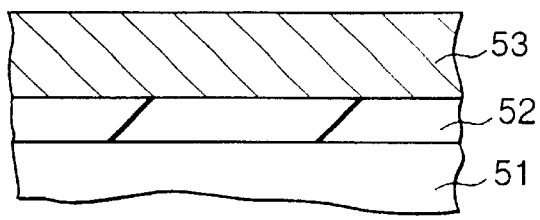
FIGS. 14A and 14G illustrate cross-sectional views sequentially showing the process of forming a pattern according to a further example of this invention.
Figure 14E:
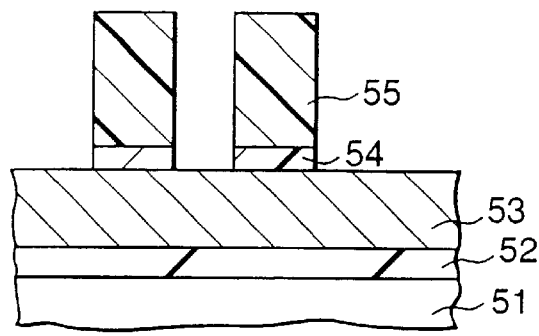
Figure 14B:
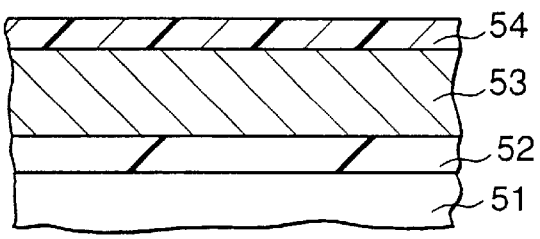

(J2): As shown in FIG. 14A, an $SiO_2$ film 52 having a thickness of 300 nm was formed on a silicon substrate 51 by means of sputtering. Then, a metallic wiring layer 53 consisting of TiN/Ti/0.5%Cu—Al/Ti/TiN (film thickness: 40 nm/5 nm/230 nm/10 nm/20 nm) was formed on the surface of $SiO_2$ film 52. Then, as shown in FIG. 14B, a solution which was prepared by dissolving 10 g of an organosilicon compound represented by the general formula (1-84) and having a weight average molecular weight of 12,000 in 90 g of anisole was spin-coated on the surface of metallic wiring layer 53. Then, the coated layer was heated for 90 seconds at a temperature of 160° C. by making use of a hot plate to evaporate the solvent and thereby to dry the coated layer, thus forming an organosilicon film 54 having a thickness of 0.1 μm.

(J3): A polysilicon film having a thickness of 390 nm was formed on an $SiO_2$ film having a thickness of 500 nm and formed on a silicon substrate. Then, a solution which was prepared by dissolving 10 g of an organosilicon compound represented by the general formula (1-84) and having a weight average molecular weight of 12,000 in 90 g of anisole was spin-coated on the surface of the polysilicon film. Then, the coated layer was heated for 90 seconds at a temperature of 160° C. by making use of a hot plate to evaporate the solvent and thereby to dry the coated layer, thus forming an organosilicon film 54 having a thickness of 0.1 μm.

The glass-transition temperature of the organosilicon film formed by the methods (J1) to (J3) was 132° C.

FIGS. 14A and 14B shows one embodiment of the aforementioned (J2) where an organosilicon film is formed on the metallic wiring layer. Likewise, the embodiments of the aforementioned (J1) and (J3) may be constructed in the same manner as in (J2) except that the organosilicon film is formed directly on the $SiO_2$ film (J1) on the polysilicon film (J3).

TABLE 15

| Organic silicone film | n, k-value | Dimension variation [nm] | Difference in dimension conversion [nm] (= Y − X) | Difference in dimension conversion [nm] (= W − Y) Upper line: Example 47 Lower line: Comparative example 13 | Selectivity to SiN film |
|---|---|---|---|---|---|
| (H1) | n = 2.10, K = 0.39 | 6 nm | −1 nm | (+2 nm) +18 nm | 12.7 |
| (H2) | n = 2.02, k = 0.20 | 4 nm | −2 nm | (+3 nm) +13 nm | 10.8 |
| (H3) | n = 2.06, k = 0.29 | 4 nm | −1 nm | (+3 nm) +15 nm | 12.7 |
| (H4) | n = 2.05, k = 0.30 | 4 nm | −1 nm | (+2 nm) +16 nm | 12.8 |
| (H5) | n = 1.98, k = 0.32 | 4 nm | −2 nm | (+3 nm) +16 nm | 11.6 |
| (H6) | n = 2.10, k = 0.32 | 8 nm | −1 nm | (+4 mn) +15 nm | 11.6 |

TABLE 16

| Organic silicon film | Selectivity to AlSi Example 50 |
|---|---|
| (H1) | 11.7 |
| (H2) | 11.4 |
| (H3) | 10.8 |
| (H4) | 10.8 |
| (H5) | 13.7 |
| (H6) | 12.7 |

TABLE 17

| Organic silicon film | Selectivity to Si Example 51 |
|---|---|
| (H1) | 8.3 |
| (H2) | 8.8 |
| (H3) | 7.9 |
| (H4) | 7.8 |
| (H5) | 6.9 |
| (H6) | 6.8 |

EXAMPLE 52

The following Examples 52 to 59 illustrate the embodiments where the organosilicon film is removed.

Figure 14C:
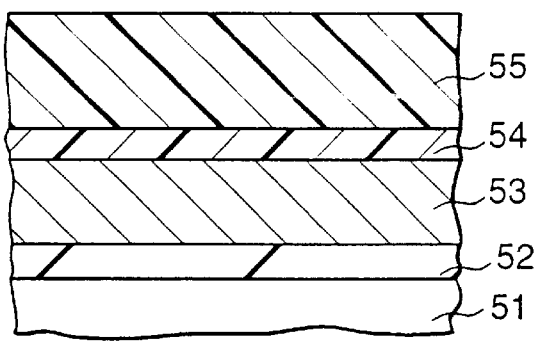
Figure 14F:
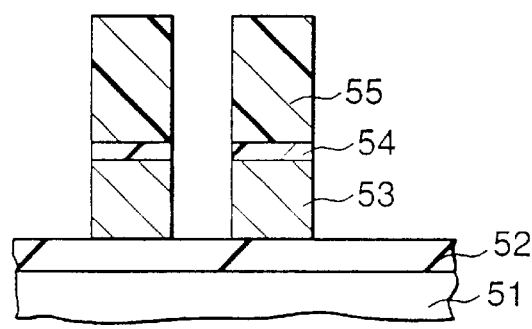
Figure 14D:
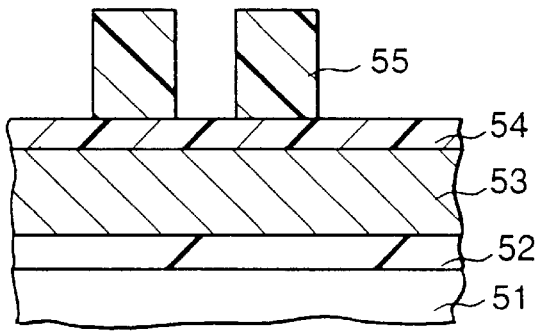

Then, as a second step, a chemical amplification type positive resist (APEX-E, Shiprey Co.) was coated on the surface of the organosilicon film 54 to form a resist film 55 having a thickness of 1 μm, which was then baked at a temperature of 100° C. for 90 seconds (FIG. 14C). Subsequently, the resist film 55 was subjected to a patterning exposure by making use of a KrF excimer stepper as a light source, and then baked for 90 seconds at a temperature of 100° C. Thereafter, the resist was developed for 60 seconds by making use of a 0.21N TMAH developing solution to form a resist pattern 55 (FIG. 14D).

As a third step, the etching of the organosilicon film 54 was performed under the conditions wherein a $Cl_2$ gas (flow rate: 100 sccm) was employed as an etching gas, the degree of vacuum was set to 20 mTorr, power density was set to 100W, and the substrate temperature was set to 50° C., whereby forming an organosilicon film pattern 54.

As a fourth step, the etching and patterning of a work film were performed as follows. Namely, in the case of (J1), the etching of the $SiO_2$ film was performed using a magnetron type RIE apparatus, and under the conditions wherein an $O_2/CF_4$ gas (flow rate: 50 sccm/50 sccm) was employed as an etching gas, the degree of vacuum was 10 mTorr, power density was set to 500 W, and the substrate temperature was set to 30° C., whereby forming an $SiO_2$ film pattern. In the case of (J2), the etching of the metallic wiring layer 53 was performed using an ICP type RIE apparatus and under the conditions wherein the inductive power/bias power was set to 400/180 W, an $Cl_2/BCl_3/N_2$ gas (flow rate: 50 sccm/60 sccm/5 sccm) was employed as an etching gas (FIG. 14F). In the case of (J3), the etching of the polysilicon layer was performed using a magnetron type RIE apparatus and under the conditions wherein an HBr gas (flow rate: 100 sccm) was employed as an etching gas, and the pressure was set to 30 mTorr.

Figure 14G:
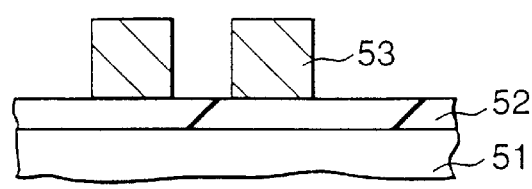

Then, as a fifth step, the removal of the chemical amplification type positive resist and organosilicon films of (J1) to (J3) were performed (FIG. 14G). In this removal of these layers, a downflow plasma apparatus was employed and a mixed gas comprising $O_2$ and $CF_4$ was employed. The substrate temperature and the flow rate of gas were varied as shown in the following Table 18. The plasma power density was set to 200 W and the pressure was set to 0.1 Torr.

TABLE 18

| $CF_4/CF_4 + O_2$ | 80° C. | 160° C. | 240° C. |
|---|---|---|---|
| 0% | (1) | (2) | (3) |
| 0.2% | (4) | (5) | (6) |
| 0.5% | (7) | (8) | (9) |
| 1% | (10) | (11) | (12) |
| 2% | (13) | (14) | (15) |

Whether or not the resist and organosilicon film could be removed without leaving a residue was checked in this example, the results being shown in the following Table 19 wherein the mark O denotes a sample where no residue was recognized, while the mark X denote a sample where a residue was recognized. As seen from this table, when the ratio of $CF_4$ was 0, a residue was admitted irrespective of the substrate temperature, whereas when the ratio of $CF_4$ was increased to 0.2%, an excellent removability was obtained when the substrate temperature was increased up to 80° C. or to 160° C. When the ratio of $CF_4$ was further increased up to 0.5%, an excellent removability was obtained irrespective of the substrate temperature. Furthermore, the growth of a mixed layer between the underlying layer and the organosilicon film was also checked by means of a cross-sectional SEM observation. As a result, the presence of a mixed layer was not admitted in the samples shown in Table 19 where no residue was admitted.

TABLE 19

|  | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| (J1) | X | X | X | O | O | X | O | O | O | O | O | O | O | O | O |
| (J2) | X | X | X | O | O | X | O | O | O | O | O | O | O | O | O |
| (J3) | X | X | X | O | O | X | O | O | O | O | O | O | O | O | O |
| (K1) | X | X | X | X | X | X | X | X | X | X | X | X | X | X | X |
| (K2) | X | X | X | X | X | X | X | X | X | X | X | X | X | X | X |
| (K3) | X | X | X | X | X | X | X | X | X | X | X | X | X | X | X |
| (L1) | X | X | X | X | X | X | X | X | X | X | X | X | X | X | X |
| (L2) | X | X | X | X | X | X | X | X | X | X | X | X | X | X | X |
| (L3) | X | X | X | X | X | X | X | X | X | X | X | X | X | X | X |

With regard to the samples which indicated an excellent removability of films in the above Table 19, the magnitude of cutting of the work film (i.e. an underlying $SiO_2$ film in the case of (J1); an underlying metallic wiring layer in the case of (J2); and the polysilicon film in the case of (J3)) was measured, the results being shown in the following Table 20. It will be seen from Table 20 that most of the samples indicated a cutting of not more than 1 nm (impossible to measure), suggesting that little damage would be caused to the underlying layer.

TABLE 20

|  | (1) | (2) | (3) | (4) | (5) | (6) | (7) | (8) |
|---|---|---|---|---|---|---|---|---|
| (J1) | — | — | — | <1 nm | <1 nm | — | <1 nm | <1 nm |
| (J2) | — | — | — | <1 nm | <1 nm | — | <1 nm | <1 nm |
| (J3) | — | — | — | <1 nm | <1 nm | — | <1 nm | <1 nm |

|  | (9) | (10) | (11) | (12) | (13) | (14) | (15) |
|---|---|---|---|---|---|---|---|
| (J1) | <1 nm | <1 nm | <1 nm | <1 nm | 1.5 nm | 1.7 nm | 2.0 nm |
| (J2) | <1 nm | <1 nm | <1 nm | <1 nm | 1.5 nm | 1.7 nm | 2.0 nm |
| (J3) | <1 nm | <1 nm | <1 nm | <1 nm | 1.5 nm | 1.7 nm | 2.0 nm |

The following experiments were conducted as a reference. First of all, organosilicon films were formed according to the following methods (K1) to (K3) as a first step.

(K1): In the same manner as in (J1), an organosilicon film was formed on an $SiO_2$ film having a thickness of 500 nm and formed on a silicon substrate.

(K2): In the same manner as in (J2), a metallic wiring layer consisting of TiN/Ti/0.5%Cu—Al/Ti/TiN was formed on an $SiO_2$ film having a thickness of 300 nm and formed on a silicon substrate, and then an organosilicon film having a thickness of 0.1 gm was formed on the metallic wiring layer.

(K3): In the same manner as in (J3), a polysilicon film was formed on an $SiO_2$ film having a thickness of 500 nm and formed on a silicon substrate, and then an organosilicon film was formed on the polysilicon film.

Then, as a second step, a resist pattern was formed on each of the organosilicon film of (K1) to (K3) in the same manner as illustrated in (J1) to (J3).

As a third step, the etching of the organosilicon film was performed using a magnetron type RIE apparatus, and under the conditions wherein a $CF_4$ gas (flow rate: 200 sccm) was employed as an etching gas, the degree of vacuum was 20 mTorr, power density was set to 100 W, and the substrate temperature was set to 50° C., whereby forming an organosilicon film pattern.

Since the organosilicon film was etched using the fluorine-based gas, as described in Example 20, the organosilicon film was swollen, and thus the etching with an excellent dimension controllability could not be performed.

As a fourth step, the etching and patterning of a work film were performed. Namely, in the case of (K1), the etching and patterning were performed in the same manner as performed for (J1); in the case of (K2), the etching and patterning were performed in the same manner as performed for (J2); and in the case of (K3), the etching and patterning were performed in the same manner as performed for (J3).

Whether or not both resist and organosilicon film could be removed without leaving a residue was checked in this experiment, the results being shown in the above Table 19. As seen from this table, since the etching gas employed was formed only of $CF_4$, a residue was admitted irrespective of the substrate temperature.

The following experiments were conducted as another reference wherein the patterning was performed by directly irradiating ultraviolet ray onto the organosilicon film. First of all, organosilicon films were formed according to the following methods (L1) to (L$_3$) as a first step.

Figure 15A:
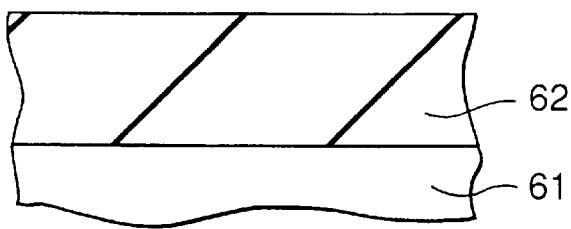
FIGS. 15A and 15E illustrate cross-sectional views sequentially showing the process of forming a pattern according to a still another example of this invention.
Figure 15B:
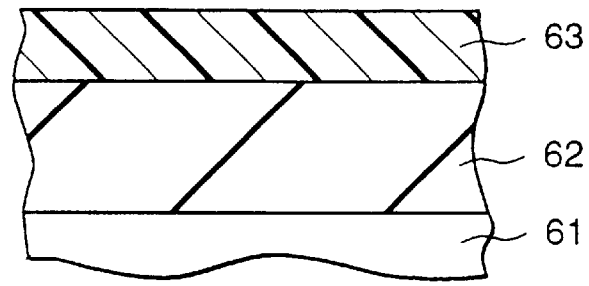

(L1): In the same manner as in (J1), an organosilicon film 63 was formed on an $SiO_2$ film 62 formed on a silicon substrate 61 (FIGS. 15A and 15B).

(L$_2$): In the same manner as in (J2), an organosilicon film was formed on a metallic wiring layer formed on the $SiO_2$ film.

(L$_3$): In the same manner as in (J3), an organosilicon film was formed on a polysilicon film formed on an $SiO_2$ film.

Figure 15C:
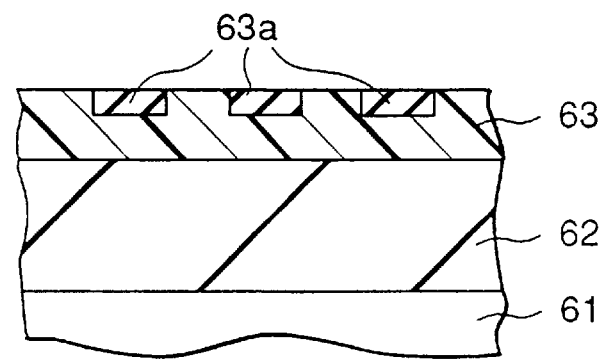

Then, each of the organosilicon films 63 of (L1) to (L$_3$) was subjected to a patterning exposure by an irradiation of ArF excimer laser thereby to oxidize the exposed portion 63a (FIG. 15C). Then, the exposed portion 63a of the organosilicon film was etched away by making use of a magnetron type RIE apparatus and under the conditions wherein a $Cl_2$ gas (flow rate: 200 sccm) was employed as a source gas, the degree of vacuum was set to 20 mTorr, the power density was set to 100 W, and the substrate temperature was set to 50° C., whereby obtaining a line and space pattern having a line width of 0.18 µm.

Figure 15D:
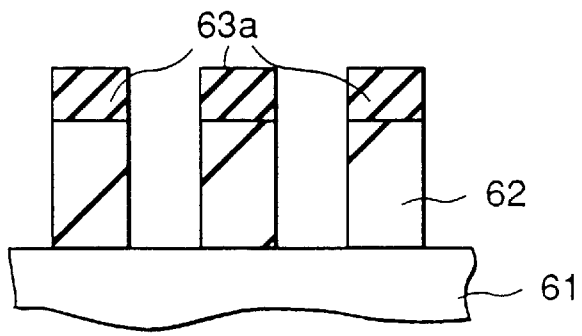

Furthermore, the $SiO_2$ film, the wiring layer and the polysilicon film were subjected to an etching by making use of the exposed and oxidized portion 63a as an etching mask. The procedures employed in this etching were the same as described in the fourth step of Example 52. FIG. 15D shows an etched state of the $SiO_2$ film.

Figure 15E:
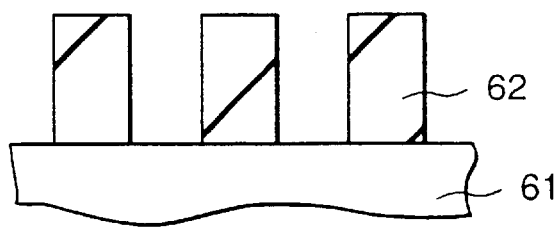

Then, the organosilicon film was removed in the same manner as illustrated in the fifth step of Example 52 (FIG. 15E). The method employed in this case was the same as illustrated in the fifth step of Example 52. Whether or not both resist and organosilicon film could be removed without leaving a residue was checked in this experiment, the results being shown in the above Table 19. Since the resist pattern was not employed in the etching of the organosilicon film, a residue was admitted in every organosilicon films irrespective of the substrate temperature. It would be clear from this experiment that if the resist pattern is employed as an etching mask in the etching of the organosilicon film, the organosilicon film would be more easily removed.

In another experiment, HBr was substituted for $Cl_2$ employed in Example 52. Namely, the etching was performed by making use of a magnetron type RIE apparatus and under the conditions wherein an HBr gas (flow rate: 100 sccm) was employed as a source gas, the degree of vacuum was set to 20 mTorr, the power density was set to 150 W, and the substrate temperature was set to 60° C. As a result, almost the same results as obtained in Example 52 were obtained.

EXAMPLE 53

First of all, organosilicon films were formed as a first step according to the same methods as shown in the methods (J1) to (J3), (K1) to (K3) and (L1) to (L3) of Example 52.

Then, the processing of an $SiO_2$ film, a metallic wiring layer and a polysilicon film was performed in the same manner as illustrated in the steps of 2, 3 and 4 of Example 52.

Then, as a fifth step, the removal of the chemical amplification type positive resist and organosilicon films of (J1) to (J3), (K1) to (K3) and (L1) to (L3) were performed according to the following methods. In this removal of these layers, a downflow plasma apparatus was employed and a mixed gas comprising $O_2$ and $SF_6$ or $O_2$ and $NF_3$ was employed. The flow rate of $O_2$ was fixed to 500 sccm, but the substrate temperature and the flow rates of $SF_6$ and $NF_3$ were varied as shown in the following Table 21. The plasma power density was set to 200 W and the pressure was set to 0.1 Torr.

TABLE 21

|  | 80° C. | 160° C. | 240° C. |
|---|---|---|---|
| $SF_6$ = 2 sccm | (1) | (2) | (3) |
| $SF_6$ = 5 sccm | (4) | (5) | (6) |
| $NF_3$ = 5 sccm | (7) | (8) | (9) |
| $Cl_2$ = 5 sccm | (10) | (11) | (12) |
| $Br_2$ = 10 sccm | (13) | (14) | (15) |

Whether or not the resist and organosilicon film could be removed without leaving a residue was checked in this example, the results being shown in the following Table 22. As seen from this table, since the etching gas employed was formed only of $CF_4$, a residue was admitted irrespective of the substrate temperature. Since the resist pattern was not employed in the etching of the organosilicon film, a residue was admitted in every organosilicon films irrespective of the substrate temperature. It would be clear from this experiment that if the resist pattern is employed as an etching mask in the etching of the organosilicon film, the organosilicon film would be more easily removed. Furthermore, the growth of a mixed layer between the underlying layer and the organosilicon film was also checked by means of a cross-sectional SEM observation. As a result, the presence of a mixed layer was not admitted in any of the samples shown in Table 22 where no residue was admitted.

TABLE 22

|      | (1) | (2) | (3) | (4) | (5) | (6) | (7) | (8) | (9) | (10) | (11) | (12) | (13) | (14) | (15) |
|------|-----|-----|-----|-----|-----|-----|-----|-----|-----|------|------|------|------|------|------|
| (J1) | X | X | X | ◯ | ◯ | ◯ | ◯ | ◯ | ◯ | ◯ | ◯ | ◯ | ◯ | ◯ | ◯ |
| (J2) | X | X | X | ◯ | ◯ | ◯ | ◯ | ◯ | ◯ | ◯ | ◯ | ◯ | ◯ | ◯ | ◯ |
| (J3) | X | X | X | ◯ | ◯ | ◯ | ◯ | ◯ | ◯ | ◯ | ◯ | ◯ | ◯ | ◯ | ◯ |
| (K1) | X | X | X | X | X | X | X | X | X | X | X | X | X | X | X |
| (K2) | X | X | X | X | X | X | X | X | X | X | X | X | X | X | X |
| (K3) | X | X | X | X | X | X | X | X | X | X | X | X | X | X | X |
| (L1) | X | X | X | X | X | X | X | X | X | X | X | X | X | X | X |
| (L2) | X | X | X | X | X | X | X | X | X | X | X | X | X | X | X |
| (L3) | X | X | X | X | X | X | X | X | X | X | X | X | X | X | X |

With regard to the samples which indicated an excellent removability of films, the magnitude of cutting of the work film (i.e. an underlying $SiO_2$ film in the case of (J1); an underlying metallic wiring film in the case of (J2); and the polysilicon film in the case of (J3)) was measured, the results being shown in the following Table 23. It will be seen from Table 23 that most of the samples indicated a cutting of not more than 1 nm (impossible to measure), suggesting that little damage would be caused to the underlying layer.

TABLE 23

|      | (1) | (2) | (3) | (4)   | (5)   | (6)   | (7)   | (8)   |
|------|-----|-----|-----|-------|-------|-------|-------|-------|
| (J1) | — | — | — | <1 nm | <1 nm | <1 nm | <1 nm | <1 nm |
| (J2) | — | — | — | <1 nm | <1 nm | <1 nm | <1 nm | <1 nm |
| (J3) | — | — | — | <1 nm | <1 nm | <1 nm | <1 nm | <1 nm |

|      | (9)   | (10)  | (11)  | (12)  | (13)  | (14)  | (15)  |
|------|-------|-------|-------|-------|-------|-------|-------|
| (J1) | <1 nm | <1 nm | <1 nm | <1 nm | <1 nm | <1 nm | <1 nm |
| (J2) | <1 nm | <1 nm | <1 nm | <1 nm | <1 nm | <1 nm | <1 nm |
| (J3) | <1 nm | <1 nm | <1 nm | <1 nm | <1 nm | <1 nm | <1 nm |

EXAMPLE 54

First of all, organosilicon films were formed as a first step according to the same methods as shown in the methods (J1) to (J3), (K1) to (K3) and (L1) to (L3) of Example 52.

Then, the processing of an $SiO_2$ film, a metallic wiring layer and a polysilicon film was performed in the same manner as illustrated in the steps of 2, 3 and 4 of Example 52.

Then, as a fifth step, the removal of the chemical amplification type positive resist and organosilicon films of (J1) to (J3), (K1) to (K3) and (L1) to (L3) were performed according to the following methods. In this removal of these layers, a downflow plasma apparatus was employed and each of these layers was treated for one minute under the conditions wherein an $O_2$ gas was employed, the substrate temperature was set to 80° C., the plasma power density was set to 200 W and the pressure was set to 0.1 Torr. Then, each layer was immersed in a solution containing HF or $NH_4F$ at room temperature. The contents of HF or $NH_4F$ in the solution are shown in the following Table 24. Whether or not the resist and organosilicon film were removed without leaving a residue was checked in this example, the results being shown in the following Table 25.

TABLE 24

| Ratio of HF | | Ratio of $HF_4F$ | |
|---|---|---|---|
| 0.1% | (1) | 0.2% | (6) |
| 0.2% | (2) | 0.5% | (7) |

TABLE 24-continued

| Ratio of HF | | Ratio of $HF_4F$ | |
|---|---|---|---|
| 0.5% | (3) | 1% | (8) |
| 1% | (4) | 2% | (9) |
| 2% | (5) | 5% | (10) |

TABLE 25

|      | (1) | (2) | (3) | (4) | (5) | (6) | (7) | (8) | (9) | (10) |
|------|-----|-----|-----|-----|-----|-----|-----|-----|-----|------|
| (J1) | X | ◯ | ◯ | ◯ | ◯ | X | ◯ | ◯ | ◯ | ◯ |
| (J2) | X | ◯ | ◯ | ◯ | ◯ | X | ◯ | ◯ | ◯ | ◯ |
| (J3) | X | ◯ | ◯ | ◯ | ◯ | X | ◯ | ◯ | ◯ | ◯ |
| (K1) | X | X | X | X | X | X | X | X | X | X |
| (K2) | X | X | X | X | X | X | X | X | X | X |
| (K3) | X | X | X | X | X | X | X | X | X | X |
| (L1) | X | X | X | X | X | X | X | X | X | X |
| (L2) | X | X | X | X | X | X | X | X | X | X |
| (L3) | X | X | X | X | X | X | X | X | X | X |

As seen from Table 25, in the case of (J1) to (J3), if the removal was performed using only $O_2$ plasma, a residue would be left as shown in Example 52 irrespective of the substrate temperature. Whereas when the ratio of HF or $NH_4F$ was increased, an excellent removability was obtained.

On the other hand, in the case of (K1) to (K3), since $CF_4$ was employed as an etching gas of the organosilicon film, the removal of the organosilicon film did not proceed smoothly, thus leaving a residue after the removing process of the organosilicon film. Furthermore, the growth of a mixed layer between the underlying layer and the organosilicon film was also checked by means of a cross-sectional SEM observation. Since the resist pattern was not employed in the etching of the organosilicon film, a residue was admitted in every organosilicon films irrespective of the substrate temperature. It would be clear from this experiment that if the resist pattern is employed as an etching mask in the etching of the organosilicon film, the organosilicon film would be more easily removed. As a result, the presence of a mixed layer was not admitted in the samples shown in Table 25 where no residue was admitted.

With regard to the samples which indicated an excellent removability of films, the magnitude of cutting of the work film (i.e. an underlying $SiO_2$ film in the case of (J1); an underlying metallic wiring layer in the case of (J2); and the polysilicon film in the case of (J3)) was measured, the results being shown in the following Table 26. It will be seen from Table 26 that most of the samples indicated a cutting of not more than 1 nm (impossible to measure), suggesting that little damage would be caused to the underlying layer.

TABLE 26

|      | (1) | (2)   | (3)   | (4)   | (5)   | (6) | (7)   | (8)   | (9)   | (10)  |
|------|-----|-------|-------|-------|-------|-----|-------|-------|-------|-------|
| (J1) | —   | <1 nm | <1 nm | <1 nm | <1 nm | —   | <1 nm | <1 nm | <1 nm | <1 nm |
| (J2) | —   | <1 nm | <1 nm | <1 nm | <1 nm | —   | <1 nm | <1 nm | <1 nm | <1 nm |
| (J3) | —   | <1 nm | <1 nm | <1 nm | <1 nm | —   | <1 nm | <1 nm | <1 nm | <1 nm |

EXAMPLE 55

First of all, organosilicon films were formed as a first step according to the same methods as shown in the methods (J1) to (J3), (K1) to (K3) and (L1) to (L3) of Example 52.

Then, the processing of an $SiO_2$ film, a metallic wiring layer and a polysilicon film was performed in the same manner as illustrated in the steps of 2, 3 and 4 of Example 52.

Then, after the work films were etched by the methods (J1) to (J3), (K1) to (K3) and (L1) to (L3) as a fifth step, the removal of the resist of (J1) to (J3), (K1) to (K3) and (L1) to (L3) and organosilicon films were performed according to the following methods. In this removal of these layers, each layer was immersed for 10 minutes in a solution containing sulfuric acid and an aqueous solution of hydrogen peroxide at room temperature and then immersed again in an aqueous solution containing HF or $NH_4F$ at room temperature. The contents of these compounds in the solution are shown in the following Table 27. The ratio of sulfuric acid/$H_2O_2$ is based on volume ratio. The contents of HF and $NH_4F$ are based on volume percent in pure water. Whether or not the resist and organosilicon film were removed without leaving a residue was checked in this example, the results being shown in the following Table 28.

TABLE 27

| Sulfuric acid/$H_2O_2$ | HF 1% | HF 2% | $NH_4F$ 1% |
|---|---|---|---|
| 10%/90% | (1)  | (2)  | (3)  |
| 30%/70% | (4)  | (5)  | (6)  |
| 50%/50% | (7)  | (8)  | (9)  |
| 70%/30% | (10) | (11) | (12) |
| 90%/10% | (13) | (14) | (15) |

In the case of (K1) to (K3), since $CF_4$ was employed as an etching gas of the organosilicon film, the removal of the organosilicon film did not proceed smoothly, thus leaving a residue after the removing process of the organosilicon film. Since the resist pattern was not employed in the etching of the organosilicon film, a residue was admitted in every organosilicon films irrespective of the substrate temperature. It would be clear from this experiment that if the resist pattern is employed as an etching mask in the etching of the organosilicon film, the organosilicon film would be more easily removed. Furthermore, the growth of a mixed layer between the underlying layer and the organosilicon film was also checked by means of a cross-sectional SEM observation. As a result, the presence of a mixed layer was not admitted in the samples shown in Table 28 where no residue was admitted.

With regard to the samples which indicated an excellent removability of films, the magnitude of cutting of the work film (i.e. an underlying $SiO_2$ film in the case of (J1); an underlying metallic wiring film in the case of (J2); and the polysilicon film in the case of (J3)) was measured, the results being shown in the following Table 29. It will be seen from Table 29 that most of the samples indicated a cutting of not more than 1 nm (impossible to measure), suggesting that little damage would be caused to the underlying layer.

TABLE 28

|      | (1) | (2) | (3) | (4) | (5) | (6) | (7) | (8) | (9) | (10) | (11) | (12) | (13) | (14) | (15) |
|------|-----|-----|-----|-----|-----|-----|-----|-----|-----|------|------|------|------|------|------|
| (J1) | ○ | ○ | ○ | ○ | ○ | ○ | ○ | ○ | ○ | ○ | ○ | ○ | ○ | ○ | ○ |
| (J2) | ○ | ○ | ○ | ○ | ○ | ○ | ○ | ○ | ○ | ○ | ○ | ○ | ○ | ○ | ○ |
| (J3) | ○ | ○ | ○ | ○ | ○ | ○ | ○ | ○ | ○ | ○ | ○ | ○ | ○ | ○ | ○ |
| (K1) | X | X | X | X | X | X | X | X | X | X | X | X | X | X | X |
| (K2) | X | X | X | X | X | X | X | X | X | X | X | X | X | X | X |
| (K3) | X | X | X | X | X | X | X | X | X | X | X | X | X | X | X |
| (L1) | X | X | X | X | X | X | X | X | X | X | X | X | X | X | X |
| (L2) | X | X | X | X | X | X | X | X | X | X | X | X | X | X | X |
| (L3) | X | X | X | X | X | X | X | X | X | X | X | X | X | X | X |

TABLE 29

|  | (1) | (2) | (3) | (4) | (5) | (6) | (7) | (8) |
|---|---|---|---|---|---|---|---|---|
| (J1) | <1 nm | <1 nm | <1 nm | <1 nm | <1 nm | <1 nm | <1 nm | <1 nm |
| (J2) | <1 nm | <1 nm | <1 nm | <1 nm | <1 nm | <1 nm | <1 nm | <1 nm |
| (J3) | <1 nm | <1 nm | <1 nm | <1 nm | <1 nm | <1 nm | <1 nm | <1 nm |

|  | (9) | (10) | (11) | (12) | (13) | (14) | (15) |
|---|---|---|---|---|---|---|---|
| (J1) | <1 nm | <1 nm | <1 nm | <1 nm | <1 nm | <1 nm | <1 nm |
| (J2) | <1 nm | <1 nm | <1 nm | <1 nm | <1 nm | <1 nm | <1 nm |
| (J3) | <1 nm | <1 nm | <1 nm | <1 nm | <1 nm | <1 nm | <1 nm |

EXAMPLE 56

In this example, the structure of material and removability were examined by making use of the method illustrated in Example 52.

First of all, an organosilicon film was formed, according to the following methods (S1) to (S12), on the surface of an $SiO_2$ film formed on a silicon substrate.

(S1): 10 g of an organosilicon compound (n/m=1/4) represented by the general formula (1-95) and having a weight average molecular weight of 3,000 was dissolved in 90 g of anisole to prepare a solution, which was then spin-coated on the surface of an underlying substrate. Then, the substrate was baked for 90 seconds at a temperature of 160° C.

(S2): The procedures of (S1) were repeated except that 10 g of an organosilicon compound (n/m=1/4) represented by the general formula (1-95) and having a weight average molecular weight of 6,000 was substituted for the organosilicon compound employed in (S1).

(S3): The procedures of (S1) were repeated except that 10 g of an organosilicon compound (n/m=1/4) represented by the general formula (1-95) and having a weight average molecular weight of 40,000 was substituted for the organosilicon compound employed in (S1).

(S4): The procedures of (S1) were repeated except that 10 g of an organosilicon compound represented by the general formula (1-47) and having a weight average molecular weight of 1,000 was substituted for the organosilicon compound employed in (S1).

(S5): The procedures of (S1) were repeated except that 10 g of an organosilicon compound represented by the general formula (1-47) and having a weight average molecular weight of 4,000 was substituted for the organosilicon compound employed in (S1).

(S6): The procedures of (S1) were repeated except that 10 g of an organosilicon compound represented by the general formula (1-47) and having a weight average molecular weight of 12,000 was substituted for the organosilicon compound employed in (S1).

(S7): The procedures of (S1) were repeated except that 10 g of an organosilicon compound represented by the general formula (1-1) and having a weight average molecular weight of 3,000 was substituted for the organosilicon compound employed in (S1).

(S8): 10 g of an organosilicon compound represented by the general formula (1-1) and having a weight average molecular weight of 3,000, 1 g of a crosslinking agent represented by the formula (3-61) and 0.1 g of silyl peroxide as a radical-generating agent were dissolved in 88.9 g of toluene to prepare a solution, which was then spin-coated on the surface of an underlying substrate. Then, the substrate was baked in a nitrogen gas atmosphere (oxygen concentration: 50 ppm or less) for 90 seconds at a temperature of 160° C.

(S9): 10 g of an organosilicon compound represented by the general formula (1-2) and having a weight average molecular weight of 3,000 was dissolved in 90 g of anisole to prepare a solution, which was then spin-coated on the surface of an underlying substrate. Then, the substrate was baked in a nitrogen gas atmosphere (oxygen concentration: 50 ppm or less) for 90 minutes at a temperature of 100° C.

(S10): The procedures of (S1) were repeated except that 10 g of an organosilicon compound represented by the general formula (1-17) and having a weight average molecular weight of 12,000 was substituted for the organosilicon compound employed in (S1).

(S11): The procedures of (S1) were repeated except that 10 g of an organosilicon compound represented by the general formula (1-29) and having a weight average molecular weight of 8,000 was substituted for the organosilicon compound employed in (S1).

(S12): The procedures of (S1) were repeated except that 10 g of an organosilicon compound represented by the general formula (1-22) and having a weight average molecular weight of 8,000 was substituted for the organosilicon compound employed in (S1).

Then, the glass transition temperature of the organosilicon films of (S1) to (S12) was measured, the results being shown in the following Table 30.

Then, a resist pattern was employed as an etching mask to perform the etching of each organosilicon film, and thereafter the etching of the $SiO_2$ film was performed. An examination was performed to see if the resist and organosilicon film could be removed without leaving a residue in this example, the results being shown in the following Table 30. Furthermore, the quantity of cutting on the $SiO_2$ film that might be brought about by the etching was measured after the removal thereof, the results being shown in the following Table 31.

As seen from this example, when the glass transition temperature of the organosilicon film was approximately not less than 0° C. and when the organosilicon film was formed of an organosilicon compound having a structure described in the general formula (12), it was possible to obtain an excellent removability. The same results were obtained when the work film was constituted by a wiring layer or polysilicon.

TABLE 30

| | Glass-transition temperature (° C.) | (1) | (2) | (3) | (4) | (5) | (6) | (7) |
|---|---|---|---|---|---|---|---|---|
| (S1) | −5 | X | X | X | X | X | X | X |
| (S2) | 10 | X | X | X | ○ | ○ | X | ○ |
| (S3) | 120 | X | X | X | ○ | ○ | X | ○ |
| (S4) | −10 | X | X | X | X | X | X | X |
| (S5) | 50 | X | X | X | ○ | ○ | X | ○ |
| (S6) | 130 | X | X | X | ○ | ○ | X | ○ |
| (S7) | −10 | X | X | X | X | X | X | X |
| (S8) | 140 | X | X | X | ○ | X | X | ○ |
| (S9) | 30 | X | X | X | ○ | X | X | ○ |
| (S10) | 50 | X | X | X | ○ | X | X | ○ |
| (S11) | 85 | X | X | X | ○ | X | X | ○ |
| (S12) | 95 | X | X | X | ○ | X | X | ○ |

| | Glass-transition temperature (° C.) | (8) | (9) | (10) | (11) | (12) | (13) | (14) | (15) |
|---|---|---|---|---|---|---|---|---|---|
| (S1) | −5 | X | X | X | X | X | ○ | ○ | ○ |
| (S2) | 10 | ○ | ○ | ○ | ○ | ○ | ○ | ○ | ○ |
| (S3) | 120 | ○ | ○ | ○ | ○ | ○ | ○ | ○ | ○ |
| (S4) | −10 | X | X | X | X | X | ○ | ○ | ○ |
| (S5) | 50 | ○ | ○ | ○ | ○ | ○ | ○ | ○ | ○ |
| (S6) | 130 | ○ | ○ | ○ | ○ | ○ | ○ | ○ | ○ |
| (S7) | −10 | X | X | X | X | X | ○ | ○ | ○ |
| (S8) | 140 | ○ | X | ○ | ○ | ○ | ○ | ○ | ○ |
| (S9) | 30 | ○ | X | ○ | ○ | ○ | ○ | ○ | ○ |
| (S10) | 50 | ○ | X | ○ | ○ | ○ | ○ | ○ | ○ |
| (S11) | 85 | ○ | X | ○ | ○ | ○ | ○ | ○ | ○ |
| (S12) | 95 | ○ | X | ○ | ○ | ○ | ○ | ○ | ○ |

TABLE 31

| | (1) | (2) | (3) | (4) | (5) | (6) | (7) | (8) | (9) |
|---|---|---|---|---|---|---|---|---|---|
| (S1) | — | — | — | — | — | — | — | — | — |
| (S2) | — | — | — | <1 nm | <1 nm | — | <1 nm | <1 nm | <1 nm |
| (S3) | — | — | — | <1 nm | <1 nm | — | <1 nm | <1 nm | <1 nm |
| (S4) | — | — | — | — | — | — | — | — | — |
| (S5) | — | — | — | <1 nm | <1 nm | — | <1 nm | <1 nm | <1 nm |
| (S6) | — | — | — | <1 nm | <1 nm | — | <1 nm | <1 nm | <1 nm |
| (S7) | — | — | — | — | — | — | — | — | — |
| (S8) | — | — | — | <1 nm | — | — | <1 nm | <1 nm | — |

TABLE 31-continued

| | | | | | | | | | |
|---|---|---|---|---|---|---|---|---|---|
| (S9) | — | — | — | <1 nm | — | — | <1 nm | <1 nm | — |
| (S10) | — | — | — | <1 nm | — | — | <1 nm | <1 nm | — |
| (S11) | — | — | — | <1 nm | — | — | <1 nm | <1 nm | — |
| (S12) | — | — | — | <1 nm | — | — | <1 nm | <1 nm | — |

| | (10) | (11) | (12) | (13) | (14) | (15) |
|---|---|---|---|---|---|---|
| (S1) | — | — | — | 3.0 nm | 3.2 nm | 3.8 nm |
| (S2) | <1 nm | <1 nm | <1 nm | 1.5 nm | 1.7 nm | 1.9 nm |
| (S3) | <1 nm | <1 nm | <1 nm | 1.5 nm | 1.6 nm | 1.9 nm |
| (S4) | — | — | — | 3.5 nm | 3.7 nm | 3.9 nm |
| (S5) | <1 nm | <1 nm | <1 nm | 1.5 nm | 1.6 nm | 1.9 nm |
| (S6) | <1 nm | <1 nm | <1 nm | 1.5 nm | 1.7 nm | 2.1 nm |
| (S7) | — | — | — | 4.5 nm | 4.7 nm | 5.1 nm |
| (S8) | <1 nm | <1 nm | <1 nm | 1.5 nm | 1.7 nm | 2.1 nm |
| (S9) | <1 nm | <1 nm | <1 nm | 5.5 nm | 5.7 nm | 5.9 nm |
| (S10) | <1 nm | <1 nm | <1 nm | 4.5 nm | 4.8 nm | 5.1 nm |
| (S11) | <1 nm | <1 nm | <1 nm | 5.5 nm | 5.8 nm | 6.1 nm |
| (S12) | <1 nm | <1 nm | <1 nm | 4.5 nm | 4.9 nm | 5.4 nm |

EXAMPLE 57

The structure of material and removability were examined by repeating the same procedures as described in Example 56 except that the removing method illustrated in Example 53 was employed, the results being shown in the following Tables 32 and 33.

As seen from Tables 32 and 33, when the glass transition temperature of the organosilicon film was approximately not less than 0° C. and when the organosilicon film was formed of an organosilicon compound having a structure represented by the general formula (12), it was possible to obtain an excellent removability. The same results were obtained when the work film was constituted by a wiring layer or polysilicon.

TABLE 32

| | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| (S1) | X | X | X | X | X | X | X | X | X | X | X | X | ○ | ○ | ○ |
| (S2) | X | X | X | ○ | ○ | X | ○ | ○ | ○ | ○ | ○ | ○ | ○ | ○ | ○ |
| (S3) | X | X | X | ○ | ○ | X | ○ | ○ | ○ | ○ | ○ | ○ | ○ | ○ | ○ |
| (S4) | X | X | X | X | X | X | X | X | X | X | X | X | ○ | ○ | ○ |
| (S5) | X | X | X | ○ | ○ | X | ○ | ○ | ○ | ○ | ○ | ○ | ○ | ○ | ○ |
| (S6) | X | X | X | ○ | ○ | X | ○ | ○ | ○ | ○ | ○ | ○ | ○ | ○ | ○ |
| (S7) | X | X | X | X | X | X | X | X | X | X | X | X | ○ | ○ | ○ |
| (S8) | X | X | X | ○ | X | X | ○ | ○ | X | ○ | ○ | X | ○ | ○ | ○ |
| (S9) | X | X | X | ○ | X | X | ○ | ○ | X | ○ | ○ | ○ | ○ | ○ | X |
| (S10) | X | X | X | ○ | X | X | ○ | ○ | X | ○ | ○ | ○ | ○ | ○ | X |
| (S11) | X | X | X | ○ | X | X | ○ | ○ | X | ○ | ○ | ○ | ○ | ○ | X |
| (S12) | X | X | X | ○ | X | X | ○ | ○ | X | ○ | ○ | ○ | ○ | ○ | X |

TABLE 33

| | (1) | (2) | (3) | (4) | (5) | (6) | (7) | (8) | (9) |
|---|---|---|---|---|---|---|---|---|---|
| (S1) | — | — | — | — | — | — | — | — | — |
| (S2) | — | — | — | <1 nm | <1 nm | — | <1 nm | <1 nm | <1 nm |
| (S3) | — | — | — | <1 nm | <1 nm | — | <1 nm | <1 nm | <1 nm |
| (S4) | — | — | — | — | — | — | — | — | — |
| (S5) | — | — | — | <1 nm | <1 nm | — | <1 nm | <1 nm | <1 nm |
| (S6) | — | — | — | <1 nm | <1 nm | — | <1 nm | <1 nm | <1 nm |
| (S7) | — | — | — | — | — | — | — | — | — |
| (S8) | — | — | — | <1 nm | — | — | <1 nm | <1 nm | — |

TABLE 33-continued

|  |  |  |  |  |  |  |  |  |
|---|---|---|---|---|---|---|---|---|
| (S9) | — | — | — | <1 nm | — | — | <1 nm | <1 nm | — |
| (S10) | — | — | — | <1 nm | — | — | <1 nm | <1 nm | — |
| (S11) | — | — | — | <1 nm | — | — | <1 nm | <1 nm | — |
| (S12) | — | — | — | <1 nm | — | — | <1 nm | <1 nm | — |

|  | (10) | (11) | (12) | (13) | (14) | (15) |
|---|---|---|---|---|---|---|
| (S1) | — | — | — | 2.8 nm | 3.2 nm | 3.6 nm |
| (S2) | <1 nm | <1 nm | <1 nm | 1.6 nm | 1.7 nm | 2.1 nm |
| (S3) | <1 nm | <1 nm | <1 nm | 1.8 nm | 1.8 nm | 2.1 nm |
| (S4) | — | — | — | 3.2 nm | 3.9 nm | 4.1 nm |
| (S5) | <1 nm | <1 nm | <1 nm | 1.7 nm | 1.9 nm | 2.1 nm |
| (S6) | <1 nm | <1 nm | <1 nm | 1.6 nm | 1.7 nm | 2.3 nm |
| (S7) | — | — | — | 4.4 nm | 4.7 nm | 5.4 nm |
| (S8) | <1 nm | <1 nm | <1 nm | 1.7 nm | 1.7 nm | 2.3 nm |
| (S9) | <1 nm | <1 nm | <1 nm | 5.4 nm | 5.7 nm | — |
| (S10) | <1 nm | <1 nm | <1 nm | 4.6 nm | 4.8 nm | — |
| (S11) | <1 nm | <1 nm | <1 nm | 5.5 nm | 5.8 nm | — |
| (S12) | <1 nm | <1 nm | <1 nm | 4.7 nm | 4.9 nm | — |

TABLE 34

|  | (1) | (2) | (3) | (4) | (5) | (6) | (7) | (8) | (9) | (10) |
|---|---|---|---|---|---|---|---|---|---|---|
| (S1) | X | X | X | X | ○ | X | X | X | X | ○ |
| (S2) | X | ○ | ○ | X | ○ | X | ○ | ○ | ○ | ○ |
| (S3) | X | ○ | ○ | X | ○ | X | ○ | ○ | ○ | ○ |
| (S4) | X | X | X | X | ○ | X | X | X | X | ○ |
| (S5) | X | ○ | ○ | X | ○ | X | ○ | ○ | ○ | ○ |
| (S6) | X | ○ | ○ | X | ○ | X | ○ | ○ | ○ | ○ |
| (S7) | X | X | X | X | ○ | X | X | X | X | ○ |
| (S8) | X | X | X | ○ | ○ | X | X | X | ○ | ○ |
| (S9) | X | X | X | ○ | ○ | X | X | X | ○ | ○ |
| (S10) | X | X | X | ○ | ○ | X | X | X | ○ | ○ |
| (S11) | X | X | X | ○ | ○ | X | X | X | ○ | ○ |
| (S12) | X | X | X | ○ | ○ | X | X | X | ○ | ○ |

TABLE 35

|  | (1) | (2) | (3) | (4) | (5) | (6) | (7) | (8) | (9) | (10) |
|---|---|---|---|---|---|---|---|---|---|---|
| (S1) | — | — | — | — | <1 nm | — | — | — | — | <1 nm |
| (S2) | — | <1 nm | <1 nm | — | <1 nm | — | <1 nm | <1 nm | <1 nm | <1 nm |
| (S3) | — | <1 nm | <1 nm | — | <1 nm | — | <1 nm | <1 nm | <1 nm | <1 nm |
| (S4) | — | — | — | — | <1 nm | — | — | — | — | <1 nm |
| (S5) | — | <1 nm | <1 nm | — | <1 nm | — | <1 nm | <1 nm | <1 nm | <1 nm |
| (S6) | — | <1 nm | <1 nm | — | <1 nm | — | <1 nm | <1 nm | <1 nm | <1 nm |
| (S7) | — | — | — | — | <1 nm | — | — | — | — | <1 nm |
| (S8) | — | — | — | <1 nm | <1 nm | — | — | — | <1 nm | <1 nm |
| (S9) | — | — | — | <1 nm | <1 nm | — | — | — | <1 nm | <1 nm |
| (S10) | — | — | — | <1 nm | <1 nm | — | — | — | <1 nm | <1 nm |
| (S11) | — | — | — | <1 nm | <1 nm | — | — | — | <1 nm | <1 nm |
| (S12) | — | — | — | <1 nm | <1 nm | — | — | — | <1 nm | <1 nm |

EXAMPLE 58

The structure of material and removability were examined by repeating the same procedures as described in Example 56 except that the removing method illustrated in Example 54 was employed, the results being shown in the following Tables 34 and 35.

As seen from Tables 34 and 35, when the glass transition temperature of the organsilicon film was approximately not less than 0° C. and when the organosilicon film was formed of an organosilicon compound having a structure represented by the general formula (12), it was possible to obtain an excellent removability. The same results were obtained when the work film was constituted by a wiring layer or polysilicon.

EXAMPLE 59

The structure of material and removability were examined by repeating the same procedures as described in Example 56 except that the removing method illustrated in Example 55 was employed, the results being shown in the following Tables 36 and 37.

As seen from Tables 36 and 37, when the glass transition temperature of the organosilicon film was approximately not less than 0° C. and when the organosilicon film was formed of an organosilicon compound having a structure rrepresented by the general formula (12), it was possible to obtain an excellent removability. The same results were obtained when the work film was constituted by a wiring layer or polysilicon.

TABLE 36

|  | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| (S1) | X | X | X | X | X | X | X | X | X | X | X | X | X | X | X |
| (S2) | ○ | ○ | ○ | ○ | ○ | ○ | ○ | ○ | ○ | ○ | ○ | ○ | ○ | ○ | ○ |
| (S3) | ○ | ○ | ○ | ○ | ○ | ○ | ○ | ○ | ○ | ○ | ○ | ○ | ○ | ○ | ○ |
| (S4) | X | X | X | X | X | X | X | X | X | X | X | X | X | X | X |
| (S5) | ○ | ○ | ○ | ○ | ○ | ○ | ○ | ○ | ○ | ○ | ○ | ○ | ○ | ○ | ○ |
| (S6) | ○ | ○ | ○ | ○ | ○ | ○ | ○ | ○ | ○ | ○ | ○ | ○ | ○ | ○ | ○ |
| (S7) | X | X | X | X | X | X | X | X | X | X | X | X | X | X | X |
| (S8) | X | X | X | X | X | X | X | X | X | X | X | X | X | X | X |
| (S9) | X | ○ | ○ | X | ○ | ○ | X | ○ | ○ | X | ○ | ○ | X | ○ | ○ |

TABLE 36-continued

|       | (1) | (2) | (3) | (4) | (5) | (6) | (7) | (8) | (9) | (10) | (11) | (12) | (13) | (14) | (15) |
|-------|-----|-----|-----|-----|-----|-----|-----|-----|-----|------|------|------|------|------|------|
| (S10) | X | ○ | ○ | X | ○ | ○ | X | ○ | ○ | X | ○ | ○ | X | ○ | ○ |
| (S11) | X | ○ | ○ | X | ○ | ○ | X | ○ | ○ | X | ○ | ○ | X | ○ | ○ |
| (S12) | X | ○ | ○ | X | ○ | ○ | X | ○ | ○ | X | ○ | ○ | X | ○ | ○ |

TABLE 37

|       | (1) | (2) | (3) | (4) | (5) | (6) | (7) | (8) | (9) |
|-------|-----|-----|-----|-----|-----|-----|-----|-----|-----|
| (S1)  | — | — | — | — | — | — | — | — | — |
| (S2)  | <1 nm | <1 nm | <1 nm | <1 nm | <1 nm | <1 nm | <1 nm | <1 nm | <1 nm |
| (S3)  | <1 nm | <1 nm | <1 nm | <1 nm | <1 nm | <1 nm | <1 nm | <1 nm | <1 nm |
| (S4)  | — | — | — | — | — | — | — | — | — |
| (S5)  | <1 nm | <1 nm | <1 nm | <1 nm | <1 nm | <1 nm | <1 nm | <1 nm | <1 nm |
| (S6)  | <1 nm | <1 nm | <1 nm | <1 nm | <1 nm | <1 nm | <1 nm | <1 nm | <1 nm |
| (S7)  | — | — | — | — | — | — | — | — | — |
| (S8)  | — | — | — | — | — | — | — | — | — |
| (S9)  | — | <1 nm | <1 nm | — | <1 nm | <1 nm | — | <1 nm | <1 nm |
| (S10) | — | <1 nm | <1 nm | — | <1 nm | <1 nm | — | <1 nm | <1 nm |
| (S11) | — | <1 nm | <1 nm | — | <1 nm | <1 nm | — | <1 nm | <1 nm |
| (S12) | — | <1 nm | <1 nm | — | <1 nm | <1 nm | — | <1 nm | <1 nm |

|       | (10) | (11) | (12) | (13) | (14) | (15) |
|-------|------|------|------|------|------|------|
| (S1)  | — | — | — | — | — | — |
| (S2)  | <1 nm | <1 nm | <1 nm | <1 nm | <1 nm | <1 nm |
| (S3)  | <1 nm | <1 nm | <1 nm | <1 nm | <1 nm | <1 nm |
| (S4)  | — | — | — | — | — | — |
| (S5)  | <1 nm | <1 nm | <1 nm | <1 nm | <1 nm | <1 nm |
| (S6)  | <1 nm | <1 nm | <1 nm | <1 nm | <1 nm | <1 nm |
| (S7)  | — | — | — | — | — | — |
| (S8)  | — | — | — | — | — | — |
| (S9)  | — | <1 nm | <1 nm | — | <1 nm | <1 nm |
| (S10) | — | <1 nm | <1 nm | — | <1 nm | <1 nm |
| (S11) | — | <1 nm | <1 nm | — | <1 nm | <1 nm |
| (S12) | — | <1 nm | <1 nm | — | <1 nm | <1 nm |

Additiional advantages and modifications will readily occur to those skilled in the art. Therefore, the invention in its broader aspects is not limited to the specific details and representative embodiments shown and described herein. Accordingly, various modifications may by made without departing from the spirit or scope of the general inventive concept as defined by the appended claims and their equivalent.

What is claimed is:

1. A method of forming a pattern which comprises the steps of:

forming an organosilicon film on a silicon-based insulating film, said organosilicon film containing an organosilicon compound having a silicon-silicon bond in a backbone chain thereof and a glass transition temperature of 0° .C or more;

forming a resist pattern on said organosilicon film;

transcribing said resist pattern on said organosilicon film through an etching of said organosilicon film by making use of an etching gas containing at least one atom selected from the group consisting of chlorine, bromine, and iodine; and etching the silicon-based insulating film by making use of at least said organosilicon film as an etching mask to form a silicon-based insulating film pattern, wherein said organosilicon compound has a structure that is represented by the following general formula in a backbone chain thereof:

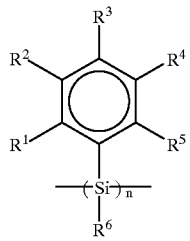

wherein $R^1$, $R^2$, $R^3$, $R^4$ and $R^5$ may be the same or different and are individually a hydrogen atom, or a substituted or unsubstituted hydrocarbon group having not more than three carbon atoms; $R^6$ is hydrogen atom or a substituted or unsubstituted aliphatic hydrocarbon group having 1 to 20 carbon atoms; and n is a positive integer.

2. The method of forming a pattern according to claim 1, wherein said organosilicon film is formed by the steps of forming a coated layer with a solution containing an organosilicon compound having a silicon-silicon bond on the backbone thereof, and heating the coated layer.

3. The method of forming a pattern according to claim 1, wherein said organosilicon film is formed by the steps of forming a coated layer with a solution containing an organosilicon compound having a silicon-silicon bond in a backbone chain thereof, and crosslinking the organosilicon compound.

4. The method of forming a pattern according to claim 3, wherein said solution further contains a crosslinking agent which effects crosslinking of said organosilicon compound.

5. The method of forming a pattern according to claim 1, wherein said silicon-based insulating film is etched using an etching gas containing a fluorine-based gas as an etching gas.

6. The method of forming a pattern according to claim 1, wherein said silicon-based insulating film is selected from the group consisting of a silicon oxide film, a silicon nitride film, a silicon oxynitride film and a spin-on glass film.

7. The method of forming a pattern according to claim 1, wherein said organosilicon film is etched by making use of an etching gas containing at least one of $Cl_2$ and HBr.

8. A method of forming a pattern which comprises the steps of:

forming an organosilicon film on one of a metallic wiring layer and a silicon-based material film, said organosilicon film containing an organosilicon compound having a silicon-silicon bond in a backbone chain thereof and a glass transition temperature of 0° C. or more;

forming a resist pattern on said organosilicon film;

transcribing said resist pattern on said organosilicon film through an etching of said organosilicon film by making use of an etching gas containing at least one atom selected from the group consisting of chlorine, bromine, and iodine; and etching the one of the metallic wiring layer and the silicon-based material film by making use of at least said organosilicon film as an etching mask to form a metallic wiring layer pattern, wherein said organosilicon compound has a structure that is represented by the following general formula in a backbone chain thereof:

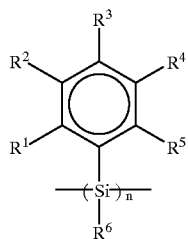

wherein $R^1$, $R^2$, $R^3$, $R^4$ and $R^5$ may be the same or different and are individually a hydrogen atom, or a substituted or unsubstituted hydrocarbon group having not more than three carbon atoms; $R^6$ is hydrogen atom or a substituted or unsubstituted aliphatic hydrocarbon group having 1 to 20 carbon atoms; and n is a positive integer.

9. The method of forming a pattern according to claim 8, wherein the etching of the one of the metallic wiring layer and the silicon-based material film is performed by the same etching apparatus as that used in the etching of the organosilicon film.

10. The method of forming a pattern according to claim 8, wherein said organosilicon film is formed by the steps of forming a coated layer with a solution containing an organosilicon compound having a silicon-silicon bond on the backbone thereof, and heating the coated layer.

11. The method of forming a pattern according to claim 8, wherein said organosilicon film is formed by the steps of forming a coated layer with a solution containing an organosilicon compound having a silicon-silicon bond in a backbone chain thereof, and crosslinking the organosilicon compound.

12. The method of forming a pattern according to claim 11, wherein said solution further contains a crosslinking agent which effects crosslinking of said organosilicon compound.

* * * * *

UNITED STATES PATENT AND TRADEMARK OFFICE
CERTIFICATE OF CORRECTION

PATENT NO. : 6,270,948 B1  Page 1 of 1
DATED : August 7, 2001
INVENTOR(S) : Yasuhiko Sato et al.

It is certified that error appears in the above-identified patent and that said Letters Patent is hereby corrected as shown below:

<u>Column 171,</u>
Line 54, "0º .C" should read -- 0º C. --.

Signed and Sealed this

Fourth Day of June, 2002

Attest:

JAMES E. ROGAN
Attesting Officer  Director of the United States Patent and Trademark Office